(12) United States Patent
Tanigaki et al.

(10) Patent No.: US 11,561,470 B2
(45) Date of Patent: Jan. 24, 2023

(54) NEGATIVE PHOTOSENSITIVE RESIN COMPOSITION, CURED FILM, ELEMENT PROVIDED WITH CURED FILM, ORGANIC EL DISPLAY PROVIDED WITH CURED FILM, AND METHOD FOR PRODUCING SAME

(71) Applicant: TORAY INDUSTRIES, INC., Tokyo (JP)

(72) Inventors: Yugo Tanigaki, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 43 days.

(21) Appl. No.: 16/495,745

(22) PCT Filed: Mar. 27, 2018

(86) PCT No.: PCT/JP2018/012431
§ 371 (c)(1),
(2) Date: Sep. 19, 2019

(87) PCT Pub. No.: WO2018/181311
PCT Pub. Date: Oct. 4, 2018

(65) Prior Publication Data
US 2020/0110337 A1 Apr. 9, 2020

(30) Foreign Application Priority Data

Mar. 29, 2017 (JP) .............................. JP2017-064524
Dec. 15, 2017 (JP) .............................. JP2017-241099

(51) Int. Cl.
*G03F 7/037* (2006.01)
*G03F 7/038* (2006.01)
(Continued)

(52) U.S. Cl.
CPC .............. *G03F 7/037* (2013.01); *G03F 7/038* (2013.01); *G03F 7/0387* (2013.01);
(Continued)

(58) Field of Classification Search
CPC ........ G03F 7/032; G03F 7/037; G03F 7/0387; G03F 7/40
See application file for complete search history.

(56) References Cited

U.S. PATENT DOCUMENTS

2006/0159839 A1* 7/2006 Suwa ................... C08G 73/101
430/270.1
2007/0190458 A1 8/2007 Nakashima et al.
(Continued)

FOREIGN PATENT DOCUMENTS

CN 104040432 A 9/2014
JP 2008-107530 A 5/2008
(Continued)

OTHER PUBLICATIONS

International Search Report, issued in PCT/JP2018/012431, PCT/ISA/210, dated Jun. 19, 2018.
(Continued)

*Primary Examiner* — John S Chu
(74) *Attorney, Agent, or Firm* — Birch, Stewart, Kolasch & Birch, LLP

(57) ABSTRACT

The invention aims to provide a cured film that is high in sensitivity, able to form a pattern having a small-tapered shape after a development step and after a heat curing step, helpful to depress the difference in the width of patterned openings between before and after the heat curing step, and high in light-shielding capability and also aims to provide a negative type photosensitive resin composition that serves for the production thereof. The negative type photosensitive resin composition includes an alkali-soluble resin (A), a
(Continued)

radical polymerizable compound (B), a photo initiator (C1), and a black colorant (Da); the alkali-soluble resin (A) including a first resin (A1) containing one or more selected from the group consisting of polyimide (A1-1), polyimide precursor (A1-2), polybenzoxazole (A1-3), polybenzoxazole precursor (A1-4), and polysiloxane (A1-5); and the radical polymerizable compound (B) including one or more selected from the group consisting of a fluorene backbone-containing radical polymerizable compound (B1) and an indane backbone-containing radical polymerizable compound (B2).

17 Claims, 6 Drawing Sheets

(51) Int. Cl.
    *G03F 7/40*     (2006.01)
    *G03F 7/075*     (2006.01)
    *H01L 51/56*     (2006.01)
    *G02F 1/1339*     (2006.01)
    *G03F 7/16*     (2006.01)
    *G03F 7/20*     (2006.01)
    *G03F 7/32*     (2006.01)

(52) U.S. Cl.
    CPC ............ *G03F 7/0757* (2013.01); *H01L 51/56* (2013.01); *G02F 1/1339* (2013.01); *G03F 7/16* (2013.01); *G03F 7/20* (2013.01); *G03F 7/327* (2013.01)

(56) References Cited

U.S. PATENT DOCUMENTS

| | | | |
|---|---|---|---|
| 2013/0034812 A1* | 2/2013 | Shimada | G03F 7/105 430/280.1 |
| 2014/0011125 A1* | 1/2014 | Inoue | C09D 11/037 430/7 |
| 2015/0153646 A1 | 6/2015 | Hsieh et al. | |
| 2015/0293282 A1* | 10/2015 | Takishita | G01J 5/0803 359/359 |
| 2018/0019290 A1 | 1/2018 | Arai et al. | |
| 2018/0031970 A1 | 2/2018 | Arimoto et al. | |

FOREIGN PATENT DOCUMENTS

| | | | |
|---|---|---|---|
| JP | 2010160418 B | * | 7/2010 |
| JP | 2014-197171 A | | 10/2014 |
| JP | 2015-111264 A | | 6/2015 |
| JP | 2016-45220 A | | 4/2016 |
| TW | 200804986 A | | 1/2008 |
| WO | WO 2015/046332 A1 | | 4/2015 |
| WO | WO 2016/140024 A1 | | 9/2016 |
| WO | WO 2016/143740 A1 | | 9/2016 |
| WO | WO 2016/158672 A1 | | 10/2016 |

OTHER PUBLICATIONS

Written Opinion of the International Searching Authority, issued in PCT/JP2018/012431, PCT/ISA/237, dated Jun. 19, 2018.

* cited by examiner

NEGATIVE PHOTOSENSITIVE RESIN COMPOSITION, CURED FILM, ELEMENT PROVIDED WITH CURED FILM, ORGANIC EL DISPLAY PROVIDED WITH CURED FILM, AND METHOD FOR PRODUCING SAME

TECHNICAL FIELD

The present invention relates to a negative type photosensitive resin composition and methods for producing a cured film, element, organic EL display, and display device therefrom.

BACKGROUND ART

In recent years, many display instruments having thin display devices, such as mobile phones, tablet PCs, and TV sets, have been developed by using organic electroluminescence (hereinafter abbreviated as "EL") display devices.

In general, an organic EL display device has a transparent electrode of, for example, indium tin oxide (hereinafter abbreviated as ITO) on the light extraction side of the light emitting element and a metal electrode of, for example, an alloy of magnesium and silver on the other side than the light extraction side of the light emitting element. Furthermore, in order to divide pixels of the light emitting element, an insulation layer called a pixel dividing layer is formed between the transparent electrode layer and the metal electrode layer. After forming the pixel dividing layer, a film of a light emitting material is formed by vapor deposition through a deposition mask to produce a light emitting layer in a region, which will act as a pixel region, where an opening is formed in the pixel dividing layer to expose the underlying layer which is either a transparent electrode or a metal electrode. The transparent electrode or the metal electrode is normally formed by sputtering, but in order to prevent disconnection of the transparent electrode or the metal electrode formed, the pixel dividing layer is required to have a small-tapered pattern shape.

An organic EL display contains a self-luminous element that emits light using energy generated from recombination of electrons injected from the cathode and holes injected from the anode. Therefore, if there exists a substance that inhibits the movement of the electrons or holes or a substance working to form an energy level that inhibits the recombination of the electrons and holes, the luminous efficiency of the light emitting element will deteriorate or the light emitting material will be deactivated, leading to a shortened life of the light emitting element. The pixel dividing layer is formed at a position neighboring to the light emitting element, and accordingly degassing from the pixel dividing layer or an outflow of ion components can cause a decrease in the life of the organic EL display. Therefore, the pixel dividing layer needs to have high heat resistance. Generally known photosensitive resin compositions having high heat resistance include negative type photosensitive resin compositions prepared by using highly heat resistant polysiloxane or a radical polymerizable compound having a highly heat resistant fluorene skeleton (see, for example, Patent document 1). The use of such a negative type photosensitive resin composition serves to produce a highly heat resistant pixel dividing layer having a small-tapered pattern.

An organic EL display contains a self-luminous element and accordingly, if outside light such as sunlight enters outdoors, the reflection of the outside light acts to reduce the visibility and contrast. Thus, a good technique is required to reduce the reflection of outside light.

A known technique to reduce the reflection of outside light by blocking outside light is the use of a photosensitive resin composition that contains an alkali-soluble polyimide and a coloring agent (see, for example, Patent document 2). This technique intends to reduce the reflection of outside light by forming a highly heat resistant, light-shielding pixel dividing layer from polyimide and a photosensitive resin composition containing a coloring agent such as pigment.

PRIOR ART DOCUMENTS

Patent Documents

Patent document 1: Japanese Unexamined Patent Publication (Kokai) No. 2014-197171
Patent document 2: International Publication WO 2016/158672

SUMMARY OF THE INVENTION

Problems to be Solved by the Invention

However, if a coloring agent such as pigment is added to a photosensitive resin composition to enhance light-shielding capability, the ultraviolet light etc. used for pattern exposure will also be blocked and the sensitivity during the light exposure step will decrease as the content of the coloring agent increases. Therefore, none of the conventionally known photosensitive resin compositions containing coloring agents have required characteristics to serve as a material for forming a pixel dividing layer of an organic EL display device. Specifically, they are inferior in terms of sensitivity, light shielding capability, or patternability for small-tapered shape.

If the light-shielding capability of the photosensitivity resin composition is improved, for example, the deep part of the film will fail to be cured sufficiently in the pattern exposure step and the deep part of the film will undergo side etching in the development step. This will lead to a backward-tapered shape to prevent the formation of a pattern having a small-tapered shape. To allow the deep part of the film to be cured sufficiently, the exposure energy in the pattern exposure step has to be increased to accelerate the UV curing. As the exposure energy increases, however, excessive crosslinking will occur in the film in the UV curing step and the reflow property will deteriorate in the heat curing step, leading to the formation of a large-tapered shape. As a result, in the case of a photosensitivity resin composition containing an alkali-soluble polyimide and a coloring agent such as pigment as described in Patent document 2, for example, there has been a problem of difficulty in allowing it to be simultaneously excellent in terms of sensitivity, light-shielding capability, and the formation of a pattern having a small-tapered shape.

Furthermore, if an attempt is made to form a pattern having a large-tapered shape after the development step and then convert it into a pattern having a small-tapered shape by causing reflow in the heat curing step, reflow will also occur undesirably along the edge of the pattern in the heat curing step. As a result, the width of the patterned opening after the heat curing step will be smaller than the width of the patterned opening after the development step, and this can lead to errors in the pixel designs etc. of display instruments such as organic EL displays. Furthermore, if a variation in the width of patterned openings is caused by reflow in the heat curing step, it can cause a decrease in the yield rate of panel production. Accordingly, this gives rise the problem of difficulty in simultaneous achievement of the formation of a pattern having a small-tapered shape and the reduction of the difference in the width of patterned openings between before and after the heat curing step.

Thus, the main object of the present invention is to provide a negative type photosensitive resin composition that is high in sensitivity, able to form pattern having a small-tapered shape after the development step and after the heat curing step, helpful to depress the difference in the width of patterned openings between before and after the heat curing step, and able to give a cured film having a high light-shielding capability.

Means of Solving the Problems

The negative type photosensitive resin composition according to the present invention is a negative type photosensitive resin composition including an alkali-soluble resin (A), a radical polymerizable compound (B), a photo initiator (C1), and a black colorant (Da);

the alkali-soluble resin (A) including a first resin (A1) containing one or more selected from the group consisting of polyimide (A1-1), polyimide precursor (A1-2), polybenzoxazole (A1-3), polybenzoxazole precursor (A1-4), and polysiloxane (A1-5); and the radical polymerizable compound (B) including one or more selected from the group consisting of a fluorene backbone-containing radical polymerizable compound (B1) and an indane backbone-containing radical polymerizable compound (B2).

Advantageous Effect of the Invention

The negative type photosensitive resin composition according to the present invention serves to provide a cured film that is high in sensitivity, able to form a pattern having a small-tapered shape after the development step and after the heat curing step, helpful to depress the difference in the width of patterned openings between before and after the heat curing step, and high in light-shielding capability.

DESCRIPTION OF PREFERRED EMBODIMENTS

Figure 1:
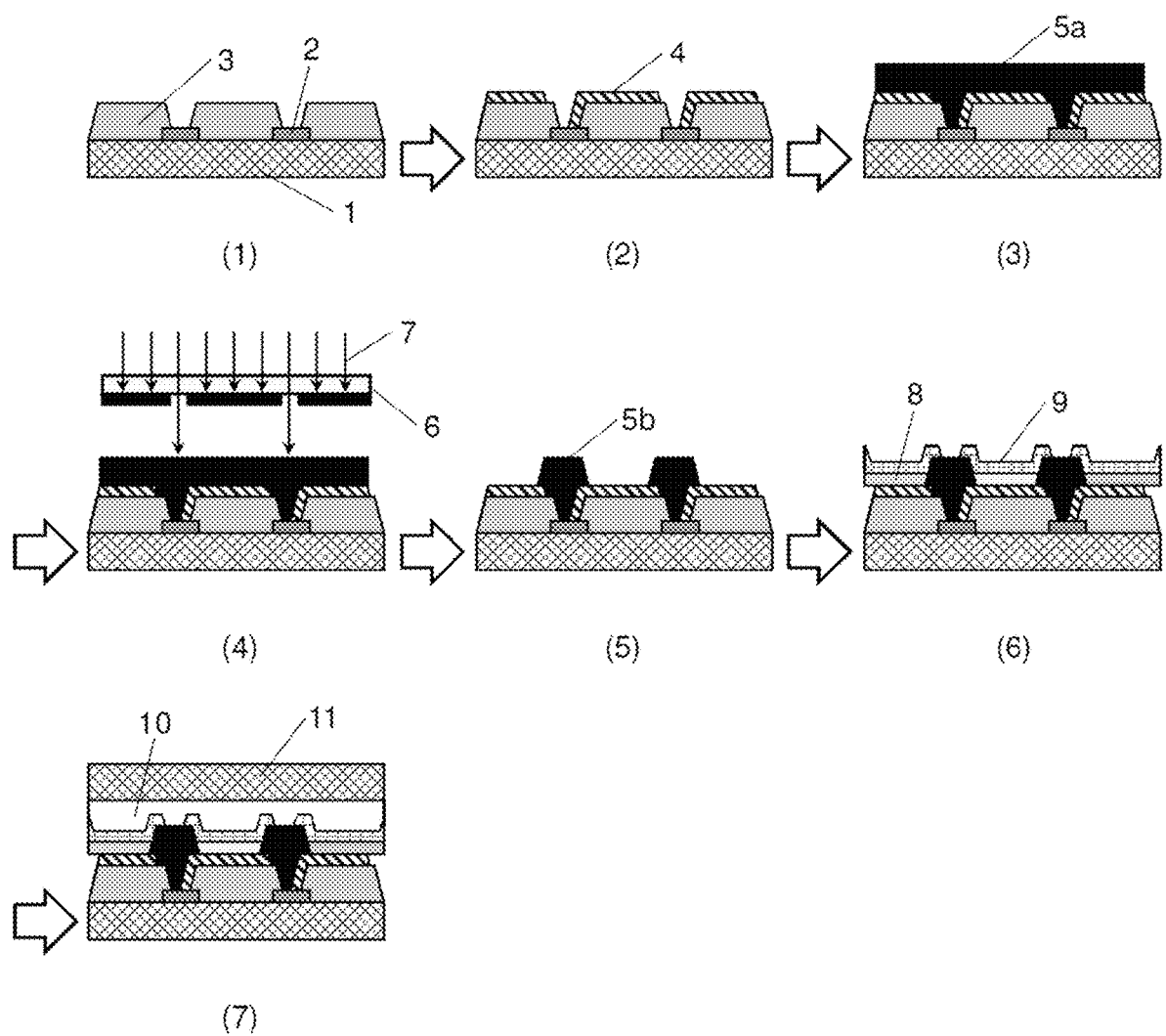
FIGS. 1 (1) to (7) show a flow chart illustrating schematic cross sections in a typical production process for an organic EL display device using a cured film of the negative type photosensitive resin composition according to the present invention.

The negative type photosensitive resin composition according to the present invention is a negative type photosensitive resin composition including an alkali-soluble resin (A), a radical polymerizable compound (B), a photo initiator (C1), and a black colorant (Da);

the alkali-soluble resin (A) including a first resin (A1) containing one or more selected from the group consisting of polyimide (A1-1), polyimide precursor (A1-2), polybenzoxazole (A1-3), polybenzoxazole precursor (A1-4), and polysiloxane (A1-5);

and the radical polymerizable compound (B) including one or more selected from the group consisting of a fluorene backbone-containing radical polymerizable compound (B1) and an indane backbone-containing radical polymerizable compound (B2).

<First Resin (A1)>

The negative type photosensitive resin composition according to the present invention contains at least a first resin (A1) as an alkali-soluble resin (A). As the first resin (A1), it contains one or more selected from the group consisting of polyimide (A1-1), polyimide precursor (A1-2), polybenzoxazole (A1-3), polybenzoxazole precursor (A1-4), and polysiloxane (A1-5).

For the present invention, the polyimide (A1-1), polyimide precursor (A1-2), polybenzoxazole (A1-3), polybenzoxazole precursor (A1-4), and polysiloxane (A1-5) may be either a single resin or a copolymer thereof.

<Polyimide (A1-1) and Polyimide Precursor (A1-2)>

Examples of the polyimide precursor (A1-2) include products of reaction between tetracarboxylic acid or a corresponding tetracarboxylic dianhydride, tetracarboxylic acid diester dichloride, or the like and a diamine or a corresponding diisocyanate compound, trimethyl-silylated diamine, or the like, which contain tetracarboxylic acid residue and/or derivative residue thereof and also contain a diamine and/or derivative residues thereof. Examples of the polyimide precursor (A1-2) include polyamide acid, polyamide acid ester, polyamide acid amide, and polyisoimide.

Examples of the polyimide (A1-1) include compounds formed by subjecting the aforementioned polyamide acid, polyamide acid ester, polyamide acid amide, or polyisoimide to dehydration and cyclization by heating or through a reaction using an acid or base, which contain a tetracarboxylic acid and/or derivative residues thereof and also contain a diamine residue and/or derivative residue thereof.

The polyimide precursor (A1-2) is a thermosetting resin that can be converted into a polyimide (A1-1) by heat-curing at a high temperature to cause dehydration and cyclization, thereby forming highly heat resistant imide bonds. Accordingly, the incorporation of a polyimide (A1-1), which contains highly heat resistant imide bonds, in the negative type photosensitive resin composition ensures the production of a cured film having a considerably improved heat resistance. Therefore, such a cured film is suited to applications that require high heat resistance. Furthermore, since the polyimide precursor (A1-2) is a resin that increases in heat resistance when dehydrated and cyclized, such a resin is preferred when a precursor having a structure with particular characteristics before dehydration and cyclization and forming a cured film with high heat resistance thereafter is desired.

In addition, the polyimide (A1-1) and polyimide precursor (A1-2) have an imide bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

From the viewpoint of obtaining a cured film having an improved heat resistance, it is preferable for the polyimide (A1-1) used for the present invention to contain a structural unit as represented by the general formula (1) given below.

[Chemical compound 1]

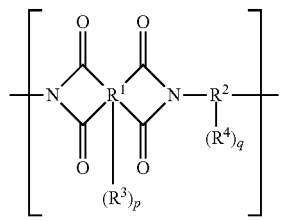

(1)

In general formula (1), $R^1$ is a tetravalent to decavalent organic group, and $R^2$ is a divalent to decavalent organic group. $R^3$ and $R_4$ are independently a phenolic hydroxyl group, a sulfonic acid group, a mercapto group, or a substituent group as represented by general formula (5) or general formula (6). Furthermore, p is an integer of 0 to 6 and q is an integer of 0 to 8.

In general formula (1), $R^1$ is a tetracarboxylic acid residue and/or a derivative residue thereof and $R^2$ is a diamine residue and/or a derivative residue thereof. Examples of such a tetracarboxylic acid derivative include tetracarboxylic dianhydride, tetracarboxylic dichloride, and tetracarboxylic acid active diester. Examples of such a diamine derivative include diisocyanate compounds and trimethyl-silylated diamine.

In general formula (1), $R^1$ is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. On the other hand, $R^2$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. Furthermore, q is preferably 1 to 8. The aforementioned aliphatic structures, alicyclic structures, and aromatic structures may each contain a heteroatom and may each be a non-substitution product or a substitution product.

[Chemical compound 2]

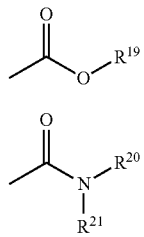

(5)

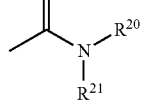

(6)

In general formulae (5) and (6), $R^{19}$ to $R^{21}$ each independently denote a hydrogen atom, an alkyl group containing 1 to 10 carbon atoms, an acyl group containing 2 to 6 carbon atoms, or an aryl group containing 6 to 15 carbon atoms. In general formulae (5) and (6), it is preferable that $R^{19}$ to $R^{21}$ each independently denote a hydrogen atom, an alkyl group containing 1 to 6 carbon atoms, an acyl group containing 2 to 4 carbon atoms, or an aryl group containing 6 to 10 carbon atoms. The above alkyl group, acyl group, and aryl group may each be either a non-substitution product or a substitution product.

It is preferable for the polyimide (A1-1) to contain a structural unit as represented by general formula (1) as primary component, and it is preferable for the structural units represented by general formula (1) to account for 50 to 100 mol %, more preferably 60 to 100 mol %, and still more preferably 70 to 100 mol %, of all structural units in the polyimide (A1-1). A content of 50 to 100 mol % ensures the production of a cured film having an improved heat resistance.

From the viewpoint of obtaining a cured film with an improved heat resistance and ensuring an improved resolution after the development step, it is preferable for the polyimide precursor (A1-2) used for the present invention to contain a structural unit as represented by the general formula (3) given below.

[Chemical compound 3]

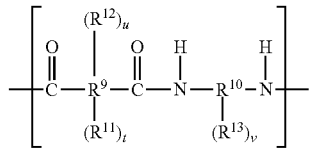

(3)

In general formula (3), $R^9$ is a tetravalent to decavalent organic group, and $R^{10}$ is a divalent to decavalent organic group. $R^{11}$ is a substituent group as represented by the general formula (5) or general formula (6) given above; $R^{12}$ is a phenolic hydroxyl group, a sulfonic acid group, or a mercapto group; and $R^{13}$ is a phenolic hydroxyl group, a sulfonic acid group, a mercapto group, or a substituent group as represented by the general formula (5) or general formula (6) given above. Furthermore, t is an integer of 2 to 8; u is an integer of 0 to 6; v is an integer of 0 to 8; and $2 \leq t+u \leq 8$.

In general formula (3), $R^9$ is a tetracarboxylic acid residue and/or a derivative residue thereof and $R^{10}$ is a diamine residue and/or a derivative residue thereof. Examples of such a tetracarboxylic acid derivative include tetracarboxylic acid dianhydride, tetracarboxylic acid dichloride, and tetracarboxylic acid active diester. Examples of such a diamine derivative include diisocyanate compounds and trimethyl-silylated diamine.

In general formula (3), $R^9$ is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. On the other hand, $R^{10}$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. Furthermore, v is preferably 1 to 8. The aforementioned aliphatic structures, alicyclic structures, and aromatic structures may each contain a heteroatom and may each be either a non-substitution product or a substitution product.

It is preferable for the polyimide precursor (A1-2) to contain a structural unit as represented by general formula (3) as primary component, and it is preferable for the structural units represented by general formula (3) to account for 50 to 100 mol %, more preferably 60 to 100 mol %, and still more preferably 70 to 100 mol %, of all structural units in the polyimide precursor (A1-2). A content of 50 to 100 mol % ensures an improved resolution.

<Polybenzoxazole (A1-3) and Polybenzoxazole Precursor (A1-4)>

Examples of the polybenzoxazole precursor (A1-4) include products of a reaction between dicarboxylic acid, or a corresponding dicarboxylic acid dichloride, dicarboxylic acid active diester, or the like and a diamine such as a bisaminophenol compound, which contain a dicarboxylic acid residue and/or a derivative residue thereof and also contain a bisaminophenol compound residue and/or a derivative residue thereof. Examples of the polybenzoxazole precursor (A1-4) include polyhydroxyamide.

Examples of the polybenzoxazole (A1-3) include compounds produced by dehydrating and cyclizing dicarboxylic acid and a bisaminophenol compound, used as diamine, through a reaction using polyphosphoric acid and those produced by dehydrating and cyclizing the aforementioned polyhydroxyamide by heating or through a reaction using phosphoric anhydride, a base, or a carbodiimide compound, which contain a dicarboxylic acid residue and/or a derivative residue thereof and also contain a bisaminophenol compound residue and/or a derivative residue thereof.

The polybenzoxazole precursor (A1-4) is a thermosetting resin that can be converted into a polybenzoxazole (A1-3) by heat-curing at a high temperature to cause dehydration and cyclization, thereby forming highly heat resistant rigid benzoxazole rings. Accordingly, the incorporation of polybenzoxazole (A1-3), which contains highly heat resistant rigid benzoxazole rings, in the negative type photosensitive resin composition ensures the production of a cured film having a considerably improved heat resistance. Therefore, such a cured film is suited to applications that require high heat resistance. Furthermore, since the polybenzoxazole precursor (A1-4) is a resin that increases in heat resistance when dehydrated and cyclized, such a resin is preferred when a precursor having a structure with particular characteristics before dehydration and cyclization and forming a cured film with high heat resistance thereafter is desired.

In addition, the polybenzoxazole (A1-3) and polybenzoxazole precursor (A1-4) have an oxazole bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

From the viewpoint of obtaining a cured film having an improved heat resistance, it is preferable for the polybenzoxazole (A1-3) used for the present invention to contain a structural unit as represented by general formula (2).

[Chemical compound 4]

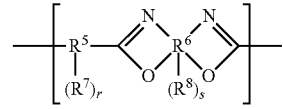

(2)

In general formula (2), $R^5$ is a divalent to decavalent organic group, and $R^6$ is a tetravalent to decavalent organic group having an aromatic structure. $R^7$ and $R^8$ are independently a phenolic hydroxyl group, a sulfonic acid group, a mercapto group, or a substituent group as represented by the general formula (5) or general formula (6) given above. Furthermore, r is an integer of 0 to 8 and s is an integer of 0 to 6.

In general formula (2), $R^5$ is a dicarboxylic acid residue and/or a derivative residue thereof and $R^6$ is a bisaminophenol compound residue and/or a derivative residue thereof. Examples of the dicarboxylic acid derivatives include dicarboxylic anhydride, dicarboxylic acid chloride, dicarboxylic acid active ester, tricarboxylic anhydride, tricarboxylic acid chloride, tricarboxylic acid active ester, and diformyl compounds.

In general formula (2), $R^5$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. On the other hand, $R_6$ is preferably a tetravalent to decavalent organic group having an aromatic structure containing 6 to 30 carbon atoms. Furthermore, s is preferably 1 to 8. The aforementioned aliphatic structures, alicyclic structures, and aromatic structures may each contain a heteroatom and may each be either a non-substitution product or a substitution product.

It is preferable for the polybenzoxazole (A1-3) to contain a structural unit as represented by general formula (2) as primary component, and it is preferable for the structural units represented by general formula (2) to account for 50 to 100 mol %, more preferably 60 to 100 mol %, and still more preferably 70 to 100 mol %, of all structural units in the polybenzoxazole (A1-3). A content of 50 to 100 mol % ensures the production of a cured film having an improved heat resistance.

From the viewpoint of obtaining a cured film with an improved heat resistance and ensuring an improved resolution after the development step, it is preferable for the polybenzoxazole precursor (A1-4) used for the present invention to contain a structural unit as represented by general formula (4).

[Chemical compound 5]

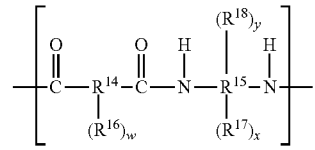

(4)

In general formula (4), $R^{14}$ is a divalent to decavalent organic group, and $R^{15}$ is a tetravalent to decavalent organic group having an aromatic structure. $R^{16}$ is a phenolic hydroxyl group, a sulfonic acid group, a mercapto group, or a substituent group as represented by the general formula (5) or general formula (6) given above; $R^{17}$ is a phenolic hydroxyl group; and $R^{18}$ is a sulfonic acid group, a mercapto group, or a substituent group as represented by the general formula (5) or general formula (6) given above. Furthermore, w is an integer of 0 to 8; x is an integer of 2 to 8; y is an integer of 0 to 6; and $2 \leq x+y \leq 8$.

In general formula (4), $R^{14}$ is a dicarboxylic acid residue and/or a derivative residue thereof and $R^{15}$ is a bisaminophenol compound residue and/or a derivative residue thereof. Examples of the dicarboxylic acid derivatives include dicarboxylic anhydride, dicarboxylic chloride, dicarboxylic acid active ester, tricarboxylic anhydride, tricarboxylic chloride, tricarboxylic acid active ester, and diformyl compounds.

In general formula (4), $R^{14}$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. On the other hand, $R^{15}$ is preferably a tetravalent to decavalent organic group having an aromatic structure containing 6 to 30 carbon atoms. The aforementioned aliphatic structures, alicyclic structures, and aromatic structures may each contain a heteroatom and may each be either a non-substitution product or a substitution product.

It is preferable for the polybenzoxazole precursor (A1-4) to contain a structural unit as represented by general formula (4) as primary component, and it is preferable for the structural units represented by general formula (4) to account for 50 to 100 mol %, more preferably 60 to 100 mol %, and still more preferably 70 to 100 mol %, of all structural units in the polybenzoxazole precursor (A1-4). A content of 50 to 100 mol % ensures an improved resolution.

<Tetracarboxylic Acid, Dicarboxylic Acid, and Derivatives Thereof>

Examples of the tetracarboxylic acid include aromatic tetracarboxylic acid, alicyclic tetracarboxylic acid, and aliphatic tetracarboxylic acid. These tetracarboxylic acids may contain a heteroatom in addition to the oxygen atoms in the carboxyl group.

Examples of the aromatic tetracarboxylic acid and derivatives thereof include 1,2,4,5-benzenetetracarboxylic acid (pyromellitic acid), 3,3',4,4'-biphenyltetracarboxylic acid, 1,2,5,6-naphthalenetetracarboxylic acid, 3,3',4,4'-benzophenonetetracarboxylic acid, 2,2-bis(3,4-dicarboxyphenyl) propane, 2,2-bis(3,4-dicarboxyphenyl) hexafluoropropane, bis (3,4-dicarboxyphenyl) sulfone, bis(3,4-dicarboxyphenyl) ether, 2,3,5,6-pyridinetetracarboxylic acid, 3,4,9,10-perylenetetracarboxylic acid, and N,N'-bis[5,5'-hexafluoropropane-2,2-diyl-bis(2-hydroxyphenyl)] bis(3,4-dicarboxybenzoic acid amide), as well as tetracarboxylic dianhydrides thereof, tetracarboxylic dichlorides thereof, and tetracarboxylic acid active diesters thereof.

Examples of the alicyclic tetracarboxylic acid and derivatives thereof include bicyclo[2.2.2]octane-7-ene-2,3,5,6-tetracarboxylic acid, 1,2,4,5-cyclohexanetetracarboxylic acid, 1,2,3,4-cyclobutanetetracarboxylic acid, and 2,3,4,5-tetrahydrofurantetracarboxylic acid, as well as tetracarboxylic dianhydrides thereof, tetracarboxylic dichlorides thereof, and tetracarboxylic acid active diesters thereof.

Examples of the aliphatic tetracarboxylic acid and derivatives thereof include butane-1,2,3,4-tetracarboxylic acid, tetracarboxylic dianhydrides thereof, tetracarboxylic dichlorides thereof, and tetracarboxylic acid active diesters thereof.

A tricarboxylic acid and/or a derivative thereof may be used as the dicarboxylic acid and a derivative thereof in the polybenzoxazole (A1-3) and polybenzoxazole precursor (A1-4).

Examples of the dicarboxylic acid and the tricarboxylic acid include aromatic dicarboxylic acid, aromatic tricarboxylic acid, alicyclic dicarboxylic acid, alicyclic tricarboxylic acid, aliphatic dicarboxylic acid, and aliphatic tricarboxylic acid. These dicarboxylic acids and tricarboxylic acids may contain a non-oxygen heteroatom in addition to the oxygen atoms in the carboxyl group.

Examples of the aromatic dicarboxylic acid and derivative thereof include 4,4'-dicarboxybiphenyl, 2,2'-bis(trifluoromethyl)-4,4'-dicarboxybiphenyl, 4,4'-benzophenonedicarboxylic acid, 2,2-bis(4-carboxyphenyl) hexafluoropropane, 2,2-bis(3-carboxyphenyl) hexafluoropropane, and 4,4'-dicarboxydiphenyl ether, as well as dicarboxylic anhydrides thereof, dicarboxylic chlorides thereof, dicarboxylic acid active esters thereof, and diformyl compounds thereof.

Examples of the aromatic tricarboxylic acid and derivative thereof include 1,2,4-benzenetricarboxylic acid, 1,3,5-benzenetricarboxylic acid, 2,4,5-benzophenonetricarboxylic acid, 2,4,4'-biphenyltricarboxylic acid, and 3,3',4'-tricarboxydiphenyl ether, as well as tricarboxylic anhydrides thereof, tricarboxylic chlorides thereof, tricarboxylic acid active esters thereof, and diformyl monocarboxylic acids thereof.

Examples of the alicyclic dicarboxylic acid and derivative thereof include tetrahydrophthalic acid, 3-methyltetrahydrophthalic acid, 4-methylhexahydrophthalic acid, 1,4-cyclohexanedicarboxylic acid, and 1,2-cyclohexanedicarboxylic acid, as well as dicarboxylic anhydrides thereof, dicarboxylic chlorides thereof, dicarboxylic acid active esters thereof, and diformyl compounds thereof.

Examples of the alicyclic tricarboxylic acid and derivative thereof include 1,2,4-cyclohexanetricarboxylic acid and 1,3, 5-cyclohexanetricarboxylic acid, as well as tricarboxylic anhydrides thereof, tricarboxylic chlorides thereof, tricarboxylic acid active esters thereof, and diformyl monocarboxylic acids thereof.

Examples of the aliphatic dicarboxylic acid and derivative thereof include itaconic acid, maleic acid, fumaric acid, malonic acid, succinic acid, and hexane-1,6-dicarboxylic acid, as well as dicarboxylic anhydrides thereof, dicarboxylic chlorides thereof, dicarboxylic acid active esters thereof, and diformyl compounds thereof.

Examples of the aliphatic tricarboxylic acid and derivative thereof include hexane-1,3,6-tricarboxylic acid and propane-1,2,3-tricarboxylic acid, as well as tricarboxylic anhydrides thereof, tricarboxylic chlorides thereof, tricarboxylic acid active esters thereof, and diformyl monocarboxylic acids thereof.

<Diamine and Derivative Thereof>

Examples of diamines and derivatives thereof include aromatic diamine, bisaminophenol compounds, alicyclic diamine, alicyclic dihydroxydiamine, aliphatic diamine, and aliphatic dihydroxydiamine. These diamines and derivatives thereof may contain a heteroatom in addition to the nitrogen atoms and oxygen atoms in the amino groups or derivatives thereof.

Examples of the aromatic diamine, bisaminophenol compounds, and derivatives thereof include p-phenylene diamine, 1,4-bis(4-aminophenoxy) benzene, 2,2'-dimethyl-4,4'-diaminobiphenyl, 2,2'-bis(trifluoromethyl)-4,4'-diaminobiphenyl, 3,3'-diamino-4,4'-biphenol, 1,5-naphthalene diamine, 9,9-bis(3-amino-4-hydroxyphenyl) fluorene, 2,2-bis(3-amino-4-hydroxyphenyl) propane, 2,2-bis(3-amino-4-hydroxyphenyl) hexafluoropropane, bis(3-amino-4-hydroxyphenyl) sulfone, 4,4'-diaminodiphenyl sulfide, bis(3-amino-4-hydroxyphenyl) ether, 3-sulfonic 4,4'-diaminodiphenyl ether, dimercaptophenylene diamine, and N,N'-bis[5,5'-hexafluoropropane-2,2-diyl-bis(2-hydroxyphenyl)] bis(3-aminobenzoic acid amide), as well as diisocyanate compounds thereof and trimethyl-silylated diamines thereof.

Examples of the alicyclic diamines, alicyclic dihydroxydiamines, and derivatives thereof include 1,4-cyclohexane diamine, bis(4-aminocyclohexyl) methane, 3,6-dihydroxy-1,2-cyclohexane diamine, and bis(3-hydroxy-4-aminocyclohexyl) methane, as well as diisocyanate compounds thereof and trimethyl-silylated diamines.

Examples of the aliphatic diamines, aliphatic dihydroxydiamines, and derivatives thereof include 1,6-hexamethylene diamine and 2,5-dihydroxy-1,6-hexamethylene diamine, as well as diisocyanate compounds thereof and trimethyl-silylated diamines.

<Structural Unit Containing Fluorine Atom>

It is preferable for one or more selected from the group consisting of the polyimide (A1-1), polyimide precursor (A1-2), polybenzoxazole (A1-3), and polybenzoxazole precursor (A1-4) to contain a structural unit having a fluorine atom.

The incorporation of a structural unit having a fluorine atom in one or more selected from the polyimide (A1-1), polyimide precursor (A1-2), polybenzoxazole (A1-3), and polybenzoxazole precursor (A1-4) ensures an improved transparency and an improved sensitivity in the light exposure step. It also works to allow the film surface to have water repellency and depress the infiltration through the film surface in the alkali development step. The light exposure referred to here means the application of active actinic ray (radiation), such as the application of, for example, visible light, ultraviolet ray, electron beam, or X-ray. In view of generally used light sources, it is preferable to use an ultra-high pressure mercury lamp type light source that emits visible light, ultraviolet ray, etc., more preferably a light source that emits j-line (wavelength 313 nm), i-line (wavelength 365 nm), h-line (wavelength 405 nm), or g-line (wavelength 436 nm). Hereinafter, the term exposure means the application of active actinic ray (radiation).

In general, when the polyimide (A1-1), polyimide precursor (A1-2), polybenzoxazole (A1-3), or polybenzoxazole precursor (A1-4) is adopted, it is necessary to use a high polarity solvent such as N-methyl-2-pyrrolidone, dimethyl sulfoxide, N,N-dimethyl formamide, and γ-butyrolactone, as the solvent described later. However, if a pigment (D1) in particular is added as the coloring agent (D) which will be described later, these high polarity solvents interact strongly with the pigment (D1), possibly deteriorating the dispersion stability improving effect of the first resin (A1), second resin (A2) which will be described later, and the dispersant (E) which will be described later.

The incorporation of a structural unit having a fluorine atom in one or more selected from the polyimide (A1-1), polyimide precursor (A1-2), polybenzoxazole (A1-3), and polybenzoxazole precursor (A1-4) ensures an improved solubility in the solvent. Accordingly, this makes it possible to decrease the content of the aforementioned high polarity solvent or dissolve these resins without using a high polarity solvent, thereby serving to improve the dispersion stability of the pigment (D1).

Examples of such a structural unit having a fluorine atom contained in a polyimide (A1-1) and/or polyimide precursor (A1-2) include a structural unit derived from a tetracarboxylic acid having a fluorine atom and/or a derivative thereof, and a structural unit derived from a diamine having a fluorine atom and/or a derivative thereof.

Examples of such a structural unit having a fluorine atom contained in a polybenzoxazole (A1-3) and/or polybenzoxazole precursor (A1-4) include a structural unit derived from a dicarboxylic acid having a fluorine atom and/or a derivative thereof, and a structural unit derived from a bisaminophenol compound having a fluorine atom and/or a derivative thereof.

It is preferable for the structural unit having a fluorine atom in one or more selected from the group consisting of the polyimide (A1-1), polyimide precursor (A1-2), polybenzoxazole (A1-3), and polybenzoxazole precursor (A1-4) to account for 30 to 100 mol % of all structural units. On the other hand, the structural unit having a fluorine atom more preferably accounts for 50 mol % or more, still more preferably 70 mol % or more. A content of 30 to 100 mol % ensures an improved sensitivity in the light exposure step.

In the aforementioned one or more resins selected from the group consisting of the polyimide (A1-1), polyimide precursor (A1-2), polybenzoxazole (A1-3), and polybenzoxazole precursor (A1-4), those structural units derived from one or more selected from the group consisting of tetracarboxylic acid having a fluorine atom, tetracarboxylic acid derivative having a fluorine atom, dicarboxylic acid having a fluorine atom, and dicarboxylic acid derivative having a fluorine atom preferably account for 30 to 100 mol % of all structural units derived from carboxylic acid or derivatives thereof. The structural units having a fluorine atom more preferably accounts for 50 mol % or more, still more preferably 70 mol % or more. A content of 30 to 100 mol % ensures an improved sensitivity in the light exposure step.

In the aforementioned one or more resins selected from the group consisting of the polyimide (A1-1), polyimide precursor (A1-2), polybenzoxazole (A1-3), and polybenzoxazole precursor (A1-4), those structural units derived from one or more selected from the group consisting of diamine having a fluorine atom, diamine derivative having a fluorine atom, bisaminophenol compound having a fluorine atom, and bisaminophenol compound derivative having a fluorine atom preferably account for 30 to 100 mol % of all structural units derived from amine or derivatives thereof. The structural units having a fluorine atom more preferably accounts for 50 mol % or more, still more preferably 70 mol % or more. A content of 30 to 100 mol % ensures an improved sensitivity in the light exposure step.

<Structural Unit Derived from Aromatic Carboxylic Acid or Derivative Thereof>

The polyimide (A1-1) and/or polyimide precursor (A1-2) preferably contain a structural unit derived from aromatic carboxylic acid and/or a derivative thereof. If the polyimide (A1-1) and/or polyimide precursor (A1-2) contain a structural unit derived from aromatic carboxylic acid and/or a derivative thereof, the heat resistance of the aromatic group serves to produce a cured film with an improved heat resistance. The aromatic carboxylic acid and a derivative thereof are preferably aromatic tetracarboxylic acid and/or a derivative thereof.

It is preferable for the structural units derived from aromatic carboxyl acid and/or derivatives thereof to account for 50 to 100 mol %, more preferably 60 to 100 mol %, and still more preferably 70 to 100 mol %, of all structural units derived from carboxylic acid or derivatives thereof in the polyimide (A1-1) and/or polyimide precursor (A1-2). A content of 50 to 100 mol % ensures the production of a cured film having an improved heat resistance.

The polybenzoxazole (A1-3) and/or polybenzoxazole precursor (A1-4) preferably contain a structural unit derived from aromatic carboxylic acid and/or a derivative thereof. If the polybenzoxazole (A1-3) and/or polybenzoxazole precursor (A1-4) contains a structural unit derived from aromatic carboxylic acid and/or a derivative thereof, the heat resistance of the aromatic group serves to produce a cured film with an improved heat resistance. The aromatic carboxylic acid and/or a derivative thereof is preferably aromatic dicarboxylic acid or aromatic tricarboxylic acid and/or a derivative thereof, of which aromatic dicarboxylic acid and/or a derivative thereof are more preferable.

It is preferable for the structural units derived from aromatic carboxyl acid and/or derivatives thereof to account for 50 to 100 mol %, more preferably 60 to 100 mol %, and still more preferably 70 to 100 mol %, of all structural units derived from carboxylic acid or derivatives thereof in the polybenzoxazole (A1-3) and/or polybenzoxazole precursor (A1-4). A content of 50 to 100 mol % ensures the production of a cured film having an improved heat resistance.

<Structural Unit Derived from Aromatic Amine or Derivative Thereof>

It is preferable for the aforementioned one or more selected from the group consisting of the polyimide (A1-1), polyimide precursor (A1-2), polybenzoxazole (A1-3), and polybenzoxazole precursor (A1-4) to contain a structural unit derived from aromatic amine and/or a derivative thereof. If one or more selected from the polyimide (A1-1), polyimide precursor (A1-2), polybenzoxazole (A1-3), and polybenzoxazole precursor (A1-4) contain a structural unit derived from aromatic amine and/or a derivative thereof, the heat resistance of the aromatic group serves to produce a cured film with an improved heat resistance. The aromatic amine or a derivative thereof is preferably aromatic diamine, bisaminophenol compound, aromatic triamine, or tris-aminophenol compound, and/or a derivative thereof, of which aromatic diamine or bisaminophenol compound and/or a derivative thereof are more preferable.

It is preferable for the structural units derived from aromatic amines and/or derivatives thereof to account for 50 to 100 mol %, more preferably 60 to 100 mol %, and still more preferably 70 to 100 mol %, of all structural units derived from amines or derivatives thereof in the aforementioned one or more resins selected from the group consisting of the polyimide (A1-1), polyimide precursor (A1-2), polybenzoxazole (A1-3), and polybenzoxazole precursor (A1-4). A content of 50 to 100 mol % ensures the production of a cured film having an improved heat resistance.

<Structural Unit Derived from Diamine Having Silyl Group or Siloxane Bond or Derivative Thereof>

It is preferable for the aforementioned one or more selected from the group consisting of the polyimide (A1-1), polyimide precursor (A1-2), polybenzoxazole (A1-3), and polybenzoxazole precursor (A1-4) to contain a structural unit derived from diamine having a silyl group or a siloxane bond and/or a derivative thereof. If one or more selected from the polyimide (A1-1), polyimide precursor (A1-2), polybenzoxazole (A1-3), and polybenzoxazole precursor (A1-4) contain a structural unit derived from diamine having a silyl group or a siloxane bond and/or a derivative thereof, it leads to increased interaction at the interface between the cured film of the negative type photosensitive resin composition and the underlying substrate, and the cured film will have an improved adhesion to the underlying substrate and a high chemical resistance.

<Structural Unit Derived from Amine Having Oxyalkylene Structure and Derivative Thereof>

It is preferable for the aforementioned one or more selected from the group consisting of the polyimide (A1-1), polyimide precursor (A1-2), polybenzoxazole (A1-3), and polybenzoxazole precursor (A1-4) to contain a structural unit derived from amine having an oxyalkylene structure and/or a derivative thereof. If one or more selected from the polyimide (A1-1), polyimide precursor (A1-2), polybenzoxazole (A1-3), and polybenzoxazole precursor (A1-4) contain a structural unit derived from an amine having an oxyalkylene structure and/or a derivative thereof, it will be possible to form a cured film having a small-tapered pattern shape and allow the cured film to have improved mechanical characteristics and improved patternability with an alkaline developer.

<End-Capping Agent>

One or more selected from the polyimide (A1-1), polyimide precursor (A1-2), polybenzoxazole (A1-3), and polybenzoxazole precursor (A1-4) may have a chain end capped with an end-capping agent such as monoamine, dicarboxylic anhydride, monocarboxylic acid, monocarboxylic chloride, or monocarboxylic acid active ester. If the resin of one or more selected from the polyimide (A1-1), polyimide precursor (A1-2), polybenzoxazole (A1-3), and polybenzoxazole precursor (A1-4) has a chain end capped with an end-capping agent, a coating liquid of the resin composition containing them will have improved storage stability.

The content of the structural units derived from various carboxylic acids, amines, or derivatives thereof in the polyimide (A1-1), polyimide precursor (A1-2), polybenzoxazole (A1-3), or polybenzoxazole precursor (A1-4) can be determined by a combination of $^1$H-NMR, $^{13}$C-NMR, $^{15}$N-NMR, IR, TOF-MS, elementary analysis, ash content measurement, and the like.

<Introduction of Ethylenically Unsaturated Double Bond Group>

It is preferable for one or more selected from the group consisting of the polyimide (A1-1), polyimide precursor (A1-2), polybenzoxazole (A1-3), and polybenzoxazole precursor (A1-4) to contain an ethylenically unsaturated double bond group. It is also preferable to perform an ethylenically unsaturated double bond group introducing reaction that is designed to introduce an ethylenically unsaturated double bond group into side chains of the resin. The incorporation of an ethylenically unsaturated double bond group allows a pattern having a small-tapered shape to be formed after the development step. In addition, in the stepped region of the cured film, the stepped shape can be maintained in the heat curing step by controlling the reflow property, thereby leading to improved halftone characteristics.

It is preferable that part of the phenolic hydroxyl groups and/or the carboxyl groups in the aforementioned one or more selected from the group consisting of the polyimide (A1-1), polyimide precursor (A1-2), polybenzoxazole (A1-3), and polybenzoxazole precursor (A1-4) are reacted with ethylenically unsaturated double bond groups. The reaction described above allows ethylenically unsaturated double bond groups to be introduced into side chains of the resin.

From the viewpoint of reactivity, such a compound having an ethylenically unsaturated double bond group is preferably an electrophilic compound having an ethylenically unsaturated double bond group. Examples of the electrophilic compound include isocyanate compounds, isothiocyanate compounds, epoxy compounds, aldehyde compounds, thioaldehyde compounds, ketone compounds, thioketone compounds, acetate compounds, carboxylic chlorides, carboxylic anhydrides, carboxylic acid active ester compounds, carboxylic acid compounds, alkyl halide compounds, alkyl azide compounds, alkyl triflate compounds, alkyl mesylate compounds, alkyl tosylate compounds, and alkyl cyanide compounds, of which isocyanate compounds, epoxy compound, aldehyde compounds, ketone compounds, and carboxylic anhydrides are preferable, and isocyanate compounds and epoxy compounds are more preferable, from the viewpoint of reactivity and applicability of the compounds.

It is preferable for one or more selected from the group consisting of the polyimide (A1-1), polyimide precursor (A1-2), polybenzoxazole (A1-3), and polybenzoxazole precursor (A1-4) to contain, as the ethylenically unsaturated double bond group, one or more groups selected from the group consisting of the groups represented by general formula (63), the groups represented by general formula (64), the groups represented by general formula (65), the groups represented by general formula (66), and the groups represented by general formula (67).

[Chemial compound 6]

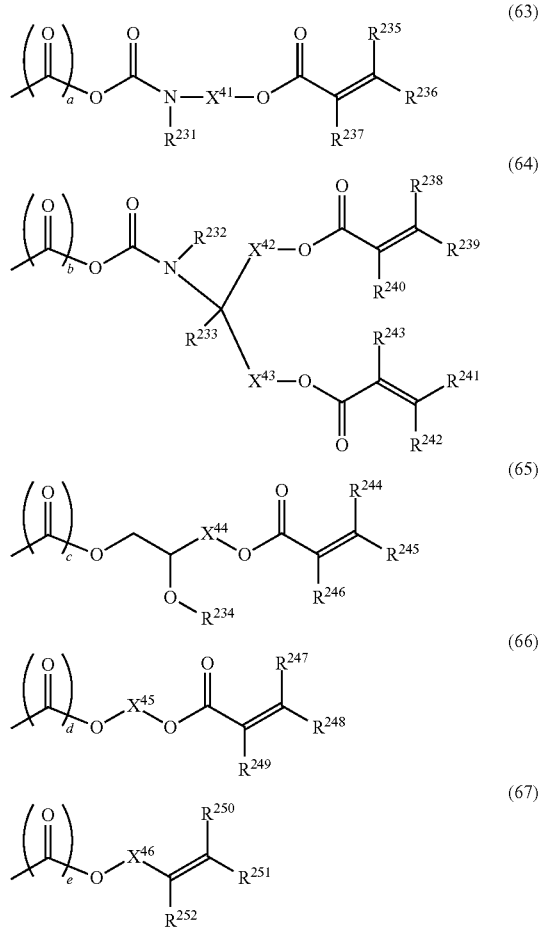

In general formulae (63), (64), (65), (66), and (67), $X^{41}$ to $X^{45}$ are each independently an alkylene chain containing 1 to 10 carbon atoms, a cycloalkylene chain containing 4 to 10 carbon atoms, or an arylene chain containing 6 to 15 carbon atoms. $X^{46}$ is a direct bond or an alkylene chain containing 1 to 10 carbon atoms. $R^{231}$ to $R^{252}$ are each independently a hydrogen atom, an alkyl group containing 1 to 10 carbon atoms, or an aryl group containing 6 to 15 carbon atoms. Furthermore, a, b, c, d, and e are each independently 0 or 1. In general formulae (63), (64), (65), (66), and (67), $R^{237}$, $R^{240}$, $R^{243}$, $R^{246}$, $R^{249}$, and $R^{252}$ are preferably each independently a hydrogen atom or an alkyl group containing 1 to 4 carbon atoms, more preferably a hydrogen atom or a methyl group. $R^{235}$, $R^{236}$, $R^{238}$, $R^{239}$, $R^{241}$, $R^{242}$, $R^{244}$, $R^{245}$, $R^{247}$, $R^{248}$, $R^{250}$, and $R^{251}$ are preferably each independently a hydrogen atom or an alkyl group containing 1 to 4 carbon atoms, more preferably a hydrogen atom. The above alkylene chains, cycloalkylene chains, arylene chains, alkyl groups, and aryl groups may each be either a non-substitution product or a substitution product.

It is preferable for the one or more resins selected from the group consisting of the polyimide (A1-1), polyimide precursor (A1-2), polybenzoxazole (A1-3), and polybenzoxazole precursor (A1-4) to have a double bond equivalent of 250 g/mol or more, more preferably 300 g/mol or more, and still more preferably 350 g/mol or more. A double bond equivalent in the above range ensures improved halftone characteristics and improved adhesion to the underlying substrate. On the other hand, it is preferable for the one or more resins selected from the group consisting of the polyimide (A1-1), polyimide precursor (A1-2), polybenzoxazole (A1-3), and polybenzoxazole precursor (A1-4) to have a double bond equivalent of 5,000 g/mol or less, more preferably 2,000 g/mol or less, and still more preferably 1,500 g/mol or less. A double bond equivalent in the above range ensures improved sensitivity in the light exposure step.

The double bond equivalent referred to herein is the mass of a resin per mole of ethylenically unsaturated double bond groups and expressed in g/mol. A value of double bond equivalent serves to calculate the number of ethylenically unsaturated double bond groups in the resin. The double bond equivalent can be calculated from the iodine value. The iodine value referred to herein is the quantity of halogen, calculated as iodine, that reacts with 100 g of the resin and expressed in gI/100 g. After reacting 100 g of the resin with iodine monochloride, the unreacted iodine is captured with an aqueous potassium iodide solution and the iodine value is determined by titrating the unreacted iodine with an aqueous sodium thiosulfate solution.

<Physical Properties of Polyimide (A1-1), Polyimide Precursor (A1-2), Polybenzoxazole (A1-3), and/or Polybenzoxazole Precursor (A1-4)>

For the one or more resins selected from the group consisting of the polyimide (A1-1), polyimide precursor (A1-2), polybenzoxazole (A1-3), and/or polybenzoxazole precursor (A1-4), the number of repetitions n of structural units is preferably 5 or more, more preferably 10 or more, still more preferably 15 or more. If the number of repetitions is 5 or more, it ensures an improved resolution after the development step. On the other hand, the number of repetitions n is preferably 1,000 or less, more preferably 500 or less, and still more preferably 100 or less. If the number of repetitions n is 1,000 or less, it ensures an improved leveling property in the coating step and an improved patternability with an alkaline developer.

For the one or more resins selected from the group consisting of the polyimide (A1-1), polyimide precursor (A1-2), polybenzoxazole (A1-3), and/or polybenzoxazole precursor (A1-4), the polystyrene-based weight average molecular weight (hereinafter Mw) as determined by gel permeation chromatography (hereinafter GPC) is preferably 1,000 or more, more preferably 3,000 or more, and still more preferably 5,000 or more. If the Mw is 1,000 or more, it ensures an improved resolution after the development step. On the other hand, the Mw is preferably 500,000 or less, more preferably 300,000 or less, and still more preferably 100,000 or less. If the Mw is 500,000 or less, it ensures an improved leveling property in the coating step and an improved patternability with an alkaline developer.

The number average molecular weight (hereinafter Mn), which herein is the polystyrene-based value determined by GPC, is preferably 1,000 or more, more preferably 3,000 or more, and still more preferably 5,000 or more. If the Mn is 1,000 or more, it ensures an improved resolution after the development step. On the other hand, the Mn is preferably 500,000 or less, more preferably 300,000 or less, and still more preferably 100,000 or less. If the Mn is 500,000 or less, it ensures an improved leveling property in the coating step and an improved patternability with an alkaline developer.

The Mw and Mn of the polyimide (A1-1), polyimide precursor (A1-2), polybenzoxazole (A1-3) and polybenzoxazole precursor (A1-4) can be easily determined as polystyrene-based values by GPC, light scattering, X-ray small angle scattering, or the like. For the polyimide (A1-1), polyimide precursor (A1-2), polybenzoxazole (A1-3) and polybenzoxazole precursor (A1-4), the number of repetitions n of structural units can be determined from the following relation: n=Mw/M where M is the molecular weight of the structural unit and Mw is the weight average molecular weight of the resin.

For the one or more resins selected from the group consisting of the polyimide (A1-1), polyimide precursor (A1-2), polybenzoxazole (A1-3), and polybenzoxazole precursor (A1-4), the alkali dissolution rate is preferably 50 nm/min or more, more preferably 70 nm/min or more, and still more preferably 100 nm/min or more. An alkali dissolution rate of 50 nm/min or more ensures an improved resolution after the development step. On the other hand, the alkali dissolution rate is preferably 12,000 nm/min or less, more preferably 10,000 nm/min or less, and still more preferably 8,000 nm/min or less. An alkali dissolution rate of 12,000 nm/min or less ensures a decreased film loss in the alkali development step.

The alkali dissolution rate referred to herein means the decrease in film thickness that occurs in the following process: a solution prepared by dissolving a resin sample in γ-butyrolactone is spread over a Si wafer and prebaked at 120° C. for 4 minutes to form a prebaked film with a film thickness of 10 μm±0.5 μm, followed by immersing the prebaked film in a 2.38 mass % aqueous solution of tetramethyl ammonium hydroxide at 23±1° C. for 60 seconds and rinsing it with water for 30 seconds.

The polyimide (A1-1) and the polyimide precursor (A1-2) can be synthesized by generally known methods. Examples include a method in which a tetracarboxylic dianhydride is reacted with diamine (partly substituted by a monoamine as end-capping agent) at 80° C. to 200° C. in a polar solvent such as N-methyl-2-pyrrolidone and a method in which a tetracarboxylic dianhydride (partly substituted by dicarboxylic anhydride, monocarboxylic acid, monocarboxylic chloride, or monocarboxylic acid active ester as end-capping agent) is reacted with diamine at 80° C. to 200° C.

The polybenzoxazole (A1-3) and the polybenzoxazole precursor (A1-4) can be synthesized by generally known methods. Examples include a method in which a dicarboxylic acid active diester is reacted with a bisaminophenol compound (partly substituted by monoamine as end-capping agent) at 80° C. to 250° C. in a polar solvent such as N-methyl-2-pyrrolidone and a method in which a dicarboxylic acid active diester (partly substituted by dicarboxylic anhydride, monocarboxylic acid, monocarboxylic chloride, or monocarboxylic acid active ester as end-capping agent) is reacted with bisaminophenol compound at 80° C. to 250° C.

For the polyimide (A1-1) and the polyimide precursor (A1-2), the imide ring closure rate (degree of imidization) can be determined easily by, for example, the method described below. First, the infrared absorption spectrum of the resin is examined to confirm the existence of absorption peaks attributed to the imide bond in the polyimide structure (near 1,780 cm$^{-1}$ and 1,377 cm$^{-1}$). Then, the resin is heat-cured at 350° C. for 1 hour, followed by examining its infrared absorption spectrum. The peak strength near 1,780 cm$^{-1}$ or 1,377 cm$^{-1}$ is measured and compared with that measured before the heat-curing step to determine the quantity of the imide bonds existing in the resin before the heat-curing step, followed by converting it into the degree of imidization.

For the polybenzoxazole (A1-3) and polybenzoxazole precursor (A1-4), the oxazole ring closure rate (degree of oxazole formation) can be determined easily by, for example, the method described below. First, the infrared absorption spectrum of the resin is examined to confirm the existence of absorption peaks attributed to the oxazole bond in the polybenzoxazole structure (near 1,574 cm$^{-1}$ and 1,557 cm$^{-1}$). Then, the resin is heat-cured at 350° C. for 1 hour, followed by examining its infrared absorption spectrum. The peak strength near 1,574 cm$^{-1}$ or 1,557 cm$^{-1}$ is measured and compared with that measured before the heat-curing step to determine the quantity of the oxazole bonds existing in the resin before the heat-curing step, followed by converting it into the degree of oxazole formation.

<Polysiloxane (A1-5)>

Examples of the polysiloxane (A1-5) used for the present invention include those polysiloxanes produced by hydrolyzing one or more selected from the group consisting of trifunctional organosilanes, tetrafunctional organosilanes, difunctional organosilanes, and monofunctional organosilanes, followed by dehydration and condensation.

The polysiloxane (A1-5) is a thermosetting resin, and a highly heat resistant siloxane bond (Si—O) is formed when it is heat-cured at a high temperature to cause dehydration and condensation. Accordingly, the incorporation of the polysiloxane (A1-5), which contains highly heat resistant siloxane bonds, in the negative type photosensitive resin composition ensures the production of a cured film having an improved heat resistance. Furthermore, since the resin increases in heat resistance when dehydrated and condensed, the resin is preferred when a resin having particular characteristics before dehydration and condensation and forming a cured film with high heat resistance thereafter is desired.

Furthermore, the polysiloxane (A1-5) has a silanol group to act as a reactive group. Accordingly, if a pigment (D1) in particular is added as the coloring agent (D) which will be described later, the silanol group will be able to interact with and/or bond to the surface of the pigment (D1) and also able to interact with and/or bond to the surface-modifying group of the pigment (D1). Accordingly, this serves to improve the dispersion stability of the pigment (D1).

<Trifunctional Organosilane Unit, Tetrafunctional Organosilane Unit, Difunctional Organosilane Unit, and Monofunctional Organosilane Unit>

From the viewpoint of obtaining a cured film with an improved heat resistance and ensuring an improved resolution after the development step, it is preferable for the polysiloxane (A1-5) used for the present invention to contain a trifunctional organosilane unit and/or a tetrafunctional organosilane unit. The trifunctional organosilane unit is preferably an organosilane unit as represented by general formula (7). The tetrafunctional organosilane unit is preferably an organosilane unit as represented by general formula (8).

The polysiloxane (A1-5) used for the present invention may contain a difunctional organosilane unit from the viewpoint of obtaining a pattern shape with a smaller taper and a cured film with improved mechanical characteristics. The difunctional organosilane unit is preferably an organosilane unit as represented by general formula (9).

The polysiloxane (A1-5) used for the present invention may contain a monofunctional organosilane unit from the viewpoint of allowing the resin composition to give a coating liquid having an improved storage stability. The monofunctional organosilane unit is preferably an organosilane unit as represented by general formula (10).

[Chemical compound 7]

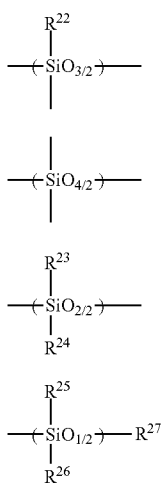

In general formulae (7) to (10), $R^{22}$ to $R^{27}$ are each independently a hydrogen atom, an alkyl group, a cycloalkyl group, an alkenyl group, or an aryl group. In general formulae (7) to (10), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms. The above alkyl group, cycloalkyl group, alkenyl group, and aryl group may each have a heteroatom, and may each be either a non-substitution product or a substitution product.

Organosilanes having organosilane units as represented by general formula (7) include, for example, trifunctional organosilanes such as methyl trimethoxysilane, methyl triethoxysilane, n-propyl trimethoxysilane, cyclohexyl trimethoxysilane, 3-glycidoxypropyl trimethoxysilane, 2-(3,4-epoxycyclohexyl) ethyl trimethoxysilane, 3-[(3-ethyl-3-oxetanyl)methoxy] propyl trimethoxysilane, 3-aminopropyl trimethoxysilane, N-phenyl-3-aminopropyl trimethoxysilane, 3-(4-aminophenyl) propyl trimethoxysilane, 1-(3-trimethoxysilylpropyl) urea, 3-triethoxysilyl-N-(1,3-dimethylbutylidene) propyl amine, 3-mercaptopropyl trimethoxysilane, 3-isocyanate propyl triethoxysilane, 1,3,5-tris-(3-trimethoxysilylpropyl) isocyanuric acid, N-t-butyl-2-(3-trimethoxysilylpropyl) succinimide, and N-t-butyl-2-(3-triethoxysilylpropyl) succinimide.

In the polysiloxane (A1-5), organosilane units as represented by general formula (7) preferably account for 50 to 100 mol %, more preferably 60 to 100 mol %, and still more preferably 70 to 100 mol %, in terms of the molar ratio of Si atoms. A content of 50 to 100 mol % ensures the production of a cured film having an improved heat resistance.

Organosilanes having organosilane units as represented by general formula (8) include, for example, tetrafunctional organosilanes such as tetramethoxy silane, tetraethoxy silane, and tetra-n-propoxy silane, and silicate compounds such as Methyl Silicate 51 (manufactured by Fuso Chemical Co., Ltd.), M-silicate 51 (manufactured by Tama Chemicals Co., Ltd.), and Methyl Silicate 51 (manufactured by Colcoat Co., Ltd.).

In the polysiloxane (A1-5), organosilane units as represented by general formula (8) preferably account for 0 to 40 mol %, more preferably 0 to 30 mol %, and still more preferably 0 to 20 mol %, in terms of the molar ratio of Si atoms. A content of 0 to 40 mol % ensures the production of a cured film with an improved heat resistance and an improved resolution after the development step.

Organosilanes having organosilane units as represented by general formula (9) include, for example, difunctional organosilanes such as dimethyl dimethoxysilane, dimethyl diethoxysilane, diethyl dimethoxysilane, diphenyl dimethoxysilane, 1,1,3,3-tetramethyl-1,3-dimethoxy disiloxane, and 1,1,3,3-tetraethyl-1,3-dimethoxy disiloxane.

In the polysiloxane (A1-5), organosilane units as represented by general formula (9) preferably account for 0 to 60 mol %, more preferably 0 to 50 mol %, and still more preferably 0 to 40 mol %, in terms of the molar ratio of Si atoms. A content of 0 to 60 mol % ensures the production of a cured film with an improved heat resistance and an improved resolution after the development step.

Organosilanes having organosilane units as represented by general formula (10) include, for example, monofunctional organosilanes such as trimethyl methoxysilane, trimethyl ethoxysilane, tri-n-propyl methoxysilane, (3-glycidoxypropyl)dimethyl methoxysilane, and (3-glycidoxypropyl)dimethyl ethoxysilane.

In the polysiloxane (A1-5), organosilane units as represented by general formula (10) preferably account for 0 to 20 mol %, more preferably 0 to 10 mol %, and still more preferably 0 to 5 mol %, in terms of the molar ratio of Si atoms. A content of 0 to 20 mol % ensures the production of a cured film having an improved heat resistance.

Examples of the polysiloxane (A1-5) used for the present invention include those polysiloxanes (A1-5) produced by hydrolyzing one or more selected from the group consisting of organosilanes as represented by general formula (7a), organosilanes as represented by general formula (8a), organosilanes as represented by general formula (9a), and organosilanes as represented by general formula (10a), followed by dehydration and condensation.

[Chemical compound 8]

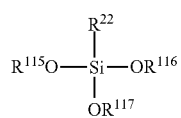

-continued

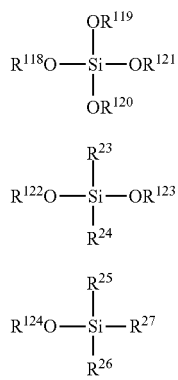

In general formulae (7a) to (10a), $R^{22}$ to $R^{27}$ are each independently a hydrogen atom, an alkyl group, a cycloalkyl group, an alkenyl group, or an aryl group, and $R^{115}$ to $R^{124}$ are each independently a hydrogen atom, an alkyl group, an acyl group, or an aryl group. In general formulae (7a) to (10a), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms. Furthermore, it is preferable that $R^{115}$ to $R^{124}$ are each independently a hydrogen atom, an alkyl group having 1 to 6 carbon atoms, an acyl group having 2 to 6 carbon atoms, or an aryl group having 6 to 15 carbon atoms. The above alkyl group, cycloalkyl group, alkenyl group, aryl group, and acyl group may each have a heteroatom, and may each be either a substitution product or a non-substitution product.

In the polysiloxane (A1-5), organosilane units as represented by general formula (7), organosilane units as represented by general formula (8), organosilane units as represented by general formula (9), and organosilane units as represented by general formula (10) may be arrayed either regularly or irregularly. A regular array is formed by, for example, alternating copolymerization, periodic copolymerization, block copolymerization, or graft copolymerization. An irregular array is formed by, for example, random copolymerization.

In the polysiloxane (A1-5), furthermore, organosilane units as represented by general formula (7), organosilane units as represented by general formula (8), organosilane units as represented by general formula (9), and organosilane units as represented by general formula (10) may be arrayed either two-dimensionally or three-dimensionally. A two-dimensional array is formed by, for example, linear chains. A three-dimensional array is formed by, for example, ladder-like, cage-like, or network-like chains.

<Organosilane Unit Having Aromatic Group>

The polysiloxane (A1-5) used for the present invention preferably contains an organosilane unit having an aromatic group. Such a polysiloxane (A1-5) is preferably one obtained by using an organosilane containing an aromatic group as the organosilane containing an organosilane unit as represented by general formula (7), general formula (9), or general formula (10). If the polysiloxane (A1-5) contains an organosilane unit having an aromatic group, the heat resistance of the aromatic group serves to produce a cured film with an improved heat resistance.

If a pigment (D1) in particular is added as the coloring agent (D) which will be described later, and if in that case the polysiloxane (A1-5) contains an organosilane unit having an aromatic group, the steric hindrance of the aromatic group serves to improve the dispersion stability of the pigment (D1). If the pigment (D1) is an organic pigment (D1-1), the aromatic group in the polysiloxane (A1-5) interacts with the aromatic group in the organic pigment (D1-1), thereby serving to improve the dispersion stability of the organic pigment (D1-1).

In the polysiloxane (A1-5), organosilane units having aromatic groups preferably account for 5 mol % or more, more preferably 10 mol % or more, and still more preferably 15 mol % or more, in terms of the molar ratio of Si atoms. A content of 5 mol % or more ensures the production of a cured film having an improved heat resistance. On the other hand, the content is preferably 80 mol % or less, more preferably 75 mol % or less, and still more preferably 70 mol % or less. A content of 80 mol % or less ensures an improved patternability with an alkaline developer. In particular, it is preferable that the molar ratio of Si atoms attributed to organosilane units having aromatic groups as represented by general formula (7), general formula (9), or general formula (10) is 5 mol % or more and 80 mol % or less.

<Organosilane Unit Having Ethylenically Unsaturated Double Bond Group>

The polysiloxane (A1-5) used for the present invention preferably contains an organosilane unit having an ethylenically unsaturated double bond group. Such a polysiloxane (A1-5) is preferably one obtained by using an organosilane having an ethylenically unsaturated double bond group as the organosilane containing an organosilane unit as represented by general formula (7), general formula (9), or general formula (10). The use of a polysiloxane (A1-5) containing an organosilane unit having an ethylenically unsaturated double bond group ensures accelerated UV curing to improve the sensitivity in the light exposure step.

When using an organosilane that contains an organosilane unit as represented by general formula (7), general formula (9), or general formula (10) and having an ethylenically unsaturated double bond group, the polysiloxane (A1-5) preferably has a double bond equivalent of 150 g/mol or more, more preferably 200 g/mol or more, and still more preferably 250 g/mol or more. A double bond equivalent of 150 g/mol or more ensures improved adhesion to the underlying substrate and also ensures the formation of a pattern having a small-tapered shape after the development step. On the other hand, the polysiloxane (A1-5) preferably has a double bond equivalent of 10,000 g/mol or less, more preferably 5,000 g/mol or less, and still more preferably 2,000 g/mol or less. A double bond equivalent of 10,000 g/mol or less ensures improved sensitivity in the light exposure step. In particular, it is preferable that the double bond equivalent attributed to the organosilane unit represented by general formula (7), general formula (9), or general formula (10) and having an ethylenically unsaturated double bond group in the polysiloxane (A1-5) is 150 g/mol or more and 10,000 g/mol or less.

<Organosilane Unit Having Acidic Group>

The polysiloxane (A1-5) used for the present invention preferably contains an organosilane unit having an acidic group. Such a polysiloxane (A1-5) is preferably one obtained by using an organosilane containing an acidic group as the aforementioned organosilane containing an organosilane unit represented by general formula (7), general formula (9), or general formula (10). If the polysiloxane (A1-5) contains an organosilane unit having an acidic group, it ensures an improved patternability with an alkaline developer and an improved resolution after the development step.

The acidic group is preferably one that shows an acidity of less than pH 6. Examples of such an acidic group that shows an acidity of less than pH 6 include carboxyl group, carboxylic anhydride group, sulfonic acid group, phenolic hydroxyl group, hydroxyimide group, and silanol group. From the viewpoint of ensuring an improved patternability with an alkaline developer and an improved resolution after the development step, the carboxylic group, carboxylic anhydride group, phenolic hydroxyl group, and hydroxyimide group are preferable, of which the carboxyl group and carboxylic anhydride group are more preferable.

When using an organosilane that contains an organosilane unit as represented by general formula (7), general formula (9), or general formula (10) and having an acidic group, the polysiloxane (A1-5) preferably has an acid equivalent of 280 g/mol or more, more preferably 300 g/mol or more, and still more preferably 400 g/mol or more. An acid equivalent of 280 g/mol or more ensures a decreased film loss in the alkali development step. On the other hand, the acid equivalent is preferably 1,400 g/mol or less, more preferably 1,100 g/mol or less, and still more preferably 950 g/mol or less. An acid equivalent of 1,400 g/mol or less ensures an improved patternability with an alkali developer and an improved resolution after the development step. In particular, it is preferable that the acid equivalent attributed to the organosilane unit represented by general formula (7), general formula (9), or general formula (10) and having an acidic group in the polysiloxane (A1-5) is 280 g/mol or more and 1,400 g/mol or less. From the viewpoint of ensuring an improved patternability in an alkaline developer and an improved resolution after the development step, the acid equivalent is preferably the carboxylic acid equivalent.

The acid equivalent referred to herein is the weight of a resin per mole of an acidic group and expressed in g/mol. The acid equivalent serves to calculate the number of acidic groups in the resin. The acid equivalent can be calculated from the acid value.

The acid value referred to herein is the weight of potassium hydroxide that reacts with 1 g of the resin and expressed in mgKOH/g. It can be determined by titrating 1 g of the resin with an aqueous potassium hydroxide solution.

The contents of various organosilane units in a polysiloxane (A1-5) can be determined by a combination of methods such as $^1$H-NMR, $^{13}$C-NMR, $^{29}$Si-NMR, IR, TOF-MS, elementary analysis, and ash content measurement.

<Physical Properties of Polysiloxane (A1-5)>

The polysiloxane (A1-5) used for the present invention preferably has a polystyrene based Mw of 500 or more, more preferably 700 or more, and still more preferably 1,000 or more, as determined by GPC. If the Mw is 500 or more, it ensures an improved resolution after the development step. On the other hand, the Mw is preferably 100,000 or less, more preferably 50,000 or less, and still more preferably 20,000 or less. If the Mw is 100,000 or less, it ensures an improved leveling property in the coating step and an improved patternability with an alkaline developer.

Polysiloxane (A1-5) can be synthesized by a generally known method. For example, a good method is to hydrolyze an organosilane in a reaction solvent, followed by dehydration and condensation. To carry out hydrolysis, dehydration, and condensation of an organosilane, a reaction solvent, water, and a catalyst (if required) are added, for example, to a mixture containing the organosilane, followed by heating while stirring at 50° C. to 150° C., preferably 90° C. to 130° C., for about 0.5 to 100 hours. During the heating and stirring, hydrolysis by-products (alcohols such as methanol) and condensation by-products (water) may be evaporated by distillation if necessary.

<Second Resin (A2)>

The negative type photosensitive resin composition according to the present invention preferably contains a second resin (A2) as an alkali-soluble resin (A). It is preferable for the second resin (A2) to include one or more selected from the group consisting of a polycyclic side chain-containing resin (A2-1), acid-modified epoxy resin (A2-2), and acrylic resin (A2-3).

For the present invention, the polycyclic side chain-containing resin (A2-1), acid-modified epoxy resin (A2-2), and acrylic resin (A2-3) may be either a single resin or a copolymer thereof.

<Polycyclic Side Chain-Containing Resin (A2-1)>

Examples of the polycyclic side chain-containing resin (A2-1) used for the present invention include (I) a polycyclic side chain-containing resin obtained through a reaction of a phenol compound, a carboxylic anhydride, and an epoxy compound, (II) a polycyclic side chain-containing resin obtained through a reaction of an epoxy compound, a carboxylic acid compound, and epoxy compound, and (III) a polycyclic side chain-containing resin obtained through a reaction of an epoxy compound, a carboxylic acid compound, and carboxylic anhydride.

The polycyclic side chain-containing resin (A2-1) is a thermosetting resin having a structure in which a backbone chain and a bulky side chain are connected through one atom and the bulky side chain has a ring structure such as fluorene ring which is highly heat resistant and rigid. Accordingly, if the negative type photosensitive resin composition to use contains a polycyclic side chain-containing resin (A2-1) having a ring structure such as fluorene ring which is highly heat resistant and rigid, it ensures the production of a cured film having an improved heat resistance. Therefore, such a cured film is suited to applications that require heat resistance.

The polycyclic side chain-containing resin (A2-1) used for the present invention preferably has an ethylenically unsaturated double bond group. If the negative type photosensitive resin composition contains a polycyclic side chain-containing resin (A2-1) having an ethylenically unsaturated double bond group, it ensures an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and ensuring the production of a cured film having improved mechanical characteristics. Therefore, such a cured film is suited to applications that require good mechanical characteristics.

From the viewpoint of producing a cured film with an improved heat resistance, the polycyclic side chain-containing resin (A2-1) used for the present invention preferably contains one or more selected from the group consisting of a structural unit as represented by general formula (47), a structural unit as represented by general formula (48), a structural unit as represented by general formula (49), and a structural unit as represented by general formula (50). Furthermore, from the viewpoint of ensuring an improved sensitivity in the light exposure step and producing a cured film having improved mechanical characteristics, it is preferable for the polycyclic side chain-containing resin (A2-1) used for the present invention to contain an ethylenically unsaturated double bond group at one or more positions selected from the backbone chain, side chain, and chain end.

[Chemical compound 9]

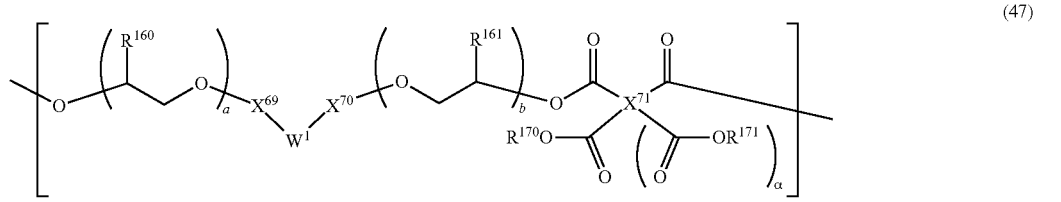

(47)

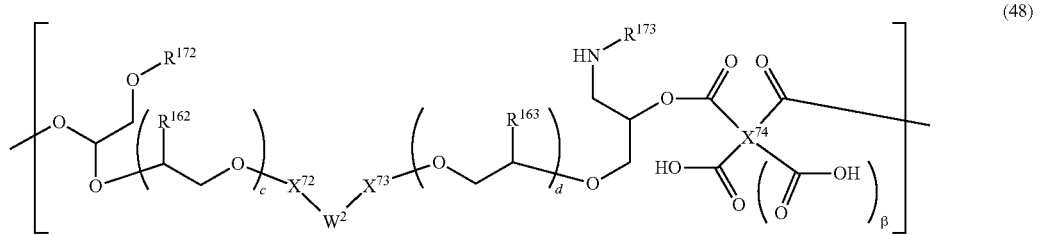

(48)

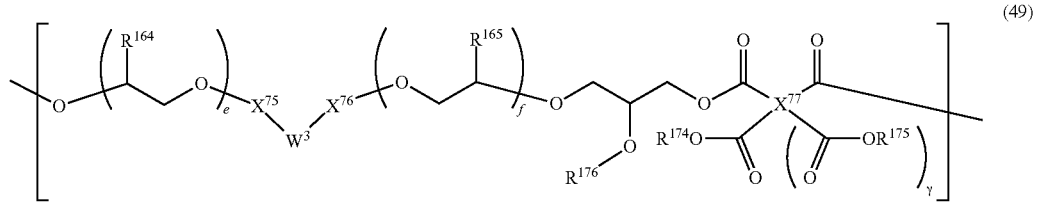

(49)

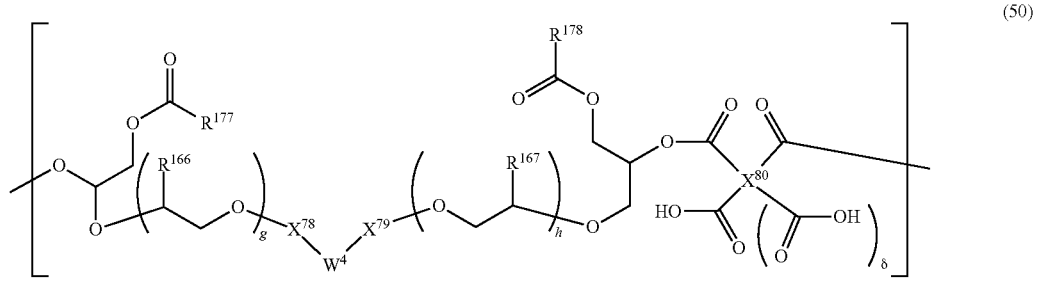

(50)

In general formulae (47) to (50), $X^{69}$, $X^{70}$, $X^{72}$, $X^{73}$, $X^{75}$, $X^{76}$, $X^{78}$, and $X^{79}$ are each independently a monocyclic or fused polycyclic hydrocarbon ring. $X^{71}$, $X^{74}$, $X^{77}$, and $X^{80}$ are each independently a carboxylic acid residue and/or a derivative residue thereof in the form of a divalent to decavalent organic group. $W^1$ to $W^4$ are each independently an organic group having two or more aromatic groups. $R^{160}$ to $R^{167}$ are each independently a hydrogen atom or an alkyl group containing 1 to 6 carbon atoms, and $R^{170}$ to $R^{175}$, $R^{177}$, and $R^{178}$ are each independently a hydrogen atom or an organic group having an ethylenically unsaturated double bond group. $R^{176}$ is a hydrogen atom or an alkyl group containing 1 to 10 carbon atoms. Furthermore, a, b, c, d, e, f, g, and h are each independently an integer of 0 to 10, and α, β, γ, and δ are each independently an integer of 0 or 1.

In general formulae (47) to (50), $X^{69}$, $X^{70}$, $X^{72}$, $X^{73}$, $X^{75}$, $X^{76}$, $X^{78}$, and $X^{79}$ are preferably each independently a monocyclic or a fused polycyclic divalent to decavalent hydrocarbon ring containing 6 to 15 carbon atoms. On the other hand, $X^{71}$, $X^{74}$, $X^{77}$, and $X^{89}$ are preferably each independently a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms. Furthermore, it is preferable that $W^1$ to $W^4$ are preferably each independently a substituent group as represented by any of general formulae (51) to (56). Furthermore, it is preferable that $R^{179}$ to $R^{176}$, $R^{177}$, and $R^{178}$ are each independently a substituent group as represented by general formula (57). The above organic groups each having an alkyl group, aliphatic structure, alicyclic structure, aromatic structure, monocyclic, or fused polycyclic aromatic hydrocarbon ring, or ethylenically unsaturated double bond group may have heteroatoms and may each be either a non-substitution product or a substitution product.

[Chemical compound 10]

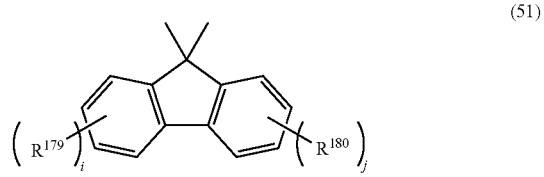

(51)

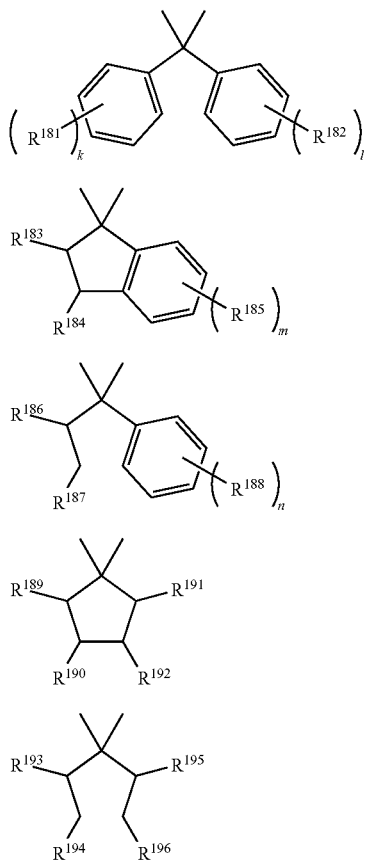

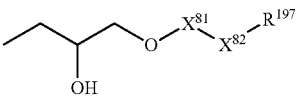

[Chemical compound 11]

(57)

In general formula (57), $X^{81}$ is a direct bond, an alkylene chain containing 1 to 10 carbon atoms, a cycloalkylene chain containing 4 to 10 carbon atoms, or an arylene chain containing 6 to 15 carbon atoms, and $X^{82}$ is a direct bond or an arylene chain containing 6 to 15 carbon atoms. $R^{197}$ is a vinyl group, an aryl group, or a (meth)acrylic group. In general formula (57), $X^{81}$ is preferably a direct bond, an alkylene chain containing 1 to 6 carbon atoms, a cycloalkylene chain containing 4 to 7 carbon atoms, or an arylene chain containing 6 to 10 carbon atoms. Furthermore, $X^{82}$ is preferably a direct bond or an arylene chain containing 6 to 10 carbon atoms. The above alkylene chain, cycloalkylene chain, arylene chain, vinyl group, aryl group, and (meth) acrylic group may each be either a non-substitution product or a substitution product.

<Synthesis Method for Polycyclic Side Chain-Containing Resin (A2-1)>

The polycyclic side chain-containing resin (A2-1) used for the present invention is preferably a polycyclic side chain-containing aromatic resin (A2-1) produced by one or more synthesis methods selected from (I) to (IV) described below.

Polycyclic side chain-containing resin (A2-1) (I): This category includes polycyclic side chain-containing resins (A2-1) that can be produced by reacting a compound containing two or more aromatic groups and a hydroxyl group in the molecule with a polyfunctional active carboxylic acid derivative (one or more selected from tetracarboxylic dianhydride, dicarboxylic dichloride, and dicarboxylic acid active diester) to prepare a resin and then subjecting it to a ring-opening addition reaction with an unsaturated compound containing an ethylenically unsaturated double bond group and an epoxy group. The polyfunctional active carboxylic acid derivative is preferably a tetracarboxylic dianhydride. In addition to the polyfunctional active carboxylic acid derivative, the reaction components may also contain a tricarboxylic anhydride, dicarboxylic anhydride, monocarboxylic chloride, or monocarboxylic acid active ester as end-capping agents.

Polycyclic side chain-containing resin (A2-1) (II): This category includes polycyclic side chain-containing resins (A2-1) that can be produced by subjecting a compound containing two or more aromatic groups and a hydroxyl group in the molecule together with an unsaturated compound containing an ethylenically unsaturated double bond group and an epoxy group to a ring-opening addition reaction to prepare a resin and then reacting it with a polyfunctional active carboxylic derivative (one or more selected from tetracarboxylic dianhydride, dicarboxylic dichloride, and dicarboxylic acid active diester). The polyfunctional active carboxylic acid derivative is preferably a tetracarboxylic dianhydride. In addition to the polyfunctional active carboxylic acid derivative, the reaction components may also contain a tricarboxylic anhydride, dicarboxylic anhydride, monocarboxylic chloride, or monocarboxylic acid active ester as end-capping agents.

Polycyclic side chain-containing resin (A2-1) (III): This category includes polycyclic side chain-containing resins In general formulae (51) to (56), $R^{179}$ to $R^{182}$, $R^{185}$, and $R^{188}$ are each independently an alkyl group containing 1 to 10 carbon atoms. $R^{183}$, $R^{184}$, $R^{186}$, $R^{187}$, $R^{189}$, $R^{191}$, and $R^{193}$ to $R^{196}$ are each independently a hydrogen atom, an alkyl group containing 1 to 10 carbon atoms, a cycloalkyl group containing 4 to 10 carbon atoms, or an aryl group containing 6 to 15 carbon atoms. $R^{190}$ and $R^{192}$ are each independently a hydrogen atom, an alkyl group containing 1 to 10 carbon atoms, a cycloalkyl group containing 4 to 10 carbon atoms, or an aryl group containing 6 to 15 carbon atoms, and $R^{190}$ and $R^{192}$ may together form a ring. The ring formed by $R^{190}$ and $R^{192}$ is, for example, a benzene ring or a cyclohexane ring. At least either $R^{183}$ or $R^{184}$ is an aryl group containing 6 to 15 carbon atoms. At least either $R^{186}$ or $R^{187}$ is an aryl group containing 6 to 15 carbon atoms. At least either $R^{189}$ or $R^{190}$ is an aryl group containing 6 to 15 carbon atoms, and at least either $R^{191}$ or $R^{192}$ is an aryl group containing 6 to 15 carbon atoms. $R^{190}$ and $R^{192}$ may together form a ring. At least either $R^{193}$ or $R^{194}$ is an aryl group containing 6 to 15 carbon atoms, and at least either $R^{195}$ or $R^{196}$ is an aryl group containing 6 to 15 carbon atoms. Furthermore, i, j, k, l, m, and n are each independently an integer of 0 to 4. In general formulae (51) to (56), it is preferable that $R^{190}$ and $R^{192}$ are each independently a hydrogen atom, an alkyl group containing 1 to 6 carbon atoms, a cycloalkyl group containing 4 to 7 carbon atoms, or an aryl group containing 6 to 10 carbon atoms, and also preferable that the ring formed by $R^{190}$ and $R^{192}$ is a benzene ring. The above alkyl group, cycloalkyl group, and aryl group may each be either a non-substitution product or a substitution product.

(A2-1) that can be produced by subjecting a compound containing two or more aromatic groups and an epoxy group in the molecule together with a polyfunctional carboxylic acid (one or more selected from tetracarboxylic acid, tricarboxylic acid, and dicarboxylic acid) to a ring-opening addition reaction to prepare a resin and then subjecting it to a ring-opening addition reaction with an unsaturated compound containing an ethylenically unsaturated double bond group and an epoxy group. The polyfunctional carboxylic acid is preferably a tetracarboxylic acid or a tricarboxylic acid. In addition to the polyfunctional carboxylic acid, the reaction components may also contain a monocarboxylic acid as an end-capping agent.

Polycyclic side chain-containing resin (A2-1) (IV): This category includes polycyclic side chain-containing resins (A2-1) that can be produced by subjecting a compound containing two or more aromatic groups and an epoxy group in the molecule together with an unsaturated carboxylic acid containing an ethylenically unsaturated double bond group to a ring-opening addition reaction to prepare a resin and then reacting it with a polyfunctional active carboxylic derivative (one or more selected from tetracarboxylic dianhydride, dicarboxylic dichloride, and dicarboxylic acid active diester). The polyfunctional active carboxylic acid derivative is preferably a tetracarboxylic dianhydride. In addition to the polyfunctional active carboxylic acid derivative, the reaction components may also contain a tricarboxylic anhydride, dicarboxylic anhydride, monocarboxylic chloride, or monocarboxylic acid active ester as end-capping agents.

<Structural Units Derived from One or More Selected from Tetracarboxylic Acid Having Aromatic Group Carboxylic Acid and Derivative Thereof, Tetracarboxylic Dianhydride Having Aromatic Group, Tricarboxylic Acid Having Aromatic Group, and Dicarboxylic Acid Having Aromatic Group>

The polycyclic side chain-containing resin (A2-1) used for the present invention preferably contains a structural unit derived from an aromatic group carboxylic acid or a derivative thereof. If the polycyclic side chain-containing resin (A2-1) contain a structural unit derived from an aromatic group carboxylic acid or a derivative thereof, the heat resistance of the aromatic group serves to produce a cured film having an improved heat resistance. The aromatic group carboxylic acid or derivative thereof is preferably one or more selected from tetracarboxylic acid having an aromatic group, tetracarboxylic dianhydride having an aromatic group, tricarboxylic acid having an aromatic group, and dicarboxylic acid having an aromatic group.

If a pigment (D1) in particular is added as the coloring agent (D) which will be described later, and if in that case the polycyclic side chain-containing resin (A2-1) contains a structural unit derived from an aromatic carboxylic acid or a derivative thereof, the steric hindrance of the aromatic group serves to improve the dispersion stability of the pigment (D1). If the pigment (D1) is an organic pigment (D1-1), the aromatic group in the polycyclic side chain-containing resin (A2-1) interacts with the aromatic group in the organic pigment (D1-1), thereby serving to improve the dispersion stability of the organic pigment (D1-1).

Examples of the aromatic group carboxylic acid or derivatives thereof include the aforementioned compounds such as aromatic tetracarboxylic acids and/or derivatives thereof, aromatic tricarboxylic acids and/or derivatives thereof, and aromatic dicarboxylic acids and/or derivatives thereof.

It is preferable for the structural units derived from aromatic carboxylic acids and/or derivatives thereof to account for 10 to 100 mol %, more preferably 20 to 100 mol %, and still more preferably 30 to 100 mol %, of all structural units derived from tetracarboxylic acids, dicarboxylic acids, or derivatives thereof in the polycyclic side chain-containing resin (A2-1). A content of 10 to 100 mol % ensures the production of a cured film having an improved heat resistance.

<Acidic Group Derived from Carboxylic Acid or Derivative Thereof>

The polycyclic side chain-containing resin (A2-1) used for the present invention preferably contains a structural unit derived from a carboxylic acid or a derivative thereof, and the polycyclic side chain-containing resin (A2-1) has an acidic group. If the polycyclic side chain-containing resin (A2-1) contains an acidic group, it ensures an improved patternability with an alkaline developer and an improved resolution after the development step.

The acidic group is preferably one that shows an acidity of less than pH 6. Examples of such an acidic group that shows an acidity of less than pH 6 include carboxyl group, carboxylic anhydride group, sulfonic acid group, phenolic hydroxyl group, and hydroxyimide group. From the viewpoint of ensuring an improved patternability in an alkaline developer and an improved resolution after the development step, the carboxylic group, carboxylic acid anhydride group, and phenolic hydroxyl group are preferable, and the carboxyl group and carboxylic anhydride group are more preferable.

The polycyclic side chain-containing resin (A2-1) used for the present invention preferably has an acid equivalent of 280 g/mol or more, more preferably 300 g/mol or more, and still more preferably 400 g/mol or more. An acid equivalent of 280 g/mol or more ensures a decreased film loss in the alkali development step. On the other hand, the acid equivalent is preferably 1,400 g/mol or less, more preferably 1,100 g/mol or less, and still more preferably 950 g/mol or less. An acid equivalent of 1,400 g/mol or less ensures an improved patternability with an alkali developer and an improved resolution after the development step. From the viewpoint of ensuring an improved patternability with an alkaline developer and an improved resolution after the development step, the acid equivalent is preferably the carboxylic acid equivalent.

The contents of the structural units derived from various monomer components in a polycyclic side chain-containing resin (A2-1) can be determined by a combination of methods such as $^1$H-NMR, $^{13}$C-NMR, $^{29}$Si-NMR, IR, TOF-MS, elementary analysis, and ash content measurement.

<Specific Examples of Polycyclic Side Chain-Containing Resin (A2-1)>

Examples of the polycyclic side chain-containing resin (A2-1) used for the present invention include ADEKA ARKLS (registered trademark) WR-101 and WR-301 (both manufactured by Adeka Corporation), OGSOL (registered trademark) CR-1030, CR-TR1, CR-TR2, CR-TR3, CR-TR4, CR-TR5, CR-TR6, CR-TR7, CR-TR8, CR-TR9 and CR-TR10 (all manufactured by Osaka Gas Chemicals Co., Ltd.), and TR-B201 and TR-B202 (both manufactured by TRONLY).

<Physical Properties of Polycyclic Side Chain-Containing Resin (A2-1)>

The polycyclic side chain-containing resin (A2-1) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate and also ensures the formation of a pattern having a small-tapered shape after the development step. On the other hand, the double bond equivalent of the polycyclic side chain-containing resin (A2-1) is preferably 10,000 g/mol or less, more preferably 5,000 g/mol or less, and still more preferably 2,000 g/mol or less. If the polycyclic side chain-containing resin (A2-1) has a double bond equivalent of 10,000 g/mol or less, it ensures improved sensitivity in the light exposure step.

The polycyclic side chain-containing resin (A2-1) used for the present invention preferably has a polystyrene based Mw of 500 or more, more preferably 1,000 or more, and still more preferably 1,500 or more, as determined by GPC. If the Mw is 500 or more, it ensures an improved resolution after the development step. On the other hand, the Mw is preferably 100,000 or less, more preferably 50,000 or less, and still more preferably 20,000 or less. If the Mw is 100,000 or less, it ensures an improved leveling property in the coating step and an improved patternability with an alkaline developer.

<Acid-Modified Epoxy Resin (A2-2)>

Examples of the acid-modified epoxy resin (A2-2) used for the present invention include (I) an acid-modified epoxy resin produced by reacting a phenol compound, a carboxylic anhydride, and an epoxy compound, (II) an acid-modified epoxy resin produced by reacting an alcohol compound, a carboxylic anhydride, and an epoxy compound, (III) an acid-modified epoxy resin produced by reacting an epoxy compound, a carboxylic acid compound, and an epoxy compound, and (IV) an acid-modified epoxy resin produced by reacting an epoxy compound, a carboxylic acid compound, and a carboxylic anhydride.

The acid-modified epoxy resin (A2-2) is a thermosetting resin and its epoxy resin backbone, which forms the skeleton, has a highly heat resistant aromatic ring structure. Accordingly, the incorporation of an acid-modified epoxy resin in the resin composition ensures the production of a cured film with an improved heat resistance. Therefore, such a cured film is suited to applications that require heat resistance.

The acid-modified epoxy resin (A2-2) used for the present invention preferably has an ethylenically unsaturated double bond group. If the resin composition contains an acid-modified epoxy resin (A2-2) having an ethylenically unsaturated double bond group, it ensures an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and ensuring the production of a cured film having improved mechanical characteristics. Therefore, such a cured film is suited to applications that require good mechanical characteristics.

The acid-modified epoxy resin (A2-2) used for the present invention has a carboxyl group and/or a carboxylic anhydride group to act as alkali-soluble groups. The existence of a carboxyl group and/or a carboxylic anhydride group ensures an improved resolution after the development step.

From the viewpoint of producing a cured film having an improved heat resistance, the acid-modified epoxy resin (A2-2) used for the present invention preferably contains one or more selected from the group consisting of a structural unit as represented by general formula (35), a structural unit as represented by general formula (36), a structural unit as represented by general formula (37), a structural unit as represented by general formula (38), a structural unit as represented by general formula (41), a structural unit as represented by general formula (42), and a structural unit as represented by general formula (43). Furthermore, from the viewpoint of ensuring an improved sensitivity in the light exposure step and producing a cured film having improved mechanical characteristics, it is preferable for the acid-modified epoxy resin (A2-2) used for the present invention to contain an ethylenically unsaturated double bond group at one or more positions selected from the backbone chain, side chain, and chain end.

[Chemical compound 12]

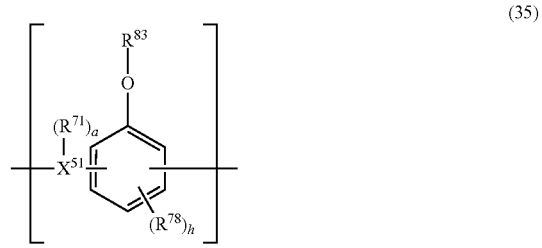

(35)

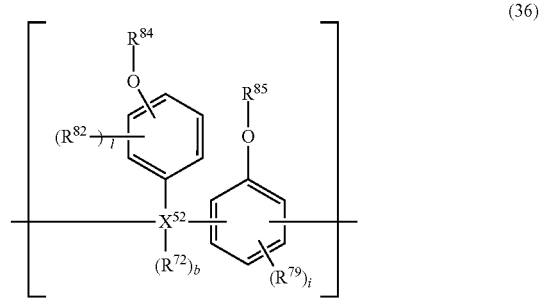

(36)

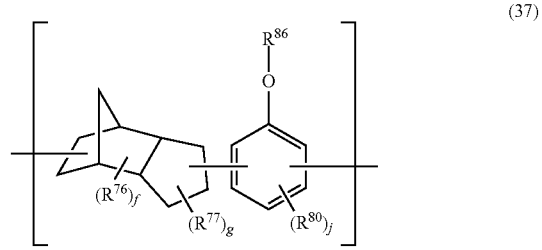

(37)

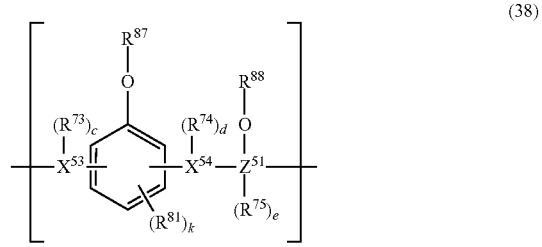

(38)

In general formulae (35) to (38), $X^{51}$ to $X^{54}$ are each independently an aliphatic structure containing 1 to 6 carbon atoms. $Z^{51}$ is a trivalent to decavalent fused polycyclic aromatic hydrocarbon ring containing 10 to 15 carbon atoms. $R^{71}$ to $R^{75}$ are each independently an alkyl group containing 1 to 10 carbon atoms, a cycloalkyl group containing 4 to 10 carbon atoms, or an aryl group containing 6 to 15 carbon atoms; $R^{76}$ and $R^{77}$ are each independently an alkyl group containing 1 to 10 carbon atoms; $R^{78}$ to $R^{82}$ are each independently a halogen, an alkyl group containing 1 to 10 carbon atoms, a cycloalkyl group containing 4 to 10 carbon atoms, or an aryl group containing 6 to 15 carbon atoms; and $R^{83}$ to $R^{88}$ are each independently a substituent group as represented by general formula (39). Furthermore, a, b, c, d, and e are each independently an integer of 0 to 10; f is an integer of 0 to 8; g is an integer of 0 to 6; h, i, j, and k are each independently an integer of 0 to 3; and l is an integer of 0 to 4. The above alkyl group, cycloalkyl group, aryl group, aliphatic structure, and fused polycyclic aromatic hydrocarbon ring may each have a heteroatom, and may each be either a non-substitution product or a substitution product.

[Chemical compound 13]

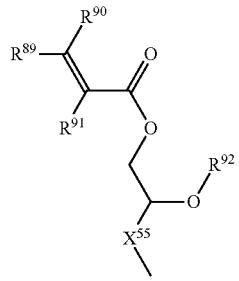
(39)

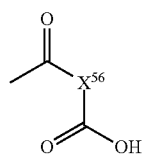
(40)

In general formula (39), $X^{55}$ is an alkylene chain containing 1 to 6 carbon atoms or a cycloalkylene chain containing 4 to 10 carbon atoms. $R^{89}$ to $R^{91}$ are each independently a hydrogen atom, an alkyl group containing 1 to 10 carbon atoms, or an aryl group containing 6 to 15 carbon atoms. $R^{92}$ is a hydrogen atom or a substituent group as represented by general formula (40). In general formula (39), it is more preferable that $R^{89}$ and $R^{90}$ are each independently a hydrogen atom or an alkyl group containing 1 to 4 carbon atoms. $R^{91}$ is preferably a hydrogen atom or an alkyl group containing 1 to 4 carbon atoms, and more preferably a hydrogen atom or a methyl group. In general formula (40), $X^{56}$ is an alkylene chain containing 1 to 6 carbon atoms or a cycloalkylene chain containing 4 to 10 carbon atoms. In general formula (40), it is preferable that $X^{56}$ is an alkylene chain containing 1 to 4 carbon atoms or a cycloalkylene chain containing 4 to 7 carbon atoms. The above alkylene chains, cycloalkylene chains, alkyl groups, and aryl group may each be either a non-substitution product or a substitution product.

[Chemical compound 14]

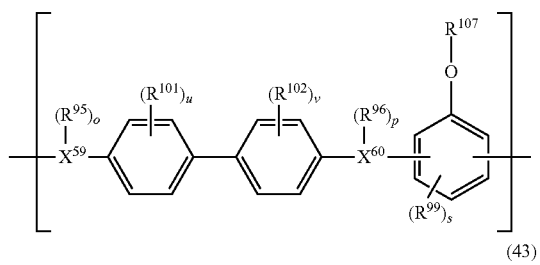
(41)

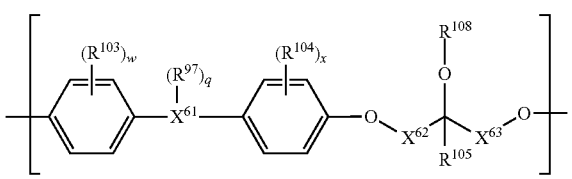
(42)

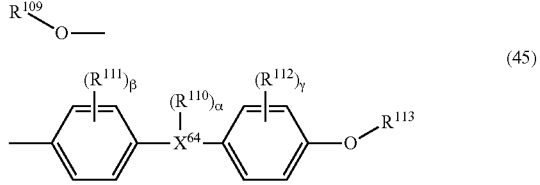
(43)

In general formulae (41) to (43), $X^{57}$ to $X^{61}$ are each independently an aliphatic structure containing 1 to 6 carbon atoms, and $X^{62}$ and $X^{63}$ are each independently an alkylene chain containing 1 to 6 carbon atoms, or a cycloalkylene chain containing 4 to 10 carbon atoms. $R^{93}$ to $R^{97}$ are each independently an alkyl group containing 1 to 10 carbon atoms, a cycloalkyl group containing 4 to 10 carbon atoms, or an aryl group containing 6 to 15 carbon atoms; $R^{98}$ to $R^{104}$ are each independently a halogen, an alkyl group containing 1 to 10 carbon atoms, a cycloalkyl group containing 4 to 10 carbon atoms, or an aryl group containing 6 to 15 carbon atoms; $R^{105}$ is a hydrogen atom or an alkyl group containing 1 to 6 carbon atoms; $R^{106}$ and $R^{107}$ are each independently a substituent group as represented by general formula (39); and $R^{108}$ is a hydrogen atom, a substituent group as represented by general formula (39), or a substituent group as represented by general formula (40). Furthermore, m, n, o, p, and q are each independently an integer of 0 to 10; r and s are each independently an integer of 0 to 3; and t, u, v, w, and x are each independently an integer of 0 to 4. The above alkylene chain, cycloalkylene chain, alkyl group, cycloalkyl group, aryl group, and aliphatic structure may each have a heteroatom and may each be either a substitution product or a non-substitution product. Of the various acid-modified epoxy resins (A2-2) used for the present invention, those acid-modified epoxy resins (A2-2) having structural units as represented by general formula (43) preferably have a substituent group as represented by general formula (44) and/or a substituent group as represented by general formula (45) at chain ends.

[Chemical compound 15]

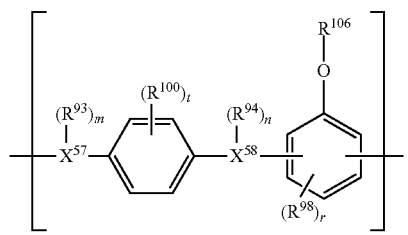
(44)

(45)

In general formula (44), $R^{109}$ is a substituent group as represented by general formula (39). In general formula (45), $X^{64}$ is an aliphatic structure containing 1 to 6 carbon atoms. $R^{110}$ is an alkyl group containing 1 to 10 carbon atoms, a cycloalkyl group containing 4 to 10 carbon atoms, or an aryl group containing 6 to 15 carbon atoms, and $R^{111}$ and $R^{112}$ are each independently a halogen, an alkyl group containing 1 to 10 carbon atoms, a cycloalkyl group containing 4 to 10 carbon atoms, or an aryl group containing 6 to 15 carbon atoms. $R^{113}$ is a substituent group as represented by general formula (39). Here, a is an integer of 0 to 10. Furthermore, β and γ are each an integer of 0 to 4. In general formula (45), it is preferable that $X^{64}$ is an aliphatic structure containing 1 to 4 carbon atoms. It is preferable that $R^{110}$ is an alkyl group containing 1 to 6 carbon atoms, a cycloalkyl group containing 4 to 7 carbon atoms, or an aryl group containing 6 to 10 carbon atoms, and it is preferable that $R^{111}$ and $R^{112}$ are each independently a halogen, an alkyl group containing 1 to 6 carbon atoms, a cycloalkyl group containing 4 to 7 carbon atoms, or an aryl group containing 6 to 10 carbon atoms.

<Structural Unit Derived from Aromatic Carboxylic Acid or Derivative Thereof>

The acid-modified epoxy resin (A2-2) used for the present invention preferably contains a structural unit derived from an aromatic carboxylic acid or a derivative thereof. If the acid-modified epoxy resin (A2-2) contain a structural unit derived from an aromatic carboxylic acid or a derivative thereof, the heat resistance of the aromatic group serves to produce a cured film having an improved heat resistance. The aromatic carboxylic acid or derivative thereof is preferably one or more selected from the group consisting of tetracarboxylic acid having an aromatic group, tricarboxylic acid having an aromatic group, tricarboxylic anhydride having an aromatic group, dicarboxylic acid having an aromatic group, and dicarboxylic anhydride having an aromatic group.

If a pigment (D1) in particular is added as the coloring agent (D) which will be described later, and if in that case the acid-modified epoxy resin (A2-2) contains a structural unit derived from an aromatic carboxylic acid or a derivative thereof, the steric hindrance of the aromatic group serves to improve the dispersion stability of the pigment (D1). If the pigment (D1) is an organic pigment (D1-1), the aromatic group in the acid-modified epoxy resin (A2-2) interacts with the aromatic group in the organic pigment (D1-1), thereby serving to improve the dispersion stability of the organic pigment (D1-1).

Examples of the aromatic carboxylic acid or derivatives thereof include the aforementioned compounds such as aromatic tetracarboxylic acids and/or derivatives thereof, aromatic tricarboxylic acids and/or derivatives thereof, and aromatic dicarboxylic acids and/or derivatives thereof.

It is preferable for the structural units derived from aromatic carboxylic acids and/or derivatives thereof to account for 10 to 100 mol %, more preferably 20 to 100 mol %, and still more preferably 30 to 100 mol %, of all structural units derived from carboxylic acids or derivatives thereof in the acid-modified epoxy resin (A2-2). A content of 10 to 100 mol % ensures the production of a cured film having an improved heat resistance.

<Acidic Group Derived from Carboxylic Acid or Derivative Thereof>

The acid-modified epoxy resin (A2-2) used for the present invention preferably contains a structural unit derived from a carboxylic acid or a derivative thereof, and the acid-modified epoxy resin (A2-2) preferably has an acidic group. If the acid-modified epoxy resin (A2-2) contains an acidic group, it ensures an improved patternability with an alkaline developer and an improved resolution after the development step.

The acidic group is preferably one that shows an acidity of less than pH 6. Examples of such an acidic group that shows an acidity of less than pH 6 include carboxyl group, carboxylic anhydride group, sulfonic acid group, phenolic hydroxyl group, and hydroxyimide group. From the viewpoint of ensuring an improved patternability with an alkaline developer and an improved resolution after the development step, the carboxylic group, carboxylic anhydride group, and phenolic hydroxyl group are preferable, and the carboxyl group and carboxylic anhydride group are more preferable.

The acid-modified epoxy resin (A2-2) used for the present invention preferably has an acid equivalent of 280 g/mol or more, more preferably 300 g/mol or more, and still more preferably 400 g/mol or more. An acid equivalent of 280 g/mol or more ensures a decreased film loss in the alkali development step. On the other hand, the acid equivalent is preferably 1,400 g/mol or less, more preferably 1,100 g/mol or less, and still more preferably 950 g/mol or less. An acid equivalent of 1,400 g/mol or less ensures an improved patternability with an alkali developer and an improved resolution after the development step. From the viewpoint of ensuring an improved patternability with an alkaline developer and an improved resolution after the development step, the acid equivalent is preferably the carboxylic acid equivalent.

The contents of structural units derived from various monomer components in the acid-modified epoxy resin (A2-2) can be determined by a combination of methods such as $^1$H-NMR, $^{13}$C-NMR, $^{29}$Si-NMR, IR, TOF-MS, elementary analysis, and ash content measurement.

<Specific Examples of Acid-Modified Epoxy Resin (A2-2)>

Examples of the acid-modified epoxy resin (A2-2) used for the present invention include KAYARAD (registered trademark) PCR-1222H, CCR-1171H, TCR-1348H, ZAR-1494H, ZFR-1401H, ZCR-1798H, ZXR-1807H, ZCR-6002H, and ZCR-8001H (all manufactured by Nippon Kayaku Co., Ltd.); and NK OLIGO (registered trademark) EA-6340, EA-7140, and EA-7340 (all manufactured by Shin-Nakamura Chemical Co., Lid.).

<Physical Properties of Acid-Modified Epoxy Resin (A2-2)>

The acid-modified epoxy resin (A2-2) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate and also ensures the formation of a pattern having a small-tapered shape after the development step. On the other hand, the acid-modified epoxy resin (A2-2) preferably has a double bond equivalent of 10,000 g/mol or less, more preferably 5,000 g/mol or less, and still more preferably 2,000 g/mol or less. If the double bond equivalent is 10,000 g/mol or less, it ensures improved sensitivity in the light exposure step.

The acid-modified epoxy resin (A2-2) used for the present invention preferably has a polystyrene based Mw of 500 or more, more preferably 1,000 or more, and still more preferably 1,500 or more, as determined by GPC. A Mw in the above range ensures an improved resolution after the development step. On the other hand, the Mw is preferably 100,000 or less, more preferably 50,000 or less, and still more preferably 20,000 or less. A Mw in the above range ensures an improved leveling property in the coating step and an improved patternability with an alkaline developer.

<Acrylic Resin (A2-3)>

Examples of the acrylic resin (A2-3) used for the present invention include acrylic resins obtainable through radical copolymerization of one or more copolymerization components selected from the group consisting of copolymerization components having acidic groups, copolymerization components derived from (meth)acrylic esters, and other copolymerization components.

The acrylic resin (A2-3) used for the present invention preferably has an ethylenically unsaturated double bond group. If the negative type photosensitive resin composition contains an acrylic (A2-3) having an ethylenically unsaturated double bond group, it ensures an improved sensitivity in the light exposure step. Furthermore, the three dimensional crosslinked structure formed has an alicyclic structure or an aliphatic structure as primary component and accordingly, the softening point of the resin is prevented from rising, allowing a small-tapered pattern shape to be formed and ensuring the production of a cured film having improved mechanical characteristics. Therefore, such a cured film is suited to applications that require good mechanical characteristics.

From the viewpoint of ensuring an improved sensitivity in the light exposure step and a cured film with improved mechanical characteristics, it is preferable for the acrylic resin (A2-3) used for the present invention to contain a structural unit as represented by general formula (61) and/or a structural unit as represented by general formula (62).

[Chemical compound 16]

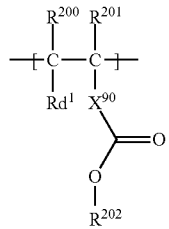

(61)

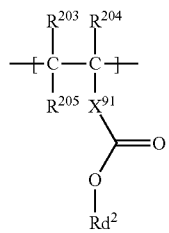

(62)

In general formulae (61) and (62), $Rd^1$ and $Rd^2$ are each independently an alkyl group containing 1 to 10 carbon atoms, a cycloalkyl group containing 4 to 15 carbon atoms, or an aryl group containing 6 to 15 carbon atoms, each also containing an ethylenically unsaturated double bond group. $R^{200}$ to $R^{205}$ are each independently a hydrogen atom, an alkyl group having 1 to 10 carbon atoms, a cycloalkyl group having 4 to 10 carbon atoms, or an aryl group having 6 to 15 carbon atoms. X90 and X91 are each independently a direct bond, an alkylene chain containing 1 to 10 carbon atoms, a cycloalkylene chain containing 4 to 10 carbon atoms, or an arylene chain containing 6 to 15 carbon atoms.

In general formulae (61) and (62), it is preferable that $Rd^1$ and $Rd^2$ are each independently an alkyl group containing 1 to 6 carbon atoms, a cycloalkyl group containing 4 to 10 carbon atoms, or an aryl group containing 6 to 10 carbon atoms, each also containing an ethylenically unsaturated double bond group. Furthermore, it is preferable that $R^{200}$ to $R^{205}$ are each independently a hydrogen atom, an alkyl group having 1 to 6 carbon atoms, a cycloalkyl group having 4 to 7 carbon atoms, or an aryl group having 6 to 10 carbon atoms. It is also preferable that $X^{90}$ and $X^{91}$ are each independently a direct bond, an alkylene chain containing 1 to 6 carbon atoms, a cycloalkylene chain containing 4 to 7 carbon atoms, or an arylene chain containing 6 to 10 carbon atoms. The above alkyl group, cycloalkyl group, aryl group, alkylene chain, cycloalkylene chain, and arylene chain may each contain a heteroatom and may each be either a non-substitution product or a substitution product.

The acrylic resin (A2-3) used for the present invention is preferably an acrylic resin (A2-3) obtainable through a radical copolymerization of a copolymerization component having an acidic group or other copolymerization components. Such other copolymerization components are each preferably a copolymerization component having an aromatic group or a copolymerization component having an alicyclic group.

<Structural Unit Derived from Copolymerization Component Having Acidic Group>

The acrylic resin (A2-3) used for the present invention contains a structural unit derived from a copolymerization component having an acidic group and it is preferable that the acrylic resin (A2-3) has an acidic group. If the acrylic resin (A2-3) contains an acidic group, it ensures an improved patternability with an alkaline developer and an improved resolution after the development step.

The acidic group is preferably one that shows an acidity of less than pH 6. Examples of such an acidic group that shows an acidity of less than pH 6 include carboxyl group, carboxylic anhydride group, sulfonic acid group, phenolic hydroxyl group, and hydroxyimide group. From the viewpoint of ensuring an improved patternability with an alkaline developer and an improved resolution after the development step, the carboxylic group, carboxylic anhydride group, and phenolic hydroxyl group are preferable, and the carboxyl group and carboxylic anhydride group are more preferable.

The acrylic resin (A2-3) used for the present invention preferably has an acid equivalent of 280 g/mol or more, more preferably 300 g/mol or more, and still more preferably 400 g/mol or more. An acid equivalent of 280 g/mol or more ensures a decreased film loss in the alkali development step. On the other hand, the acid equivalent is preferably 1,400 g/mol or less, more preferably 1,100 g/mol or less, and still more preferably 950 g/mol or less. An acid equivalent of 1,400 g/mol or less ensures an improved patternability with an alkali developer and an improved resolution after the development step. From the viewpoint of ensuring an improved patternability with an alkaline developer and an improved resolution after the development step, the acid equivalent is preferably the carboxylic acid equivalent.

Regarding the acrylic resin (A2-3) used for the present invention, it is preferable for the acrylic resin (A2-3) not to have an epoxy group when the acrylic resin (A2-3) has a carboxyl group. If the acrylic resin (A2-3) has both a carboxyl group and an epoxy group, the carboxyl group and the epoxy group can react with each other during storage of a coating liquid prepared from the negative type photosensitive resin composition. Therefore, the coating liquid prepared from the resin composition may have a decreased storage stability. A preferable example of such an acrylic resin (A2-3) that has no epoxy group is one produced through radical copolymerization of a copolymerization component that has a carboxyl group or a carboxylic anhydride group and another copolymerization component that has no epoxy group.

<Structural Unit Derived from Copolymerization Component Having Aromatic Group>

The acrylic resin (A2-3) used for the present invention preferably contains a structural unit derived from a copolymerization component having an aromatic group. If the acrylic resin (A2-3) contains a structural unit derived from a copolymerization component having an aromatic group, the heat resistance of the aromatic group serves to produce a cured film with an improved heat resistance.

If a pigment (D1) in particular is added as the coloring agent (D) which will be described later, and if in that case the acrylic resin (A2-3) contains a structural unit derived from a copolymerization component having an aromatic group, the steric hindrance of the aromatic group serves to improve the dispersion stability of the pigment (D1). If the pigment (D1) is an organic pigment (D1-1), the aromatic group in the acrylic resin (A2-3) interacts with the aromatic group in the organic pigment (D1-1), thereby serving to improve the dispersion stability of the organic pigment (D1-1).

In the acrylic resin (A2-3), the structural units derived from copolymerization components having aromatic groups preferably account for 10 mol % or more, more preferably 20 mol % or more, and still more preferably 30 mol % or more, of all structural units derived from copolymerization components. A content of 10 mol % or more ensures the production of a cured film having an improved heat resistance. On the other hand, the content is preferably 80 mol % or less, more preferably 75 mol % or less, and still more preferably 70 mol % or less. A content of 80 mol % or less ensures an improved sensitivity in the light exposure step.

<Structural Unit Derived from Copolymerization Component Containing Alicyclic Group>

The acrylic resin (A2-3) used for the present invention preferably contains a structural unit derived from a copolymerization component having an alicyclic group. If the acrylic resin (A2-3) contains a structural unit derived from a copolymerization component having an alicyclic group, the heat resistance and transparency of the alicyclic group serves to produce a cured film with an improved heat resistance and an improved transparency.

In the acrylic resin (A2-3), the structural units derived from copolymerization components having alicyclic groups preferably account for 5 mol % or more, more preferably 10 mol % or more, and still more preferably 15 mol % or more, of all structural units derived from copolymerization components. A content of 5 mol % or more ensures the production of a cured film having an improved heat resistance and transparency. On the other hand, the content is preferably 90 mol % or less, more preferably 85 mol % or less, and still more preferably 75 mol % or less. A content of 90 mol % or less ensures the production of a cured film having improved mechanical characteristics.

The acrylic resin (A2-3) used for the present invention is preferably a resin obtainable through a ring-opening addition reaction of a resin obtainable through a radical copolymerization of a copolymerization component having an acidic group or other copolymerization components with an unsaturated compound that contains an ethylenically unsaturated double bond group and an epoxy group. The ring-opening addition reaction involving an unsaturated compound containing an ethylenically unsaturated double bond group and an epoxy group serves to introduce ethylenically unsaturated double bond groups into side chains of the acrylic resin (A2-3). The contents of structural units derived from various copolymerization components in an acrylic resin (A2-3) can be determined by a combination of methods such as $^1$H-NMR, $^{13}$C-NMR, $^{29}$Si-NMR, IR, TOF-MS, elementary analysis, and ash content measurement.

<Physical Properties of Acrylic Resin (A2-3)>

The acrylic resin (A2-3) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate and also ensures the formation of a pattern having a small-tapered shape after the development step. On the other hand, the acrylic resin (A2-3) preferably has a double bond equivalent of 10,000 g/mol or less, more preferably 5,000 g/mol or less, and still more preferably 2,000 g/mol or less. If the double bond equivalent is 10,000 g/mol or less, it ensures improved sensitivity in the light exposure step.

The acrylic resin (A2-3) used for the present invention preferably has a polystyrene based Mw of 1,000 or more, more preferably 3,000 or more, and still more preferably 5,000 or more, as determined by GPC. If the Mw is 1,000 or more, it ensures an improved resolution after the development step. On the other hand, the Mw is preferably 100,000 or less, more preferably 70,000 or less, and still more preferably 50,000 or less. If the Mw is 100,000 or less, it ensures an improved leveling property in the coating step and an improved patternability with an alkaline developer.

The acrylic resin (A2-3) can be synthesized by a generally known method. For example, a good method is to perform radical copolymerization of copolymerization components in air or nitrogen in the presence of a radical polymerization initiator. As a process for such radical copolymerization, a reaction container is placed in air or sufficiently purged with nitrogen by bubbling, reduced pressure deaeration, etc., and then copolymerization components and a radical polymerization initiator are added to a reaction solvent, followed by continuing the reaction at 60° C. to 110° C. for 30 to 500 minutes. In addition, a chain transfer agent such as thiol compounds and/or a polymerization terminator such as phenol compounds may be used as required.

In the negative type photosensitive resin composition according to the present invention, it is preferable for the first resin (A1) to account for 25 mass % or more, more preferably 50 mass % or more, still more preferably 60 mass % or more, still more preferably 70 mass % or more, and particularly preferably 80 mass % or more, of the total quantity, which accounts for 100 mass %, of the first resin (A1) and the second resin (A2). A content of 25 mass % or more ensures the production of a cured film having an improved heat resistance. On the other hand, it is preferable for the first resin (A1) to account for 99 mass % or less, more preferably 98 mass % or less, still more preferably 97 mass % or less, still more preferably 95 mass % or less, and particularly preferably 90 mass % or less. A content of 99 mass % or less ensures the formation of a cured film having a small-tapered pattern shape. In addition, in the stepped region of the cured film, the stepped shape can be maintained in the heat curing step by controlling the reflow property, thereby leading to improved halftone characteristics.

If the contents of the first resin (A1) and the second resin (A2) are in the preferred ranges in the negative type photosensitive resin composition according to the present invention, it ensures not only the production of a cured film with an improved heat resistance, but also the formation of a small-tapered pattern shape. Therefore, a cured film produced from the negative type photosensitive resin composition according to the present invention can be used suitably in components that require a high heat resistance and a small-tapered pattern shape such as insulation layers in, for example, pixel dividing layers of organic EL display devices. If a cured film of the negative type photosensitive resin composition according to the present invention is used in components that are considered to suffer problems related to heat resistance or pattern shape, such as defects and characteristics deterioration in elements due to degassing caused by heat decomposition and disconnection in the electrode wiring attributable to a large-tapered pattern shape, it will be possible to produce a high reliability element that is free from such problems. In addition, since the negative type photosensitive resin composition according to the present invention contains a coloring agent (D) which will be described later, it serves for prevention of the electrode wiring from becoming visible and for reduction of external light reflection, leading to an improved contrast in image displaying.

<Radical Polymerizable Compound (B)>

The negative type photosensitive resin composition according to the present invention further contains a radical polymerizable compound (B). The radical polymerizable compound (B) is a compound having a plurality of ethylenically unsaturated double bond groups in the molecule. In the light exposure step, radicals are generated from the photo initiator (C1), which will be described later, to cause radical polymerization of the radical polymerizable compound (B), and the light-exposed part of the film of the resin composition becomes insoluble in the alkaline developer, thereby serving to form a negative type pattern.

The incorporation of the radical polymerizable compound (B) serves to accelerate the UV curing in the light exposure of the film of the resin composition to ensure an improved sensitivity in the light exposure step. In addition, the cross-link density after the heat curing step will increase, leading to a cured film having an improved hardness.

It is preferable for the radical polymerizable compound (B) to be a (meth)acrylic group-containing compound because such a compound will be radical polymerized easily. It is more preferable for the compound to have two or more (meth)acrylic groups in the molecule from the viewpoint of ensuring an improved sensitivity in the light exposure step and producing a cured film having an increased hardness. The radical polymerizable compound (B) preferably has a double bond equivalent of 80 to 800 g/mol from the viewpoint of ensuring an improved sensitivity in the light exposure step and forming a small-tapered pattern shape.

In addition to the fluorene backbone-containing radical polymerizable compound (B1) and the indane backbone-containing radical polymerizable compound (B2), which will be described later, examples of the radical polymerizable compound (B) include diethylene glycol di(meth)acrylate, triethylene glycol di(meth)acrylate, tetraethylene glycol di(meth)acrylate, propylene glycol di(meth)acrylate, trinn-ethylolpropane di(meth)acrylate, trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol tricyclodecane di(meth)acrylate, pentaerythritol tri(meth)acrylate, pentaerythritol tetra(meth)acrylate, dipenta erythritol penta(meth)acrylate, dipenta erythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy) phenyl] propane, 1,3,5-tris-((meth)acryloxyethyl) isocyanuric acid, and 1,3-bis((meth)acryloxyethyl) isocyanuric acid, as well as acid-modified forms thereof. From the viewpoint of ensuring an improved resolution after the development step, furthermore, also preferable are compounds that are produced by subjecting a compound having two or more glycidoxy groups in the molecule and an unsaturated carboxylic acid having an ethylenically unsaturated double bond group to a ring-opening addition reaction and then reacting the resulting compound with a polybasic carboxylic acid or a polybasic carboxylic anhydride.

In the negative type photosensitive resin composition according to the present invention, the radical polymerizable compound (B) preferably accounts for 15 parts by mass or more, more preferably 20 parts by mass or more, still more preferably 25 parts by mass or more, and particularly preferably 30 parts by mass or more, relative to the total quantity, which accounts for 100 parts by mass, of the alkali-soluble resin (A) and the radical polymerizable compound (B). A content of 15 parts by mass or more ensures an improved sensitivity in the light exposure step and the formation of a cured film having a small-tapered pattern shape. Furthermore, the content of the radical polymerizable compound (B) is preferably 65 parts by mass or less, more preferably 60 parts by mass or less, still more preferably 55 parts by mass or less, and particularly preferably 50 parts by mass or less. A content of 65 parts by mass or less ensures the formation of a cured film having an improved heat resistance and the formation of a small-tapered pattern shape.

<Fluorene Backbone-Containing Radical Polymerizable Compound (B1) and Indane Backbone-Containing Radical Polymerizable Compound (B2)>

The negative type photosensitive resin composition according to the present invention includes, as the radical polymerizable compound (B), one or more selected from the group consisting of a fluorene backbone-containing radical polymerizable compound (B1) and an indane backbone-containing radical polymerizable compound (B2).

The fluorene backbone-containing radical polymerizable compound (B1) is a compound having a plurality of ethylenically unsaturated double bond groups and a fluorene backbone in the molecule. The indane backbone-containing radical polymerizable compound (B2) is a compound having a plurality of ethylenically unsaturated double bond groups and an indane backbone in the molecule.

The incorporation of a fluorene backbone-containing radical polymerizable compound (B1) and/or an indane backbone-containing radical polymerizable compound (B2) serves to realize not only improved sensitivity in the light exposure step and control of the pattern shape to form a small-tapered pattern shape after the development step, but also a small-tapered pattern shape after the heat curing step. It is considered that a fluorene backbone or an indane backbone is introduced into the UV-cured film in the light exposure step and accordingly the film increases greatly in molecular weight when cured by UV even with a small exposure energy to insolubilize the film in the alkaline developer, thereby leading to an improved sensitivity in the light exposure step. Since the fluorene backbone and indane backbone are hydrophobic, it is inferred furthermore that the increased hydrophobicity of the UV-cured film works to depress the penetration of the alkaline developer, thereby preventing the side etching in the deep part of the film where a sufficient degree of UV curing is particularly difficult to realize. As a result, the formation of a backward-tapered shape is hindered whereas the pattern shape control becomes possible after the development step; for example, it becomes possible to form small-tapered pattern shape after the development step. It is further inferred that in addition to the depression of the formation of a backward-tapered shape after the development step, the steric hindrance of the fluorene backbone and/or indane backbone prevents excessive curing in the UV curing step to allow the reflow property to be maintained in the tapered part of the pattern in the heat curing step, thereby serving to realize the formation of a small-tapered pattern shape.

In addition, the incorporation of a fluorene backbone-containing radical polymerizable compound (B1) and/or an indane backbone-containing radical polymerizable compound (B2) serves to allow the pattern shape to be controlled after the development step to permit the formation of a small-tapered pattern shape, thereby realizing improved halftone characteristics. This is considered to be because the hydrophobicity of the fluorene backbone and/or indane backbone acts in the alkali development step not only to depress the side etching in the halftone exposed part where the film has not been cured completely, but also to control the alkali solubility of the halftone exposed part.

Furthermore, the incorporation of a fluorene backbone-containing radical polymerizable compound (B1) and/or an indane backbone-containing radical polymerizable compound (B2) also acts to depress the difference in the width of patterned openings between before and after the heat curing step. Similarly to the above case, this is also considered to be attributed to the fact that the fluorene backbone and indane backbone are hydrophobic. Specifically, it is considered that the side etching in the deep part of the film where a sufficient degree of UV curing is difficult to realize is depressed in the development step to permit the formation of a small-tapered pattern after the development step, and accordingly, the reflow in the edge of the pattern is depressed in the heat curing step, making it possible to reduce the difference in the width of patterned openings between before and after the heat curing step. As a fluorene backbone or an indane backbone is introduced into the UV-cured film in the light exposure step, the film increases greatly in molecular weight, which is also considered to serve to depress the reflow in the edge of the pattern in the heat curing step.

If a benzofuranone based black pigment (D1a-1a) is added as a black colorant (Da), which will be described later, development residues derived from the pigment may occur as a result of an insufficient alkali tolerance of the pigment. Specifically, the surface of the benzofuranone based black pigment (D1a-1a) is exposed to an alkaline developer in the development step and accordingly, part of the surface is decomposed or dissolved sometimes to remain on the substrate as development residues formed from the pigment. In such a case, a flexible chain-containing aliphatic radical polymerizable compound (B3), which will be described later, as well as the fluorene backbone-containing radical polymerizable compound (B1) and/or the indane backbone-containing radical polymerizable compound (B2) may be added in order to depress the formation of development residues from the pigment. As in the above case, it is considered that since the fluorene backbone and indane backbone are hydrophobic, the increased hydrophobicity of the UV-cured film works to prevent the penetration of the alkaline developer to depress the decomposition or dissolution of the benzofuranone based black pigment (D1a-1a) by the alkaline developer.

It is preferable for the fluorene backbone-containing radical polymerizable compound (B1) to be a compound as represented by general formula (11). It is preferable for the indane backbone-containing radical polymerizable compound (B2) to be a compound as represented by general formula (12) or a compound as represented by general formula 13).

[Chemical compound 17]

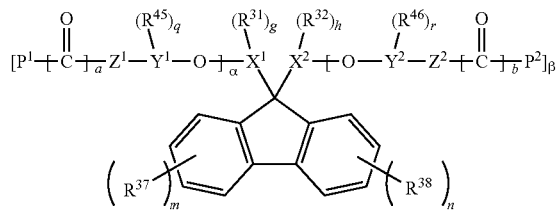

(11)

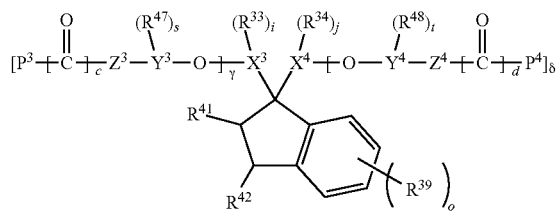

(12)

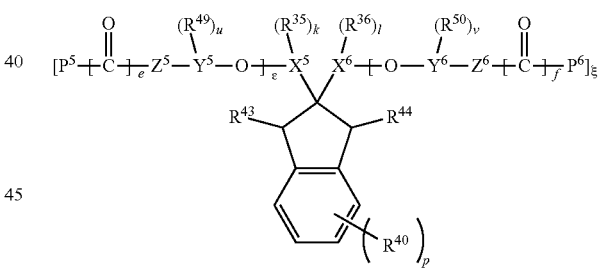

(13)

In general formula (11), (12), and (13), it is preferable that $X^1$ to $X^6$ are each independently a monocyclic or fused polycyclic divalent to decavalent aromatic hydrocarbon ring containing 6 to 15 carbon atoms or a monocyclic or fused polycyclic divalent to octavalent aliphatic hydrocarbon ring containing 4 to 10 carbon atoms. $Y^1$ to $Y^6$ are each independently a direct bond, an alkylene group containing 1 to 10 carbon atoms, a cycloalkylene group containing 4 to 10 carbon atoms, an arylene group containing 6 to 15 carbon atoms, or a group as represented by general formula (18). When $Y^1$ to $Y^6$ are each a direct bond or a group as represented by general formula (18), $Z^1$ to $Z^6$ are each a direct bond and q, r, s, t, u, and v are 0. When $Y^1$ to $Y^6$ are each an alkylene group containing 1 to 10 carbon atoms, a cycloalkylene group containing 4 to 10 carbon atoms, or an arylene group containing 6 to 15 carbon atoms, $Z^1$ to $Z^6$ are each an oxygen atom and q, r, s, t, u, and v are each independently an integer of 0 to 8. $R^{31}$ to $R^{40}$ are each independently a halogen, an alkyl group containing 1 to 10 carbon atoms, a cycloalkyl group containing 4 to 10 carbon atoms, an aryl group containing 6 to 15 carbon atoms, a fluoroalkyl group containing 1 to 10 carbon atoms, a fluorocycloalkyl group containing 4 to 10 carbon atoms, or a fluoroaryl group containing 6 to 15 carbon atoms; $R^{41}$ to $R^{44}$ are each independently a hydrogen atom, an alkyl group containing 1 to 10 carbon atoms, a cycloalkyl group containing 4 to 10 carbon atoms, or an aryl group containing 6 to 15 carbon atoms; and $R^{45}$ to $R^{60}$ are each independently an alkyl group containing 1 to 10 carbon atoms or a hydroxy group. $P^1$ to $P^6$ are each independently a group as represented by general formula (14). Furthermore, a, b, c, d, e, and f are each independently 0 or 1. When a, b, c, d, e, and f are 0, $Z^1$ to $Z^6$ are each an oxygen atom. Here, g, h, i, j, k, and l are each independently an integer of 0 to 8, and m, n, o, and p are each independently an integer of 0 to 4. Furthermore, α, β, γ, δ, ε, and ζ are each independently an integer of 1 to 4. The above monocyclic or fused polycyclic aromatic hydrocarbon ring, monocyclic or fused polycyclic aliphatic hydrocarbon ring, alkylene group, cycloalkylene group, arylene group, alkyl group, cycloalkyl group, aryl group, fluoroalkyl group, fluorocycloalkyl group, and fluoroaryl group may each have a heteroatom and may each be either a non-substitution product or a substitution product.

[Chemical compound 18]

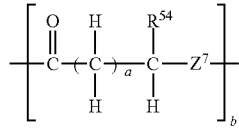
(18)

(19)

(20)

In general formula (18), $R^{54}$ is a hydrogen atom or an alkyl group containing 1 to 10 carbon atoms. $Z^7$ is a group as represented by general formula (19) or a group as represented by general formula (20). Here, a is an integer of 1 to 10 and b is an integer of 1 to 4. In general formula (20), $R^{55}$ is a hydrogen atom or an alkyl group containing 1 to 10 carbon atoms. In general formula (20), $R^{55}$ is preferably a hydrogen atom or an alkyl group containing 1 to 4 carbon atoms, more preferably a hydrogen atom or a methyl group.

[Chemical compound 19]

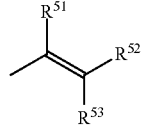
(14)

In general formula (14), $R^{51}$ to $R^{53}$ are each independently a hydrogen atom, an alkyl group containing 1 to 10 carbon atoms, or an aryl group containing 6 to 15 carbon atoms. In general formula (14), $R^{51}$ is preferably a hydrogen atom or an alkyl group containing 1 to 4 carbon atoms, and more preferably a hydrogen atom or a methyl group. It is preferable that $R^{52}$ and $R^{53}$ are each independently a hydrogen atom or an alkyl group containing 1 to 4 carbon atoms, more preferably a hydrogen atom.

It is preferable for the fluorene backbone-containing radical polymerizable compound (B1) and indane backbone-containing radical polymerizable compound (B2) to contain at least one lactone modified chain and/or at least one lactam modified chain. The incorporation of at least one lactone modified chain and/or at least one lactam modified chain serves to ensure an improved sensitivity in the light exposure step and depress the formation of development residues after the development step. In addition, in the stepped region of the cured film, the stepped shape can be maintained in the heat curing step by controlling the reflow property, thereby leading to improved halftone characteristics. Furthermore, the difference in the width of patterned openings between before and after the heat curing step can be depressed.

In the case where the fluorene backbone-containing radical polymerizable compound (B1) and the indane backbone-containing radical polymerizable compound (B2) are a compound as represented by the general formula (11) given above, a compound as represented by the general formula (12) given above, or a compound as represented by the general formula (13) given above and also where $Y^1$ to $Y^6$ in the general formulae (11), (12) and (13) given above are groups as represented by general formula (18), the fluorene backbone-containing radical polymerizable compound (B1) and the indane backbone-containing radical polymerizable compound (B2) have at least one lactone modified chain and/or at least one lactam modified chain. In the general formulae (11), (12), and (13) given above, it is preferable that two or more of $Y^1$ and $Y^2$ are groups as represented by general formula (18), that two or more of $Y^3$ and $Y^4$ are groups as represented by general formula (18), and that two or more of $Y^5$ and $Y^6$ are groups as represented by general formula (18). If two or more of $Y^1$ and $Y^2$, two or more of $Y^3$ and $Y^4$, and two or more of $Y^5$ and $Y^6$ are groups as represented by general formula (18), it serves to ensure an improved sensitivity in the light exposure step and depress the formation of development residues after the development step. In addition, this also serves to ensure improved halftone characteristics. Furthermore, the difference in the width of patterned openings between before and after the heat curing step can be depressed.

It is also preferable for the fluorene backbone-containing radical polymerizable compound (B1) to be a compound having a structural unit as represented by general formula (15). It is also preferable for the indane backbone-containing radical polymerizable compound (B2) to be a compound having a structural unit as represented by general formula (16) or a compound having a structural unit as represented by general formula (17).

[Chemical compound 20]

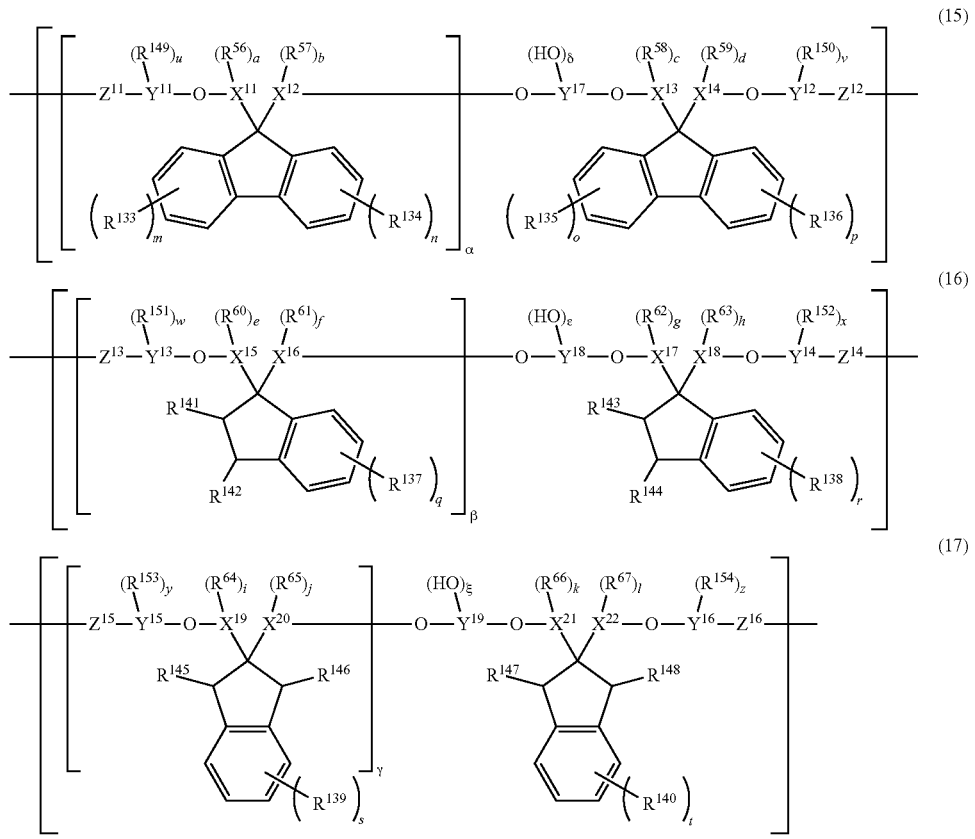

In general formulae (15), (16), and (17), it is preferable that $X^{11}$ to $X^{22}$ are each independently a monocyclic or fused polycyclic divalent to decavalent aromatic hydrocarbon ring containing 6 to 15 carbon atoms or a monocyclic or fused polycyclic divalent to octavalent aliphatic hydrocarbon ring containing 4 to 10 carbon atoms. $Y^{11}$ to $Y^{16}$ are each independently a direct bond, an alkylene group containing 1 to 10 carbon atoms, a cycloalkylene group containing 4 to 10 carbon atoms, or an arylene group containing 6 to 15 carbon atoms. When $Y^{11}$ to $Y^{16}$ are each a direct bond, $Z^{11}$ to $Z^{16}$ are each a direct bond and u, v, w, x, y, and z are 0. When $Y^{11}$ to $Y^{16}$ are not direct bonds, $Z^{11}$ to $Z^{16}$ are each an oxygen atom and u, v, w, x, y, and z are each independently an integer of 0 to 8. $Y^{17}$ to $Y^{19}$ are each independently an alkylene group containing 1 to 10 carbon atoms, a cycloalkylene group containing 4 to 10 carbon atoms, or an arylene group containing 6 to 15 carbon atoms. $R^{56}$ to $R^{67}$ and $R^{133}$ to $R^{140}$ are each independently a halogen, an alkyl group containing 1 to 10 carbon atoms, a cycloalkyl group containing 4 to 10 carbon atoms, an aryl group containing 6 to 15 carbon atoms, a fluoroalkyl group containing 1 to 10 carbon atoms, a fluorocycloalkyl group containing 4 to 10 carbon atoms, or a fluoroaryl group containing 6 to 15 carbon atoms; $R^{141}$ to $R^{148}$ are each independently a hydrogen, an alkyl group containing 1 to 10 carbon atoms, a cycloalkyl group containing 4 to 10 carbon atoms, or an aryl group containing 6 to 15 carbon atoms; and $R^{149}$ to $R^{154}$ are each independently an alkyl group containing 1 to 10 carbon atoms or a hydroxy group. Here, a, b, c, d, e, f, g, h, i, j, k, and l are each independently an integer of 0 to 8, and m, n, o, p, q, r, s, and t are each independently an integer of 0 to 4. α, β, and γ are each independently 1 or 2, and δ, ε, and are each independently 0 or 1. The above monocyclic or fused polycyclic aromatic hydrocarbon ring, monocyclic or fused polycyclic aliphatic hydrocarbon ring, alkylene group, cycloalkylene group, arylene group, alkyl group, cycloalkyl group, aryl group, fluoroalkyl group, fluorocycloalkyl group, and fluoroaryl group may each have a heteroatom and may each be either a non-substitution product or a substitution product.

It is preferable that the fluorene backbone-containing radical polymerizable compound (B1) and indane backbone-containing radical polymerizable compound (B2) to contain, in the molecule, two or more, more preferably three or more, and still more preferably four or more ethylenically unsaturated double bond groups. The existence of two or more ethylenically unsaturated double bond groups ensures an improved sensitivity in the light exposure step. In addition, if a pigment (D1) in particular is added as the coloring agent (D) which will be described later, the pigment (D1) may be immobilized in the cured region as a result of crosslinking in the UV curing step to serve to depress the formation of development residues derived from the pigment (D1) after the development step. Furthermore, the difference in the width of patterned openings between before and after the heat curing step can be depressed. On the other hand, it is preferable that the fluorene backbone-containing radical polymerizable compound (B1) and indane backbone-containing radical polymerizable compound (B2) to contain, in the molecule, 12 or less, more preferably 10 or less, still more preferably 8 or less, and particularly preferably 6 or less ethylenically unsaturated double bond groups. The incorporation of 12 or less ethylenically unsaturated double bond groups allows a pattern having a small-tapered shape to be formed after the heat curing step and serves to depress the difference in the width of patterned openings between before and after the heat curing step.

From the viewpoint of forming a pattern having a small-tapered shape after the development step, it is preferable for the fluorene backbone-containing radical polymerizable compound (B1) and indane backbone-containing radical polymerizable compound (B2) to contain one or more, more preferably two or more ethylenically unsaturated double bond groups in the molecule. On the other hand, the number of ethylenically unsaturated double bond groups is preferably four or less, more preferably three or less. This is considered to be because the adoption of an appropriate number of ethylenically unsaturated double bond groups acts to prevent a large-tapered shape to be formed as a result of excessive crosslinking in the UV curing step while the side etching in the development step caused by the lack of crosslinking in the UV curing step is depressed to serve for pattern shape control after the development step.

From the viewpoint of ensuring an improved sensitivity in the light exposure step and depressing the formation of development residues after the development step, it is preferable for the ethylenically unsaturated double bond groups existing in each molecule of the fluorene backbone-containing radical polymerizable compound (B1) and indane backbone-containing radical polymerizable compound (B2) to be (meth)acrylic groups, which undergo radical polymerization easily, and it is preferable for each molecule to contain two or more (meth)acrylic groups.

It is preferable for the fluorene backbone-containing radical polymerizable compound (B1) and indane backbone-containing radical polymerizable compound (B2) to have a double bond equivalent of 150 g/mol or more, more preferably 170 g/mol or more, still more preferably 190 g/mol or more, and particularly preferably 210 g/mol or more. A double bond equivalent of 150 g/mol or more allows a pattern having a small-tapered shape to be formed after the heat curing step and serves to depress the difference in the width of patterned openings between before and after the heat curing step. On the other hand, it is preferable that the fluorene backbone-containing radical polymerizable compound (B1) and indane backbone-containing radical polymerizable compound (B2) to have a double bond equivalent of 800 g/mol or less, more preferably 600 g/mol or less, still more preferable 500 g/mol or less, and particularly preferably 400 g/mol or less. If the double bond equivalent is 800 g/mol or less, it ensures improved sensitivity in the light exposure step.

It is preferable for the fluorene backbone-containing radical polymerizable compound (B1) and indane backbone-containing radical polymerizable compound (B2) to have a molecular weight of 400 or more, more preferably 450 or more, still more preferably 470 or more, and particularly preferably 500 or more. A molecular weight of 400 or more allows a pattern having a small-tapered shape to be formed after the heat curing step and serves to depress the difference in the width of patterned openings between before and after the heat curing step. On the other hand, it is preferable for the fluorene backbone-containing radical polymerizable compound (B1) and indane backbone-containing radical polymerizable compound (B2) to have a molecular weight of 1,500 or less, more preferably 1,300 or less, still more preferably 1,100 or less, and particularly preferably 900 or less. A molecular weight 1,500 or less ensures an improved sensitivity in the light exposure step.

Examples of the fluorene backbone-containing radical polymerizable compound (B1) include 9,9-bis[4-(2-(meth)acryloxyethoxy) phenyl] fluorene, 9,9-bis[4-(3-(meth)acryloxypropoxy) phenyl] fluorene, 9,9-bis[4-[(3-(meth)acryloxy) hexyloxy] phenyl] fluorene, 9,9-bis[4-(2-(meth)acryloxyethoxy)-3-methylphenyl] fluorene, 9,9-bis[4-(2-(meth)acryloxyethoxy)-3,5-dimethy phenyl] fluorene, 9,9-bis(4-(meth)acryloxy phenyl) fluorene, 9,9-bis[4-(2-hydroxy-3-(meth)acryloxypropoxy) phenyl] fluorene, 9,9-bis[4-(2-hydroxy-3-(meth)acryloxypropoxy)-3-methyl phenyl] fluorene, 9,9-bis[4-(2-hydroxy-3-(meth)acryloxypropoxy)-3,5-dimethyl phenyl] fluorene, 9,9-bis[3-phenyl-4-(2-(meth)acryloxyethoxy) phenyl] fluorene, 9,9-bis[4-(2-(meth)acryloxyethoxy)-1-naphthyl] fluorene, 9,9-bis[3,4-bis(2-(meth)acryloxyethoxy) phenyl] fluorene, 9-[3,4-bis(2-(meth)acryloxyethoxy) phenyl]-9-[4-(2-(meth)acryloxyethoxy) phenyl] fluorene, ε-caprolactone modified 9,9-bis(4-(meth)acryloxyphenyl) fluorene, δ-valerolactone modified 9,9-bis(4-(meth)acryloxy phenyl) fluorene, γ-butyrolactone modified 9,9-bis(4-(meth)acryloxy phenyl) fluorene, β-propiolactone modified 9,9-bis(4-(meth)acryloxy phenyl) fluorene, ε-caprolactam modified 9,9-bis(4-(meth)acryloxy phenyl) fluorene, and OGSOL (registered trademark) EA-50P, EA-0200, EA-0250P, EA-0300, EA-500, EA-1000, EA-F5000-4, EA-F5003, EA-F5005, EA-F5503, EA-F5510, EA-F5610, EA-F5710, and GA-5000 (all manufactured by Osaka Gas Chemicals Co., Ltd.).

Examples of the indane backbone-containing radical polymerizable compound (B2) include 1,1-bis[4-(2-(meth)acryloxyethoxy) phenyl] indane, 1,1-bis[4-(3-(meth)acryloxypropoxy) phenyl] indane, 1,1-bis[4-[(3-(meth)acryloxy) hexyloxy] phenyl] indane, 1,1-bis[4-(2-(meth)acryloxyethoxy)-3-methylphenyl] indane, 1,1-bis[4-(2-(meth)acryloxyethoxy)-3,5-dimethylphenyl] indane, 1,1-bis(4-(meth)acryloxyphenyl) indane, 1,1-bis[4-(2-hydroxy-3-(meth)acryloxypropoxy) phenyl] indane, 1,1-bis[4-(2-hydroxy-3-(meth)acryloxypropoxy)-3-methyl phenyl] indane, 1,1-bis[4-(2-hydroxy-3-(meth)acryloxypropoxy)-3,5-dimethylphenyl] indane, 1,1-bis[4-(2-(meth)acryloxyethoxy)phenyl]-3-phenyl indane, 1,1-bis[3-phenyl-4-(2-(meth)acryloxyethoxy)phenyl] indane, 1,1-bis[4-(2-(meth)acryloxyethoxy)-1-naphthyl] indane, 1,1-bis[3,4-bis(2-(meth)acryloxyethoxy) phenyl] indane, 2,2-bis[4-(2-(meth)acryloxyethoxy) phenyl] indane, 2,2-bis[4-(3-(meth)acryloxypropoxy) phenyl] indane, 2,2-bis[4-[(3-(meth)acryloxy) hexyloxy] phenyl] indane, 2,2-bis[4-(2-(meth)acryloxyethoxy)-3-methyl phenyl] indane, 2,2-bis(4-(meth)acryloxy phenyl) indane, 2,2-bis[4-(2-hydroxy-3-(meth)acryloxypropoxy) phenyl] indane, 2,2-bis[3-phenyl-4-(2-(meth)acryloxyethoxy) phenyl] indane, 2,2-bis[4-(2-(meth)acryloxyethoxy)-1-naphthyl] indane, 2,2-bis[3,4-bis(2-(meth)acryloxyethoxy) phenyl] indane, ε-caprolactone modified 1,1-bis(4-(meth)acryloxyphenyl) indane, δ-valerolactone modified 1,1-bis(4-(meth)acryloxyphenyl) indane, γ-butyrolactone modified 1,1-bis(4-(meth)acryloxyphenyl) indane, β-propiolactone modified 1,1-bis(4-(meth)acryloxyphenyl) indane, and ε-caprolactam modified 1,1-bis(4-(meth)acryloxy phenyl) indane.

The fluorene backbone-containing radical polymerizable compound (B1) and the indane backbone-containing radical polymerizable compound (B2) can be synthesized by a generally known method. For example, a good synthesis method is described in International Publication WO 2008/139924.

In the negative type photosensitive resin composition according to the present invention, the total quantity of the fluorene backbone-containing radical polymerizable compound (B1) and the indane backbone-containing radical polymerizable compound (B2) preferably accounts for 0.5 part by mass or more, more preferably 1 part by mass or more, still more preferably 2 parts by mass or more, still more preferably 3 parts by mass or more, and particularly preferably 5 parts by mass or more, relative to the total quantity, which accounts for 100 parts by mass, of the alkali-soluble resin (A) and the radical polymerizable compound (B). A content of 0.5 part by mass or more ensures not only an improved sensitivity in the light exposure step and a small-tapered pattern shape after the development step realized by the control of the pattern shape, but also a small-tapered pattern shape formed after the heat curing step. In addition, the difference in the width of patterned openings between before and after the heat curing step can be depressed. On the other hand, it is preferable for the total quantity of the fluorene backbone-containing radical polymerizable compound (B1) and indane backbone-containing radical polymerizable compound (B2) to account for 25 parts by mass or less, more preferably 22 parts by mass or less, still more preferably 20 parts by mass or less, still more preferably 18 parts by mass or less, and particularly preferably 15 parts by mass or less. A content of 25 parts by mass or less serves not only to depress the difference in the width of patterned openings between before and after the heat curing step, but also to depress the formation of development residues.

<Flexible Chain-Containing Aliphatic Radical Polymerizable Compound (B3)>

For the negative type photosensitive resin composition according to the present invention, it is preferable that the radical polymerizable compound (B) contains a flexible chain-containing aliphatic radical polymerizable compound (B3). A flexible chain-containing aliphatic radical polymerizable compound (B3) as referred to herein is a compound having, in the molecule, a plurality of ethylenically unsaturated double bond groups and a flexible backbone such as aliphatic chain and oxyalkylene chain.

The incorporation of the flexible chain-containing aliphatic radical polymerizable compound (B3) allows the UV curing in the light exposure step to progress efficiently, thereby ensuring an improved sensitivity in the light exposure step. In addition, if a pigment (D1) in particular is added as the coloring agent (D), which will be described later, the pigment (D1) may be immobilized in the cured region as a result of crosslinking in the flexible chain-containing aliphatic radical polymerizable compound (B3) in the UV curing step to serve to depress the formation of development residues derived from the pigment (D1) after the development step. Furthermore, the difference in the width of patterned openings between before and after the heat curing step can be depressed. In addition, in the stepped region of the cured film, the stepped shape can be maintained in the heat curing step by controlling the reflow property, thereby leading to improved halftone characteristics. It is inferred that this is because the existence of a flexible backbone such as aliphatic chain works to increase the probability of intermolecular collisions between ethylenically unsaturated double bond groups to promote the UV curing and lead to an increased crosslink density.

If a benzofuranone based black pigment (D1a-1a) is added as a black colorant (Da), which will be described later, development residues derived from the pigment may occur as a result of an insufficient alkali tolerance of the pigment, as described previously. In such a case, too, the addition of a flexible chain-containing aliphatic radical polymerizable compound (B3) can serve to depress the formation of development residues from the pigment.

It is preferable for the flexible chain-containing aliphatic radical polymerizable compound (B3) to be a radical polymerizable compound containing, in the molecule, a group as represented by general formula (24) and a plurality of groups as represented by general formula (25).

[Chemical compound 21]

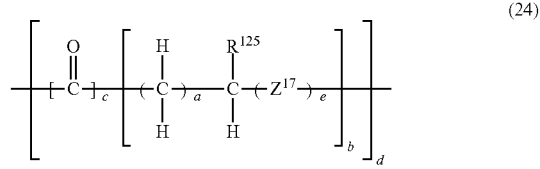

(24)

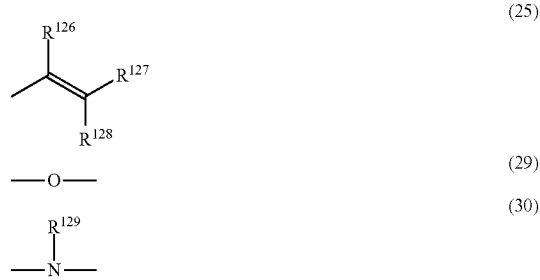

(25)

—O— (29)

$$\begin{array}{c} R^{129} \\ | \\ -N- \end{array}$$ (30)

In general formula (24), $R^{125}$ is a hydrogen atom or an alkyl group containing 1 to 10 carbon atoms. $Z^{17}$ is a group as represented by general formula (29) or a group as represented by general formula (30). Here, a is an integer of 1 to 10; b is an integer of 1 to 4; c is an integer of 0 or 1; d is an integer of 1 to 4; and e is an integer of 0 or 1. When c is 0, d is 1. In general formula (25), $R^{126}$ to $R^{128}$ are each independently a hydrogen atom, an alkyl group containing 1 to 10 carbon atoms, or an aryl group containing 6 to 15 carbon atoms. In general formula (30), $R^{129}$ is a hydrogen atom or an alkyl group containing 1 to 10 carbon atoms. In general formula (24), c is preferably 1 and e is preferably 1. In general formula (25), $R^{126}$ is preferably a hydrogen atom or an alkyl group containing 1 to 4 carbon atoms, more preferably a hydrogen atom or a methyl group. It is more preferable that $R^{127}$ and $R^{128}$ are each independently a hydrogen atom or an alkyl group containing 1 to 4 carbon atoms, more preferably a hydrogen atom. In general formula (30), $R^{129}$ is preferably a hydrogen atom or an alkyl group containing 1 to 4 carbon atoms, more preferably a hydrogen atom or a methyl group. If c is 1 in general formula (24), it serves to depress the formation of development residues after the development step and ensures improved halftone characteristics.

It is preferable for the flexible chain-containing aliphatic radical polymerizable compound (B3) to contain a compound as represented by general formula (27) and/or a compound as represented by general formula (28).

[Chemical compound 22]

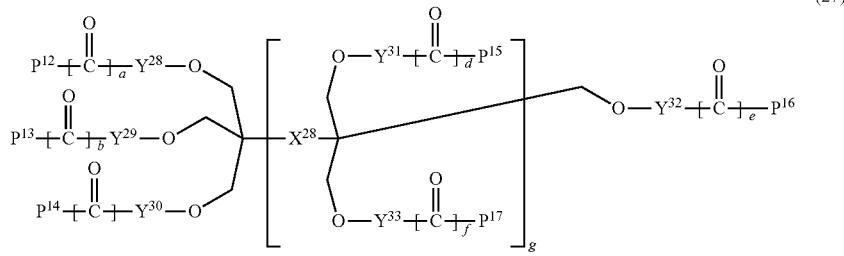

(27)

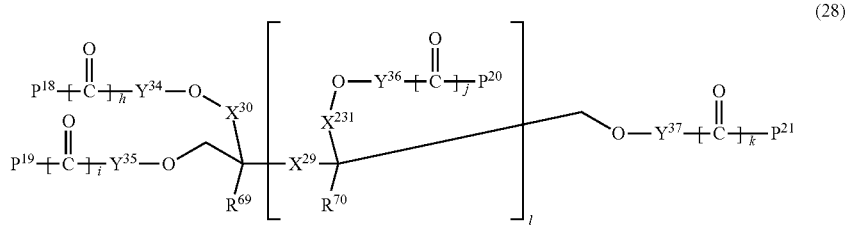

(28)

In general formula (27), $X^{28}$ is a divalent organic group. $Y^{28}$ to $Y^{33}$ are each independently a direct bond or a group as represented by the general formula (24) given above, and at least one of $Y^{28}$ to $Y^{33}$ is a group as represented by the general formula (24) given above. $P^{12}$ to $P^{17}$ are each independently a hydrogen atom or a group as represented by the general formula (25) given above, and at least two of $P^{12}$ to $P^{17}$ are groups as represented by the general formula (25) given above. Furthermore, a, b, c, d, e, and f are each independently an integer of 0 or 1, and g is an integer of 0 to 10.

In general formula (27), $X^{28}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms. It is preferable that a, b, c, d, e and f are each independently an integer of 1 and that g is an integer of 0 to 5. The aforementioned aliphatic structures, alicyclic structures, and aromatic structures may each contain a heteroatom and may each be either a non-substitution product or a substitution product. In general formula (27), it is preferable that two or more, more preferably three or more, and still more preferably four or more, of $Y^{28}$ to $Y^{33}$ are groups as represented by general formula (24). If two or more of $Y^{28}$ to $Y^{33}$ are groups as represented by general formula (24), it serves to ensure an improved sensitivity in the light exposure step and depress the formation of development residues after the development step. In addition, this also serves to ensure improved halftone characteristics.

In general formula (28), $X^{29}$ is a divalent organic group. $X^{30}$ and $X^{31}$ is each independently a direct bond or an alkylene chain containing 1 to 10 carbon atoms. $Y^{34}$ to $Y^{37}$ are each independently a direct bond or a group as represented by the general formula (24) given above, and at least one of $Y^{34}$ to $Y^{37}$ is a group as represented by the general formula (24) given above. $R^{69}$ and $R^{70}$ are each independently a hydrogen atom or an alkyl group containing 1 to 10 carbon atoms. $P^{18}$ to $P^{21}$ are each independently a hydrogen atom or a group as represented by the general formula (25) given above, and at least two of $P^{18}$ to $P^{21}$ are groups as represented by the general formula (25) given above. Furthermore, h, j, and k are each independently an integer of 0 or 1, and l is an integer of 0 to 10.

In general formula (28), $X^{29}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms. It is preferable that h, i, j and k are each independently an integer of 1 and that l is an integer of 0 to 5. The aforementioned alkyl groups, alkylene chains, aliphatic structures, alicyclic structures, and aromatic structures may each contain a heteroatom and may each be either a non-substitution product or a substitution product. In general formula (28), it is preferable that two or more, more preferably three or more, and still more preferably four or more, of $Y^{34}$ to $Y^{37}$ are groups as represented by general formula (24). If two or more of $Y^{34}$ to $Y^{37}$ are groups as represented by general formula (24), it serves to ensure an improved sensitivity in the light exposure step and depress the formation of development residues after the development step.

It is preferable for the flexible chain-containing aliphatic radical polymerizable compound (B3) to contain at least one lactone modified chain and/or at least one lactam modified chain. The incorporation of at least one lactone modified chain and/or at least one lactam modified chain in the flexible chain-containing aliphatic radical polymerizable compound (B3) serves to depress the formation of development residues after the development step and ensure improved halftone characteristics.

In the case where the flexible chain-containing aliphatic radical polymerizable compound (B3) is a compound as represented by the general formula (27) given above or a compound as represented by the general formula (28) given above and also where c is 1 and e is 1 in the aforementioned general formula (24), the flexible chain-containing aliphatic radical polymerizable compound (B3) has at least one lactone modified chain and/or at least one lactam modified chain.

It is preferable for the flexible chain-containing aliphatic radical polymerizable compound (B3) to contain, in the molecule, two or more, more preferably three or more, and still more preferably four or more ethylenically unsaturated double bond groups. The existence of two or more ethylenically unsaturated double bond groups ensures an improved sensitivity in the light exposure step. On the other hand, it is preferable for the flexible chain-containing aliphatic radical polymerizable compound (B3) to contain, in the molecule, 12 or less, more preferably 10 or less, still more preferably 8 or less, and particularly preferably 6 or less ethylenically unsaturated double bond groups. The incorporation of 12 or less ethylenically unsaturated double bond groups allows a pattern having a small-tapered shape to be formed after the heat curing step and serves to depress the difference in the width of patterned openings between before and after the heat curing step. In addition, this also serves to ensure improved halftone characteristics.

From the viewpoint of ensuring an improved sensitivity in the light exposure step and depressing the formation of development residues after the development step, it is preferable for the ethylenically unsaturated double bond groups existing in each molecule of the flexible chain-containing aliphatic radical polymerizable compound (B3) to be (meth)acrylic groups, which undergo radical polymerization easily, and it is preferable for each molecule to contain two or more (meth)acrylic groups.

It is preferable for the flexible chain-containing aliphatic radical polymerizable compound (B3) to have a double bond equivalent of 100 g/mol or more, more preferably 120 g/mol or more, still more preferably 150 g/mol or more, still more preferably 170 g/mol or more, and particularly preferably 200 g/mol or more. If the double bond equivalent is 100 g/mol or more, it ensures improved sensitivity in the light exposure step and serves to depress the formation of development residues after the development step. In addition, the difference in the width of patterned openings between before and after the heat curing step can be depressed and improved halftone characteristics can be ensured. On the other hand, it is preferable for the flexible chain-containing aliphatic radical polymerizable compound (B3) to have a double bond equivalent of 800 g/mol or less, more preferably 600 g/mol or less, still more preferable 500 g/mol or less, and particularly preferably 450 g/mol or less. If the double bond equivalent is 800 g/mol or less, it ensures improved sensitivity in the light exposure step and serves to depress the formation of development residues after the development step. In addition, the difference in the width of patterned openings between before and after the heat curing step can be depressed and improved halftone characteristics can be ensured.

It is preferable for the flexible chain-containing aliphatic radical polymerizable compound (B3) to have a molecular weight of 500 or more, more preferably 700 or more, still more preferably 800 or more, still more preferably 900 or more, and particularly preferably 1,000 or more. If the molecular weight is 700 or more, it ensures improved sensitivity in the light exposure step and serves to depress the formation of development residues after the development step. In addition, the difference in the width of patterned openings between before and after the heat curing step can be depressed and improved halftone characteristics can be ensured. On the other hand, it is preferable for the flexible chain-containing aliphatic radical polymerizable compound (B3) to have a molecular weight of 3,000 or less, more preferably 2,700 or less, still more preferably 2,400 or less, and particularly preferably 2,200 or less. If the molecular weight is 3,000 or less, it ensures improved sensitivity in the light exposure step and serves to depress the formation of development residues after the development step. In addition, the difference in the width of patterned openings between before and after the heat curing step can be depressed and improved halftone characteristics can be ensured.

It is also preferable for the flexible chain-containing aliphatic radical polymerizable compound (B3) to a compound containing at least one lactone modified chain and/or at least one lactam modified chain and also containing two ethylenically unsaturated double bond groups (hereinafter referred to as flexible chain-containing difunctional aliphatic radical polymerizable compound). If a flexible chain-containing difunctional aliphatic radical polymerizable compound is contained, it serves to form a small-tapered pattern after the development step and furthermore depresses the reflow in the edge of the pattern in the heat curing step, making it possible to reduce the difference in the width of patterned openings between before and after the heat curing step. It is inferred that this is because the existence of two ethylenically unsaturated double bond groups acts to prevent excessive curing of the film surface in the light exposure step while the existence of at least one lactone modified chain and/or at least one lactam modified chain serves to increase the probability of collisions between ethylenically unsaturated double bond groups in the deepest region to promote the UV curing and lead to an increased crosslink density. In addition, the incorporation of flexible chain-containing difunctional aliphatic radical polymerizable compounds serves to allow the pattern shape to be controlled after the development step to permit the formation of a small-tapered pattern shape, thereby realizing improved halftone characteristics.

Such a flexible chain-containing difunctional aliphatic radical polymerizable compound is preferably a compound as represented by the general formula (27) given above wherein two of $P^{12}$ to $P^{17}$ are groups as represented by the general formula (25) given above and also wherein c is 1 and e is 1 in the general formula (24) given above. For the compounds represented by the general formula (28) given above, it is preferable that two of $P^{18}$ to $P^{21}$ are groups as represented by the general formula (25) given above and also that c is 1 and e is 1 in the general formula (24) given above. It is also preferable for the flexible chain-containing difunctional aliphatic radical polymerizable compound to be a compound as represented by general formula (32).

[Chemical compound 23]

(32)

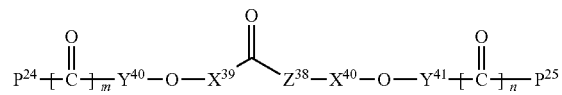

In general formula (32), $X^{39}$ and $X^{40}$ are each independently a divalent organic group. $Y^{40}$ and $Y^{41}$ are each independently a direct bond or a group as represented by the general formula (24) given above, and at least either $Y^{40}$ or $Y^{41}$ is a group as represented by the general formula (24) given above. $Z^{38}$ is a direct bond or an oxygen atom. $P^{24}$ and $P^{25}$ are each a group as represented by general formula (25). Furthermore, m and n are each independently 0 or 1. In the general formula (24) given above, c is 1 and e is 1. In general formula (32), $X^{39}$ and $X^{40}$ are each preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. Here, it is preferable that c and d are each independently 1. The aforementioned aliphatic structures, alicyclic structures, and aromatic structures may each contain a heteroatom and may each be either a non-substitution product or a substitution product.

Specific examples of the flexible chain-containing aliphatic radical polymerizable compound (B3) include compounds containing three or more ethylenically unsaturated double bond groups in the molecule such as ethoxylated dipentaerythritol hexa(meth)acrylate, propoxylated dipentaerythritol hexa(meth)acrylate, ε-caprolactone modified dipentaerythritol hexa(meth)acrylate, δ-valerolactone modified dipentaerythritol hexa(meth)acrylate, γ-butyrolactone modified dipentaerythritol hexa(meth)acrylate, β-propiolactone modified dipentaerythritol hexa(meth)acrylate, ε-caprolactam modified dipentaerythritol hexa(meth)acrylate, ε-caprolactone modified dipentaerythritol penta(meth)acrylate, ε-caprolactone modified trimethylolpropane tri(meth)acrylate, ε-caprolactone modified ditrimethylolpropane tetra(meth)acrylate, ε-caprolactone modified glycerin tri(meth)acrylate, ε-caprolactone modified pentaerythritol tri(meth)acrylate, ε-caprolactone modified pentaerythritol tetra(meth)acrylate, and ε-caprolactone modified 1,3,5-tris-((meth)acryloxyethyl) isocyanuric acid, as well as KAYARAD (registered trademark) DPEA-12, DPCA-20, DPCA-30, DPCA-60, and DPCA-120 (all manufactured by Nippon Kayaku Co., Ltd.) and NK ESTER (registered trademark) A-DPH-6E, A-DPH-6P, M-DPH-6E, A-9300-1CL, and A-9300-3CL (all manufactured by Shin-Nakamura Chemical Co., Ltd.).

They also include compounds containing two ethylenically unsaturated double bond groups in the molecule such as ε-caprolactone modified hydroxypivalic acid-based neopentyl glycol di(meth)acrylate, ε-caprolactone modified trimethylolpropane di(meth)acrylate, ε-caprolactone modified ditrimethylolpropane di(meth)acrylate, ε-caprolactone modified glycerin di(meth)acrylate, ε-caprolactone modified pentaerythritol di(meth)acrylate, ε-caprolactone modified dimethylol-tricyclodecane di(meth)acrylate, ε-caprolactone modified 1,3-bis((meth)acryloxy ethyl) isocyanuric acid, ε-caprolactone modified 1,3-bis((meth)acryloxyethyl) isocyanuric acid, and KAYARAD (registered trademark) HX-220 and HX-620 (all manufactured by Nippon Kayaku Co., Ltd.). A flexible chain-containing aliphatic radical polymerizable compound (B3) can be synthesized by a generally known method.

In the negative type photosensitive resin composition according to the present invention, the flexible chain-containing aliphatic radical polymerizable compound (B3) preferably accounts for 5 parts by mass or more, more preferably 10 parts by mass or more, still more preferably 15 parts by mass or more, and particularly preferably 20 parts by mass or more, relative to the total quantity, which accounts for 100 parts by mass, of the alkali-soluble resin (A) and the radical polymerizable compound (B). If the content is 5 parts by mass or more, it ensures improved sensitivity in the light exposure step and serves to depress the formation of development residues after the development step. In addition, the difference in the width of patterned openings between before and after the heat curing step can be depressed. Furthermore, the content of the flexible chain-containing aliphatic radical polymerizable compound (B3) is preferably 45 parts by mass or less, more preferably 40 parts by mass or less, still more preferably 35 parts by mass or less, and particularly preferably 30 parts by mass or less. A content of 45 parts by mass or less ensures the formation of a cured film having a small-tapered pattern shape.

For the negative type photosensitive resin composition according to the present invention, it is preferable that the radical polymerizable compound (B) contains a fluorene backbone-containing radical polymerizable compound (B1) and/or an indane backbone-containing radical polymerizable compound (B2) and also contains a flexible chain-containing aliphatic radical polymerizable compound (B3). In the negative type photosensitive resin composition according to the present invention, the total quantity of the fluorene backbone-containing radical polymerizable compound (B1) and the indane backbone-containing radical polymerizable compound (B2) preferably accounts for 1 part by mass or more, more preferably 3 parts by mass or more, still more preferably 5 parts by mass or more, still more preferably 10 parts by mass or more, and particularly preferably 15 parts by mass or more, relative to the total quantity, which accounts for 100 parts by mass, of the fluorene backbone-containing radical polymerizable compound (B1), the indane backbone-containing radical polymerizable compound (B2), and the flexible chain-containing aliphatic radical polymerizable compound (B3). A content of 1 part by mass or more ensures not only an improved sensitivity in the light exposure step and a small-tapered pattern shape after the development step realized by the control of the pattern shape, but also a small-tapered pattern shape formed after the heat curing step. In addition, the difference in the width of patterned openings between before and after the heat curing step can be depressed. This also serves to ensure improved halftone characteristics. On the other hand, it is preferable for the total quantity of the fluorene backbone-containing radical polymerizable compound (B1) and indane-backbone-containing radical polymerizable compound (B2) to account for 70 parts by mass or less, more preferably 65 parts by mass or less, still more preferably 60 parts by mass or less, still more preferably 55 parts by mass or less, and particularly preferably 50 parts by mass or less. If the content is 70 parts by mass or less, it ensures improved sensitivity in the light exposure step and serves to depress the formation of development residues after the development step. In addition, the difference in the width of patterned openings between before and after the heat curing step can be depressed.

<Negative Type Photosensitivity>

The negative type photosensitive resin composition according to the present invention contains a photo initiator (C-1) as the photosensitive agent (C).

<Photo Initiator (C1)>

A photo initiator (C1) is a compound that generates radicals as a result of bond cleavage and/or a reaction that occur when exposed to light. The incorporation of the photo initiator (C1) acts to cause radical polymerization of the radical polymerizable compound (B), and the light-exposed region of the film of the resin composition becomes insoluble in the alkaline developer, thereby serving to form a negative type pattern. Furthermore, the UV curing in the light exposure step is promoted to improve the sensitivity.

Furthermore, if the photo initiator (C1) accounts for a specific content or more, the difference in the width of patterned openings between before and after the heat curing step can be depressed. It is inferred that this is attributed to an increased radical generation caused by the photo initiator (C1) in the light exposure step. More specifically, an increased radical generation in the light exposure step gives rise to an increase in the probability of collisions between the radicals generated and the ethylenically unsaturated double bond groups in the radical polymerizable compound (B) and the UV curing is promoted to increase the crosslink density, serving to depress the reflow in the tapered part and edge of the pattern in the heat curing step and hence reduce the difference in the width of patterned openings between before and after the heat curing step.

Preferable examples of the photo initiator (C1) include benzylketal based photo initiator, α-hydroxyketone based photo initiator, α-aminoketone based photo initiator, acyl phosphine oxide based photo initiator, oxime ester based photo initiator, acridine based photo initiator, titanocene based photo initiator, benzophenone based photo initiator, acetophenone based photo initiator, aromatic ketoester based photo initiator, and benzoic acid ester based photo initiator, of which α-hydroxyketone based photo initiator, α-aminoketone based photo initiator, acyl phosphine oxide based photo initiator, oxime ester based photo initiator, acridine based photo initiator, and benzophenone based photo initiator are more preferable from the viewpoint of ensuring an improved sensitivity in the light exposure step, and among others, α-aminoketone based photo initiator, acyl phosphine oxide based photo initiator, and oxime ester based photo initiator are still more preferable.

Examples of the benzyl ketal based photo initiator include 2,2-dimethoxy-1,2-diphenylethane-1-one.

Examples of the α-hydroxyketone based photo initiator include 1-(4-isopropylphenyl)-2-hydroxy-2-methylpropane-1-one, 2-hydroxy-2-methyl-1-phenylpropane-1-one, 1-hydroxycyclohexylphenyl ketone, 1-[4-(2-hydroxyethoxy) phenyl]-2-hydroxy-2-methylpropane-1-one, and 2-hydroxy-1-[4-[4-(2-hydroxy-2-methylpropionyl) benzyl] phenyl]-2-methylpropane-1-one.

Examples of the α-aminoketone based photo initiator include 2-methyl-1-[4-(methylthio) phenyl]-2-morpholinopropane-1-one, 2-benzyl-2-dimethylamino-1-(4-morpholinophenyl)-butane-1-one, 2-dimethylamino-2-(4-methylbenzyl)-1-(4-morpholinophenyl)-butane-1-one, and 3,6-bis(2-methyl-2-morpholinopropionyl)-9-octyl-9H-carbazole.

Examples of the acyl phosphine oxide based photo initiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photo initiator include 1-phenylpropane-1,2-dione-2-(O-ethoxycarbonyl) oxime, 1-phenylbutane-1,2-dione-2-(O-methoxycarbonyl) oxime, 1,3-diphenylpropane-1,2,3-trione-2-(O-ethoxycarbonyl) oxime, 1-[4-(phenylthio)phenyl] octane-1,2-dione-2-(O-benzoyl) oxime, 1-[4-[4-carboxyphenylthio] phenyl] propane-1,2-dione-2-(O-acetyl) oxime, 1-[4-[4-(2-hydroxyethoxy) phenylthio] phenyl] propane-1,2-dione-2-(O-acetyl) oxime, 1-[4-(phenylthio) phenyl]-3-cyclopentylpropane-1,2-dione-2-(O-benzoyl) oxime, 1-[4-(phenylthio) phenyl]-2-cyclopentylethane-1,2-dione-2-(O-acetyl) oxime, 1-[9,9-diethylfluorene-2-yl] propane-1,2-dione-2-(O-acetyl) oxime, 1-[9,9-di-n-propyl-7-(2-methylbenzoyl)-fluorene-2-yl] ethanone-1-(O-acetyl) oxime, 1-[9-ethyl-6-(2-methylbenzoyl)-9H-carbazole-3-yl] ethanone-1-(O-acetyl) oxime, 1-[9-ethyl-6-[2-methyl-4-[1-(2,2-dimethyl-1,3-dioxolan-4-yl) methyloxy] benzoyl]-9H-carbazole-3-yl] ethanone-1-(O-acetyl) oxime, 1-[9-ethyl-6-(2-methylbenzoyl)-9H-carbazole-3-yl]-3-cyclopentylpropane-1-one-1-(O-acetyl) oxime, and 1-(9-ethyl-6-nitro 9H-carbazole-3-yl)-1-[2-methyl-4-(1-methoxypropane-2-yloxy) phenyl] methanone-1-(O-acetyl) oxime.

Examples of the acridine based photo initiator include 1,7-bis(acridine-9-yl)-n-heptane.

Examples of the titanocene based photo initiator include bis($\eta^5$-2,4-cyclopentadiene-1-yl)-bis[2,6-difluoro-3-(1H-pyrrole-1-yl)phenyl] titanium (IV) and bis($\eta^5$-3-methyl-2,4-cyclopentadiene-1-yl)-bis(2,6-difluorophenyl) titanium (IV).

Examples of the benzophenone based photo-initiator include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, and fluorenone.

Examples of the acetophenone based photo initiator include 2,2-diethoxyacetophenone, 2,3-diethoxyacetophenone, 4-t-butyldichloroacetophenone, benzalacetophenone, and 4-azidebenzalacetophenone.

Examples of the aromatic keto ester based photo initiator include methyl 2-phenyl-2-oxyacetate.

Examples of the benzoic acid ester based photo initiator include ethyl 4-(dimethylamino)benzoate, (2-ethyl)hexyl 4-(dimethylamino)benzoate, ethyl 4-(diethylamino)benzoate, and methyl 2-benzoylbenzoate.

In the negative type photosensitive resin composition according to the present invention, the photo initiator (C1) preferably accounts for 10 parts by mass or more, more preferably 12 parts by mass or more, still more preferably 14 parts by mass or more, and particularly preferably 15 parts by mass or more, relative to the total quantity, which accounts for 100 parts by mass, of the alkali-soluble resin (A) and the radical polymerizable compound (B). If the content is 10 parts by mass or more, the difference in the width of patterned openings between before and after the heat curing step can be depressed. On the other hand, the content of the photo initiator (C1) is preferably 30 parts by mass or less, more preferably 25 parts by mass or less, still more preferably 22 parts by mass or less, and particularly preferably 20 parts by mass or less. A content of 30 parts by mass or less ensures an improved resolution after the development step and the formation of a cured film having a small-tapered pattern.

<Photo Acid Generator (C2)>

The negative type photosensitive resin composition according to the present invention may further contain a photo acid generator (C2) as a photosensitive agent (C). A photo acid generator (C2) is a compound that generates an acid as a result of bond cleavage that occurs when exposed to light.

The incorporation of the photo acid generator (C2) serves to accelerate the UV curing in the light exposure step to ensure an improved sensitivity. In addition, the crosslink density after the heat-curing of the resin composition will increase, leading to a cured film having an improved chemical resistance. There are ionic compounds and nonionic compounds that can work as the photo acid generator (C2).

The photo acid generator (C2) for the ionic compounds is preferably free of heavy metals or halogen ions, and the use of a triorganosulfonium salt based compound is more preferable. Such triorganosulfonium salt based compounds include, for example, methane sulfonates, trifluoromethane sulfonates, camphor sulfonates, and 4-toluene sulfonates of triphenyl sulfonium; methane sulfonates, trifluoromethane sulfonates, camphor sulfonates, and 4-toluene sulfonates of dimethyl-1-naphthyl sulfonium; methane sulfonates, trifluoromethane sulfonates, camphor sulfonates, and 4-toluene sulfonates of dimethyl(4-hydroxy-1-naphthyl) sulfonium; methane sulfonates, trifluoromethane sulfonates, camphor sulfonates, and 4-toluene sulfonates of dimethyl(4,7-dihydroxy-1-naphthyl) sulfonium; methane sulfonates, trifluoromethane sulfonates, camphor sulfonates, and 4-toluene sulfonates of diphenyl iodonium.

Examples of the photo acid generator (C2), which is a nonionic compound, include halogen-containing compounds, diazomethane compounds, sulfone compounds, sulfonic acid ester compounds, carboxylic acid ester compounds, sulfone imide compounds, phosphoric acid ester compounds, and sulfone benzotriazole compounds.

Of these photo acid generators (C2), the nonionic compounds are preferable to the ionic compounds from the viewpoint of solubility and cured film's insulation properties. From the viewpoint of the strength of the acid to be generated, more preferable are those which generate benzenesulfonic acid, 4-toluenesulfonic acid, perfluoroalkylsulfonic acid, or phosphoric acid. Sulfonic acid ester compounds, sulfonimide compound, and iminosulfonic acid ester compounds are still more preferable from the viewpoint of high sensitivity in terms of the quantum yield for the j-line (wavelength 313 nm), i-line (wavelength 365 nm), h-line (wavelength 405 nm), and g-line (wavelength 436 nm) and the transparency of the resulting cured films.

In the negative type photosensitive resin composition according to the present invention, the photo acid generator (C2) preferably accounts for 0.1 part by mass or more, more preferably 0.5 part by mass or more, still more preferably 0.7 part by mass or more, and particularly preferably 1 part by mass or more, relative to the total quantity, which accounts for 100 parts by mass, of the alkali-soluble resin (A) and the radical polymerizable compound (B). A content of 0.1 part by mass or more ensures an improved sensitivity in the light exposure step. On the other hand, the content of the photo acid generator (C2) is preferably 25 parts by mass or less, more preferably 20 parts by mass or less, still more preferably 17 parts by mass or less, and particularly preferably 15 parts by mass or less. A content of 25 parts by mass or less ensures an improved resolution after the development step and the formation of a pattern having a small-tapered shape.

<Coloring Agent (D), Black Colorant (Da), and Non-Black Coloring Agent (Db)>

The negative type photosensitive resin composition according to the present invention further contain a black colorant (Da) as the coloring agent (D). The coloring agent (D) is a compound that absorbs light in a specific wavelength range and in particular, it is a compound that acts to color a material by absorbing light in the visible light wavelength range (380 to 780 nm).

The incorporation of the coloring agent (D) serves to obtain a colored film from a negative type photosensitive resin composition and impart coloring capability to the film prepared from a resin composition to allow the light penetrating the film of the resin composition or the light reflected by the film of the resin composition to have a desired color. It also serves to impart light-shielding capability so that light in a wavelength range is absorbed by the coloring agent (D) and removed from the light penetrating the film of the resin composition or the light reflected by the film of the resin composition.

The coloring agent (D) may be a compound that absorbs light in a visible light wavelength range for coloring in white, red, orange, yellow, green, blue, or violet. Two or more of such coloring agents may be used in combination to ensure an improved toning capability so that the color coordinates of the light penetrating the film of the resin composition or the light reflected by the film of the resin composition can be adjusted as desired.

The negative type photosensitive resin composition according to the present invention contains a black colorant (Da) as an essential component of the coloring agent (D). The black colorant (Da) is a compound that acts to color a material black by absorbing light in the visible light wavelength range. If containing the black colorant (Da), the film of a resin composition turns black to improve the light-shielding capability so that the light penetrating the film of the resin composition or reflected by the film of the resin composition is blocked. Thus, such a film can be used suitably in such components as light-shielding films for black matrices of color filters, black column spacers of liquid crystal display devices, etc., pixel dividing layers and TFT planarization layers of organic EL display devices, that require increased contrast realized by depression of external light reflection.

For the coloring agent (D), a color that meets a Color Index Generic Number (hereinafter referred to as C.I. number) that contains "BLACK" is regarded as black. In the case of a coloring agent that has no C.I. number, it is regarded as black if the resulting cured film is black. In the case of a mixture of two or more coloring agents (D) having non-black C.I. numbers or a mixture of two or more coloring agents (D) that contains at least one coloring agent (D) having no C.I. number, it is regarded as black if the resulting cured film is black. Regarding the expression "regarded as black if the resulting cured film is black", a cured film of a resin composition containing a coloring agent (D) is examined to obtain a transmission spectrum and the transmittance per 1.0 µm of film thickness at a wavelength of 550 nm is assigned to the Lam bert-Beer's equation to give a film thickness in the range of 0.1 to 1.5 µm where the transmittance at a wavelength of 550 nm is 10%. The expression applies when the transmittance in the wavelength rage of 450 to 650 nm is 25% or less in the converted transmission spectrum.

The transmission spectrum of a cured film can be obtained by the method described below. A resin composition containing at least an appropriate binder resin and a coloring agent (D) is prepared in such a manner that the coloring agent (D) accounts for 35 mass % of the total solid content of the resin composition. The resin composition is spread over a substrate of Tempax glass (manufactured by AGC Techno Glass Co., Ltd.) to form a film and prebaked at 110° C. for 2 minutes to form a prebaked film. Using a high temperature inert gas oven (INH-9CD-S, manufactured by Koyo Thermo Systems Co., Ltd.), it is heat-cured in a nitrogen atmosphere at 250° C. for 60 minutes to prepare a cured film with a film of the resin composition containing a coloring agent (D) having a thickness of 1.0 µm (hereinafter referred to as coloring agent-containing cured film). Elsewhere, a resin composition containing the aforementioned binder resin but not containing the coloring agent (D) is prepared, spread over a Tempax glass substrate by a method similar to the above one, prebaked, and heat-cured to form a 1.0 µm thick cured film of the resin composition which does not containing the coloring agent (D) (hereinafter referred to as blank cured film). First, using an ultraviolet-visible spectrophotometer (MultiSpec-1500, manufactured by Shimadzu Corporation), a Tempax glass substrate coated with a blank cured film having a film thickness of 1.0 µm is examined to provide a blank ultraviolet-visible absorption spectrum. Then, the Tempax glass substrate carrying the coloring agent-containing cured film prepared above is examined using a single beam to determine the transmittance per 1.0 μm of film thickness in the wavelength range of 450 to 650 nm, and its difference from the blank is used to calculate the transmittance of the coloring agent-containing cured film.

From the viewpoint of light-shielding capability, the black colorant (Da) is preferably a compound that turns to black by absorbing light over the entire visible light wavelength range. It is also preferable for the coloring agent (D) to be a mixture of two or more selected from coloring agents of white, red, orange, yellow, green, blue, and violet. A combination of two or more of these coloring agents (D) can act to color a material pseudo-black to ensure an improved light-shielding capability.

For the negative type photosensitive resin composition according to the present invention, the black coloring agent (Da) preferably contains one or more selected from the group consisting of the black pigment (D1a), black dye (D2a-1), and a mixture of two or more dyes (D2a-2), which will be described later, and the incorporation of the black pigment (D1a), which will be described later, is particularly preferable from the viewpoint of light-shielding capability.

The non-black coloring agent (Db) is a compound that acts to color a material by absorbing light in a visible light wavelength range. Specifically, they are coloring agents that serve for coloring in non-black colors including white, red, orange, yellow, green, blue, and violet, as described above. The incorporation of the black coloring agent (Da) and a non-black coloring agent (Db) serves to impart light-shielding capability as well as coloring capability and/or toning capability to the film of a resin composition.

For the negative type photosensitive resin composition according to the present invention, the non-black coloring agent (Db) preferably contains the non-black pigment (D1b) and/or the non-black dye (D2b), which will be described later, and more preferably contains the non-black pigment (D1b), which will be described later, from the viewpoint of light-shielding capability, and heat resistance or weather resistance.

In the negative type photosensitive resin composition according to the present invention, it is preferable for the coloring agent (D) to account for 15 mass % or more, more preferably 20 mass % or more, still more preferably 25 mass % or more, and particularly preferably 30 mass % or more, of the total quantity, which accounts for 100 mass %, of the alkali-soluble resin (A), the coloring agent (D), and the dispersant (E) which will be described later. A content of 15 mass % or more ensures an improved light-shielding capability, coloring capability, or toning capability. On the other hand, it is preferable for the coloring agent (D) to account for 80 mass % or less, more preferably 75 mass % or less, still more preferably 70 mass % or less, and particularly preferably 65 mass % or less. A content of 80 mass % or less ensures an improved sensitivity in the light exposure step.

Furthermore, it is preferable for the coloring agent (D) to account for 5 mass % or more, more preferably 10 mass % or more, still more preferably 15 mass % or more, and particularly preferably 20 mass % or more, of the total solid content, excluding the solvent, of the negative type photosensitive resin composition according to the present invention. A content of 5 mass % or more ensures an improved light-shielding capability, coloring capability, or toning capability. On the other hand, it is preferable for the coloring agent (D) to account for 70 mass % or less, more preferably 65 mass % or less, still more preferably 60 mass % or less, still more preferably 55 mass % or less, and particularly preferably 50 mass % or less. A content of 70 mass % or less ensures an improved sensitivity in the light exposure step.

In the negative type photosensitive resin composition according to the present invention, the preferred content of the black colorant (Da) is the same as the aforementioned preferred content of the coloring agent (D).

<Pigment (D1), Organic Pigment (D1-1), and Inorganic Pigment (D1-2)>

For the negative type photosensitive resin composition according to the present invention, the coloring agent (D) preferably contains a pigment (D1). As an embodiment relating to the incorporation of the pigment (D1) in the coloring agent (D), it necessarily contains a black colorant (Da) and may optionally contain a non-black coloring agent (Db).

The pigment (D1) is a compound that works to color a material by physical adsorption of the pigment (D1) on the surface of the material or interaction of the pigment (D1) with the surface of the material, and it is insoluble in most solvents etc. The pigment (D1) serves for coloring with high hiding power and can prevent color fading from being caused by ultraviolet ray etc. The incorporation of the pigment (D1) ensures coloring in a color with high hiding power and allows the film of the resin composition to have an improved light-shielding capability and weather resistance.

The number average particle diameter of the pigment (D1) is preferably 1 to 1,000 nm, more preferably 5 to 500 nm, and still more preferably 10 to 200 nm. If the pigment (D1) has a number average particle diameter in the 1 to 1,000 nm, the film of the resin composition will have an improved light-shielding capability and the pigment (D1) will have an improved dispersion stability.

Here, the number average particle diameter of the pigment (D1) can be determined from laser scattering attributed to the Brownian movement of the pigment (D1) in a solution (dynamic light scattering method) that is measured by a submicronic particle size distribution measuring apparatus (N4-PLUS, manufactured by Beckman Coulter K.K.) or a zeta potential/particle diameter/molecular weight measuring apparatus (Zetasizer Nano ZS, manufactured by Sysmex Corporation). On the other hand, the number average particle diameter of the pigment (D1) in a cured film prepared from a resin composition can be measured by scanning electron microscope (hereinafter referred to as SEM) and transmission electron microscope (hereinafter referred to as TEM). The number average particle diameter of the pigment (D1) is measured directly at a magnification of 50,000 to 200,000 times. If the pigment (D1) is in the form of perfectly spherical particles, the diameter of the perfect sphere is measured and used as the number average particle diameter. If the pigment (D1) is not in the form of perfectly spherical particles, the longest size across each particle (hereinafter long diameter) and the longest size in the direction perpendicular to the longest diameter (hereinafter short diameter) are measured and the long diameter and the short diameter are averaged to calculate the biaxial average diameter, which is adopted as the number average particle diameter.

The pigment (D1) may be, for example, an organic pigment (D1-1) or an inorganic pigment (D1-2). Examples of the organic pigment (D1-1) include phthalocyanine based pigments, anthraquinone based pigments, quinacridone based pigments, dioxazine based pigments, thioindigo based pigments, diketopyrrolopyrrole based pigments, threne based pigments, indoline based pigments, benzofuranone based pigments, perylene based pigments, aniline based pigments, azo based pigments, condensed azo based pigments, and carbon black. Examples of the inorganic pigment (D1-2) include titanium oxide, barium carbonate, zirconium oxide, calcium carbonate, barium sulfate, white carbon, alumina white, silicon dioxide, graphite, and silver tin alloy, as well as fine particles, oxides, composite oxides, sulfides, sulfates, nitrates, carbonates, nitrides, carbides, and acid nitrides of metals such as titanium, copper, iron, manganese, cobalt, chromium, nickel, zinc, calcium, and silver. In the total solid, excluding the solvent, in the negative type photosensitive resin composition according to the present invention, the preferred contents of the pigment (D1), organic pigment (D1-1) and inorganic pigment (D1-2) are the same as the aforementioned preferred content of the coloring agent (D).

<Black Pigment (D1a) and Non-Black Pigment (D1b)>

For the negative type photosensitive resin composition according to the present invention, the pigment (D1) preferably contains a black pigment (D1a), or a black pigment (D1 a) and a non-black pigment (D1b).

The black pigment (D1a) is a pigment that acts to color a material black by absorbing light in the visible light wavelength range. The incorporation of the black pigment (D1a) leads to the formation of a black film of the resin composition and, since it is also high in hiding power, the film of the resin composition will have an increased light-shielding capability.

For the negative type photosensitive resin composition according to the present invention, it is preferable that the black colorant (Da) is a black pigment (D1a) and that this black pigment (D1a) is one or more selected from the group consisting of a black organic pigment (D1a-1), a black inorganic pigment (D1a-2), and a mixture of two or more color pigments (D1a-3), which will be described later.

The non-black pigment (D1b) is a pigment that serves for coloring in a non-black color such as violet, blue, green, yellow, orange, red, and white by absorbing light in a visible light wavelength range. The incorporation of the non-black pigment (D1b) serves to provide a colored film of a resin composition and impart coloring capability or toning capability. The use of a combination of two or more non-black pigments (D1b) serves to provide a film of a resin composition having intended color coordinates to ensure an improved toning capability. The non-black pigment (D1b) is, for example, a pigment that serves for coloring in a non-black color such as white, red, orange, yellow, green, blue, and violet as described later.

For the negative type photosensitive resin composition according to the present invention, the non-black pigment (D1b) is preferably a non-black organic pigment (D1b-1) and/or a non-black inorganic pigment (D1b-2), which will be described later.

<Black Organic Pigment (D1a-1), Black Inorganic Pigment (D1a-2), and a Mixture of Two or More Pigments (D1a-3)>

For the negative type photosensitive resin composition according to the present invention, the black pigment (D1a) is preferably one or more selected from the group consisting of a black organic pigment (D1a-1), a black inorganic pigment (D1a-2), and a mixture of two or more color pigments (D1a-3).

The black organic pigment (D1a-1) is an organic pigment that acts to color a material black by absorbing light in the visible light wavelength range. The incorporation of the black organic pigment (D1a-1) leads to the formation of a black film of the resin composition and, since it is also high in hiding power, the film of the resin composition will have an increased light-shielding capability. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In addition, the black organic pigment (D1a-1) has better insulation properties and lower dielectricity than most inorganic pigments and accordingly, the incorporation of the black organic pigment (D1a-1) serves to produce a film with an improved resistance value. In particular, it serves to reduce light emission defects and improve the reliability when applied to insulation layers such as pixel dividing layers in organic EL display devices.

Examples of the black organic pigment (D1a-1) include anthraquinone based black pigments, benzofuranone based black pigments, perylene based black pigments, aniline based black pigments, azomethine based black pigments, and carbon black. Examples of carbon black include channel black, furnace black, thermal black, acetylene black, and lamp black. Channel black is preferable from the viewpoint of light blocking capability.

The black inorganic pigment (D1a-2) is an inorganic pigment that acts to color a material black by absorbing light in the visible light wavelength range. The incorporation of the black inorganic pigment (D1a-2) leads to the formation of a black film of the resin composition and, since it is also high in hiding power, the film of the resin composition will have an increased light-shielding capability. Being an inorganic substance and higher in heat resistance and weather resistance, furthermore, it will serve to provide a film of the resin composition that has an improved heat resistance and weather resistance.

Examples of the black inorganic pigment (D1a-2) include graphite, silver tin alloy, and fine particles, oxides, composite oxides, sulfides, sulfates, nitrates, carbonates, nitrides, carbides, and acid nitrides of graphite, silver tin alloy, and metals such as titanium, copper, iron, manganese, cobalt, chrome, nickel, zinc, calcium, and silver. From the viewpoint of improving the light-shielding capability, fine particles, oxides, composite oxides, sulfides, nitrides, carbides, and acid nitrides of titanium or silver are preferable, and nitrides and acid nitrides of titanium are more preferable.

The mixture of two or more pigments (D1a-3) is a combination of two or more pigments selected from pigments of white, red, orange, yellow, green, blue, and violet to work as a pigment mixture for coloring in pseudo-black. The incorporation of the mixture of two or more pigments (D1a-3) leads to the formation of a black film of the resin composition and, since it is also high in hiding power, the film of the resin composition will have an increased light-shielding capability. Being a mixture of two or more pigments, furthermore, it can work to permit transmission or blocking of light in an intended specific wavelength range and therefore, its toning capability can be improved by adjusting the transmission spectrum or absorption spectrum of the film of the resin composition.

Generally known black organic pigments, black inorganic pigments, red pigments, orange pigments, yellow pigments, green pigments, blue pigments, and violet pigments may be used. Examples of pigments serving for coloring in white include titanium oxide, barium carbonate, zirconium oxide, Chinese white, zinc sulfide, lead white, calcium carbonate, barium sulfate, white carbon, alumina white, silicon dioxide, kaolin clay, talc, and bentonite.

<Non-Black Organic Pigment (D1b-1) and Non-Black Inorganic Pigment (D1b-2)>

For the negative type photosensitive resin composition according to the present invention, the non-black pigment (D1b) is preferably a non-black organic pigment (D1b-1) and/or a non-black inorganic pigment (D1b-2).

The non-black organic pigment (D1 b-1) is an organic pigment that serves for coloring in a non-black color such as white, red, orange, yellow, green, blue, and violet by absorbing light in a visible light wavelength range. The incorporation of the non-black organic pigment (D1b-1) serves to provide a colored film of a resin composition and impart coloring capability or toning capability. Being an organic substance, furthermore, it will work to permit transmission or blocking of light in an intended specific wavelength range as it undergoes chemical structure modifications or functionality changes and therefore, its toning capability can be improved by adjusting the transmission spectrum or absorption spectrum of the film of the resin composition. The use of a combination of two or more non-black organic pigments (D1 b-1) serves to provide a film of a resin composition having intended color coordinates to ensure an improved toning capability. Examples of the non-black organic pigment (D1b-1) include organic pigments that serve for coloring in non-black colors such as white, red, orange, yellow, green, blue, and violet.

The non-black inorganic pigment (D1b-2) is an inorganic pigment that serves for coloring in a non-black color such as white, red, orange, yellow, green, blue, and violet by absorbing light in a visible light wavelength range. The incorporation of the non-black inorganic pigment (D1b-2) serves to provide a colored film of a resin composition and impart coloring capability or toning capability. Being an inorganic substance and higher in heat resistance and weather resistance, furthermore, it will serve to provide a film of the resin composition that has an improved heat resistance and weather resistance. The use of a combination of two or more non-black inorganic pigments (D1 b-2) serves to provide a film of a resin composition having intended color coordinates to ensure an improved toning capability. The use of a combination of two or more non-black inorganic pigments (D1 b-2) serves to provide a film of a resin composition having intended color coordinates to ensure an improved toning capability. Examples of the non-black inorganic pigments (D1 b-2) include inorganic pigments that serve for coloring in non-black colors such as white, red, orange, yellow, green, blue, and violet.

<Benzofuranone Based Black Pigment (D1a-1a), Perylene Based Black Pigment (D1 b), and Azo Based Black Pigment (D1a-1c)>

For the negative type photosensitive resin composition according to the present invention, the black organic pigment (D1a-1) is preferably one or more selected from the group consisting of a benzofuranone based black pigment (D1a-1a), a perylene based black pigment (D1a-1b), and an azo based black pigment (D1a-1c).

The incorporation of one or more selected from the group consisting of a benzofuranone based black pigment (D1a-1a), a perylene based black pigment (D1 b), and an azo based black pigment (D1a-1c) ensures the production of a black film of the resin composition and, since it is also high in hiding power, the film of the resin composition will have an increased light-shielding capability. In particular, as compared with common organic pigments, they are higher in light-shielding capability per unit pigment content in the resin composition and accordingly, a smaller quantity of them can be as effective in imparting lightshielding capability. Therefore, they serve not only to produce a film with an improved light-shielding capability, but also to ensure an improved sensitivity in the light exposure step. Being an organic substance, furthermore, they will work to permit transmission or blocking of light in an intended specific wavelength range as they undergo chemical structure modifications or functionality changes and therefore, their toning capability can be improved by adjusting the transmission spectrum or absorption spectrum of the film of the resin composition. In particular, being able to improve the transmittance in a near-infrared wavelength range (for example, 700 nm or more), it can be applied suitably to uses that require light-shielding capability and utilize light in a near-infrared wavelength range. In addition, having better insulation properties and lower dielectricity than most inorganic pigments and organic pigments and accordingly, they serve to produce a film with an improved resistance value. In particular, it serves to reduce light emission defects and improve the reliability when applied to insulation layers such as pixel dividing layers in organic EL display devices.

Furthermore, the benzofuranone based black pigment (D1a-1a) absorbs light in a visible light wavelength range while efficiently transmitting light in an ultraviolet wavelength range (for example, 400 nm or less), and accordingly the incorporation of the benzofuranone based black pigment (D1a-1a) ensures an improved sensitivity in the light exposure step.

The benzofuranone based black pigment (D1a-1a) is a compound having a benzofuran-2(3H)-one structure or a benzofuran-3(2H)-one structure in the molecule and serving for coloring in black by absorbing light in the visible light wavelength range.

On the other hand, if the benzofuranone based black pigment (D1a-1a) is added, development residues derived from the pigment may occur as a result of an insufficient alkali tolerance of the pigment, as described previously. Specifically, the surface of the benzofuranone based black pigment (D1a-1a) is exposed to an alkaline developer in the development step and accordingly, part of the surface is decomposed or dissolved sometimes to remain on the substrate as development residues from the pigment. In such a case, as described previously, a flexible chain-containing aliphatic radical polymerizable compound (B3), as well as the fluorene backbone-containing radical polymerizable compound (B1) or the indane backbone-containing radical polymerizable compound (B2) may be added in order to depress the formation of development residues from the pigment.

The benzofuranone based black pigment (D1a-1a) is preferably a benzofuranone compound as represented by any of general formulae (63) to (68), a geometrical isomer thereof, a salt thereof, or a geometrical isomer salt thereof.

[Chemical compound 24]

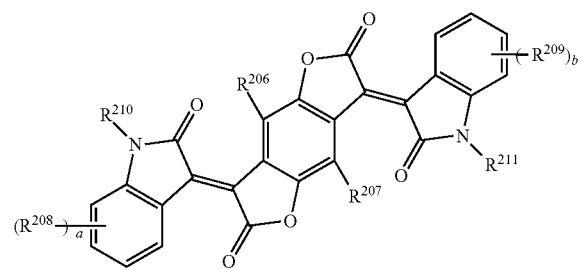

(63)

-continued (64)

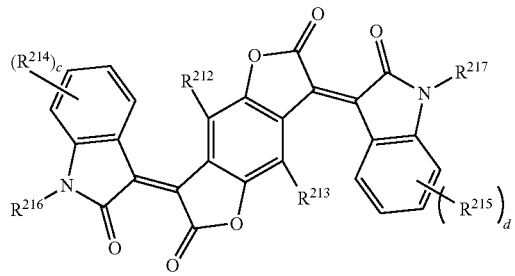

(65)

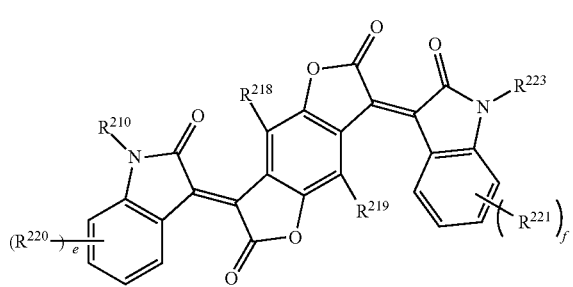

In general formulae (63) to (65), $R^{296}$, $R^{207}$, $R^{212}$, $R^{213}$, $R^{218}$, and $R^{219}$ are each independently a hydrogen atom, a halogen atom, an alkyl group containing 1 to 10 carbon atoms, or an alkyl group containing 1 to 20 fluorine atoms and 1 to 10 carbon atoms. $R^{298}$, $R^{209}$, $R^{214}$, $R^{215}$, $R^{220}$, and $R^{221}$ are each independently a hydrogen atom, a halogen atom, $R^{251}$, COOH, COOR$^{251}$, COO—, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3$—, SO$_2$NH$_2$, SO$_2$NHR$^{251}$, or SO$_2$NR$^{251}$R$^{252}$, and $R^{251}$ and $R^{252}$ are each independently an alkyl group containing 1 to 10 carbon atoms, an cycloalkyl group containing 4 to 10 carbon atoms, an alkenyl group containing 2 to 10 carbon atoms, a cycloalkenyl group containing 4 to 10 carbon atoms, or an alkynyl group containing 2 to 10 carbon atoms. A plurality selected from $R^{208}$, $R^{209}$, $R^{214}$, $R^{215}$, $R^{220}$, and $R^{221}$ may be connected by a direct bond, oxygen atom bridge, sulfur atom bridge, NH bridge, or NR$^{251}$ bridge to form a ring. $R^{210}$, $R^{211}$, $R^{216}$, $R^{217}$, $R^{222}$, and $R^{223}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4. The above alkyl group, cycloalkyl group, alkenyl group, cycloalkenyl group, alkynyl group, and aryl group may have a heteroatom, and may each be either a substitution product or a non-substitution product.

[Chemical compound 25]

(66)

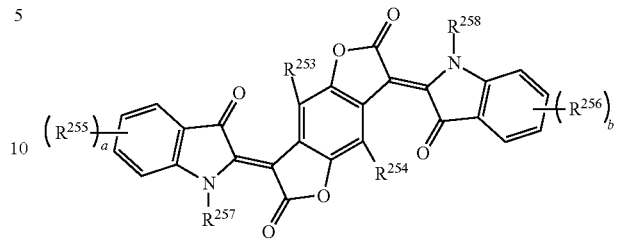

(67)

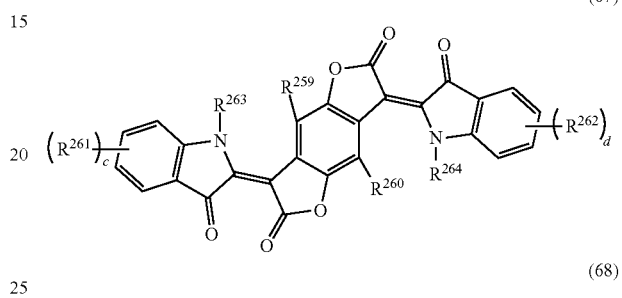

(68)

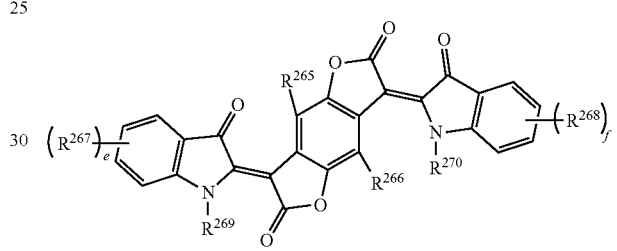

In general formulae (66) to (68), $R^{253}$, $R^{254}$, $R^{259}$, $R^{260}$, $R^{265}$, and $R^{266}$ are each independently a hydrogen atom, a halogen atom, an alkyl group containing 1 to 10 carbon atoms, or an alkyl group containing 1 to 20 fluorine atoms and 1 to 10 carbon atoms. $R^{255}$, $R^{256}$, $R^{261}$, $R^{262}$, $R^{267}$, and $R^{268}$ are each independently a hydrogen atom, a halogen atom, $R^{271}$, COOH, COOR$^{271}$, COO—, CONH$_2$, CONHR$^{271}$, CONR$^{271}$R$^{272}$, CN, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3$—, SO$_2$NH$_2$, SO$_2$NHR$^{271}$, or SO$_2$NR$^{271}$R$^{272}$, and $R^{271}$ and $R^{272}$ are each independently an alkyl group containing 1 to 10 carbon atoms, an cycloalkyl group containing 4 to 10 carbon atoms, an alkenyl group containing 2 to 10 carbon atoms, a cycloalkenyl group containing 4 to 10 carbon atoms, or an alkynyl group containing 2 to 10 carbon atoms. A plurality selected from $R^{255}$, $R^{256}$, $R^{261}$, $R^{262}$, $R^{267}$, and $R^{268}$ may be connected by a direct bond, oxygen atom bridge, sulfur atom bridge, NH bridge, or NR$^{271}$ bridge to form a ring. $R^{257}$, $R^{258}$, $R^{263}$, $R^{264}$, $R^{269}$, and $R^{279}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4. The above alkyl group, cycloalkyl group, alkenyl group, cycloalkenyl group, alkynyl group, and aryl group may have a heteroatom, and may each be either a non-substitution product or a substitution product.

Examples of the benzofuranone based black pigment (D1a-1a) include IRGAPHOR (registered trademark) BLACK S0100CF (manufactured by BASF), black pigments as described in International Publication WO 2010-

081624, and black pigments as described in International Publication WO 2010-081756.

The perylene based black pigment (D1a-1 b) is a compound having a perylene structure in the molecule and serving for coloring in black by absorbing light in the visible light wavelength range.

The perylene based black pigment (D1a-1b) is preferably a perylene compound as represented by any of general formulae (69) to (71), a geometrical isomer thereof, a salt thereof, or a geometrical isomer salt thereof.

[Chemical compound 26]

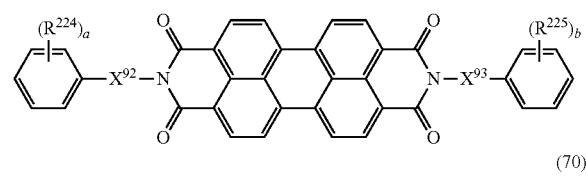

(69)

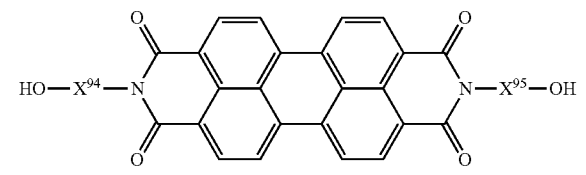

(70)

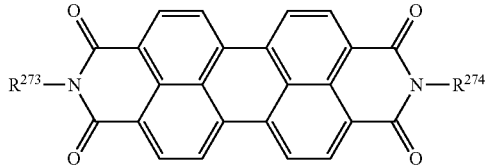

(71)

In general formulae (69) to (71), $X^{92}$, $X^{93}$, $X^{94}$, and $X^{95}$ are each independently an alkylene chain containing 1 to 10 carbon atoms. $R^{224}$ and $R^{225}$ are each independently a hydrogen atom, a hydroxyl group, an alkoxy group containing 1 to 6 carbon atoms, or an acyl group containing 2 to 6 carbon atoms. $R^{273}$ and $R^{274}$ are each independently a hydrogen atom or an alkyl group containing 1 to 10 carbon atoms. Furthermore, a and b are each an integer of 0 to 5. The above alkylene chain, alkoxy group, acyl group, and alkyl group may have a heteroatom, and may each be either a non-substitution product or a substitution product.

Examples of the perylene based black pigment (D1a-1 b) include Pigment Black 31 and 32 (each figure shows a C. I. number).

In addition to the above ones, other examples include PALIOGEN (registered trademark) BLACK S0084, K0084, L0086, K0086, EH0788, and FK4281 (all manufactured by BASF).

The azo based black pigment (D1a-1c) is a compound having an azo group in the molecule and serving for coloring in black by absorbing light in the visible light wavelength range.

The azo based black pigment (D1a-1c) is preferably an azo compound as represented by general formula (72).

[Chemical compound 27]

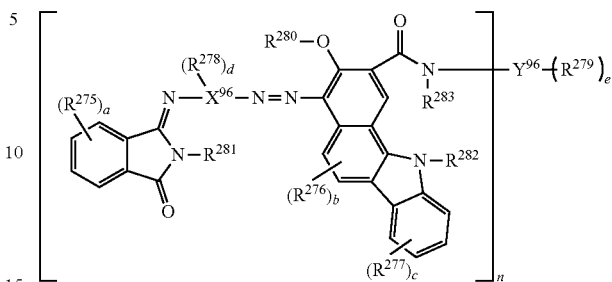

(72)

In general formula (72), $X^{96}$ is an arylene chain containing 6 to 15 carbon atoms. $Y^{96}$ is an arylene chain containing 6 to 15 carbon atoms. $R^{275}$, $R^{276}$, and $R^{277}$ are each independently a halogen atom or an alkyl group containing 1 to 10 carbon atoms. $R^{278}$ is a halogen atom, an alkyl group having 1 to 10 carbon atoms, an alkoxy group having 1 to 6 carbon atoms, or a nitro group. $R^{279}$ is a hydrogen atom, an alkyl group having 1 to 10 carbon atoms, an alkoxy group having 1 to 6 carbon atoms, an acylamino group having 2 to 10 carbon atoms, or a nitro group. $R^{280}$, $R^{281}$, $R^{282}$, and $R^{283}$ are each independently a hydrogen atom or an alkyl group containing 1 to 10 carbon atoms. Furthermore, a is an integer of 0 to 4; b is an integer of 0 to 2; c is an integer of 0 to 4; d, and e are each independently an integer of 0 to 8; and n is an integer of 1 to 4. The above arylene chain, alkyl group, alkoxy group, and acylamino group may each have a heteroatom, and may each be either a non-substitution product or a substitution product.

Examples of the azo based black pigment (D1a-1c) include CHROMOFINE (registered trademark) BLACK A1103 (manufactured by Dainichiseika Colour & Chemicals Mfg. Co., Ltd.), a black pigment as described in Japanese Unexamined Patent Publication (Kokai) No. HEI-01-170601, or a black pigment as described in Japanese Unexamined Patent Publication (Kokai) No. HEI-02-034664.

Furthermore, it is preferable for the aforementioned one or more selected from the group consisting of the benzofuranone based black pigment (D1a-1a), the perylene based black pigment (D1a-1b) and the azo based black pigment (D1a-1c) to account for 5 mass % or more, more preferably 10 mass % or more, still more preferably 15 mass % or more, and particularly preferably 20 mass % or more, of the total solid content, excluding the solvent, of the negative type photosensitive resin composition according to the present invention. A content of 5 mass % or more ensures an improved light-shielding capability and toning capability. On the other hand, it is preferable for the aforementioned one or more selected from the group consisting of the benzofuranone based black pigment (D1a-1a), the perylene based black pigment (D1a-1 b) and the azo based black pigment (D1a-1c) to account for 70 mass % or less, more preferably 65 mass % or less, still more preferably 60 mass % or less, still more preferably 55 mass % or less, and particularly preferably 50 mass % or less. A content of 70 mass % or less ensures an improved sensitivity in the light exposure step.

<Covering Layer (DC)>

For the negative type photosensitive resin composition according to the present invention, it is preferable for the black organic pigment (D1a-1) to further contain a covering layer (DC). The covering layer (DC) is, for example, a layer covering the pigment surface that is formed by surface treatment with a silane coupling agent, surface treatment with a silicate, surface treatment with a metal alkoxide, or surface treatment with a resin.

The incorporation of the covering layer (DC) serves to modify the surface state of the particles of the black organic pigment (D1a-1) by making the particle surface acidic, basic, hydrophilic, or hydrophobic, thereby improving its acid resistance, alkaline resistance, solvent resistance, dispersion stability, heat resistance, etc. This serves to depress the formation of development residues derived from the pigment. Here, side etching is prevented in the development step and a small-tapered pattern can be formed after the development step. Furthermore, the reflow in the edge of the pattern in the heat curing step is depressed, thereby making it possible to reduce the difference in the width of patterned openings between before and after the heat curing step. In addition, the pattern shape can be controlled after the development step to permit the formation of a small-tapered pattern shape, thereby realizing improved halftone characteristics. Furthermore, the formation of an insulating covering layer on the particle surface serves to produce a cured film having improved insulation properties and ensure improved display reliability etc. resulting from a reduction in leak electric current etc.

In the case where a benzofuranone based black pigment (D1a-1a) in particular is added as the black organic pigment (D1a-1) which is described previously, the incorporation of the covering layer (DC) in the benzofuranone based black pigment (D1a-1a) acts to improve the alkali resistance of the pigment and depress the formation of development residues derived from the pigment.

The average covering rate of the covering layer (DC) on the black organic pigment (D1a-1) is preferably 50% or more, more preferably 70% or more, still more preferably 80% or more, and still more preferably 90% or more. If the covering layer (DC) has an average covering rate of 80% or more, it serves to depress the residue generation in the development step.

Regarding the aforementioned average covering rate of the covering layer (DC) on the black organic pigment (D1a-1), a cross section is observed at a magnification of 50,000 to 200,000 times under a transmission electron microscope (H9500; manufactured by Hitachi High-Technologies Corporation) at an accelerating voltage of 300 kV and 100 particles of the black pigment selected at random. The covering rate M (%) of each black pigment is calculated by the equation given below and their number average is calculated to provide the average covering rate N (%).

Covering rate $M(\%) = \{L1/(L1+L2)\} \times 100$

L1: total length of regions covered by the covering layer measured along the circumference of a particle (nm)

L2: total length of regions not covered by the covering layer (regions where the interface and the embedded resin are in direct contact) measured along the circumference of a particle (nm)

L1+L2: circumference of the particle (nm)

<Silica Covering Layer (DC-1), Metal Oxide Covering Layer (DC-2), and Metal Hydroxide Covering Layer (DC-3)>

It is preferable for the covering layer (DC) to contain one selected from the group consisting of the silica covering layer (DC-1), metal oxide covering layer (DC-2), and metal hydroxide covering layer (DC-3). Silica, metal oxides, and metal hydroxides have a function to make a pigment alkali-resistant and therefore can work to depress the formation of development residues derived from the pigment.

The term "silica" in the expression of "silica covering layer (DC-1)" refers collectively to silicon dioxide and hydrated compounds thereof. The term "metal oxide" in the expression of "metal oxide covering layer (DC-2)" refers collectively to metal oxides and hydrates thereof. A typical metal oxide is alumina, which refers to alumina ($Al_2O_3$), alumina hydrate ($Al_2O_3 \cdot nH_2O$), etc. Atypical metal hydroxide contained in a metal hydroxide covering layer (DC-3) is aluminum hydroxide ($Al(OH)_3$). Silica is low in dielectric constant and therefore, a large increase in the dielectric constant of a pixel dividing layer can be avoided even when the covering layer (DC) accounts for a large content in the black organic pigment (D1a-1).

The silica covering layer (DC-1), metal oxide covering layer (DC-2), and metal hydroxide covering layer (DC-3) in the covering layer (DC) can be analyzed by, for example, the X-ray diffraction method. The X-ray diffraction equipment to use is, for example, a powder X-ray diffractometer (manufactured by MAC Science). The calculated mass of silicon atoms or metal atoms contained in the silica covering layer (DC-1), the metal oxide covering layer (DC-2), or the metal hydroxide covering layer (DC-3) is rounded off to one decimal place. For the black organic pigment (D1a-1) that contains the covering layer (DC), furthermore, the mass of the pigment particles excluding the covering layer (DC) can be determined by, for example, the method described below. A weighed sample of a pigment is put in a mortar, brayed with a pestle etc. to remove the covering layer (DC), and immersed in an amide based solvent such as N,N-dimethyl formamide so that only the pigment particles are dissolved, followed by removing it as filtrate. This procedure is repeated until the filter residue loses blackishness completely and then the mass of the filter residue is measured and subtracted from the mass of the pigment.

It is preferable for the metal oxide or metal hydroxide contained the metal oxide covering layer (DC-2) or metal hydroxide covering layer (DC-3) to good in both chemical durability, such as alkali resistance, heat resistance, and light resistance, and physical durability, such as Vickers hardness to resist the appropriately optimized mechanical energy applied in the dispersion step and wear resistance. Examples of the metal oxide and metal hydroxide include alumina, zirconia, zinc oxide, titanium oxide, and ferric oxide. From the viewpoint of insulation properties, ultraviolet ray transmittance, and near infrared ray transmittance, alumina and zirconia are preferable, and alumina is more preferable from the viewpoint of dispersibility in alkali-soluble resins and solvents. The metal oxide and metal hydroxide may have a surface modified by an appropriate group such as organic group.

When the covering layer (DC) contains a silica covering layer (DC-1), the formation of an alumina covering layer as a metal oxide covering layer (DC-2) on the surface of the silica covering layer (DC-1) can serve to prevent the deterioration of pattern straightness. Alumina can work effectively to improve the dispersibility in an aqueous pigment suspension in the pigment granulating step that is performed after the pigment surface treatment step and therefore, it serves to adjust the secondary aggregation particle diameter in an intended range and improve the productivity and quality stability. The covering rate of the alumina covering layer as the metal oxide covering layer (DC-2) contained in the covering layer (DC) is preferably 10 parts by mass or more, more preferably 20 parts by mass or more, relative to the silica, which is assumed to account for 100 parts by mass, in the silica covering layer (DC-1).

When the covering layer (DC) contains a silica covering layer (DC-1), the content of silica is preferably 1 part by mass or more, more preferably 2 parts by mass or more, and still more preferably 5 parts mass or by more, relative to the pigment particles, which are assumed to account for 100 parts by mass. If the content is 1 part by mass or more, the covering rate of the pigment particle surface can be increased and the formation of pigment-derived development residues can be depressed. On the other hand, the silica preferably accounts for 20 parts by mass or less, more preferably 10 parts by mass or less. A content of 20 part by mass or less ensures an improved pattern straightness in the pixel dividing layer.

When the covering layer (DC) contains a metal oxide covering layer (DC-2) and/or a metal hydroxide covering layer (DC-3), the total content of the metal oxide and the metal hydroxide is preferably 0.1 part by mass or more, more preferably 0.5 part by mass or more, relative to the pigment particles, which are assumed to account for 100 parts by mass. A content of 0.1 part by mass or more ensures an improved dispersibility and pattern straightness. On the other hand, the total content of the metal oxide and the metal hydroxide is preferably 15 parts by mass or less, more preferably 10 parts by mass or less. If the total content is 15 parts by mass or less, it serves to prevent the occurrence of a pigment concentration gradient and allows the coating liquid to have an improved storage stability in the negative type photosensitive composition according to the present invention, which is designed so that its viscosity is low, preferably 15 mPa·s or less.

For various cases including those where silica is not a single component in the interior or the surface in the covering layer (DC) or where differences occur in the dehydration rate due to heat history, the content of silica as referred to herein means the silicon dioxide based, that is, $SiO_2$ based, value calculated from the content of silicon atoms. The content of metal oxide or metal hydroxide means the converted value for the metal oxide or metal hydroxide calculated from the content of metal atoms. More specifically, the contents of alumina, zirconia, and titanium oxide are calculated on the basis of $Al_2O_3$, $ZrO_2$, and $TiO_2$, respectively. Furthermore, the total content of metal oxide and metal hydroxide means the content of metal oxide or metal hydroxide when only either of them is contained and means the sum of their contents when both are contained.

The covering layer (DC) may be surface-modified with an organic group using a silane coupling agent with the hydroxyl group acting as reactive site on the surface of the silica, metal oxide, or metal hydroxide contained in the silica covering layer (DC-1), metal oxide covering layer (DC-2), or metal hydroxide covering layer (DC-3). It is preferable for the organic group to be an ethylenically unsaturated double bond group. Surface modification with a silane coupling agent having an ethylenically unsaturated double bond group works to make a black organic pigment (D1a-1) radical polymerizable and serves for preventing the removal of the film from the cured region and impeding the formation of pigment-derived development residues in the unexposed region.

A black organic pigment (D1a-1) having a covering layer (DC) may be further subjected to surface treatment of the outermost layer with an organic based surface treatment agent. Such surface treatment of the outermost layer acts to increase the wettability with resins or solvents. The covering layer (DC) may further contain a resin covering layer that is formed by covering treatment with a resin. The incorporation of a resin covering layer serves to cover the particle surface with a low-conductivity resin having insulation properties that can modify the surface conditions of the particle to ensure the production of a cured film with an improved light shielding capability and insulation properties.

<Dye (D2)>

For the negative type photosensitive resin composition according to the present invention, the coloring agent (D) preferably contains a dye (D2). As an embodiment relating to the incorporation of the dye (D2) in the coloring agent (D), it is preferable that the dye (D2) is contained as the aforementioned black coloring agent (Da) and/or non-black coloring agent (Db).

The dye (D2) is a compound that works to color a material as a result of a substituent group such as an ionic group and hydroxyl group in the dye (D2) being chemically adsorbed on or strongly interacting with the surface structure of the material, and generally it is soluble in solvents etc. The coloring by the dye (D2) is achieved as a result of the adsorption of individual molecules on the material, leading to a high coloring power and a high color development efficiency.

The incorporation of the dye (D2) ensures coloring in a color with high coloring power and allows the film of the resin composition to have an improved coloring capability and toning capability. Examples of the dye (D2) include direct dye, reactive dye, sulfur dye, vat dye, acidic dye, metallized dye, metallized acidic dye, basic dye, mordant dye, acidic mordant dye, disperse dye, cation dye, and fluorescent whitening dye. A disperse dye as referred to herein is a dye that is insoluble or poorly soluble in water and has no anionic ionizable group such as sulfonic acid group and carboxy group.

Examples of the dye (D2) include anthraquinone based dye, azo based dye, azine based dye, phthalocyanine based dye, methine based dye, oxazine based dye, quinoline based dye, indigo based dye, indigoid based dye, carbonium based dye, threne based dye, perinone based dye, perylene based dye, triaryl methane based dye, and xanthene based dye. From the viewpoint of the solubility in the solvents described later and heat resistance, preferable are anthraquinone based dye, azo based dye, azine based dye, methine based dye, triaryl methane based dye, and xanthene based dye.

For the negative type photosensitive resin composition according to the present invention, the dye (D2) preferably contains one or more selected from the group consisting of black dye (D2a-1), mixture of two or more dyes (D2a-2) and non-black dye (D2b), which will be described later.

Furthermore, it is preferable for the dye (D2) to account for 0.01 mass % or more, more preferably 0.05 mass % or more, and still more preferably 0.1 mass % or more, of the total solid content, excluding the solvent, of the negative type photosensitive resin composition according to the present invention. A content of 0.01 mass % or more ensures an improved coloring capability, or toning capability. On the other hand, it is preferable for the dye (D2) to account for 50 mass % or less, more preferably 45 mass % or less, and still more preferably 40 mass % or less. A content of 50 mass % or less ensures the production of a cured film having an improved heat resistance.

<Black Dye (D2a-1), Mixture of Two or More Dyes (D2a-2), and Non-Black Dye (D2b)>

For the negative type photosensitive resin composition according to the present invention, the dye (D2) preferably contains one or more selected from the group consisting of black dye (D2a-1), mixture of two or more dyes (D2a-2) and non-black dye (D2b).

The black dye (D2a-1) is a dye that acts to color a material black by absorbing light in the visible light wavelength range. The incorporation of the black dye (D2a-1) ensures the production of a black film of the resin composition and, since it is also high in coloring capability, the film of the resin composition will have an improved light shielding capability.

The mixture of two or more dyes (D2a-2) is a combination of two or more dyes selected from dyes of white, red, orange, yellow, green, blue, and violet to work as a dye mixture for coloring in pseudo-black. The incorporation of the mixture of two or more dyes (D2a-2) ensures the production of a black film of the resin composition and, since it is also high in coloring capability, the film of the resin composition will have an improved light shielding capability. Being a mixture of two or more dyes, furthermore, it can work to permit transmission or blocking of light in an intended specific wavelength range and therefore, its toning capability can be improved by varying the transmission spectrum or absorption spectrum of the film of the resin composition. Generally known black dyes, red dyes, orange dyes, yellow dyes, green dyes, blue dyes, and violet dyes may be used.

The non-black dye (D2b) is a dye that serves for coloring in a non-black color such as white, red, orange, yellow, green, blue, and violet by absorbing light in a visible light wavelength range. The incorporation of a non-black dye (D2b) serves to provide a colored film of a resin composition and impart coloring capability or toning capability. The use of a combination of two or more non-black dyes (D2b) serves to provide a film of a resin composition having intended color coordinates to ensure an improved toning capability. The non-black dye (D2b) is a dye that serves for coloring in a non-black color such as white, red, orange, yellow, green, blue, and violet as described above.

A cured film prepared by curing the negative type photosensitive resin composition according to the present invention preferably has an optical density of 0.3 or more, more preferably 0.5 or more, still more preferably 0.7 or more, and particularly preferably 1.0 or more, per micrometer of film thickness. If the optical density per micrometer of film thickness is 0.3 or more, the resulting cured film will serve to improve the light shielding capability, thereby preventing the electrode wiring from becoming visible and reducing the external light reflection to ensure an improved contrast in image displaying in display apparatuses such as organic EL display devices and liquid crystal display devices. Thus, such a film can be used suitably in such components as light shielding films for black matrices of color filters, black column spacers of liquid crystal display devices, etc., pixel dividing layers and TFT planarization layers of organic EL display devices, that require increased contrast realized by depression of external light reflection. On the other hand, the optical density per micrometer of film thickness is preferably 5.0 or less, more preferably 4.0 or less, and still more preferably 3.0 or less. If the optical density per micrometer of film thickness is 5.0 or less, it ensures an improved sensitivity in the light exposure step and the formation of a cured film having a small-tapered pattern shape. The optical density per micrometer of film thickness of a cured film can be controlled by varying the components and their contents of the coloring agent (D) described above.

<Dispersant (E)>

The negative type photosensitive resin composition according to the present invention preferably further contains a dispersant (E). The dispersant (E) is a compound that has a surface affinity group to interact with the surface of the aforementioned pigment (D1) and/or a disperse dye used as dye (D2) and also has a dispersion stabilization structure to improve the dispersion stability of the pigment (D1) and/or a disperse dye used as dye (D2). Such dispersion stabilization structures of the dispersant (E) include polymer chains and/or substituent groups having electrostatic charges.

If the negative type photosensitive resin composition contains pigment (D1) and/or a disperse dye as dye (D2) as a result of the incorporation of the dispersant (E), their dispersion stability can be improved and an improved resolution after the development step is ensured. In particular, if for example the pigment (D1) is in the form of particles crushed to a number average particle diameter of 1 μm or less, the surface area of the particles of the pigment (D1) will increase and the particles of the pigment (D1) will undergo aggregation easily. On the other hand, if the dispersant (E) is contained, the surface of the crushed pigment (D1) will interact with the surface affinity group in the dispersant (E), and the dispersion stabilization structure of the dispersant (E) will give rise to steric hindrance and/or electrostatic repulsion, which can work to impede the aggregation of the particles of the pigment (D1) to ensure an improved dispersion stability.

The dispersant (E) having a surface affinity group is, for example, a dispersant (E) having only a basic group, a dispersant (E) having both a basic group and an acidic group, a dispersant (E) having only an acidic group, and a dispersant (E) having neither a basic group nor an acidic group. From the viewpoint of improving the dispersion stability of the particles of the pigment (D1), it is preferable to adopt a dispersant (E) having only a basic group or a dispersant (E) having both a basic group and an acid group.

It is preferable for the dispersant (E) having a surface affinity group to have a structure in which the basic group and/or the acidic group working as surface affinity groups form a salt with an acid and/or a base.

Examples of the dispersant (E) having only a basic group include DISPERBYK (registered trademark)-108, -160, -167, -182, -2000, and -2164, and BYK (registered trademark)-9075, -LP-N6919, and -LP-N21116 (all manufactured by BYK-Chemie Japan); EFKA (registered trademark) 4015, 4050, 4080, 4300, 4400, and 4800 (all manufactured by BASF); Ajisper (registered trademark) PB711 (manufactured by Ajinomoto Fine-Techno Co., Inc.); and SOLSPERSE (registered trademark) 13240, 20000, and 71000 (all manufactured by Lubrizol).

Examples of the dispersant (E) having both a basic group and an acidic group include ANTI-TERRA (registered trademark)-U100 and -204, and DISPERBYK (registered trademark)-106, -140, -145, -180, -191, -2001, and -2020, BYK (registered trademark)-9076 (manufactured by BYK-Chemie Japan); Ajisper (registered trademark) PB821 and PB881 (all manufactured by Ajinomoto Fine-Techno Co., Inc.); and SOLSPERSE (registered trademark) 9000, 13650, 24000, 33000, 37500, 39000, 56000, and 76500 (all manufactured by Lubrizol).

Examples of the dispersant (E) having only an acidic group include DISPERBYK (registered trademark)-102, -118, -170, and -2096, and BYK (registered trademark)-P104 and -220S (all manufactured by BYK-Chemie Japan); and SOLSPERSE (registered trademark) 3000, 16000, 21000, 36000, and 55000 (all manufactured by Lubrizol).

Examples of the dispersant (E) having neither a basic group nor an acidic group include DISPERBYK (registered trademark)-103, -192, -2152, and -2200 (all manufactured by BYK-Chemie Japan); and SOLSPERSE (registered trademark) 27000, 54000, and X300 (all manufactured by Lubrizol).

The amine value of the dispersant (E) is preferably 5 mgKOH/g or more, more preferably 8 mgKOH/g or more, and still more preferably 10 mgKOH or more. An amine value of 5 mgKOH/g or more ensures an improved dispersion stability of the pigment (D1). On the other hand, the amine value of the dispersant (E) is preferably 150 mgKOH/g or less, more preferably 120 mgKOH/g or less, and still more preferably 100 mgKOH/g or less. An amine value of 150 mgKOH/g or less ensures an improved storage stability of the resin composition.

The amine value referred to herein is the weight of the equivalent amount of potassium hydroxide to an acid that reacts with 1 g of the dispersant (E) and it is expressed in mgKOH/g. It can be determined by neutralizing 1 g of the dispersant (E) with an acid, followed by titration with an aqueous potassium hydroxide solution. From the amine value, the amine equivalent (in g/mol), which represents the weight of resin per mole of a basic group such as amino group, can be calculated and then the number of basic groups such as amino groups in the dispersant (E) can be determined, The acid value of the dispersant (E) is preferably 5 mgKOH/g or more, more preferably 8 mgKOH/g or more, and still more preferably 10 mgKOH or more. An acid value of 5 mgKOH/g or more ensures an improved dispersion stability of the pigment (D1). On the other hand, the acid value is preferably 200 mgKOH/g or less, more preferably 170 mgKOH/g or less, and still more preferably 150 mgKOH/g or less. An acid value of 200 mgKOH/g or less ensures an improved storage stability of the resin composition.

The acid value referred to herein is the weight of potassium hydroxide that reacts with 1 g of the dispersant (E) and expressed in mgKOH/g. It can be determined by titrating 1 g of the dispersant (E) with an aqueous potassium hydroxide solution. From the acid value, the acid equivalent (in g/mol), which represents the weight of resin per mole of acid group, can be calculated and then the number of acid groups in the dispersant (E) can be determined.

Examples of a dispersant (E) having a polymer chain include acrylic resin based dispersants, polyoxyalkylene ether based dispersants, polyester based dispersants, polyurethane based dispersants, polyol based dispersants, polyethylene imine based dispersants, and polyallyl amine based dispersants. From the viewpoint of the patternability with an alkaline developer, acrylic resin based dispersants, polyoxyalkylene ether based dispersants, polyester based dispersants, polyurethane based dispersants, and polyol based dispersants are preferable.

If the negative type photosensitive resin composition according to the present invention contains a disperse dye as the pigment (D1) and/or the dye (D2), it is preferable for the dispersant (E) to account for 1 mass % or more, more preferably 5 mass % or more, and still more preferably 10 mass % or more, of the total quantity, which accounts for 100 mass %, of the pigment (D1) and/or the disperse dye and the dispersant (E) in the negative type photosensitive resin composition according to the present invention. A content of 1 mass % or more ensures an improved dispersion stability of the pigment (D1) and/or disperse dye and an improved resolution after the development step. On the other hand, the content of the dispersant (E) is preferably 60 mass % or less, more preferably 55 mass % or less, and still more preferably 50 mass % or less. A content of 60 mass % or less ensures the production of a cured film having an improved heat resistance.

<Sensitizer>

The negative type photosensitive resin composition according to the present invention preferably further contains a sensitizer. The sensitizer is a compound that absorbs energy obtained from light exposure, generates excited triplet electrons through internal conversion and intersystem crossing, and acts for energy transfer to the aforementioned photo initiator (C1).

The incorporation of the sensitizer serves to improve the sensitivity in the light exposure step. The mechanism is inferred as follows: the sensitizer absorbs long-wavelength light that is not absorbed by the photo initiator (C1) and its energy is transferred from the sensitizer to the photo initiator (C1) to realize an improved efficiency of the photo-reaction.

The sensitizer is preferably a thioxanthone based one. Examples of the thioxanthone based sensitizer include thioxanthone, 2-methyl thioxanthone, 2-chlorothioxanthone, 2-isopropyl thioxanthone, 2,4-dimethyl thioxanthone, 2,4-diethyl thioxanthone, and 2,4-dichlorothioxanthone.

In the negative type photosensitive resin composition according to the present invention, the sensitizer preferably accounts for 0.01 part by mass or more, more preferably 0.1 part by mass or more, still more preferably 0.5 part by mass or more, and particularly preferably 1 part by mass or more, relative to the total quantity, which accounts for 100 parts by mass, of the alkali-soluble resin (A) and the radical polymerizable compound (B). A content of 0.01 part by mass or more ensures an improved sensitivity in the light exposure step. On the other hand, the content of the sensitizer is preferably 15 parts by mass or less, more preferably 13 parts by mass or less, still more preferably 10 parts by mass or less, and particularly preferably 8 parts by mass or less. A content of 15 parts by mass or less ensures an improved resolution after the development step and the formation of a cured film having a small-tapered pattern.

<Chain Transfer Agent>

The negative type photosensitive resin composition according to the present invention preferably further contains a chain transfer agent. The chain transfer agent is a compound that receives radicals from growing polymer chain ends of polymer chains resulting from radical polymerization in the light exposure step and transfers the radicals to other polymer chains.

The incorporation of a chain transfer agent serves to improve the sensitivity in the light exposure step. Regarding the mechanism, it is inferred that radical crosslinking progresses deeply into the film as the radicals generated by light exposure are transferred to other polymer chains by the chain transfer agent. In particular, if for example the resin composition contains a black coloring agent (Da) as the aforementioned coloring agent (D), the light applied for exposure may be absorbed significantly by the black coloring agent (Da), possibly preventing the light from reaching deep portions of the film. On the other hand, if a chain transfer agent is contained, radicals will be transferred by the chain transfer agent to allow radical crosslinking to reach deep portions of the film, thereby ensuring an improved sensitivity in the light exposure step.

Furthermore, the inclusion of a chain transfer agent makes it possible to form a cured film having a small-tapered pattern shape. It is considered that the transfer of radicals caused by the chain transfer agent serves to control the molecular weight of the polymer chains resulting from the radical polymerization in the light exposure step. More specifically, the incorporation of a chain transfer agent acts to prevent significantly high-molecular weight polymer chains from being produced by excessive radical polymerization in the light exposure step, thereby resulting in a film having an appropriately depressed softening point. It is considered that this serves to improve the reflow property of the pattern in the heat curing step, leading to the formation of a small-tapered pattern shape.

The chain transfer agent is preferably a thiol based chain transfer agent. Examples of the thiol based chain transfer agent include β-mercaptopropionic acid, 2-ethyihexyl β-mercaptopropionate, 1,4-bis(3-mercaptobutanoyloxy)butane, ethylene glycol bis(thioglycolate), trimethylolpropane tris-(3-mercaptopropionate), trimethylolpropane tris-(3-mercaptobutyrate), trimethylolpropane tris-(thioglycolate), 1,3,5-tris-[(3-mercaptopropionyloxy) ethyl] isocyanuric acid, pentaerythritol tetrakis(3-mercaptopropionate), and dipentaerythritol hexakis(3-mercaptopropionate).

In the negative type photosensitive resin composition according to the present invention, the chain transfer agent preferably accounts for 0.01 part by mass or more, more preferably 0.1 part by mass or more, still more preferably 0.5 part by mass or more, and particularly preferably 1 part by mass or more, relative to the total quantity, which accounts for 100 parts by mass, of the alkali-soluble resin (A) and the radical polymerizable compound (B). A content of 0.01 part by mass or more ensures an improved sensitivity in the light exposure step and the formation of a cured film having a small-tapered pattern shape. On the other hand, the content of the chain transfer agent is preferably 15 parts by mass or less, more preferably 13 parts by mass or less, still more preferably 10 parts by mass or less, and particularly preferably 8 parts by mass or less. A content of 15 parts by mass or less ensures an improved resolution after the development step and the production of a cured film having an improved heat resistance.

<Polymerization Terminator>

The negative type photosensitive resin composition according to the present invention preferably further contains a polymerization terminator. A polymerization terminator is a compound that can work to terminate radical polymerization by capturing radicals generated in the light exposure step or radicals located at growing polymer chain ends of polymer chains formed by the radical polymerization in the light exposure step and holding the radicals in a stable state.

The inclusion of a polymerization terminator in an appropriate quantity serves to reduce the quantity of residues left after the development step to ensure an improved resolution after the development step. It is inferred that the excess radicals generated in the light exposure step or the radicals located at growing chain ends of high-molecular weight polymers are captured by the polymerization terminator to arrest excessive progress of the radical polymerization.

The polymerization terminator is preferably a phenolic polymerization terminator. Examples of the phenolic polymerization terminator include 4-methoxyphenol, 1,4-hydroquinone, 1,4-benzoquinone, 2-t-butyl-4-methoxyphenol, 3-t-butyl-4-methoxyphenol, 4-t-butyl catechol, 2,6-di-t-butyl-4-methyl phenol, 2,5-di-t-butyl-1,4-hydroquinone, 2,5-di-t-amyl-1,4-hydroquinone, and IRGANOX (registered trademark) 245, 259, 565, 1010, 1035, 1076, 1098, 1135, 1330, 1425, 1520, 1726, and 3114 (all manufactured by BASF).

In the negative type photosensitive resin composition according to the present invention, the polymerization terminator preferably accounts for 0.01 part by mass or more, more preferably 0.03 part by mass or more, still more preferably 0.05 part by mass or more, and particularly preferably 0.1 part by mass or more, relative to the total quantity, which accounts for 100 parts by mass, of the alkali-soluble resin (A) and the radical polymerizable compound (B). A content of 0.01 part by mass or more ensures an improved resolution after the development step and the production of a cured film having an improved heat resistance. Furthermore, the content of the polymerization terminator is preferably 10 parts by mass or less, more preferably 8 parts by mass or less, still more preferably 5 parts by mass or less, and particularly preferably 3 parts by mass or less. A content of 10 part by mass or less ensures an improved sensitivity in the light exposure step.

<Crosslinking Agent (F)>

The negative type photosensitive resin composition according to the present invention preferably further contains a crosslinking agent (F). A crosslinking agent (F) is a compound that has a crosslinkable group to form a bond with resin. The incorporation of the crosslinking agent (F) ensures the production of a cured film having an improved hardness and chemical resistance. It is inferred that the crosslinking agent serves to introduce new crosslinked structures in the cured film of the resin composition to improve the crosslink density. Furthermore, the inclusion of a crosslinking agent (F) makes it possible to form a small-tapered pattern shape after the heat curing step. It is considered that a crosslinked structure is formed among polymer chains by the crosslinking agent (F) to impede dense orientation of polymer chains and maintain the reflow property of the pattern in the heat curing step, thereby making it possible to form a small-tapered pattern shape.

The crosslinking agent (F) is preferably a compound that has, in its molecule, two or more thermally crosslinking groups such as alkoxymethyl group, methylol group, epoxy group, and oxetanyl group.

Examples of a compound having two or more alkoxy methyl groups or methylol groups in the molecule include DML-PC, DML-OC, DML-PTBP, DML-PCHP, DML-MBPC, DML-MTrisPC, DMOM-PC, DMOM-PTBP, TriML-P, TriML-35XL, TML-HQ, TML-BPA, TML-BPAF, TML-BPAP, TMOM-BPA, TMOM-BPAF, TMOM-BPAP, HML-TPHAP, and HMOM-TPHAP (all manufactured by Honshu Chemical Industry Co., Ltd.); and NIKALAC (registered trademark) MX-290, MX-280, MX-270, MX-279, MW-100LM, MW-30HM, MW-390, and MX-750LM (all manufactured by Sanwa Chemical Co., Ltd.).

Examples of compounds having two or more epoxy groups in their molecules include Epolite (registered trademark) 40E, 100E, 400E, 70P, 1500NP, 80MF, 3002, and 4000 (all manufactured by Kyoeisha Chemical Co., Ltd.), Denacol (registered trademark) EX-212L, EX-216L, EX-321L, and EX-850L (all manufactured by Nagase ChemteX Corporation), jER (registered trademark) 828, 1002, 1750, YX8100-BH30, E1256, and E4275 (all manufactured by Mitsubishi Chemical Corporation), GAN, GOT, EPPN-502H, NC-3000, and NC-6000 (all manufactured by Nippon Kayaku Co., Ltd.), EPICLON (registered trademark) EXA-9583, HP4032, N695, and HP7200 (all manufactured by DIC Corporation), TECHMORE (registered trademark) VG-3101L (manufactured by Printec, Inc.), TEPIC (registered trademark) S, G, and P (all manufactured by Nissan Chemical Industries, Ltd.), and Epotohto (registered trademark) YH-434L (manufactured by Tohto Kasei Co., Ltd.).

Examples of a compound having two or more oxetanyl groups in the molecule include ETERNACOLL (registered trademark) EHO, OXBP, OXTP, and OXMA (all manufactured by Ube Industries, Ltd.), and oxetanized phenol novolac.

In the negative type photosensitive resin composition according to the present invention, the crosslinking agent preferably accounts for 0.5 part by mass or more, more preferably 1 part by mass or more, and still more preferably 2 parts by mass or more, relative to the total quantity, which accounts for 100 parts by mass, of the alkali-soluble resin (A) and the radical polymerizable compound (B). A content of 0.5 part by mass or more ensures the formation of a cured film having improved hardness and chemical resistance and the formation of a small-tapered pattern shape after the heat curing step. On the other hand, the content of the crosslinking agent is preferably 50 parts by mass or less, more preferably 40 parts by mass or less, and still more preferably 30 parts by mass or less. A content of 50 parts by mass or less ensures the formation of a cured film having improved hardness and chemical resistance and the formation of a small-tapered pattern shape after the heat curing step.

<Epoxy Compound Having a Fluorene Backbone and Two or More Epoxy Groups in the Molecule (F1) and Epoxy Compound Having an Indane Backbone and Two or More Epoxy Groups in the Molecule (F2)>

It is preferable for the negative type photosensitive resin composition according to the present invention to contain, as the crosslinking agent (F), an epoxy compound having a fluorene backbone and two or more epoxy groups in the molecule (F1) and/or an epoxy compound having an indane backbone and two or more epoxy groups in the molecule (F2).

The incorporation of an epoxy compound having a fluorene backbone and two or more epoxy groups in the molecule (F1) or an epoxy compound having an indane backbone and two or more epoxy groups in the molecule (F2) serves to realize not only improved sensitivity in the light exposure step and control of the pattern shape to realize a small taper after the development step, but also a small-tapered pattern shape after the heat curing step. This is considered to be because an interpenetrating polymer network structure is formed in the film that is UV-cured in the light exposure step and as a result the epoxy compound is taken in the cured film to cause a dramatic increase in the molecular weight of the film, leading to an improved sensitivity in the light exposure step. Since the fluorene backbone and indane backbone are hydrophobic, it is further inferred that increased hydrophobicity of the UV-cured film works to prevent the side etching in the deep part of the film where a sufficient degree of UV is difficult to realize, allowing a small taper to be formed by pattern shape control after the development step. It is also considered that the steric hindrance of the fluorene backbone or indane backbone prevents excessive curing in the UV curing step to allow a small-tapered pattern shape to be formed after the heat curing step.

In addition, the pattern shape can be controlled after the development step to permit the formation of a small taper, thereby realizing improved halftone characteristics. This is considered to be because the hydrophobicity of the fluorene backbone or indane backbone acts to depress the side etching to permit the control of the alkali solubility of the halftone exposed region. In addition, the difference in the width of patterned openings between before and after the heat curing step can be depressed. As in the above case, the formation of a pattern having a small-tapered shape after the development step serves to depress the reflow in the edge of the pattern in the heat curing step while the introduction of a fluorene backbone or indane backbone in the cured film causes a dramatic increase in the molecular weight of the film. It is inferred that as a result of this, the reflow in the edge of the pattern in the heat curing step is depressed, thereby making it possible to reduce the difference in the width of patterned openings between before and after the heat curing step.

It is preferable for the epoxy compound having a fluorene backbone and two or more epoxy groups in the molecule (F1) and the epoxy compound having an indane backbone and two or more epoxy groups in the molecule (F2) to have an epoxy equivalent of 150 g/mol or more, more preferably 170 g/mol or more, still more preferably 190 g/mol or more, and particularly preferably 210 g/mol or more. An epoxy equivalent of 150 g/mol or more allows a pattern having a small-tapered shape to be formed after the heat curing step. On the other hand, the epoxy equivalents of the epoxy compound having a fluorene backbone and two or more epoxy groups in the molecule (F1) and the epoxy compound having an indane backbone and two or more epoxy groups in the molecule (F2) are preferably 800 g/mol or less, more preferably 600 g/mol or less, still more preferable 500 g/mol or less, and particularly preferably 400 g/mol or less. If the epoxy equivalent is 800 g/mol or less, the difference in the width of patterned openings between before and after the heat curing step can be depressed.

Examples of the epoxy compound having a fluorene backbone and two or more epoxy groups in the molecule (F1) include 9,9-bis[4-(2-glycidoxyethoxy)phenyl] fluorene, 9,9-bis[4-(3-glycidoxypropoxy)phenyl] fluorene, 9,9-bis[4-((3-glycidoxy)hexyloxy)phenyl] fluorene, 9,9-bis[4-(2-glycidoxyethoxy)-3-methyl phenyl] fluorene, 9,9-bis(4-glycidoxyphenyl) fluorene, 9,9-bis[4-(2-hydroxy-3-glycidoxypropoxy)phenyl] fluorene, 9,9-bis[3-phenyl-4-(2-glycidoxyethoxy)phenyl] fluorene, 9,9-bis[4-(2-glycidoxyethoxy)-1-naphthyl] fluorene, 9,9-bis[4'-(2-glycidoxyethoxy)-(1,1'-biphenyl)-4-yl] fluorene, and 9,9-bis [3,4-bis(2-glycidoxyethoxy)phenyl] fluorene, as well as OGSOL (registered trademark) PG, PG-100, EG, EG-200, EG-280, CG-400, and CG-500 (all manufactured by Osaka Gas Chemicals Co., Ltd.), and ONCOAT (registered trademark) EX-1010, EX-1012, EX-1020, EX-1030, EX-1040, EX-1050, and EX-1051 (all manufactured by Nagase ChemteX Corporation).

Examples of the epoxy compound having an indane backbone and two or more epoxy groups in the molecule (F2) include 1,1-bis[4-(2-glycidoxyethoxy)phenyl] indane, 1,1-bis[4-(3-glycidoxyhexyloxy)phenyl] indane, 1,1-bis[4-(2-glycidoxyethoxy)-3-methyl phenyl] indane, 1,1-bis(4-glycidoxyphenyl) indane, 1,1-bis[4-(2-hydroxy-3-glycidoxypropoxy) phenyl] indane, 1,1-bis[4-(2-glycidoxyethoxy)phenyl]-3-phenyl indane, 1,1-bis[4-(2-glycidoxyethoxy)-1-naphthyl] indane, 1,1-bis[3,4-bis(2-glycidoxyethoxy)phenyl] indane, 2,2-bis[4-(2-glycidoxyethoxy) phenyl] indane, 2,2-bis(4-glycidoxy phenyl) indane, and 2,2-bis[3,4-bis(2-glycidoxyethoxy) phenyl] indane.

Such an epoxy compound having a fluorene backbone and two or more epoxy groups in the molecule (F1) or an epoxy compound having an indane backbone and two or more epoxy groups in the molecule (F2) can be synthesized by a generally known method.

In the photosensitive resin composition according to the present invention, the total quantity of the fluorene backbone and two or more epoxy groups in the molecule (F1) and the epoxy compound having an indane backbone and two or more epoxy groups in the molecule (F2) preferably accounts for 0.5 part by mass or more, more preferably 1 part by mass or more, still more preferably 2 parts by mass or more, still more preferably 3 parts by mass or more, and particularly preferably 5 parts by mass or more, relative to the total quantity, which accounts for 100 parts by mass, of the alkali-soluble resin (A) and the radical polymerizable compound (B). A content of 0.5 part by mass or more ensures an improved sensitivity in the light exposure step and the formation of a small-tapered pattern shape after the development step and after the heat curing step. In addition, the difference in the width of patterned openings between before and after the heat curing step can be depressed. On the other hand, the total content of the epoxy compound having a fluorene backbone and two or more epoxy groups in the molecule (F1) and the epoxy compound having an indane backbone and two or more epoxy groups in the molecule (F2) is preferably 50 parts by mass or less, more preferably 40 parts by mass or less, still more preferably 30 parts by mass or less, still more preferably 25 parts by mass or less, and particularly preferably 20 parts by mass or less. A content of 50 parts by mass or less serves not only to depress the difference in the width of patterned openings between before and after the heat curing step, but also to depress the formation of development residues.

<Silane Coupling Agent>

The negative type photosensitive resin composition according to the present invention preferably further contains a silane coupling agent. The silane coupling agent is a compound that has a hydrolysable silyl group or silanol group. The incorporation of a silane coupling agent serves to increase the interaction at the interface between the cured film of the resin composition and the underlying substrate, thereby ensuring an improved adhesion to the underlying substrate and the production of a cured film having an improved chemical resistance. The silane coupling agent is preferably a trifunctional organosilane, a tetrafunctional organosilane, or a silicate compound.

Examples of the trifunctional organosilane include methyl trimethoxysilane, cyclohexyl trimethoxysilane, vinyl trimethoxysilane, 3-acryloxypropyl trimethoxysilane, phenyl trimethoxysilane, 4-hydroxyphenyl trimethoxysilane, 1-naphthyl trimethoxysilane, 4-styryl trimethoxysilane, 3-glycidoxypropyl trimethoxysilane, 3-trimethoxysilylpropyl succinic acid, 3-trimethoxysilylpropyl succinic anhydride, 3,3,3-trifluoropropyl trimethoxysilane, 3-[(3-ethyl-3-oxetanyl)methoxy]propyl trimethoxysilane, 3-aminopropyl trimethoxysilane, 3-(4-aminophenyl)propyl trimethoxysilane, 1-(3-trimethoxysilylpropyl) urea, 3-triethoxysilyl-N-(1,3-dimethylbutylidene)propyl amine, 3-mercaptopropyl trimethoxysilane, 3-isocyanatepropyl triethoxysilane, 1,3,5-tris-(3-trimethoxysilylpropyl) isocyanuric acid, and N-t-butyl-2-(3-trimethoxy silyl propyl) succinimide.

Examples of the tetrafunctional organosilane or silicate compound include organosilanes as represented by general formula (73).

[Chemical compound 28]

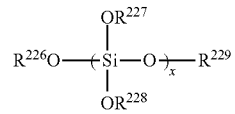

(73)

In general formula (73), $R^{226}$ to $R^{229}$ are each independently a hydrogen atom, an alkyl group, an acyl group, or an aryl group, and x is an integer of 1 to 15. In general formula (73), it is preferable for $R^{226}$ to $R^{229}$ to be each independently a hydrogen atom, an alkyl group containing 1 to 6 carbon atoms, an acyl group containing 2 to 6 carbon atoms, or an aryl group containing 6 to 15 carbon atoms, more preferably a hydrogen atom, an alkyl group containing 1 to 4 carbon atoms, an acyl group containing 2 to 4 carbon atoms, or an aryl group containing 6 to 10 carbon atoms. The above alkyl group, acyl group, and aryl group may each be either a non-substitution product or a substitution product.

Examples of organosilanes as represented by general formula (73) include tetrafunctional organosilanes such as tetramethoxysilane, tetraethoxysilane, tetra-n-propoxysilane, tetraisopropoxysilane, tetra-n-butoxysilane, and tetraacetoxysilane; and silicate compounds such as Methyl Silicate 51 (manufactured by Fuso Chemical Co., Ltd.), M Silicate 51, Silicate 40, and Silicate 45 (all manufactured by Tama Chemicals Co., Ltd.), and Methyl Silicate 51, Methyl Silicate 53A, Ethyl Silicate 40, and Ethyl Silicate 48 (all manufactured by Colcoat Co., Ltd.).

In the negative type photosensitive resin composition according to the present invention, the silane coupling agent preferably accounts for 0.01 part by mass or more, more preferably 0.1 part by mass or more, still more preferably 0.5 part by mass or more, and particularly preferably 1 part by mass or more, relative to the total quantity, which accounts for 100 parts by mass, of the alkali-soluble resin (A) and the radical-polymerizable compound (B). A content of 0.01 part by mass or more ensures an improved adhesion to the underlying substrate and the production of a cured film having an improved chemical resistance. On the other hand, the content of the silane coupling agent is preferably 15 parts by mass or less, more preferably 13 parts by mass or less, still more preferably 10 parts by mass or less, and particularly preferably 8 parts by mass or less. A content of 15 parts by mass or less ensures an improved resolution after the development step.

<Surfactant>

The negative type photosensitive resin composition according to the present invention may further contains a surfactant. The surfactant is a compound that has a hydrophilic structure and a hydrophobic structure. The incorporation of an appropriate quantity of a surfactant serves to allow the resin composition to have an appropriately controlled surface tension, thereby ensuring an improved leveling property in the coating step and an improved film thickness uniformity of the coating film. The surfactant is preferably a fluorine resin based surfactant, silicone based surfactant, polyoxyalkylene ether based surfactant, or acrylic resin based surfactant.

In the negative type photosensitive resin composition according to the present invention, the surfactant preferably accounts for 0.001 mass % or more, more preferably 0.005 mass % or more, and still more preferably 0.01 mass % or more. A content of 0.001 mass % or more ensures an improved leveling property in the coating step. On the other hand, the surfactant preferably accounts for 1 mass % or less, more preferably 0.5 mass % or less, and still more preferably 0.03 mass % or less. A content of 1 mass % or less ensures an improved leveling property in the coating step.

<Solvent>

The negative type photosensitive resin composition according to the present invention preferably further contains a solvent. The solvent is a compound that can dissolve the various resins and various additives added to the resin composition. The incorporation of the solvent ensures uniform dissolution of the various resins and various additives added to the resin composition and the production of a cured film having an improved transmittance. Furthermore, it serves to control the viscosity of the resin composition appropriately, allowing a film with a desired film thickness to be formed on the substrate. In addition, it serves to appropriately control the surface tension of the resin composition, the drying speed in the coating step, etc., thereby ensuring an improved leveling property in the coating step and an improved film thickness uniformity of the coating film.

From the viewpoint of the solubilities of the various resins and various additives, the solvent is preferably a compound having an alcoholic hydroxyl group, a compound having a carbonyl group, or a compound having three or more ether bonds. In addition, it is also preferable for such a compound to have a boiling point of 110° C. to 250° C. under atmospheric pressure. A boiling point of 110° C. or more allows the solvent to volatilize moderately in the coating step to cause drying of the coating film, thereby preventing uneven coating and ensuring an improved film thickness uniformity. On the other hand, a boiling point of 250° C. or less serves to reduce the quantity of the solvent remaining in the coating film. Accordingly, the film shrinkage in the heat curing step can be reduced to ensure the production of a cured film having a higher flatness and an improved film thickness uniformity.

Compounds containing an alcoholic hydroxyl group and having a boiling point of 110° C. to 250° C. under atmospheric pressure include diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, and tetrahydrofurfuryl alcohol.

Compounds containing a carbonyl group and having a boiling point of 110° C. to 250° C. under atmospheric pressure include 3-methoxy-n-butyl acetate, 3-methyl-3-n-butyl acetate, propylene glycol monomethyl ether acetate, dipropylene glycol monomethyl ether acetate, and γ-butyrolactone.

Compounds containing three or more ether bonds and having a boiling point of 110° C. to 250° C. under atmospheric pressure include diethylene glycol dimethyl ether, diethylene glycol ethyl methyl ether, and dipropylene glycol dimethyl ether.

For the negative type photosensitive resin composition according to the present invention, the content of the solvent may be adjusted appropriately to suite the coating method to be used etc. For example, a content of 50 to 95 mass % relative to the total quantity of the negative type photosensitive resin composition is commonly adopted when the spin coating technique is used to form a coating film.

If the pigment (D1) and/or a disperse dye to work as the dye (D2) are to be added as the coloring agent (D), it is preferable to use a solvent having a carbonyl group or an ester bond. The incorporation of a solvent having a carbonyl group or an ester bond ensures an improved dispersion stability of the pigment (D1) and/or the disperse dye used as the dye (D2). From the viewpoint of dispersion stability, the use of a solvent having an acetate bond is more preferable. The incorporation of a solvent having an acetate bond ensures an improved dispersion stability of the pigment (D1) and/or the disperse dye used as the dye (D2).

Examples of the solvent having an acetate bond include 3-methoxy-n-butyl acetate, 3-methyl-3-methoxy-n-butyl acetate, ethylene glycol monomethyl ether acetate, propylene glycol monomethyl ether acetate, diethylene glycol monomethyl ether acetate, diethylene glycol monoethyl ether acetate, diethylene glycol mono-n-butyl ether acetate, dipropylene glycol monomethyl ether acetate, cyclohexanol acetate, propylene glycol diacetate, and 1,4-butanediol diacetate.

In the negative type photosensitive resin composition according to the present invention, the solvent having a carbonyl group or an ester bond preferably accounts for 30 to 100 mass %, more preferably 50 to 100 mass %, and still more preferably 70 to 100 mass %, solvent quantity. A content of 30 to 100 mass % ensures an improved dispersion stability of the pigment (D1).

<Other Additives>

The negative type photosensitive resin composition according to the present invention may further contains another resin or a precursor thereof. Examples of such another resin or a precursor thereof include polyamide, polyamide-imide, epoxy resin, novolac resin, urea resin, polyurethane, and precursors thereof.

<Production Method for the Negative Type Photosensitive Resin Composition According to the Present Invention>

Described below is a typical production method for the negative type photosensitive resin composition according to the present invention. In the case where a pigment (D1) containing a black colorant (Da) is incorporated as the coloring agent (D), a dispersant (E) is added to a solution of the first resin (A1) and the second resin (A2), and the pigment (D1) is dispersed in this mixed solution using a dispersing machine to prepare a pigment dispersion liquid. Subsequently a radical polymerizable compound (B), a photo initiator (C1), other additives, and an appropriate solvent are added to this pigment dispersion liquid and stirred for 20 minutes to 3 hours to prepare a uniform solution. After the stirring, the resulting solution is filtered to produce a negative type photosensitive resin composition according to the present invention.

Examples of the dispersing machine include ball mill, bead mill, sand grinder, triple roll mill, and high-speed impact mill. From the viewpoint of ensuring an improved dispersion efficiently and finer dispersion, it is preferable to use a bead mill. Examples of the bead mill include CoBall Mill, basket mill, pin mill, and DYNO mill. Examples of the beads for bead mills include titania beads, zirconia beads, and zircon beads. These bead mills preferably have a bead diameter of 0.01 to 6 mm, more preferably 0.015 to 5 mm, and still more preferably 0.03 to 3 mm. If both the diameter of the primary particles of the pigment (D1) and that of the secondary particles formed through aggregation of the primary particles are several hundreds of nanometers or less, it is preferable to use fine beads of 0.015 to 0.1 mm. In this case, it is preferable to adopt a bead mill equipped with a centrifugal separation type separator that can separate the fine beads from the pigment dispersion liquid. If the pigment (D1) contains large particles of several hundreds of nanometers or more, it is preferable to use beads of 0.1 to 6 mm from the viewpoint of improving the dispersion efficiently.

<Cured Pattern Having a Small-Tapered Pattern Shape>

A cured film can be produced by curing the negative type photosensitive resin composition. In particular, the negative type photosensitive resin composition according to the present invention serves to produce a cured film containing a cured pattern having a small-tapered pattern shape. In the cross section of the cured pattern in the cured film prepared from the negative type photosensitive resin composition according to the present invention, each inclined slope preferably has a taper angle of 1° or more, more preferably 5° or more, still more preferably 10° or more, still more preferably 12° or more, and particularly preferably 15° or more. A taper angle of 1° or more ensures the production of an organic EL display with an improved resolution because it permits high density integration and arrangement of light emitting elements. In the cross section of the cured pattern in the cured film, each inclined slope preferably has a taper angle of 60° or less, more preferably 45° or less, still more preferably 40° or less, still more preferably 35° or less, and particularly preferably 30° or less. A taper angle of 60° or less serves to prevent disconnection while forming electrodes such as transparent electrodes and reflecting electrodes. It also serves to depress the electric field concentration along edges of electrodes, thereby reducing the degradation of the light emitting devices. In the case where a cured film preferably has an optical density of 0.3 to 5.0 per micrometer of film thickness and possesses a cured pattern having a cross section in which each inclined slope preferably has a taper angle of 1° to 60°, such a cured film is preferred in constructing organic EL displays.

<Step-Shaped Cured Pattern>

The negative type photosensitive resin composition according to the present invention can be processed, while maintaining a high sensitivity, into a small-tapered cured pattern having a stepped shape with a sufficiently large difference in film thickness between thick portions and thin portions.

Figure 3:
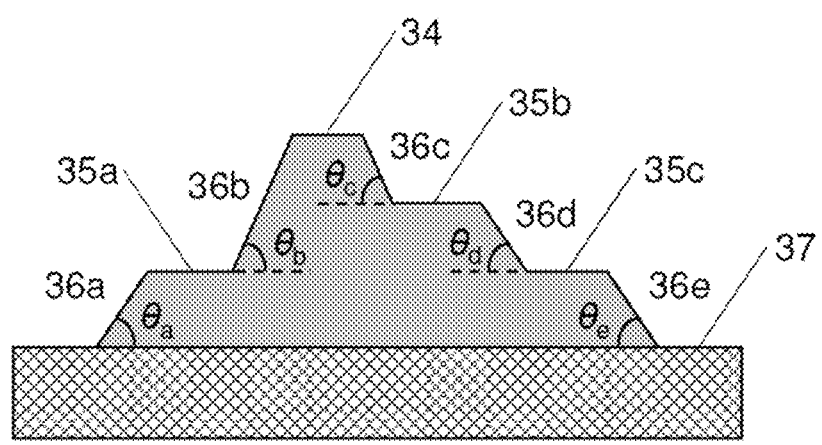
FIG. 3 shows a cross-sectional view of a typical cross section of a step-shaped cured pattern.

FIG. 3 shows an example of the cross section of a step-shaped cured pattern that can be prepared from the negative type photosensitive resin composition according to the present invention. The thick part 34 in the stepped shape represents a part that is cured in the light exposure step and has the maximum film thickness in the cured pattern. The thin parts 35a, 35b, and 35c in the stepped shape show parts that are halftone-exposed in the light exposure step and are smaller in thicknesses than the thick part 34. In the cross section of a step-shaped cured pattern, the taper angles $\theta_a$, $\theta_b$, $\theta_c$, $\theta_d$, and $\theta_e$ of the slopes 36a, 36b, 36c, 36d, and 36e are preferably small.

The taper angles $\theta_a$, $\theta_b$, $\theta_c$, $\theta_d$, and $\theta_e$ referred to here are the angles formed, in the cross section of a step-shaped cured pattern, between the horizontal side of the underlying substrate 37 where the cured pattern is produced or the horizontal side of the thin part 35a, 35b, or 35c and the slope 36a, 36b, 36c, 36d, or 36e that crosses the horizontal side in the cross section of the step-shaped cured pattern. A forward taper has a taper angle in the range of 1° or larger and smaller than 90° whereas a backward taper has a taper angle in the range of 91° or larger and smaller than 180°. The term "rectangular" refers to a taper angle of 90°, and the term "small-tapered" means that the relevant taper angle is in the range from 1° to 60°.

A cured pattern having a stepped shape prepared from the negative type photosensitive resin composition according to the present invention preferably has 1 or more, more preferably 2 or more, steps. On the other hand, the number of steps is preferably 10 or less, more preferably 7 or less, and still more preferably 5 or less. If the number of steps is in the above range, a sufficiently large film thickness difference can be ensured between the thick parts and the thin parts and between any two thin parts that are adjacent to each other with a step interposed therebetween so that the area of contact with the vapor deposition mask used for forming a light emitting layer can be reduced, thereby preventing a decrease in yield in panel production due to particle generation and also preventing degradation of the light emitting element.

In a step-shaped cured pattern prepared from the negative type photosensitive resin composition according to the present invention, the region having a maximum thickness between the plane of the bottom surface and the plane of the top surface is referred to as the thick part 34, whereas a region having a thickness smaller than that of the thick part 34 is referred to as a thin part 35. When the film thickness of the thick part 34 is denoted by $(T_{FT})$ μm and the film thickness of the thin parts 35a, 35b, and 35c located with at least one step away from the thick part 34 is denoted by $(T_{HT})$ μm, the film thickness difference between $(T_{FT})$ and $(T_{HT})$, which is denoted by $(\Delta T_{FT-HT})$ μm is preferably 0.5 μm or more, more preferably 1.0 μm or more, still more preferably 1.5 μm or more, still more preferably 2.0 μm or more, particularly preferably 2.5 μm or more, and most preferably 3.0 μm or more. If the film thickness difference is in the above range, the area of contact with the vapor deposition mask used for forming a light emitting layer can be decreased, thereby preventing a decrease in yield in panel production due to particle generation and also preventing degradation of the light emitting element. Furthermore, one layer alone in the step-shaped cured patter can have a sufficiently large film thickness difference to permit a shortened process time. On the other hand, the film thickness difference $(\Delta T_{FT-HT})$ μm is preferably 10.0 μm or less, more preferably 9.5 μm or less, still more preferably 9.0 μm or less, still more preferably 8.5 μm or less, and particularly preferably 8.0 μm or less. If the film thickness difference is in the above range, the exposure energy required for forming a step-shaped cured pattern can be reduced to permit a shortened tact time.

The film thickness $(T_{FT})$ of the thick part 34 is preferably 2.0 μm or more, more preferably 2.5 μm or more, still more preferably 3.0 μm or more, still more preferably 3.5 μm or more, and particularly preferably 4.0 μm or more. This ensures depression of degradation of the light emitting element and permits a shortened process time.

The film thickness $(T_{FT})$ of the thick part 34 is preferably 10.0 μm or less, more preferably 9.5 μm or less, still more preferably 9.0 μm or less, still more preferably 8.5 μm or less, and particularly preferably 8.0 μm or less. If the film thickness $(T_{FT})$ is in the above range, the exposure energy required for forming a step-shaped cured pattern can be reduced to permit a shortened tact time.

The film thickness $(T_{HT})$ of the thin parts 35a, 35b, and 35c located with at least one step away from the thick part 34 is preferably 0.10 μm or more, more preferably 0.15 μm or more, still more preferably 0.20 μm or more, still more preferably 0.25 μm or more, and particularly preferably 0.30 μm or more. This ensures depression of degradation of the light emitting element and permits a shortened process time.

The film thickness $(T_{HT})$ of the thin parts 35a, 35b, and 35c is preferably 7.5 μm or less, more preferably 7.0 μm or less, still more preferably 6.5 μm or less, still more preferably 6.0 μm or less, and particularly preferably 5.5 μm or less. If the film thickness $(T_{HT})$ is in the above range, the exposure energy required for forming a step-shaped cured pattern can be reduced to permit a shortened tact time.

Furthermore, it is also preferable that the film thickness ($T_{FT}$) μm of the thick part 34 and the film thickness ($T_{HT}$) μm of the thin parts 35a, 35b, and 35c meet the relations represented by general formulae (α) to (γ).

$$2.0 \leq (T_{FT}) \leq 10.0 \tag{$\alpha$}$$

$$0.20 \leq (T_{HT}) \leq 7.5 \tag{$\beta$}$$

$$0.10 \times (T_{FT}) \leq (T_{HT}) \leq 0.75 \times (T_{FT}) \tag{$\gamma$}$$

It is more preferable that the film thickness ($T_{FT}$) μm of the thick part 34 and the film thickness ($T_{HT}$) μm of the thin parts 35a, 35b, and 35c further meet the relations represented by general formulae (δ) to (ζ).

$$2.0 \leq (T_{FT}) \leq 10.0 \tag{$\delta$}$$

$$0.30 \leq (T_{HT}) \leq 7.0 \tag{$\varepsilon$}$$

$$0.15 \times (T_{FT}) \leq (T_{HT}) \leq 0.70 \times (T_{FT}) \tag{$\zeta$}$$

If the film thickness ($T_{FT}$) μm of the thick part 34 and the film thickness ($T_{HT}$) μm of the thin parts 35a, 35b, and 35c are in the above ranges, it ensures depression of degradation of the light emitting element and permits a shortened process time.

In the organic EL display according to the present invention, each inclined slope in the cross section of a step-shaped cured pattern prepared from the negative type photosensitive resin composition preferably has a taper angle of 1° or more, more preferably 5° or more, still more preferably 10° or more, still more preferably 12° or more, and particularly preferably 15° or more. A taper angle in the above range ensures the production of an organic EL display having an improved resolution because it permits high density integration and arrangement of light emitting elements. The taper angle of each inclined slope in the cross section of a cured pattern is preferably 60° or less, more preferably 45° or less, still more preferably 40° or less, still more preferably 35° or less, and particularly preferably 30° or less. A taper angle in the above range serves to prevent disconnection while forming electrodes such as transparent electrodes and reflecting electrodes. It also serves to depress the electric field concentration along edges of electrodes, thereby reducing the degradation of the light emitting devices.

<Production Processes for Organic EL Display Device>

As a typical process that uses the negative type photosensitive resin composition according to the present invention, a process that uses a cured film prepared from the composition as a light-shielding pixel dividing layer in an organic EL display device is described below with reference to a schematic cross section shown in FIG. 1. (1): First, a thin-film-transistor (hereinafter TFT) 2 is formed on a glass substrate 1, followed by forming a film of a photosensitivity material for TFT planarization film, performing pattern processing by photolithography, and heat-curing it to form a cured film 3 that works for TFT planarization. (2): Next, a film of a silver-palladium-copper alloy (hereinafter APC) is formed by sputtering, followed by etching it through a photoresist for pattern processing to form an APC layer, forming a film of indium tin oxide (hereinafter ITO) on the APC layer by sputtering, and etching it through a photoresist for pattern processing to form a reflecting electrode 4 as first electrode. (3): Subsequently, the negative type photosensitive resin composition according to the present invention is spread and prebaked to form a prebaked film 5a. (4): Next, active actinic ray 7 is applied through a mask 6 that has an intended pattern. (5): Then, development is performed for pattern processing, followed by performing bleaching light exposure and middle-baking as required and heat-curing to form a cured pattern 5b having an intended pattern to serve as a light-shielding pixel dividing layer. (6): Subsequently, a film of an EL luminescence material is formed by deposition through a mask to produce an EL luminescence layer 8, forming a film of a magnesium-silver alloy (hereinafter MgAg) by deposition, and etching it through a photoresist for pattern processing to form a transparent electrode 9 as second electrode. (7): Then, a film of a photosensitive material for planarization film is formed, followed by performing pattern processing by photolithography, heat-curing it to form a cured film 10 for planarization, and subsequently joining a cover glass 11 to produce an organic EL display device having a light-shielding pixel dividing layer of the negative type photosensitive resin composition according to the present invention.

<Production Processes for Liquid Crystal Display Device>

Figure 2:
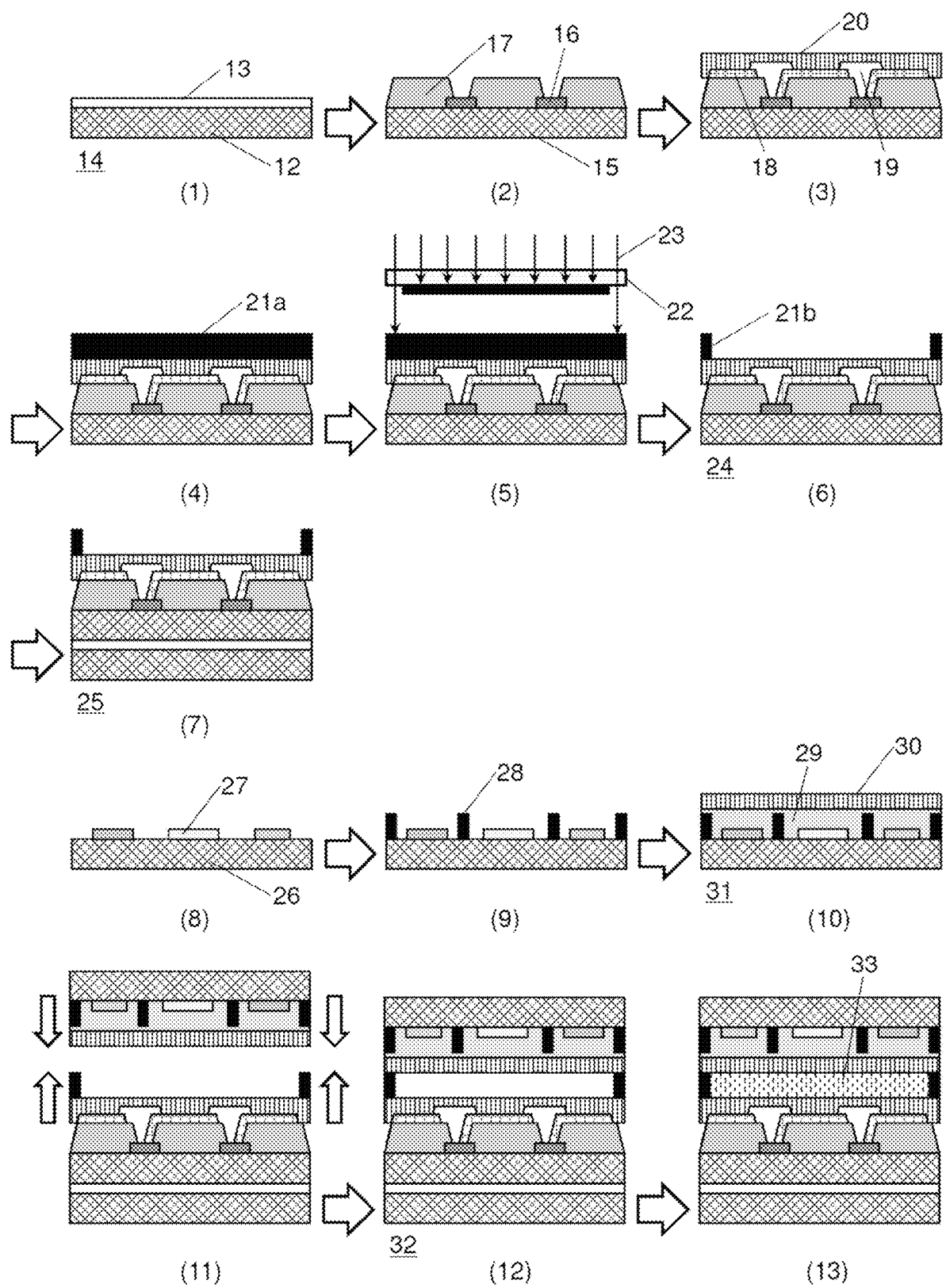
FIGS. 2 (1) to (13) show a flow chart illustrating schematic cross sections in a typical production process for a liquid crystal display device using a cured film of the negative type photosensitive resin composition according to the present invention.

As another typical process that uses the negative type photosensitive resin composition according to the present invention, a process that uses a cured film of the composition as a black column spacer (hereinafter BCS) in a liquid crystal display device and as a black matrix (hereinafter BM) in a color filter is described below with reference to a schematic cross section shown in FIG. 2. (1): First, a backlight unit (hereinafter BLU) 13 is formed on a glass substrate 12 to prepare a glass substrate 14 having a BLU. (2): In addition, a TFT 16 is formed on another glass substrate 15, followed by forming a film of a photosensitive material for TFT planarization film, performing pattern processing by photolithography, and heat-curing it to form a cured film 17 for TFT planarization. (3): Then, an ITO film is formed by sputtering, etching it through a photoresist for pattern processing, forming a transparent electrode 18, and forming thereon a planarization film 19 and an alignment layer 20. (4): Subsequently, the negative type photosensitive resin composition according to the present invention is spread and prebaked to form a prebaked film 21a. (5): Next, active actinic ray 23 is applied through a mask 22 that has an intended pattern. (6): Then, development is performed for pattern processing, followed by performing bleaching light exposure and middle-baking as required and heat-curing to form a cured pattern 21b having an intended pattern to serve as a light-shielding BCS, thereby producing a glass substrate 24 having a BCS. (7): Next, the glass substrate 14 and the glass substrate 24 are joined together to produce a glass substrate 25 having a BLU and a BCS.

(8): In addition, a three-color (red, green, and blue) filter 27 is formed on another glass substrate 26. (9): Then, a cured pattern 28 having an intended pattern as a light-shielding BM is formed from the negative type photosensitive resin composition according to the present invention by the same procedure as above. (10): Then, a film of a photosensitive material for planarization is formed, followed by performing pattern processing by photolithography, heat-curing it to form a cured film 29 for planarization, and forming an alignment layer 30 thereon to produce a color filter substrate 31. (11): Next, the glass substrate 25, which have the aforementioned BLU and BCS, and the color filter substrate 31 are joined together (12) to produce a glass substrate 32 having a BLU, BCS and BM. (13): Subsequently, liquid crystal is injected to form a liquid crystal layer 33 to produce a liquid crystal display device having a BCS and a BM formed from the negative type photosensitive resin composition according to the present invention.

As described above, the organic EL display and liquid crystal display production methods that use the negative type photosensitive resin composition according to the present invention can serve to produce a highly heat-resistant, light-shielding cured film that is pattern-processed and contains polyimide and/or polybenzoxazole, thereby realizing an increased yield, increased performance, and increased reliability in producing organic EL displays and liquid crystal displays.

When adopting a process that uses the negative type photosensitive resin composition according to the present invention, direct pattern processing can be performed by photolithography because the resin composition is photosensitive. Accordingly, compared with processes that uses a photoresist, the number of steps can be reduced to realize an increased productivity, a shortened process time, and a shortened takt time in producing organic EL displays and liquid crystal displays.

<Organic EL Display Using Cured Film Prepared from the Negative Type Photosensitive Resin Composition According to the Present Invention>

The negative type photosensitive resin composition according to the present invention serves suitably to produce an organic EL display device or liquid crystal display device. Furthermore, the negative type photosensitive resin composition according to the present invention serves to prepare a small-tapered pattern shape to produce a highly heat-resistant cured film. Therefore, it can be used suitably in components that require a high heat resistance and a small-tapered pattern shape such as insulation layers in pixel dividing layers etc. of organic EL display devices. If a cured film of the negative type photosensitive resin composition according to the present invention is used in components that are considered to suffer problems related to heat resistance or pattern shape, such as defects and characteristics deterioration in elements due to degassing caused by heat decomposition and disconnection in the electrode wiring attributable to a large-tapered pattern shape, it will serve to produce a high reliability element that is free from such problems. Furthermore, since the cured film is high in light-shielding capability, it serves for preventing the electrode wiring from becoming visible and for reducing external light reflection, leading to an improved contrast in image displaying. Therefore, if a cured film prepared from the negative type photosensitive resin composition according to the present invention is used as the pixel dividing layer in an organic EL display device, the contrast can be improved without forming a polarizing plate and a quarter wave plate on the light extraction side of the light emitting element.

In addition, the organic EL display according to the present invention preferably further has a curved displaying part. The curvature radius of the curved surface is preferably 0.1 mm or more, more preferably 0.3 mm or more, from the viewpoint of reducing display defects attributed to disconnection etc. in the curved displaying part. It is preferable for the curvature radius of the curved surface to be 10 mm or less, more preferably 7 mm or less, and still more preferably 5 mm or less, from the viewpoint of reducing the size and increasing the resolution of the organic EL display.

The production method for a display device that uses the negative type photosensitive resin composition according to the present invention includes the steps of (1) to (4) described below.

(1) A step for forming a coating film of the negative type photosensitive resin composition according to the present invention on a substrate, (2) a step for applying active actinic ray to the coating film of the negative type photosensitive resin composition through a photomask, (3) a step for development using an alkaline solution to form a pattern of the negative type photosensitive resin composition, and (4) a step for heating the pattern to produce a cured pattern of the negative type photosensitive resin composition.

<Step for Forming a Coating Film>

The production method for a display device that uses the negative type photosensitive resin composition according to the present invention includes: (1) a step for forming a coating film of a negative type photosensitive resin composition on a substrate. Available methods for forming a coating film of the negative type photosensitive resin composition according to the present invention include, for example, a method in which the resin composition is spread over a substrate and a method in which the resin composition is spread in a pattern over a substrate.

The substrate may be in the form of a substrate having electrodes or wiring of an oxide containing one or more selected from the group consisting of indium, tin, zinc, aluminum, and gallium, a metal (molybdenum, silver, copper, aluminum, chromium, titanium, etc.), or CNT (carbon nanotube) formed on a glass plate.

Oxides that contain one or more selected from the group consisting of indium, tin, zinc, aluminum, and gallium include indium tin oxide (ITO), indium zinc oxide (IZO), aluminum zinc oxide (AZO), indium gallium zinc oxide (IGZO), and zinc oxide (ZnO).

<Method for Spreading the Negative Type Photosensitive Resin Composition According to the Present Invention on a Substrate>

Available methods for spreading the negative type photosensitive resin composition according to the present invention on a substrate include, for example, microgravure coating, spin coating, dip coating, curtain flow coating, roll coating, spray coating, and slit coating. The coating thickness depends on the coating method used, solid content in the resin composition, viscosity thereof, and the like, but commonly, coating is performed in such a manner that the film thickness will be 0.1 to 30 μm after spreading and prebaking.

It is preferable to form a film by performing prebaking after spreading the negative type photosensitive resin composition according to the present invention on a substrate. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Spreading the Negative Type Photosensitive Resin Composition According to the Present Invention in a Pattern on a Substrate>

Available methods for spreading the negative type photosensitive resin composition according to the present invention in a pattern on a substrate include, for example, letterpress printing, intaglio printing, stencil printing, planographic printing, screen printing, ink jet printing, offset printing, and laser printing. The coating thickness depends on the coating method used, solid content in the negative type photosensitive resin composition according to the present invention, viscosity thereof, and the like, but commonly, coating is performed in such a manner that the film thickness will be 0.1 to 30 μm after spreading and prebaking.

It is preferable to spread the negative type photosensitive resin composition according to the present invention in a pattern on a substrate and then prebake it. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Pattern Processing of Coating Film Formed on Substrate>

Available methods for pattern processing of a coating film of the negative type photosensitive resin composition according to the present invention formed on a substrate include, for example, direct pattern processing by photolithography and pattern processing by etching. The method of direct pattern processing by photolithography is preferable from the viewpoint of decreasing the number of steps to ensure an improved productivity and a shortened process time.

<Step for applying active actinic ray through photomask>

The production method for a display device that uses the negative type photosensitive resin composition according to the present invention includes: (2) a step for applying active actinic ray to the coating film of the negative type photosensitive resin composition through a photomask.

The negative type photosensitive resin composition according to the present invention is spread on a substrate and prebaked to form a film, which is then exposed to light by using a light exposure device such as stepper, mirror projection mask aligner (MPA), and parallel light mask aligner (PLA). Available active actinic rays used for light exposure include ultraviolet light, visible light, electron beam, X-ray, KrF (wavelength 248 nm) laser, and ArF (wavelength 193 nm) laser. It is preferable to use the j-line (wavelength 313 nm), i-line (wavelength 365 nm), h-line (wavelength 405 nm), or g-line (wavelength 436 nm) of a mercury lamp. The exposure energy is commonly about 100 to 40,000 $J/m^2$ (10 to 4,000 $mJ/cm^2$) (as measured by i-line illuminance meter), and light may be exposed through a photomask having a desired pattern as required.

The production method for a display device that uses the negative type photosensitive resin composition according to the present invention preferably uses a halftone photomask as the photomask. The halftone photomask is preferably one that has a pattern containing transparent portions and light-shielding portions and that also has translucent portions, which are lower in transmittance than the transparent portions and higher in transmittance than the light blocking portions, located between the transparent portions and the light-shielding portions. The use of a halftone photomask for light exposure allows a step-shaped pattern to be formed after the development and heat curing steps. Here, the part cured by exposure to active actinic ray through the transparent portions correspond to the thick part, whereas the halftone-exposed parts where active actinic ray is applied through the translucent portions correspond to the thin parts.

The halftone photomask used in the production method for a display device that uses the negative type photosensitive resin composition according to the present invention preferably has an area where the transparent portions and the translucent portions are adjacent to each other. If there exists such an area where transparent portions and translucent portions are adjacent to each other, the pattern formed after the development step will have thick film parts as described above that correspond to the transparent portions of the photomask and thin film parts as described above that correspond to the translucent portions of the photomask. Furthermore, the halftone photomask has an area where the transparent portions and the translucent portions are adjacent to each other. After the development step, it is possible to form a pattern that has openings corresponding to the light-shielding portions of the photomask and thin film parts as described above corresponding to the translucent portions of the photomask. The use of a halftone photomask having an area as described above permits the formation of a step-shaped pattern that has the aforementioned thick film parts, thin film parts, and openings after the development step.

The halftone photomask used for the production method for a display device that uses the negative type photosensitive resin composition according to the present invention preferably has a transparent portion that has a polyhedral shape or that has a closed polyhedral shape entirely or partly defined by arcs. The existence of a transparent portion having such a shape permits the formation of a thick film part having that shape after the development step. Examples of such a polyhedral shape or a closed polyhedral shape entirely or partly defined by arcs include, for example, circle, square, rectangle, regular pentagon, pentagon, regular hexagon, hexagon, regular octagon, and octagon, as well as polygons, such as square and rectangle, partly defined by arcs, ellipse, and perfect circle. Such a thick film part that is adjacent to a thin film part exists in the form of columnar pattern having a closed polyhedral shape. Accordingly, in a process for producing organic EL display devices, for example, it is preferred because it can function as support for the deposition mask in the step for forming an organic EL layer as described later. It is preferable, furthermore, for the halftone photomask to have a light-shielding portion having a polyhedral shape or a closed polyhedral shape entirely or partly defined by arcs. The existence of a light-shielding portion having such a shape permits the formation of an opening having that shape after the development step. Such an opening will exist in the form of an opening pattern having a closed polyhedral shape and will be located adjacent to a thin film part. Accordingly, in a process for producing organic EL display devices, for example, its use is preferred because it can function as a light emitting pixel portion where an organic EL layer is formed in the step for forming an organic EL layer as described later. Since it has an area where a light-shielding portion and a translucent portion are adjacent to each other, it functions as a pixel dividing layer located adjacent to a light emitting pixel portion in an organic EL display device, serving suitably to prevent disconnection while forming electrodes and preventing a decrease in yield in panel production.

In the halftone photomask used for the method for producing a display device from the negative type photosensitive resin composition according to the present invention, the transparent portions preferably account for 1% or more, more preferably 3% or more, still more preferably 5% or more, and particularly preferably 10% or more, of the total area of the transparent portions and the translucent portions. If the translucent portions account for 1% or more of the total area, it serves for accurate placement of the deposition mask used for forming an organic EL layer to realize the formation of a high accuracy deposition pattern, leading to the prevention of a decrease in the panel production yield. On the other hand, the percent area of the transparent portions is preferably 50% or less, more preferably 40% or less, still more preferably 30% or less, and particularly preferably 25% or less. If the percent area of the transparent portions is 50% or less, the area of contact with the vapor deposition mask used for forming an organic EL layer can be decreased, thereby preventing a decrease in yield in panel production due to particle generation and also preventing degradation of the light emitting element.

For a halftone photomask in which the transparent portions have a transmittance of (% $T_{FT}$)%, the transmittance (% $T_{HT}$)% of the translucent portions is preferably 10% or more, more preferably 15% or more, still more preferably 20% or more, and particularly preferably 25% or more, of (% $T_{FT}$). If the transmittance (% $T_{HT}$) of the translucent portions is in the above range, the exposure energy required for forming a step-shaped cured pattern can be reduced to permit a shortened tact time. On the other hand, the transmittance (% $T_{HT}$)% of the translucent portions is preferably 60% or less, more preferably 55% or less, still more preferably 50% or less, and particularly preferably 45% or less, of (% $T_{FT}$). If the transmittance (% $T_{HT}$)% of the translucent portions is in the above range, a sufficiently large film thickness difference can be ensured between the thick part and the thin parts and between any two thin parts that are adjacent to each other with a step interposed therebetween, thereby preventing degradation of the light emitting element. Furthermore, one step-shaped cured pattern layer alone can have a sufficiently large difference in film thickness to permit a shortened process time.

When for a step-shaped cured pattern prepared by applying active actinic ray through a halftone photomask, the film thickness of the thin parts formed when the transmittance (% $T_{HT}$)% of the translucent portions is equal to 30% of (% $T_{FT}$) is denoted by ($T_{HT30}$) μm whereas the film thickness of the thin parts formed when the transmittance (% $T_{HT}$)% of the translucent portions is equal to 20% of (% $T_{FT}$) is denoted by ($T_{HT20}$) μm, the difference in film thickness between ($T_{HT30}$) and ($T_{HT20}$), which is denoted by ($\Delta T_{HT30-HT20}$) μm is preferably 0.3 μm or more, more preferably 0.5 μm or more, still more preferably 0.7 μm or more, and particularly preferably 0.8 μm or more. If the film thickness difference is in the above range, a sufficiently large film thickness difference can be ensured between the thick parts and the thin parts and between any two thin parts that are adjacent to each other with a step interposed therebetween, thereby preventing degradation of the light emitting element. Furthermore, one step-shaped cured pattern layer alone can have a sufficiently large difference in film thickness to realize a shortened process time. On the other hand, the film thickness difference ($\Delta T_{HT30-HT20}$) μm is preferably 1.5 μm or less, more preferably 1.4 μm or less, still more preferably 1.3 μm or less, and particularly preferably 1.2 μm or less. If the film thickness difference is in the above range, it serves to reduce the generation of a film thickness variation that can result from slight fluctuations in exposure energy attributed to the equipment etc., leading to an improved film thickness uniformity and an improved production yield of organic EL display devices.

Regarding the photomask, the method applied to the production of a display device using the negative type photosensitive resin composition according to the present invention may adopt two or more photomasks in which transparent portions are located in different regions. Light exposure performed in two or more stages using two or more photomasks in which transparent portions are located in different regions serves to form two or more light-exposed portions that correspond to the cured portions and the halftone-exposed portions that are formed when a halftone photomask is used. This allows a step-shaped pattern to be formed after the development and heat-curing steps.

Post-exposure baking may be performed after the light exposure step. Post-exposure baking can serve effectively for improving the resolution after the development step, and widening the allowable range of the development conditions. The post-exposure baking can be achieved by using an oven, hot plate, infrared ray, flash annealing device, laser annealing device, or the like. The post-exposure baking temperature is preferably 50° C. to 180° C., more preferably 60° C. to 150° C. The post-exposure baking time is preferably in the range of 10 seconds to several hours. A post-exposure baking time of 10 seconds to several hours can ensure smooth progress of the reaction and a shortened development time.

<Step for Development with Alkaline Solution to Form a Pattern>

The production method for a display device that uses the negative type photosensitive resin composition according to the present invention includes: (3) a step for development using an alkaline solution to form a pattern of the negative type photosensitive resin composition.

After the light exposure step, development is performed using an automatic development apparatus etc. Since the negative type photosensitive resin composition according to the present invention has a negative type photosensitivity, the unexposed portions are removed by a developer in the development step to provide a relief pattern.

In the above step (3) for development using an alkaline solution to form a pattern of the negative type photosensitive resin composition, each inclined slope in the cross section of the resulting pattern preferably has a taper angle of 1° or more, more preferably 5° or more, still more preferably 10° or more, still more preferably 12° or more, and particularly preferably 15° or more. A taper angle of 1° or more permits high density integration and arrangement of light emitting elements to ensure an improved resolution. On the other hand, the taper angle of each inclined slope in the cross section of the resulting pattern is preferably 60° or less, more preferably 45° or less, still more preferably 40° or less, still more preferably 35° or less, and particularly preferably 30° or less. A taper angle of 60° or less serves to prevent disconnection while forming electrodes such as transparent electrodes and reflecting electrodes. It also serves to depress the electric field concentration along edges of electrodes, thereby reducing the degradation of the light emitting devices.

Furthermore, in the step (3) for development using an alkaline solution to form a pattern of the negative type photosensitive resin composition, it is preferable for the resulting pattern to be a step-shaped pattern. In the case of a step-shaped pattern, the taper angle herein refers to the taper angle of the inclined slope located at the end in the cross section of a thin film part of the step-shaped pattern. It is preferable for the step-shaped pattern to have a taper angle as described above. A taper angle of 1° or more permits high density integration and arrangement of light emitting elements to allow each thin film part to have a small-tapered shape after the development step and accordingly, the degree of UV curing of the step-shaped pattern can be increased in the step (3b) for photo-curing a pattern of the negative type photosensitive resin composition, which will be described later, thereby serving suitably in combination with the effect in depressing the pattern reflow in the heat curing step. Accordingly, this permits the formation of a step-shaped pattern in which an adequate difference in film thickness exists between the thick film part and the thin film parts after the heat curing step and the formation of a pattern of a small-tapered shape in the thin film parts after the heat curing step. Such thin film parts are preferred because they can function as a pixel dividing layer in an organic EL display device and prevent disconnection while forming electrodes such as transparent electrodes and reflecting electrodes, thereby preventing a decrease in yield in panel production.

An alkaline developer is generally used as the developer. Preferable alkaline developers include, for example, organic alkaline solutions and aqueous solutions of compounds that show alkalinity, of which aqueous solutions of compounds that show alkalinity, that is, alkaline aqueous solutions, are more preferable from an environmental viewpoint.

Such organic alkaline solutions and compounds that show alkalinity include, for example, 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethylammonium hydroxide, tetraethylammonium hydroxide, sodium hydroxide, potassium hydroxide, magnesium hydroxide, calcium hydroxide, barium hydroxide, sodium carbonate, and potassium carbonate, of which tetramethylammonium hydroxide and tetraethylammonium hydroxide are more preferable from the viewpoint of decreasing the metal impurities in the cured film and ensuring the production of display devices with fewer display defects.

An organic solvent may be used as the developer. The developer to be used may be a mixed solution that contains both an organic solvent and a poor solvent for the negative photosensitive resin composition according to the present invention.

Good development methods include, for example, paddle development, spray development, and dip development. Good procedures for paddle development include, for example, a procedure in which a developer as given above is spread directly on the light-exposed film, followed by leaving it to stand for an appropriate period of time and a procedure in which a developer as given above is sprayed for an appropriate period of time to coat the light-exposed film, followed by leaving it to stand for an appropriate period of time. Good procedures for spray development include, for example, a procedure in which a developer as given above is sprayed continuously for an appropriate period of time to the light-exposed film. Good procedures for dip development include, for example, a procedure in which the light-exposed film is dipped in a developer as given above for an appropriate period of time and a procedure in which the light-exposed film is dipped in a developer as given above, followed by applying ultrasonic wave continuously for an appropriate period of time. It is preferable to adopt paddle development as the development method from the viewpoint of the prevention of apparatus contamination in the development step and the reduction of the developer consumption to achieve a decrease in process cost. The prevention of apparatus contamination in the development step serves for preventing substrate contamination in the development step to ensure the production of display devices with fewer display defects. On the other hand, it is preferable to adopt spray development as the development method from the viewpoint of decreasing the residues remaining after the development step. It is preferable to adopt dip development as the development method from the viewpoint of recycling the developer to ensure a reduction in the developer consumption and a decrease in process cost.

The development time is preferably 5 seconds or more, more preferably 10 seconds or more, still more preferably 30 seconds or more, and particularly preferably 1 minute or more. A development time in the above range ensures a decreased residue formation in the alkaline development step. On the other hand, from the viewpoint of shortening the tact time, the development time is preferably 30 minutes or less, more preferably 15 minutes or less, still more preferably 10 minutes or less, and particularly preferably 5 minutes or less.

It is preferable for the relief pattern resulting from the development step to be washed with a rinsing liquid. The rinsing liquid is preferably water when an alkaline aqueous solution is used as developer. Examples of the rinsing liquid include aqueous solutions of alcohols such as ethanol and isopropyl alcohol, aqueous solutions of esters such as propylene glycol monomethyl ether acetate, and aqueous solutions of compounds that show acidity such as carbon dioxide gas, hydrochloric acid, and acetic acid. An organic solvent may be used as the rinsing liquid.

After obtaining a pattern of the negative type photosensitive resin composition according to the present invention by photolithography, bleaching light exposure may be performed. Bleaching light exposure serves to control the pattern shape of the heat-cured film as desired. It also serves to produce a cured film with a higher transparency.

Bleaching light exposure can be performed using an exposure machine such as stepper, mirror projection mask aligner (MPA), and parallel light mask aligner (PLA). Available active actinic rays used for bleaching light exposure include ultraviolet light, visible light, electron beam, X-ray, KrF (wavelength 248 nm) laser, and ArF (wavelength 193 nm) laser. It is preferable to use the j-line (wavelength 313 nm), i-line (wavelength 365 nm), h-line (wavelength 405 nm), or g-line (wavelength 436 nm) of a mercury lamp. The exposure energy is commonly about 500 to 500,000 J/m$^2$ (50 to 50,000 mJ/cm$^2$) (as measured by i-line illuminance meter), and light may be exposed through a mask having a desired pattern as required.

Middle-baking may be performed after producing a pattern of the negative type photosensitive resin composition according to the present invention. Middle-baking serves to ensure an improved resolution after the heat-curing step and also allow a desired pattern shape to be obtained after the heat-curing step. The middle-baking can be achieved by using an oven, hot plate, infrared ray, flash annealing device, laser annealing device, or the like. The middle-baking temperature is preferably 50° C. to 250° C., more preferably 70° C. to 220° C. The middle-baking time is preferably in the range of 10 seconds to several hours. The middle-baking may be performed in two or more stages such as middle-baking at 100° C. for 5 minutes, followed by middle-baking at 150° C. for 5 minutes.

<Step for Photo-Curing a Pattern>

In the production method for a display device that uses the negative type photosensitive resin composition according to the present invention, the step (3) for development using an alkaline solution to form a pattern of the negative type photosensitive resin composition is preferably followed by a step (3b) for photo-curing the pattern of the negative type photosensitive resin composition.

The step (3b) for photo-curing the pattern serves to increase the crosslink density in the pattern and decrease the content of low molecular weight components that can cause degassing, leading to an increased reliability of light emitting elements having a pattern of the negative type photosensitive resin composition. In the case where the pattern of the negative type photosensitive resin composition has a stepped shape, the pattern reflow can be depressed in the heat curing step to permit the formation of a step-shaped pattern having a sufficiently large difference in film thickness between the thick film part and the thin film parts. In addition, the reflow property of the film surface is maintained in the heat curing step and accordingly, the flatness is increased to prevent a decrease in the yield in panel production. Furthermore, when producing an organic EL display having a pattern of the negative type photosensitive resin composition, the area of contact with the vapor deposition mask used for forming an organic EL layer can be decreased, thereby preventing a decrease in yield in panel production due to particle generation and also preventing degradation of the light emitting element.

<Step for Applying Active Actinic Ray to a Pattern>

The step (3b) for photo-curing the pattern preferably includes a substep for applying active actinic ray to the pattern. The substep for applying active actinic ray to the pattern serves to depress the pattern reflow in the heat curing step of the pattern of the negative type photosensitive resin composition. In addition, it works to prevent a decrease in the yield in panel production.

Good methods for applying active actinic ray to the pattern of the negative type photosensitive resin composition in the aforementioned substep for applying active actinic ray to the pattern include, for example, bleaching light exposure using a light exposure device such as stepper, scanner, mirror projection mask aligner (MPA), and parallel light mask aligner (PLA).

The exposure wavelength of the active actinic ray used in the step for applying active actinic ray to a pattern is preferably 10 nm or more, more preferably 100 nm or more, and still more preferably 200 nm or more. On the other hand, the exposure wavelength of the active actinic ray is preferably 450 nm or less, more preferably 420 nm or less, still more preferably 380 nm or less, and particularly preferably 340 nm or less. Furthermore, it is preferable to use the j-line (wavelength 313 nm), i-line (wavelength 365 nm), h-line (wavelength 405 nm), or g-line (wavelength 436 nm) of a mercury lamp, and it is particularly preferable to use a mixed ray of the i-line, h-line, and g-line. If the exposure wavelength is in the above range, it serves to depress the pattern reflow in the heat curing step for the pattern of the negative type photosensitive resin composition. In addition, it works to prevent a decrease in the yield in panel production. Furthermore, from the viewpoint of increasing the stepped film thickness, the exposure wavelength is preferably 310 nm or less, more preferably 270 nm or less, still more preferably 230 nm or less, and particularly preferably 200 nm or less.

Good active actinic rays to use for bleaching light exposure in the step for applying active actinic ray to a pattern include, for example, ultraviolet light, visible light, electron beam, X-ray, XeF (wavelength 351 nm) laser, XeCl (wavelength 308 nm) laser, KrF (wavelength 248 nm) laser, or ArF (wavelength 193 nm) laser.

Good lamps to use for the application of active actinic ray in the step for applying active actinic ray to a pattern include, for example, ultra-high pressure mercury lamp, high pressure mercury lamp, low pressure mercury lamp, metal halide lamp, Xe excimer lamp, KrF excimer lamp, and ArF excimer lamp.

The exposure energy of the active actinic ray to use in the step for applying active actinic ray to a pattern is preferably 100 J/m$^2$ (10 mJ/cm$^2$) or more as measured by an i-line illuminance meter. On the other hand, the exposure energy of the active actinic ray is preferably 50,000 J/m$^2$ (5,000 mJ/cm$^2$) or less as measured by an i-line illuminance meter. If the exposure energy is in the above range, it serves to depress the pattern reflow in the heat curing step for the pattern of the negative type photosensitive resin composition. In addition, it works to prevent a decrease in the yield in panel production.

In the case where the photomask used in the step (2) for applying active actinic ray to the coating film of the negative type photosensitive resin composition through a photomask is a halftone photomask, the exposure energy ratio $(E_{BLEACH})/(E_{EXPO})$, where $(E_{BLEACH})$ mJ/cm$^2$ is the exposure energy of the active actinic ray used in the step for applying active actinic ray to a pattern whereas $(E_{EXPO})$ mJ/cm$^2$ is the exposure energy for the photomask's transparent portions in the step (2) for applying active actinic ray through a photomask, is preferably 0.1 or more, more preferably 0.3 or more, still more preferably 0.5 or more, still more preferably 0.7 or more, and particularly preferably 1 or more. If the exposure energy ratio is in the above range, it serves to depress the pattern reflow in the heat curing step for the pattern of the negative type photosensitive resin composition. In addition, it works to prevent a decrease in the yield in panel production. From the viewpoint of increasing the stepped film thickness, the exposure energy ratio is preferably 0.5 or more, more preferably 0.7 or more, and still more preferably 1 or more. From the viewpoint of increasing the yield, furthermore, the exposure energy ratio is preferably less than 4, more preferably less than 3.5, and still more preferably less than 3.

Preferable examples of the treatment atmosphere for bleaching light exposure performed in the step for applying active actinic ray to a pattern include, for example, air, nitrogen, helium, neon, argon, krypton, xenon, gas atmospheres containing 1 to 10,000 ppm (0.0001 to 1 mass %) of oxygen, vacuum, water, and organic solvents, of which air is more preferable from the viewpoint of shortening the takt time of bleaching light exposure. From the viewpoint of increasing the stepped film thickness, nitrogen, helium, neon, argon, krypton, xenon, gas atmospheres containing 1 to 10,000 ppm (0.0001 to 1 mass %) of oxygen, vacuum, and water are preferable. The content of oxygen in the gas atmospheres containing oxygen is preferably 1,000 ppm or less, more preferably 100 ppm or less.

The treatment temperature for bleaching light exposure performed in the step for applying active actinic ray to a pattern is preferably 10° C. or more, more preferably 20° C. or more, still more preferably 30° C. or more, still more preferably 40° C. or more, and particularly preferably 60° C. or more. On the other hand, the treatment temperature is preferably 200° C. or less, more preferably 150° C. or less, still more preferably 120° C. or less, and particularly preferably 100° C. or less. If the treatment temperature is in the above range, it serves to depress the pattern reflow in the heat curing step for the pattern of the negative type photosensitive resin composition. In addition, it works to prevent a decrease in the yield in panel production.

<Step for Active Gas Ultraviolet Ray Treatment of a Pattern>

The step (3b) for photo-curing the pattern preferably includes a substep for performing active gas ultraviolet ray treatment of the pattern. The step (3b) for photo-curing the pattern may include both the aforementioned substep for applying active actinic ray to the pattern and the aforementioned substep for performing active gas ultraviolet ray treatment of the pattern. The substep for performing active gas ultraviolet ray treatment of the pattern serves to depress the pattern reflow in the heat curing step of the pattern of the negative type photosensitive resin composition. In addition, it works to prevent a decrease in the yield in panel production.

Examples of the method for active gas ultraviolet ray treatment of the pattern of the negative type photosensitive resin composition performed in the aforementioned substep for performing active gas ultraviolet ray treatment of the pattern include, for example, applying ultraviolet ray to it while exposing it to gas.

Gases useful for the active gas ultraviolet ray treatment performed in the aforementioned substep for performing active gas ultraviolet ray treatment of the pattern include a gas containing one or more components selected from the group consisting of oxygen, ozone, argon, fluorine, and chlorine. From the viewpoint of increasing the stepped film thickness, it is preferable to use a gas containing oxygen or ozone as a component. When using a gas containing oxygen as a component, it is preferable for oxygen to account for 10 to 100 mass % of the gas from the viewpoint of increasing the stepped film thickness.

The exposure wavelength of the ultraviolet ray used for the active gas ultraviolet ray treatment in the aforementioned substep for performing active gas ultraviolet ray treatment of the pattern is preferably 10 nm or more, more preferably 20 nm or more, still more preferably 50 nm or more, and particularly preferably 100 nm or more. On the other hand, the exposure wavelength of the ultraviolet ray to be applied is preferably 450 nm or less, more preferably 400 nm or less, still more preferably 350 nm or less, and particularly preferably 300 nm or less. It is particularly preferable to use ultraviolet ray having a wavelength of 185 nm or a wavelength of 254 nm. If the exposure wavelength is in the above range, it serves to depress the pattern reflow in the heat curing step for the pattern of the negative type photosensitive resin composition. In addition, it works to prevent a decrease in the yield in panel production.

The ultraviolet ray illuminance used in the aforementioned substep for performing active gas ultraviolet ray treatment of the pattern is preferably 3 mW/cm$^2$ or more. On the other hand, the ultraviolet ray illuminance is preferably 2,000 mW/cm$^2$ or less. If the ultraviolet ray illuminance is in the above range, it serves to depress the pattern reflow in the heat curing step for the pattern of the negative type photosensitive resin composition. In addition, it works to prevent a decrease in the yield in panel production.

The treatment temperature for the active gas ultraviolet ray treatment in the aforementioned substep for performing active gas ultraviolet ray treatment of the pattern is preferably 10° C. or more, more preferably 20° C. or more, still more preferably 30° C. or more, and particularly preferably 40° C. or more. On the other hand, the treatment temperature is preferably 200° C. or less, more preferably 150° C. or less, still more preferably 120° C. or less, and particularly preferably 100° C. or less. If the treatment temperature is in the above range, it serves to depress the pattern reflow in the heat curing step for the pattern of the negative type photosensitive resin composition. in addition, it works to prevent a decrease in the yield in panel production.

The treatment time for the ultraviolet active gas ray treatment in the aforementioned substep for performing active gas ultraviolet ray treatment of the pattern is preferably 10 seconds or more. The other hand, the treatment time is preferably 30 minutes or less. If the treatment time is in the above range, it serves to depress the pattern reflow in the heat curing step for the pattern of the negative type photosensitive resin composition. It also serves to shorten the takt time.

<Step for Plasma Treatment of a Pattern>

The step (3b) for photo-curing the pattern preferably includes a substep for performing plasma treatment of the pattern. The step (3b) for photo-curing the pattern may include both the aforementioned substep for applying active actinic ray to the pattern and the aforementioned substep for performing plasma treatment of the pattern. The substep for performing plasma treatment of the pattern serves to depress the pattern reflow in the heat curing step of the pattern of the negative type photosensitive resin composition. In addition, it works to prevent a decrease in the yield in panel production.

Examples of the method for plasma treatment of the pattern of the negative type photosensitive resin composition performed in the aforementioned substep for performing plasma treatment of the pattern include, for example, exposing it to gas that is ionized or radicalized by applying electromagnetic waves.

Gases useful for plasma treatment performed in the aforementioned substep for performing plasma treatment of the pattern include a gas containing one or more components selected from the group consisting of oxygen, ozone, argon, fluorine, and chlorine. From the viewpoint of increasing the stepped film thickness, it is preferable to use a gas containing oxygen or ozone as a component. When using a gas containing oxygen as a component, it is preferable for oxygen to account for 10 to 100 mass % of the gas.

The high-frequency power used in the aforementioned substep for performing plasma treatment of the pattern is preferably 100 W or more. On the other hand, the high-frequency power is preferably 10,000 W or less. If the high-frequency power is in the above range, it serves to depress the pattern reflow in the heat curing step for the pattern of the negative type photosensitive resin composition. In addition, it works to prevent a decrease in the yield in panel production.

The gas flow rate used in the aforementioned substep for performing plasma treatment of the pattern is preferably 10 sccm (standard cc/min) or more. On the other hand, the gas flow rate is preferably 200 sccm or less. If the gas flow rate is in the above range, it serves to depress the pattern reflow in the heat curing step for the pattern of the negative type photosensitive resin composition. In addition, it works to prevent a decrease in the yield in panel production.

The treatment pressure used in the aforementioned substep for performing plasma treatment of the pattern is preferably 1 Pa or more. On the other hand, the treatment pressure is preferably 100 Pa or less. If the treatment pressure is in the above range, it serves to depress the pattern reflow in the heat curing step for the pattern of the negative type photosensitive resin composition. In addition, it works to prevent a decrease in the yield in panel production.

The treatment temperature for the plasma treatment in the aforementioned substep for performing plasma treatment of the pattern is preferably 10° C. or more, more preferably 20° C. or more, still more preferably 30° C. or more, and particularly preferably 40° C. or more. On the other hand, the treatment temperature is preferably 200° C. or less, more preferably 150° C. or less, still more preferably 120° C. or less, and particularly preferably 100° C. or less. If the treatment temperature is in the above range, it serves to depress the pattern reflow in the heat curing step for the pattern of the negative type photosensitive resin composition. In addition, it works to prevent a decrease in the yield in panel production.

The treatment time of the plasma treatment performed in the aforementioned substep for performing plasma treatment of the pattern is preferably 10 seconds or more. On the other hand, the treatment time is preferably 30 minutes or less. If the treatment time is in the above range, it serves to depress the pattern reflow in the heat curing step for the pattern of the negative type photosensitive resin composition. It also serves to shorten the takt time.

<Step for Heating Pattern to Produce Patterned Cured Film>

The production method for a display device that uses the negative type photosensitive resin composition according to the present invention includes a step (4) for heating the pattern of the negative type photosensitive resin composition to produce a cured pattern of the negative type photosensitive resin composition.

The heating of the patterned film of the negative type photosensitive resin composition according to the present invention formed on a substrate can be carried out by using an oven, hot plate, infrared ray, flash anneal apparatus, laser anneal apparatus, or the like. The heating to heat-cure the pattern of the negative type photosensitive resin composition according to the present invention serves to ensure the production of a cured film with an improved heat resistance and also ensure the formation of a small-tapered pattern shape.

The heat-curing temperature is preferably 150° C. or more, more preferably 200° C. or more, and still more preferably 250° C. or more. A heat-curing temperature of 150° C. or more ensures the formation of a cured film with an increased heat resistance and the formation of a heat-cured film of a pattern shape having a smaller taper. On the other hand, from the viewpoint of shortening the tact time, the heat-curing temperature is preferably 500° C. or less, more preferably 450° C. or less, and still more preferably 400° C. or less.

The heat-curing time is preferably 1 minute or more, more preferably 5 minutes or more, still more preferably 10 minutes or more, and particularly preferably 30 minutes or more. A heat-curing time of 1 minute or more ensures a pattern shape having a smaller taper after heat-curing. On the other hand, from the viewpoint of shortening the tact time, the heat-curing time is preferably 300 minutes or less, more preferably 250 minutes or less, still more preferably 200 minutes or less, and particularly preferably 150 minutes or less. Furthermore, the heat-curing may be performed in two or more stages such as heat-curing at 150° C. for 30 minutes, followed by heat-curing at 250° C. for 30 minutes.

Furthermore, the negative type photosensitive resin composition according to the present invention can form cured films that serve suitably in components such as pixel dividing layer, electrode insulation layer, wiring insulation layer, interlaminar insulation layer, TFT planarization layer, electrode planarization layer, wiring planarization layer, TFT protection layer, electrode protection layer, wiring protection layer, gate insulation layer, color filter, black matrix, and black column spacer. Furthermore, the organic EL display according to the present invention contains one or more selected from the group consisting of pixel dividing layer, electrode insulation layer, wiring insulation layer, TFT planarization layer, electrode planarization layer, wiring planarization layer, TFT protection layer, electrode protection layer, and wiring protection layer that are formed using the cured film. In particular, being high in light-shielding capability, it can serve suitably as light-shielding pixel dividing layer, black matrix, or black column spacer in the organic EL display. In addition, it will be possible to produce elements and display devices in which the cured film is used for the aforementioned purposes.

Furthermore, the display device production method that uses the negative type photosensitive resin composition according to the present invention can serve to produce a highly heat-resistant, light-shielding cured film that is pattern-processed and contains polyimide and/or polybenzoxazole, thereby realizing an increased yield, increased performance, and increased reliability in producing organic EL displays and liquid crystal displays. In addition, since the negative type photosensitive resin composition according to the present invention can be processed directly to form a pattern by photolithography, the number of steps can be reduced, compared with processes that use photoresists, to realize an increased productivity, a shortened process time, and a shortened takt time.

EXAMPLES

The present invention will now be illustrated more specifically with reference to Examples and Comparative examples, but it should be understood that the invention is not construed as being limited to the scopes thereof. Some of the compounds used are referred to using abbreviations as listed below.

6FDA: 2,2-(3,4-dicarboxyphenyl)hexafluoropropane dianhydride; 4,4'-hexafluoropropane-2,2-diyl-bis(1,2-phthalic anhydride)

A-BPEF: NK ESTER (registered trademark) A-BPEF (manufactured by Shin-Nakamura Chemical Co., Ltd.; 9,9-bis[4-(2-acryloxyethoxy)phenyl] fluorene)

AcrTMS: 3-acryloxypropyl trimethoxysilane

A-DPH-12E: NK ESTER (registered trademark) A-DPH-12E (manufactured by Shin-Nakamura Chemical Co., Ltd.; ethoxylated dipentaerythritol hexaacrylate having 12 oxyethylene structures in the molecule)

A-DPH-6E: NK ESTER (registered trademark) A-DPH-6E (manufactured by Shin-Nakamura Chemical Co., Ltd.; ethoxylated dipentaerythritol hexaacrylate having 6 oxyethylene structures in the molecule)

A-DPH-6P: NK ESTER (registered trademark) A-DPH-6P (manufactured by Shin-Nakamura Chemical Co., Ltd.; propoxylated dipentaerythritol hexaacrylate having 6 oxypropylene structures in the molecule)

APC: Argentum-Palladium-Cupper (silver-palladium-copper alloy)

BAHF: 2,2-bis(3-amino-4-hydroxyphenyl) hexafluoropropane

BFE: 1,2-bis(4-formylphenyl) ethane

BGPF: 9,9-bis(4-glycidoxyphenyl) fluorene

BHPF: 9,9-bis(4-hydroxyphenyl) fluorene

Bis-A-AF: 2,2-bis(4-aminophenyl) hexafluoropropane

Bk-A1103: CHROMOFINE (registered trademark) BLACK A1103 (manufactured by Dainichiseika Colour & Chemicals Mfg. Co., Ltd.; azo based black pigment having a primary particle diameter of 50 to 100 nm)

Bk-S0084: PALIOGEN (registered trademark) BLACK S0084 (manufactured by BASF; perylene based black pigment having a primary particle diameter of 50 to 100 nm)

Bk-S0100CF: IRGAPHOR (registered trademark) BLACK S0100CF (manufactured by BASF, benzofuranone based black pigment with primary particle diameter of 40 to 80 nm)

CPL-1: ε-caprolactone modified dipentaerythritol hexaacrylate having an oxypentylene carbonyl structure in the molecule CPL-2: ε-caprolactone modified dipentaerythritol hexaacrylate having four oxypentylene carbonyl structures in the molecule CPL-3: ε-caprolactone modified dipentaerythritol hexaacrylate having five oxypentylene carbonyl structures in the molecule D.BYK-167: DISPERBYK (registered trademark)-167 (manufactured by BYK-Chemie Japan, dispersant having an amine value)

DFA: N,N-dimethylformamide dimethyl acetal

DMeDMS: dimethyl dimethoxysilane

DPCA-20: KAYARAD (registered trademark) DPCA-20 (manufactured by Nippon Kayaku Co., Ltd.; ε-caprolactone modified dipentaerythritol hexaacrylate having two oxypentylene carbonyl structures in the molecule)

DPCA-30: KAYARAD (registered trademark) DPCA-30 (manufactured by Nippon Kayaku Co., Ltd.; ε-caprolactone modified dipentaerythritol hexaacrylate having three oxypentylene carbonyl structures in the molecule)

DPCA-60: KAYARAD (registered trademark) DPCA-60 (manufactured by Nippon Kayaku Co., Ltd.; ε-caprolactone modified dipentaerythritol hexaacrylate having six oxypentylene carbonyl structures in the molecule)

DPCA-120: KAYARAD (registered trademark) DPCA-120 (manufactured by Nippon Kayaku Co., Ltd.; ε-caprolactone modified dipentaerythritol hexaacrylate having 12 oxypentylene carbonyl structures in the molecule)

DPHA: KAYARAD (registered trademark) DPHA (manufactured by Nippon Kayaku Co., Ltd., dipentaerythritol hexaacrylate)

FLN-1: 9,9-bis(4-acryloxyphenyl) fluorene

FLN-2: 9,9-bis[3,4-bis(2-acryloxyethoxy)phenyl] fluorene

FLN-3: 9,9-bis[4-(2-acryloxyethoxy)-1-naphthyl] fluorene

FLN-4: a radical polymerizable compound having two fluorene backbones in the molecule and two acryloxy groups in the molecule FLN-5: ε-caprolactone modified 9,9-bis(4-hydroxyphenyl) fluorene diacrylate having two oxypentylene carbonyl structures in the molecule FR-201: 9,9-bis(4-glycidoxyphenyl) fluorene (manufactured by Tronly)

FR-301: 9,9-bis[4-(2-hydroxy-3-acryloxypropoxy)phenyl] fluorene (manufactured by Tronly)

GMA: glycidyl methacrylate

HFHA: N,N'-bis[5,5'-hexafluoropropane-2,2-diyl-bis(2-hydroxyphenyl)] bis(3-aminobenzoic acid amide)

HX-220: KAYARAD (registered trademark) HX-220 (manufactured by Nippon Kayaku Co., Ltd.; ε-caprolactone modified hydroxypivalic acid neopentyl glycol diacrylate having two oxypentylene carbonyl structures in the molecule)

IDE-1: 1,1-bis(4-glycidoxyphenyl)-3-phenyl indane

IDN-1: 1,1-bis(4-acryloxyphenyl) indane

IDN-2: 1,1-bis[4-(2-acryloxyethoxy)phenyl] indane

IDN-3: 1,1-bis[4-(2-hydroxy-3-acryloxypropoxy)phenyl] indane

IGZO: indium-gallium-zinc oxide

ITO: indium tin oxide

MAA: methacrylic acid

MAP: 3-aminophenol; m-aminophenol

MBA: 3-methoxy-n-butyl acetate

MeTMS: methyl trimethoxysilane

MgAg: Magnesium-Argentum (magnesium-silver alloy)

MOI: Karenz (registered trademark) MOI (manufactured by Showa Denko K.K., 2-methacryloxyethyl isocyanate)

NA: 5-norbornene-2,3-dicarboxylic anhydride; nadic anhydride

NC-7000L: an epoxy resin (manufactured by Nippon Kayaku Co., Ltd.; having a structural unit containing a naphthalene backbone, a benzene backbone, and two epoxy groups)

NCI-831: Adeka ARKLS (registered trademark) NCI-831 (manufactured by Adeka Corporation, oxime ester based photo-initiator)

NMP: N-methyl-2-pyrolidone

ODPA: bis(3,4-dicarboxyphenyl) ether dianhydride; oxydiphthalic dianhydride

P.B.15:6: C. I. Pigment Blue 15:6

P.R.254: C. I. Pigment Red 254

P.V.23: C. I. Pigment Violet 23

P.Y.139: C. I. Pigment Yellow 139

PGMEA: propylene glycol monomethyl ether acetate

PHA: phthalic anhydride

PhTMS: phenyl trimethoxysilane

S-20000: SOLSPERSE (registered trademark) 20000 (manufactured by Lubrizol, polyether based dispersant)

SiDA: 1,3-bis(3-aminopropyl) tetramethyl disiloxane

STR: styrene

TCDM: tricyclo[5.2.1.0$^{2,6}$]decane-8-yl methacrylate; dimethylol-tricyclodecane dimethacrylate THPHA: 1,2,3,6-tetrahydrophthalic anhydride TMAH: tetramethylammonium hydroxide TMOS: tetramethoxysilane TMSSucA: 3-trimethoxysilylpropyl succinic anhydride TPK-1227: carbon black, surface-treated for introduction of sulfonic acid group (manufactured by CABOT)

TrisP-PA: 1,1-bis(4-hydroxyphenyl)-1-[4-[1-(4-hydroxyphenyl)-1-methylethyl]phenyl] ethane (manufactured by Honshu Chemical Industry Co., Ltd.)

WR-301: ADEKA ARKLS (registered trademark) WR-301 (manufactured by Adeka Corporation; polycyclic side chain-containing resin obtainable by reacting carboxylic anhydride with a resin obtainable through ring opening addition reaction of an epoxy group-containing aromatic compound and an unsaturated carboxylic acid, having an acid equivalent of 560 and a double bond equivalent of 450)

Synthesis Example (A)

In a three neck flask, 18.31 g (0.05 mol) of BAHF, 17.42 g (0.3 mol) of propylene oxide, and 100 mL of acetone were weighed out and dissolved. To this liquid, a solution of 20.41 g (0.11 mol) of 3-nitrobenzoyl chloride dissolved in 10 mL of acetone was added dropwise. After the end of dropping, the solution was allowed to react at −15° C. for 4 hours, followed by allowing it to return to room temperature. The resulting white solid precipitate was separated out by filtration and vacuum-dried at 50° C. A 30 g portion of the resulting solid material was put in a 300 mL stainless steel autoclave and dispersed in 250 mL of 2-methoxy ethanol, followed by adding 2 g of 5% palladium-carbon. Then, a balloon was used to introduce hydrogen to allow a reaction to continue for 2 hours at room temperature. After the 2-hour period, it was confirmed that the balloon would deflate no more. After the end of the reaction, the solution was filtrated to remove the palladium compound used as catalyst and concentrated by evaporation under reduced pressure to produce a hydroxyl group-containing diamine compound (HFHA) having a structure as given below.

[Chemical compound 29]

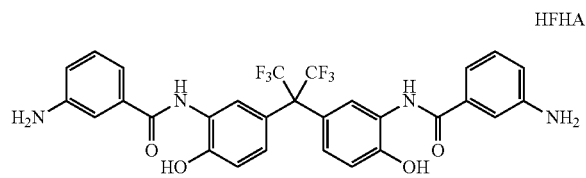

HFHA

Synthesis Example 1 Synthesis of Polyimide (PI-1)

In a three neck flask in a dry nitrogen flow, 31.13 g of BAHF (0.085 mol; 77.3 mol % relative to total quantity of structural units derived from amines or derivatives thereof), 1.24 g of SiDA (0.0050 mol; 4.5 mol % relative to total quantity of structural units derived from amines or derivatives thereof), 2.18 g of MAP as end capping agent (0.020 mol; 18.2 mol % relative to total quantity of structural units derived from amines or derivatives thereof), and 150.00 g of NMP were weighed out and dissolved. To this liquid, a solution of 31.02 g (0.10 mol; 100 mol % relative to total quantity of structural units derived from carboxylic acids or derivatives thereof) of ODPA dissolved in 50.00 g of NMP was added, stirred at 20° C. for 1 hour, and then stirred at 50° C. for 4 hours. Subsequently, 15 g of xylene was added and stirred at 150° C. for 5 hours while boiling water azeotropically with xylene. After the end of the reaction, the reaction solution was poured in 3 L of water, and the precipitated solid sediment was separated out by filtering. The solid obtained was washed with water three times and dried for 24 hours at 80° C. in a vacuum dryer to provide polyimide (PI-1). The resulting polyimide had a Mw of 27,000 and an acid equivalent of 350.

Synthesis Examples 2 to 4 Synthesis of Polyimide (PI-2) to Polyimide (PI-4)

According to Table 1-1 for the types and ratios of monomers, the same polymerization procedure as in Synthesis example 1 was carried out to prepare polyimide (PI-2) to polyimide (PI-4).

Synthesis Example 5 Synthesis of Polyimide (PI-5)

According to Table 1-1 for the types and ratios of monomers, the same polymerization procedure as in Synthesis example 1 was carried out to prepare a polyimide resin. In a three neck flask in a dry nitrogen flow, 32.79 g of the resulting polyimide resin and 76.51 g of MBA were weighed out and dissolved. The mixed solution was cooled to 0° C., and to this liquid, a solution of 3.16 g (0.45 mole equivalent relative to phenolic hydroxyl group in resin) of MOI dissolved in 3.16 g of MBA was added dropwise. After the end of dropping, stirring was performed at 80° C. for 1 hour to prepare a polyimide solution (PI-5). The resulting polyimide had a Mw of 33,000, an acid equivalent of 760 g/mol, and a double bond equivalent of 930 g/mol.

Synthesis Example 6 Synthesis of Polyimide Precursor (PIP-1)

In a three neck flask in a dry nitrogen flow, 44.42 g (0.10 mol; 100 mol % relative to total quantity of structural units derived from carboxylic acids or derivatives thereof) of 6FDA and 150 g of NMP were weighed out and dissolved. To this liquid, a solution of 14.65 g (0.040 mol; 32.0 mol % relative to total quantity of structural units derived from amines or derivatives thereof) of BAHF, 18.14 g (0.030 mol; 24.0 mol % relative to total quantity of structural units derived from amines or derivatives thereof) of HFHA, 1.24 g (0.0050 mol; 4.0 mol % relative to total quantity of structural units derived from amines or derivatives thereof) of SiDA dissolved in 50 g of NMP was added, stirred at 20° C. for 1 hour, and then stirred at 50° C. for 2 hours. Then, a solution of 5.46 g (0.050 mol; 40.0 mol % relative to total quantity of structural units derived from amines or derivatives thereof) of MAP, used as end capping agent, dissolved in 15 g of NMP was added and stirred at 50° C. for 2 hours. Subsequently, a solution of 23.83 g (0.20 mol) of DFA dissolved in 15 g of NMP was added dropwise over 10 minutes. After the end of dropping, stirring was performed at 50° C. for 3 hours. After the end of the reaction, the reaction solution was cooled room temperature and then the reaction solution was poured in 3 L of water. The precipitated solid sediment was separated out by filtering. The solid obtained was washed with water three times and dried for 24 hours at 80° C. in a vacuum dryer to provide polyimide precursor (PIP-1). The resulting polyimide precursor had a Mw of 20,000 and an acid equivalent of 450.

Synthesis Example 7 Synthesis of Polyimide Precursor (PIP-2)

According to Table 1-2 for the types and ratios of monomers, the same polymerization procedure as in Synthesis example 6 was carried out to prepare a polyimide precursor (PIP-2).

Synthesis Example 8 Synthesis of Polybenzoxazole (PBO-1)

In a 500 mL round bottom flask equipped with a toluene-filled Dean-Stark water separator and a cooling pipe, 34.79 g (0.095 mol; 95.0 mol % relative to total quantity of structural units derived from amines or derivatives thereof) of BAHF, 1.24 g (0.0050 mol; 5.0 mol % relative to total quantity of structural units derived from amines or derivatives thereof) of SiDA, and 75.00 g of NMP were weighed out and dissolved. To this liquid, a solution of 19.06 g (0.080 mol; 66.7 mol % relative to total quantity of structural units derived from carboxylic acids or derivatives thereof) of BFE and 6.57 g (0.040 mol; 33.3 mol % relative to total quantity of structural units derived from carboxylic acids or derivatives thereof) of NA, used as end capping agent, dissolved in 25.00 g of NMP was added, stirred at 20° C. for 1 hour, and then stirred at 50° C. for 1 hour. Subsequently, heating and stirring was performed at 200° C. or more for 10 hours in a nitrogen atmosphere to promote dehydration reaction. After the end of the reaction, the reaction solution was poured in 3 L of water, and the precipitated solid sediment was separated out by filtering. The solid obtained was washed with water three times and dried for 24 hours at 80° C. in a vacuum dryer to provide polybenzoxazole (PBO-1). The resulting polybenzoxazole had a Mw of 25,000, an acid equivalent of 330.

Synthesis Example 9 Synthesis of Polybenzoxazole Precursor (PBOP-1)

In a 500 mL round bottom flask equipped with a toluene-filled Dean-Stark water separator and a cooling pipe, 34.79 g (0.095 mol; 95.0 mol % relative to total quantity of structural units derived from amines or derivatives thereof) of BAHF, 1.24 g (0.0050 mol; 5.0 mol % relative to total quantity of structural units derived from amines or derivatives thereof) of SiDA, and 70.00 g of NMP were weighed out and dissolved. To this liquid, a solution of 19.06 g (0.080 mol; 66.7 mol % relative to total quantity of structural units derived from carboxylic acids or derivatives thereof) of BFE dissolved in 20.00 g of NMP was added, stirred at 20° C. for 1 hour, and then stirred at 50° C. for 2 hours. Then, a solution of 6.57 g (0.040 mol; 33.3 mol % relative to total quantity of structural units derived from carboxylic acids or derivatives thereof) of NA, used as end capping agent, dissolved in 10 g of NMP was added and stirred at 50° C. for 2 hours. Then, in a nitrogen atmosphere, stirring was performed at 100° C. for 2 hours. After the end of the reaction, the reaction solution was poured in 3 L of water, and the precipitated solid sediment was separated out by filtering. The solid obtained was washed with water three times and dried for 24 hours at 80° C. in a vacuum dryer to provide a polybenzoxazole precursor (PBOP-1). The resulting polybenzoxazole precursor had a Mw of 20,000 and an acid equivalent of 330.

Synthesis Example 10 Synthesis of Polysiloxane Solution (PS-1)

In a three neck flask, 23.84 g (35 mol %) of MeTMS, 49.57 g (50 mol %) of PhTMS, 3.81 g (5 mol %) of TMOS, and 76.36 g of PGMEA were fed. A flow of air was supplied to the flask at 0.05 L/Min, and the mixed solution was heated to 40° C. in an oil bath while stirring it. While stirring the mixed solution, a solution of 0.271 g of phosphoric acid dissolved in 28.38 g of water was added dropwise over 10 minutes. After the end of dropping, stirring was performed at 40° C. for 30 minutes to hydrolyze the silane compound. After the end of hydrolysis, a solution of 13.12 g (10 mol %) of TMSSucA dissolved in 8.48 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-1). The resulting polysiloxane had a Mw of 4,200 and a carboxylic acid equivalent (acid equivalent) of 700 g/mol.

Synthesis Example 11 Synthesis of Polysiloxane Solution (PS-2)

In a three neck flask, 13.62 g (20 mol %) of MeTMS, 49.57 g (50 mol %) of PhTMS, 23.43 g (20 mol %) of AcrTMS, and 89.84 g of PGMEA were fed. A nitrogen flow was supplied at 0.05 L/min through the flask and the mixed solution was heated to 40° C. in an oil bath while stirring. While further continuing the stirring of the mixed solution, an aqueous phosphoric acid solution of 0.499 g of phosphoric acid dissolved in 27.93 g of water was added over 10 minutes. After the end of addition, stirring was performed at 40° C. for 30 minutes to hydrolyze the silane compound. After the end of hydrolysis, a solution of 13.12 g (10 mol %) of TMSSucA dissolved in 9.98 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-2). The resulting polysiloxane had a Mw of 5,200, a carboxylic acid equivalent (acid equivalent) of 800 g/mol, and a double bond equivalent of 800 g/mol.

Synthesis Example 12

According to Table 1-5 for the ratios of monomers, the same polymerization procedure as in Synthesis example 11 was carried out to prepare a polysiloxane solution (PS-3).

Synthesis Example 13 Synthesis of Polycyclic Side Chain-Containing Resin Solution (CR-1)

In a three neck flask, 35.04 g (0.10 mol) of BHPF and 40.31 g of MBA were weighed out and dissolved. To this liquid, a solution of 27.92 g (0.090 mol) of ODPA and 2.96 g (0.020 mol) of PHA, used as end capping agent, dissolved in 30.00 g of MBA was added and stirred at 20° C. for 1 hour. Then, in a nitrogen atmosphere, stirring was performed at 150° C. for 5 hours. After the end of reaction, a solution of 14.22 g (0.10 mol) of GMA, 0.135 g (0.0010 mol) of dibenzyl amine, and 0.037 g (0.0003 mol) of 4-methoxyphenol dissolved in 10.00 g of MBA was added to the resulting solution, followed by stirring at 90° C. for 4 hours to provide a polycyclic side chain-containing resin solution (CR-1). The resulting polycyclic side chain-containing resin had a Mw of 4,000, a carboxylic acid equivalent (acid equivalent) of 810 g/mol, and a double bond equivalent of 810 g/mol.

Synthesis Example 14 Synthesis of Polycyclic Side Chain-Containing Resin Solution (CR-2)

In a three neck flask, 46.25 g (0.10 mol) of BGPF and 54.53 g of MBA were weighed out and dissolved. To this liquid, a solution of 17.22 g (0.20 mol) of MAA, 0.135 g (0.0010 mol) of dibenzyl amine, and 0.037 g (0.0003 mol) of 4-methoxyphenol dissolved in 10.00 g of MBA was added and stirred at 90° C. for 4 hours. Subsequently, a solution of 27.92 g (0.090 mol) of ODPA and 2.96 g (0.020 mol) of PHA, used as end capping agent, dissolved in 30.00 g of MBA was added and stirred at 20° C. for 1 hour. Then, in a nitrogen atmosphere, stirring was performed at 150° C. for 5 hours to provide a polycyclic side chain-containing resin solution (CR-2). The resulting polycyclic side chain-containing resin had a Mw of 4,700, a carboxylic acid equivalent (acid equivalent) of 470 g/mol, and a double bond equivalent of 470 g/mol.

Synthesis Example 15 Synthesis of Acid-Modified Epoxy Resin Solution (AE-1)

In a three neck flask, 46.00 g of NC-7000L (epoxy equivalent 230 g/mol) and 47.91 g of MBA were weighed out and dissolved. To this liquid, a solution of 17.22 g (0.20 mol) of MAA, 0.270 g (0.0020 mol) of dibenzyl amine, and 0.074 g (0.0006 mol) of 4-methoxyphenol dissolved in 10.00 g of MBA was added and stirred at 90° C. for 4 hours. Subsequently, a solution of 24.34 g (0.160 mol) of THPHA dissolved in 30.00 g of MBA was added and stirred at 20° C. for 1 hour. Then, in a nitrogen atmosphere, stirring was performed at 150° C. for 5 hours to provide an acid-modified epoxy resin solution (AE-1). The resulting acid-modified epoxy resin had a Mw of 5,000, an acid equivalent of 540 g/mol, a double bond equivalent of 430 g/mol.

Synthesis Example 16 Synthesis of Acrylic Resin Solution (AC-1)

In a three neck flask, 0.821 g (1 mol %) of 2,2'-azobis (isobutyronitrile) and 29.29 g of PGMEA were fed. Then, 21.52 g (50 mol %) of MAA, 22.03 g (20 mol %) of TCDM, and 15.62 g (30 mol %) of STR were fed and stirred for a while at room temperature, followed by filling the flask with nitrogen sufficiently by bubbling and subsequently stirring at 70° C. for 5 hours. Next, a solution of 14.22 g (20 mol %) of GMA, 0.676 g (1 mol %) of dibenzyl amine, and 0.186 g (0.3 mol %) of 4-methoxyphenol dissolved in 59.47 g of PGMEA was added to the resulting solution, followed by stirring at 90° C. for 4 hours to provide an acrylic resin solution (AC-1). The resulting acrylic resin had a Mw of 15,000, a carboxylic acid equivalent (acid equivalent) of 490 g/mol, a double bond equivalent of 740 g/mol. The components used in Synthesis examples 1 to 16 are summarized in Table 1-1 to Table 1-3.

TABLE 1-1

| | | Monomer [molar ratio] | | | | | |
|---|---|---|---|---|---|---|---|
| | Polymer | Tetracarboxylic acid and derivative thereof | | Diamine and derivative thereof | | Terminal sealing agent | Compound having ethylenically unsaturated double bond group |
| Synthesis example 1 | polyimide (PI-1) | ODPA (100) | — | BAHF (85) | — | SiDA (5) | MAP (20) | — |
| Synthesis example 2 | polyimide (PI-2) | ODPA (100) | — | BAHF (35) | Bis-A-AF (50) | SiDA (5) | MAP (20) | — |
| Synthesis example 3 | polyimide (PI-3) | ODPA (60) | 6FDA (40) | BAHF (85) | — | SiDA (5) | MAP (20) | — |
| Synthesis example 4 | polyimide (PI-4) | — | 6FDA (100) | BAHF (85) | — | SiDA (5) | MAP (20) | — |
| Synthesis example 5 | polyimide (PI-5) | ODPA (100) | — | BAHF (85) | — | SiDA (5) | MAP (20) | MOI (20) |
| Synthesis example 6 | polyimide precursor (PIP-1) | — | 6FDA (100) | BAHF (40) | HFHA (30) | SiDA (5) | MAP (50) | — |
| Synthesis example 7 | polyimide precursor (PIP-2) | ODPA (40) | 6FDA (60) | BAHF (40) | HFHA (30) | SiDA (5) | MAP (50) | — |

| | Proportion of structural units derived from fluorine atom-containing monomers to all structural units [mol %] | Proportion of structural units derived from fluorine atom-containing monomers to all structural units derived from carboxylic acid derivatives [mol %] | Proportion of structural units derived from fluorine atom-containing monomers to all structural units derived from amine derivatives [mol %] | Acid equivalent [g/mol] | Double bond equivalent [g/mol] |
|---|---|---|---|---|---|
| Synthesis example 1 | 40.5 | 0.0 | 77.3 | 350 | — |
| Synthesis example 2 | 16.7 | 0.0 | 31.8 | 720 | — |
| Synthesis example 3 | 59.5 | 40.0 | 77.3 | 380 | — |
| Synthesis example 4 | 88.1 | 100.0 | 77.3 | 420 | — |
| Synthesis example 5 | 40.5 | 0.0 | 77.3 | 760 | 930 |
| Synthesis example 6 | 75.6 | 100.0 | 56.0 | 450 | — |
| Synthesis example 7 | 57.8 | 60.0 | 56.0 | 420 | — |

TABLE 1-2

| | Polymer | Monomer [molar ratio] | | | | Proportion of structural units derived from fluorine atom-containing monomers to all structural units [mol %] | Proportion of structural units derived from fluorine atom-containing monomers to all structural units derived from carboxylic acid derivatives [mol %] | Proportion of structural units derived from fluorine atom-containing monomers to all structural units derived from amine derivatives [mol %] | Acid equivalent [g/mol] |
|---|---|---|---|---|---|---|---|---|---|
| | | Dicarboxylic acid and derivative thereof diformyl compound and derivative thereof | Bisaminophenol compound and derivative thereof dihydroxy diamine and derivative thereof | | Terminal sealing agent | | | | |
| Synthesis example 8 | polybenzoxazole (PBO-1) | BFE (80) | BAHF (95) | SiDA (5) | NA (40) | 43.2 | 0.0 | 95.0 | 330 |
| Synthesis example 9 | polybenzoxazole precursor (PBOP-1) | BFE (80) | BAHF (95) | SiDA (5) | NA (40) | 43.2 | 0.0 | 95.0 | 330 |

| | Polymer | Monomer [mol %] | | | | | | Proportion of structural units derived from aromatic group-containing organosilane to all polysiloxane [mol %] | Acid equivalent [g/mol] | Double bond equivalent [g/mol] |
|---|---|---|---|---|---|---|---|---|---|---|
| | | Trifunctional organosilane | | | | Tetrafunctional organosilane tetrafunctional organosilane oligomer | Difunctional organosilane monofunctional organosilane | | | |
| Synthesis example 10 | polysiloxane solution (PS-1) | MeTMS (35) | PhTMS (50) | TMSSucA (10) | — | TMOS (5) | — | 50.0 | 700 | — |
| Synthesis example 11 | polysiloxane solution (PS-2) | MeTMS (20) | PhTMS (50) | TMSSucA (10) | AcrTMS (20) | — | — | 50.0 | 800 | 800 |
| Synthesis example 12 | polysiloxane solution (PS-3) | MeTMS (10) | PhTMS (50) | TMSSucA (10) | AcrTMS (20) | — | DMeDMS (10) | 50.0 | 800 | 800 |

TABLE 1-3

| Polymer | Monomer [molar ratio] | | | | | | Proportion of structural units derived from aromatic group-containing monomer to all structural units derived from carboxylic acid derivatives [mol %] | Acid equivalent [g/mol] | Double bond equivalent [g/mol] |
|---|---|---|---|---|---|---|---|---|---|
| | Compound having two or more aromatic groups and hydroxyl group | Compound having two or more aromatic groups and epoxy group | Tetracarboxylic dianhydride tetracarboxylic acid | Terminal sealing agent | Unsaturated compound having ethylenically unsaturated double bond group and epoxy group | Unsaturated carboxylic acid having ethylenically unsaturated double bond group | | | |
| Synthesis example 13: polycyclic side chain-containing resin solution (CR-1) | BHPF (100) | — | ODPA (90) | PHA (20) | GMA (100) | — | 100.0 | 810 | 810 |
| Synthesis example 14: polycyclic side chain-containing resin solution (CR-2) | — | BGPF (100) | ODPA (90) | PHA (20) | — | MAA (200) | 100.0 | 470 | 470 |

| Polymer | Monomer [molar ratio] | | | Proportion of structural units derived from aromatic group-containing monomer to all structural units derived from carboxylic acid derivatives [mol %] | Acid equivalent [g/mol] | Double bond equivalent [g/mol] |
|---|---|---|---|---|---|---|
| | Compound having aromatic group and epoxy group | Dicarboxylic acid anhydride dicarboxylic acid | Unsaturated carboxylic acid having ethylenically unsaturated double bond group | | | |
| Synthesis example 15: acid-modified epoxy resin solution (AE-1) | NC-7000L (epoxy equivalent: 230 g/mol) 46.00 g (in terms of epoxy group: 0.2 mol) (molar ratio in terms of epoxy group: 100) | THPHA 24.34 g (0.16 mol) (molar ratio: 80) | MAA 17.22 g (0.20 mol) (molar ratio: 100) | 0.0 | 540 | 430 |

| Polymer | Monomer [molar ratio] | | | | Proportion of structural units derived from aromatic group-containing monomers to all structural units derived from copolymerization components [mol %] | Acid equivalent [g/mol] | Double bond equivalent [g/mol] |
|---|---|---|---|---|---|---|---|
| | Copolymerization component having acidic group | Copolymerization component having aromatic group | Copolymerization component having alicyclic group | Unsaturated compound having ethylenically unsaturated double bond group and epoxy group | | | |
| Synthesis example 16: acrylic resin solution (AC-1) | MAA (50) | STR (30) | TCDM (20) | GMA (20) | 30.0 | 490 | 740 |

Covering Example 1 Synthesis of Surface-Covered Benzofuranone Based Black Pigment (Bk-CBF1)

A 150 g portion of benzofuranone based black pigment Bk-S0100CF (non-surface-treated; pH 4.5 at pigment surface), used as black pigment, was put in a glass container containing 2,850 g of deionized water and stirred by a dissolver to prepare an aqueous pigment suspension liquid. This was sucked by a tube pump, transferred to a horizontal type bead mill filled with zirconia beads having a diameter of 0.4 mm (Torayceram (registered trademark), manufactured by Toray Industries, Inc.), subjected to a two-pass dispersion treatment procedure, totally discharged back into the original glass container, and stirred again by a dissolver. A pH meter was attached in such a manner that the end electrode part is at a depth of 3 to 5 cm from the surface of the aqueous pigment suspension liquid being stirred in the glass container to measure the pH value of the resulting aqueous pigment suspension liquid, showing a pH of 4.5 (liquid temperature 25° C.). Subsequently, the liquid temperature of the aqueous pigment suspension liquid was raised to 60° C. while stirring. Then stirring was stopped after 30 minutes and it was confirmed after 2 minutes that there was no precipitated deposition at the bottom of the glass container, followed by restarting stirring.

A liquid prepared by diluting an aqueous sodium silicate solution ($Na_2O \cdot nSiO_2 \cdot mH_2O$; 30 mass % as sodium oxide, 10 mass % as silicon dioxide) 100 times with deionized water and a 0.001 mol/L sulfuric acid solution were added in parallel to the aqueous pigment suspension liquid while adjusting their addition rates so as to maintain the pH value in the range of 2 or more and less than 7, thereby allowing the particle surface of the black pigment to be covered with precipitated silica in such a manner that the silica covering accounted for 10.0 parts by mass in terms of $SiO_2$ relative to 100 parts by mass of the black pigment. Next, a liquid prepared by diluting an aqueous sodium aluminate solution ($Na_2O \cdot nAl_2O_3 \cdot mH_2O$; 40 mass % as sodium oxide, 50 mass % as alumina) 100 times with deionized water and a 0.001 mol/L sulfuric acid solution were added in parallel to the aqueous pigment suspension liquid while adjusting their addition rates so as to maintain the pH value in the range of 2 or more and less than 7, thereby allowing the surface of the silica covering layer to be covered with precipitated alumina in such a manner that the alumina covering accounted for 2.0 parts by mass in terms of $Al_2O_3$ relative to 100 parts by mass of the black pigment. Following this, filtration and rinsing were repeated three times to remove part of the water-soluble impurities in the aqueous pigment suspension liquid, and the liquid was transferred to a horizontal type bead mill filled with zirconia beads having a diameter of 0.4 mm and subjected to a one-pass dispersion treatment procedure. Furthermore, the ionic impurities were removed by adding 10 g of a cation exchange resin and 10 g of an anion exchange resin (Amberlite, manufactured by Organo Corporation) to the aqueous pigment suspension liquid and stirring it for 12 hours, followed by filtration to obtain black filter residue. It was dried in an oven at 90° C. for 6 hours and then dried in an oven at 200° C. for 30 minutes, followed by granulation by dry crush treatment in a jet mill to form a surface-covered benzofuranone based black pigment (Bk-CBF1).

Time-of-flight secondary ion mass spectrometry and X-ray diffraction analysis were carried out and results showed that the silica and alumina covering layers on the surface-covered benzofuranone based black pigment (Bk-CBF1) accounted for 10.0 parts by mass in terms of $SiO_2$ and 2.0 parts by mass in terms of $Al_2O_3$, respectively, relative to 100 parts by mass of the black pigment and that the average covering rate of the covering layers on the pigment was 97.5%.

Preparation Example 1 Preparation of Pigment Dispersion Liquid (Bk-1)

A 34.5 g portion of S-20000, used as dispersant, and 782.0 g of MBA, used as solvent, were weighed, mixed, and stirred for 10 minutes to ensure diffusion, and then 103.5 g of Bk-S0100CF, used as coloring agent, was weighed, mixed, and stirred for 30 minutes, followed by carrying out wet media dispersion treatment in a horizontal type bead mill filled with zirconia beads having a diameter of 0.40 mm in such a manner that the number average particle diameter would be 100 nm to produce a pigment dispersion liquid (Bk-1) having a solid content of 15 mass % and a coloring agent/dispersant ratio of 75/25 (mass ratio). The pigment in the resulting pigment dispersion liquid had a number average particle diameter of 100 nm.

Preparation Example 2 Preparation of Pigment Dispersion Liquid (Bk-2)

A 92.0 g portion of a 30 mass % solution of polyimide (PI-1), which was obtained in synthesize example 1 and used as resin, in MBA, 27.6 g of S-20000, used as dispersant, and 717.6 g of MBA, used as solvent, were weighed, mixed, and stirred for 10 minutes to ensure diffusion, and then 82.8 g of Bk-S0100CF, used as coloring agent, was weighed, mixed, and stirred for 30 minutes, followed by carrying out wet media dispersion treatment in a horizontal type bead mill filled with zirconia beads having a diameter of 0.4 mm in such a manner that the number average particle diameter would be 100 nm to produce a pigment dispersion liquid (Bk-2) having a solid content of 15 mass % and a coloring agent/resin/dispersant ratio of 60/20/20 (mass ratio). The pigment in the resulting pigment dispersion liquid had a number average particle diameter of 100 nm.

Preparation Examples 3 to 9 Preparation of Pigment Dispersion Liquid (Bk-3) to Pigment Dispersion Liquid (Bk-9)

According to Table 2-1 for the coloring agents, and the types and ratios of the first resin (A1) and the dispersant (E), the pigment was dispersed as described in Preparation example 2 to produce pigment dispersion liquid (Bk-3) to pigment dispersion liquid (Bk-9). The components used in Preparation examples 1 to 9 are summarized in Table 2-1.

TABLE 2-1

| | | Components [mass %] | | | | Number average particle diameter of pigment in pigment dispersion liquid [nm] |
|---|---|---|---|---|---|---|
| | Dispersion liquid | Coloring agent | | First resin (A1) | Dispersing agent (E) | |
| Preparation example 1 | pigment dispersion liquid (Bk-1) | Bk-S0100CF (75) | — | — | S-20000 (25) | 100 |
| Preparation example 2 | pigment dispersion liquid (Bk-2) | Bk-S0100CF (60) | — | polyimide (PI-1) (20) | S-20000 (20) | 100 |
| Preparation example 3 | pigment dispersion liquid (Bk-3) | Bk-S0100CF (65) | — | polyimide (PI-1) (25) | S-20000 (10) | 120 |
| Preparation example 4 | pigment dispersion liquid (Bk-4) | Bk-S0084 (60) | — | polyimide (PI-1) (20) | D.BYK-167 (20) | 120 |
| Preparation example 5 | pigment dispersion liquid (Bk-5) | Bk-A1103 (60) | — | polyimide (PI-1) (20) | D.BYK-167 (20) | 120 |
| Preparation example 6 | pigment dispersion liquid (Bk-6) | TPK-1227 (60) | — | polyimide (PI-1) (20) | D.BYK-167 (20) | 120 |
| Preparation example 7 | pigment dispersion liquid (Bk-7) | P.R.254 (21) | P.Y.139 (9) P.B.15:6 (30) | polyimide (PI-1) (20) | D.BYK-167 (20) | 110 |
| Preparation example 8 | pigment dispersion liquid (Bk-8) | P.V.23 (30) | P.Y.139 (30) — | polyimide (PI-1) (20) | D.BYK-167 (20) | 110 |
| Preparation example 9 | pigment dispersion liquid (Bk-9) | Bk-CBF1 (60) | — | polyimide (PI-1) (20) | S-20000 (20) | 100 |

Table 2-2 shows a list and physical properties of the radical polymerizable compound (B), fluorene backbone-containing radical polymerizable compound (B1), indane backbone-containing radical polymerizable compound (B2), and flexible chain-containing aliphatic radical polymerizable compound (B3) used each Example and Comparative example.

TABLE 2-2

| | | (B) Physical properties of radical polymerizable compound | | | |
|---|---|---|---|---|---|
| Radical polymerizable compound (B) | Fluorene backbone or indane backbone | Flexible chain in (B1), (B2), or (B3) | Molecular weight | Number of ethylenically unsaturated double bond group | Double bond equivalent [g/mol] |
| 1 DPHA | — | — | 578.56 | 6 | 96 |
| 2 FLN-1 | 1 fluorene backbone | — | 458.50 | 2 | 229 |
| 3 A-BPEF | 1 fluorene backbone | 2 oxyethylene chains | 546.61 | 2 | 273 |
| 4 FR-301 | 1 fluorene backbone | 2 oxyhydroxypropylene chains | 606.66 | 2 | 303 |
| 5 FLN-2 | 1 fluorene backbone | 4 oxyethylene chains | 774.81 | 4 | 194 |
| 6 FLN-3 | 1 fluorene backbone | 2 oxyethylene chains | 646.73 | 2 | 323 |
| 7 FLN-4 | 2 fluorene backbones | 3 oxyethylene chains | 923.06 | 2 | 462 |
| 8 FLN-5 | 1 fluorene backbone | 2 ε-caprolactone modified chains | 686.79 | 2 | 343 |
| 9 IDN-1 | 1 indane backbone | — | 410.46 | 2 | 205 |
| 10 IDN-2 | 1 indane backbone | 2 oxyethylene chains | 498.57 | 2 | 249 |
| 11 IDN-3 | 1 indane backbone | 2 oxyhydroxypropylene chains | 558.62 | 2 | 279 |
| 12 CPL-1 | — | 1 ε-caprolactone modified chain | 692.70 | 6 | 115 |
| 13 DPCA-20 | — | 2 ε-caprolactone modified chains | 806.85 | 6 | 134 |
| 14 DPCA-30 | — | 3 ε-caprolactone modified chains | 920.99 | 6 | 153 |
| 15 CPL-2 | — | 4 ε-caprolactone modified chains | 692.70 | 6 | 115 |
| 16 CPL-3 | — | 5 ε-caprolactone modified chains | 692.70 | 6 | 115 |
| 17 DPCA-60 | — | 6 ε-caprolactone modified chains | 1263.42 | 6 | 211 |
| 18 DPCA-120 | — | 6×2 ε-caprolactone modified chains | 1948.27 | 6 | 325 |
| 19 A-DPH-6E | — | 6 oxyethylene chains | 842.88 | 6 | 140 |
| 20 A-DPH-12E | — | 6×2 oxyethylene chains | 1107.19 | 6 | 185 |
| 21 A-DPH-6P | — | 6 oxypropylene chains | 927.04 | 6 | 155 |
| 22 HX-220 | — | 2 ε-caprolactone modified chains | 540.64 | 2 | 270 |

The structure of FLN-4 (a radical polymerizable compound having two fluorene backbones in the molecule and two acryloxy groups in the molecule) is given below.

[Chemical compound 30]

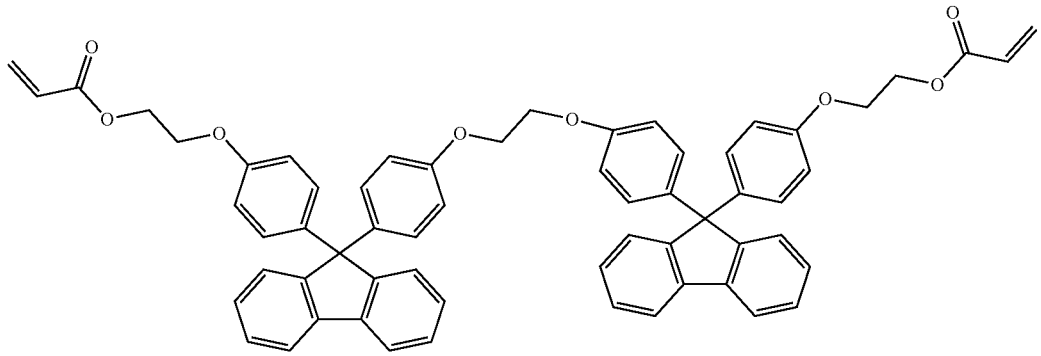

The structure of FLN-5 (ε-caprolactone modified 9,9-bis(4-hydroxyphenyl) fluorene diacrylate having two oxypentylene carbonyl structures in the molecule) is given below.

[Chemical compound 31]

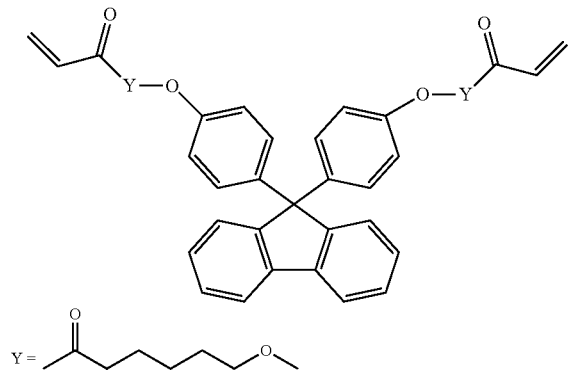

The structural unit of the acid-modified epoxy resin (AE-1) obtained in Synthesis example 14 is described below. The acid-modified epoxy resin (AE-1) has a structural unit as represented by general formula (38a).

[Chemical compound 32]

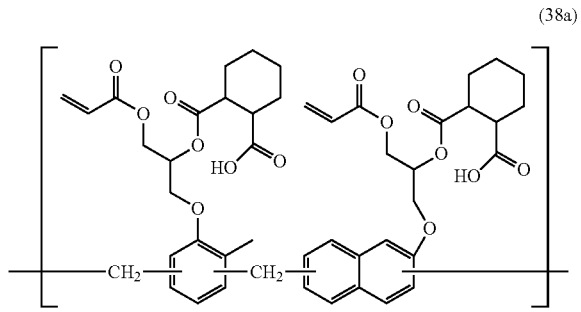

(38a)

The evaluation methods used for each Example and Comparative example are described below.

(1) Weight Average Molecular Weight of Resin

Using a GPC analysis apparatus (HLC-8220, manufactured by Tosoh Corporation) and tetrahydrofuran or NMP as fluidized bed, the polystyrene based weight average molecular weight was determined according to JIS K7252-3 (2008) from measurements taken near room temperature.

(2) Acid Value and Acid Equivalent

Using an automatic potentiometric titration apparatus (AT-510; manufactured by Kyoto Electronics Manufacturing Co., Ltd.) with a 0.1 mol/L sodium hydroxide/ethanol solution as titration reagent and a 1/1 (by mass) xylene/N,N-dimethyl formamide mixture as titration solvent, the acid value (in mgKOH/g) was determined by potentiometric titration according to JIS K2501 (2003). From the measured acid value, the acid equivalent (in g/mol) was calculated.

(3) Double Bond Equivalent

Using an automatic potentiometric titration apparatus (AT-510; manufactured by Kyoto Electronics Manufacturing Co., Ltd.) with an iodine monochloride solution (mixed solution of 7.9 g of iodine trichloride, 8.9 g of iodine, and 1,000 mL of acetic acid) as iodine supply source, 100 g/L of an aqueous potassium iodide solution as aqueous solution for capturing unreacted iodine, and 0.1 mol/L of an aqueous sodium thiosulfate solution as titration reagent, the iodine value of resin was determined by the Wijs method according to Item 6 "Iodine Value" of JIS K0070 (1992) "Test Method for Acid Value, Saponification Value, Ester Value, Iodine Value, Hydroxyl Value, and Unsaponifiable Components of Chemical Products". From the measured iodine value (in gI/100 g), the double bond equivalent (in g/mol) was calculated.

(4) Contents of Various Organosilane Units in Polysiloxane

After performing $^{29}$Si-NMR measurement, the proportion of the integrated value of Si atoms attributed to a specific organosilane unit to the total integrated value of Si atoms attributed to the organosilane was calculated to determine its content. The specimen (liquid) for measurement was put in a Teflon (registered trademark) NMR sample tube with a diameter of 10 mm. The measuring conditions for $^{29}$Si-NMR were as described below.

Apparatus: magnetic nuclear resonance apparatus (JNM-GX270; manufactured by JEOL Ltd.)
Measuring method: gated decoupling
Nuclear frequency: 53.6693 MHz ($^{29}$Si nucleus)
Spectral band width: 20,000 Hz
Pulse width: 12 μs (45° pulse)
Pulse repeating time: 30.0 seconds
Solvent: acetone-d6

Reference substance: tetramethyl silane
Measuring temperature: 23° C.
Specimen rotating speed: 0.0 Hz
(5) Average Covering Rate of Covering Layer on Pigment A two-pack type room temperature curing transparent acrylic based transparent resin (Techovit 4006; manufactured by Heraeus Kulzer) was impregnated with the surface-covered benzofuranone based black pigment (Bk-CBF1) prepared in Covering example 1 and left to stand at 25° C. for 3 hours for reaction and curing to prepare a specimen for observation. The specimen for observation was roughly machine-polished using diamond polishing paper and then a smooth cross section was created in a part of the specimen by argon ion beam polishing using an ion milling device (IM4000; manufactured by Hitachi High-Technologies Corporation). The cross section was observed at a magnification of 100,000 times using a transmission electron microscope (H9500; manufactured by Hitachi High-Technologies Corporation) under the conditions of an accelerating voltage of 300 kV, and an image of the cross section was obtained by adjusting the brightness and contrast of the display device so that the circumferences of particles of the black pigment were visible as difference in contrast. For 100 particles of the black pigment selected at random from an image, the covering rate M (%) of each black pigment was calculated by the equation given below and their number average was calculated, thereby providing the average covering rate N (%) of the black pigment.

Here, of the circumferences of particles of the black pigment, those of the black pigment particles found to have interfaces with air were omitted from the calculation of the average covering rate N (%) because it was likely that the embedding resin failed to be impregnated sufficiently during the preparation of the specimen, allowing part of the covering layer to be removed by polishing, which can cause a decrease in the covering rate.

$$\text{Covering rate } M(\%)=\{L1/(L1+L2)\}\times 100$$

L1: total length of regions covered by the covering layer measured along the circumference of a particle (nm)

L2: total length of regions not covered by the covering layer (regions where the interface and the embedding resin are in direct contact) measured along the circumference of a particle (nm)

L1+L2: circumference of the nucleus (nm)

(6) Number Average Particle Diameter of Pigment

A zeta potential/particle diameter/molecular weight measuring apparatus (Zetasizer Nano ZS, manufactured by Sysmex Corporation) was used, and a pigment dispersion liquid was diluted with PGMEA used as dilution solvent to a concentration of $1.0\times 10^{-5}$ to 40 vol %. Adopting the refractive index of the dilution solvent as that of the PGMEA and adopting 1.6 as the refractive index of the specimen, the number average particle diameter of the pigment in the pigment dispersion liquid was determined by applying laser beam having a wavelength of 633 nm.

(7) Pre-Treatment of Substrate

A glass substrate containing a 100 nm ITO film formed by sputtering on a glass plate (manufactured by Geomatec Co., Ltd.; hereinafter referred to as ITO substrate) was used after subjecting it to UV-$O_3$ cleaning treatment for 100 seconds using a desktop type optical surface treatment apparatus (PL16-110; manufactured by Sen Lights Co., Ltd.).

(8) Film Thickness Measurement

A surface roughness/contour form measuring machine (SURFCOM 1400D, manufactured by Tokyo Seimitsu Co., Ltd.) was used to measure the film thickness of a prebaked specimen, a developed specimen, and a heat-cured specimen under the measuring conditions of a magnification of 10,000 times, a measuring length of 1.0 mm, and a measuring speed of 0.30 mm/s.

(9) Sensitivity

The resolution pattern on the developed film prepared above was observed by a FPD/LSI inspection microscope (OPTIPHOT-300; manufactured by Nicon Corporation) and the light exposure (as measured by i-line illuminance meter) required to form a 20 µm line-and-space pattern with a 1 to 1 width ratio was measured to represent the sensitivity. Evaluations were made according to the criteria given below, and specimens rated as A+, A, B, or C, which had a sensitivity of 90 mJ/$cm^2$ or less, were judged as acceptable. Those rated as A+, A, or B, which had a sensitivity of 60 mJ/$cm^2$ or less, were judged as having a good sensitivity and those rated as A+ or A, which had a sensitivity of 45 mJ/$cm^2$ or less, were judged as having an excellent sensitivity.

A+: Sensitivity of 1 to 30 mJ/$cm^2$
A: Sensitivity of 31 to 45 mJ/$cm^2$
B: Sensitivity of 46 to 60 mJ/$cm^2$
C: Sensitivity of 61 to 90 mJ/$cm^2$
D: Sensitivity of 91 to 150 mJ/$cm^2$
E: Sensitivity of 151 to 500 mJ/$cm^2$

(10) Development Residue

The resolution pattern on a cured film prepared was observed by a FPD/LSI inspection microscope (OPTIPHOT-300; manufactured by Nicon Corporation) and the opening of a 20 µm line-and-space pattern was observed to check for pigment-derived development residue. Evaluations were made according to the criteria given below, and specimens rated as A+, A, or B, in which development residue covered 10% or less of the area of the opening, were judged as acceptable. Those rated as A+ or A, in which development residue covered 5% or less of the area of the opening, were judged as good in terms of development residue, and those rated as A+, in which development residue covered none of the area of the opening, were judged as excellent in terms of development residue.

A+: Development residue covers none of the area of the opening.
A: Development residue covers 1% to 5% of the area of the opening.
B: Development residue covers 6% to 10% of the area of the opening.
C: Development residue covers 11% to 30% of the area of the opening.
D: Development residue covers 31% to 50% of the area of the opening.
E: Development residue covers 51% to 100% of the area of the opening.

(11) Shape of Pattern Cross Section after the Development Step and Shape of Pattern Cross Section after the Heat Curing Step From the resolution patterns of the resulting developed films and the resolution patterns of the resulting cured films, line-and-space patterns with a space width of 20 µm were selected and their cross sections were observed by a field emission type scanning electron microscope (S-4800, manufactured by Hitachi High-Technologies Corporation) to measure the taper angle in each cross section. Results of observation of the shape of pattern cross section after development and the shape of pattern cross section after heat curing were subjected to evaluation according to the following criteria, and specimens rated as A+, A, or B, in which the cross section had a taper angle 60° or less, were judged as acceptable. Those rated as A+ or A, in which the cross section had a taper angle 45° or less, were judged as good in terms of pattern shape, and those rated as A+, in which the cross section had a taper angle 30° or less, were judged as excellent in terms of pattern shape.

A+: Cross section having a taper angle of 1° to 30°
A: Cross section having a taper angle of 31° to 45°
B: Cross section having a taper angle of 46° to 60°
C.: Cross section having a taper angle of 61° to 70°
D: Cross section having a taper angle of 71° to 80°
E: Cross section having a taper angle of 81° to 179°

(12) Difference in Width of Patterned Opening Between Before and after the Heat Curing The resolution pattern on a developed film prepared was observed by a FPD/LSI inspection microscope (OPTIPHOT-300; manufactured by Nicon Corporation) and the width of the opening in a 20 μm line-and-space pattern was measured and defined as patterned opening width after development ($CD_{DEV}$). Subsequently, the aforementioned developed film was heat-cured according to the method described in Example 1 given below using a high temperature inert gas oven (INH-9CD-S; manufactured by Koyo Thermo Systems Co., Ltd.) to prepare a cured film of the negative type photosensitive composition. The resolution pattern on a cured film prepared was observed by a FPD/LSI inspection microscope (OPTIPHOT-300; manufactured by Nicon Corporation) and the width of the opening at the same position as that used for observation after development in the 20 μm line-and-space pattern was measured and defined as patterned opening width after heat curing ($CD_{CURE}$).

The difference in the width of the patterned opening between before and after the heat curing (($CD_{DEV}$)−($CD_{CURE}$)) was calculated from the width of the patterned opening after development and the width of the patterned opening after heat curing. Evaluations were made according to the criteria given below, and specimens rated as A+, A, or B, in which the difference in the width of the patterned opening between before and after heat curing is 0.60 μm or less were judged as acceptable. Specimens rated as A+ or A, in which the difference in the width of the patterned opening between before and after heat curing is 0.40 μm or less were judged as good in terms of difference in the width of the patterned opening, and those rated as A+, in which the difference in the width of the patterned opening between before and after heat curing is 0.20 μm or less were judged as excellent in terms of difference in the width of the patterned opening.

A+: Difference in width of patterned opening between before and after heat curing is 0 to 0.20 μm.
A: Difference in width of patterned opening between before and after the heat curing is 0.21 to 0.40 μm.
B: Difference in width of patterned opening between before and after the heat curing is 0.41 to 0.60 μm.
C: Difference in width of patterned opening between before and after the heat curing is 0.61 to 1.00 μm.
D: Difference in width of patterned opening between before and after the heat curing is 1.01 to 2.00 μm.
E: Difference in width of patterned opening between before and after the heat curing is 2.01 μm or more.

(13) Heat Resistance (Difference in High Temperature Weight Retention Rate)

After the heat curing step, the resulting cured film was scraped out from the substrate, and about 10 mg of it was put in an aluminum cell. This aluminum cell was left in a nitrogen atmosphere at 30° C. for 10 minutes in a thermogravimetric analysis apparatus (TGA-50; manufactured by Shimadzu Corporation), then up to 150° C. at a heating rate of 10° C./min, and maintained at 150° C. for 30 minutes, followed by performing thermogravimetric analysis while heating up to 500° C. at a heating rate of 10° C./min. Relative to the weight measured after heating at 150° C. for 30 minutes, which represents 100 mass %, the weight retention rate (Ma) in mass % and the weight retention rate (Mb) in mass % were measured after additional heating at 350° C. and 400° C., respectively, followed by calculating the difference in the high temperature weight retention rate ((Ma)-(Mb)) as an indicator of the heat resistance.

Evaluations were made according to the criteria given below, and specimens rated as A+, A, or B, which gave a difference in high temperature weight retention rate of 25.0 mass % or less, were judged as acceptable. Those rated as A+ or A, which gave a difference in high temperature weight retention rate of 15.0 mass % or less, were judged as good in terms of heat resistance, and those rated as A+, which gave a difference in high temperature weight retention rate of 5.0 mass % or less, were judged as excellent in terms of heat resistance.

A+: Difference in high temperature weight retention rate is 0 to 5.0%.
A: Difference in high temperature weight retention rate is 5.1% to 15.0%.
B: Difference in high temperature weight retention rate is 15.1% to 25.0%.
C: Difference in high temperature weight retention rate is 25.1% to 35.0%.
D: Difference in high temperature weight retention rate is 35.1% to 45.0%.
E: Difference in high temperature weight retention rate is 45.1% to 100%.

(14) Light-Shielding Capability (Optical Density (OD) Value)

According to the method described in Example 1 given below, a cured film of the negative type photosensitive resin composition was prepared. A transmission densitometer (X-Rite 361T (V); manufactured by X-Rite) was used to measure the incident light intensity ($I_0$) and the transmitted light intensity (I) for the cured film prepared above. As an indicator of the light blocking capability, the OD value was calculated by the equation given below.

$$OD\ \text{value} = \log_{10}(I_0/I)$$

(15) Insulation Properties (Surface Resistivity)

According to the method described in Example 1 given below, a cured film of the negative type photosensitive resin composition was prepared. The surface resistivity (Ω/□) of the cured film prepared was measured using a high-resistance resistivity meter (Highresta UP; manufactured by Mitsubishi Chemical Corporation).

(16) Light Emission Characteristics of Organic EL Display (Production Method for Organic EL Display)

Figure 4:
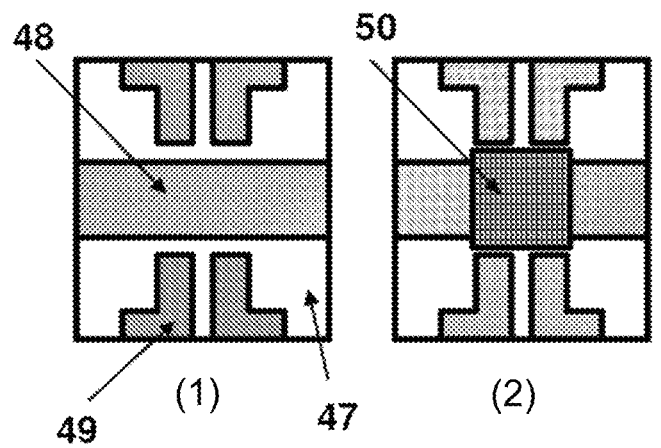
FIGS. 4 (1) to (4) show schematic diagrams illustrating an organic EL display device used for evaluation of luminescence characteristics.
Figure 4:
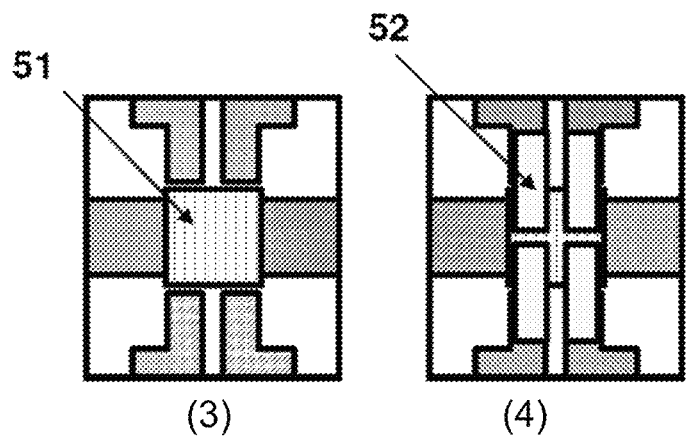

FIGS. 4 (1) to (4) show schematic views of the substrate used. First, an ITO transparent conductive coating film of 10 nm was formed by sputtering over the entire surface of a non-alkali glass substrate 47 with a size of 38 mm×46 mm and etched to produce a first electrode 48, which is a transparent electrode. An auxiliary electrode 49 was also formed simultaneously to take out a second electrode (FIG. 4 (1)). The resulting substrate was subjected to ultrasonic cleaning for 10 minutes using Semico Clean (registered trademark) 56 (manufactured by Furuuchi Chemical Corporation) and then rinsed with ultrapure water.

Then, the negative type photosensitive resin composition was spread on this substrate and prebaked by the method described in Example 1, followed by patterning exposure through a photomask having a predetermined pattern, development, rinsing, and heating for heat-curing. In this way, an insulation layer 50 having openings with a width of 70 μm and a length of 260 μm aligned at intervals of 155 μm in the width direction and 465 μm in the length of direction, each opening exposing the first electrode, was formed in an limited effective area of the substrate (FIG. 4 (2)). These openings would finally form light emitting pixels of an organic EL display. The limited effective area of the substrate had a size of 16 mm×16 mm and the insulation layer 50 had a thickness of about 1.0 μm.

Then, an organic EL display was produced using the substrate having a first electrode 48, auxiliary electrode 49, and insulation layer 50 formed thereon. After carrying out nitrogen plasma treatment as pre-treatment, an organic EL layer 51 that included a light emitting layer was formed by vacuum deposition (FIG. 4 (3)). Here, the degree of vacuum used for deposition was 1 to $10^{-3}$ Pa or less and the substrate was rotated relative to the deposition source during the deposition step. First, a compound (HT-1) was deposited to a thickness of 10 nm to form a hole injection layer and a compound (HT-2) was deposited to a thickness of 50 nm to form a hole transport layer. Subsequently, a compound (GH-1) and a compound (GD-1) were deposited as host material and dopant material, respectively, on the light emitting layer to a thickness of 40 nm to ensure a doping concentration of 10%. Then, a 40 nm thick layer of compounds (ET-1) and (LiQ) combined at a volume ratio of 1:1, adopted as electron transport materials, was formed thereon. The structures of the compounds used in the organic EL layer are shown below.

[Chemical compound 33]

HT-1

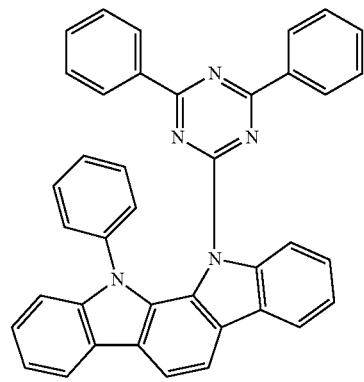

HT-2

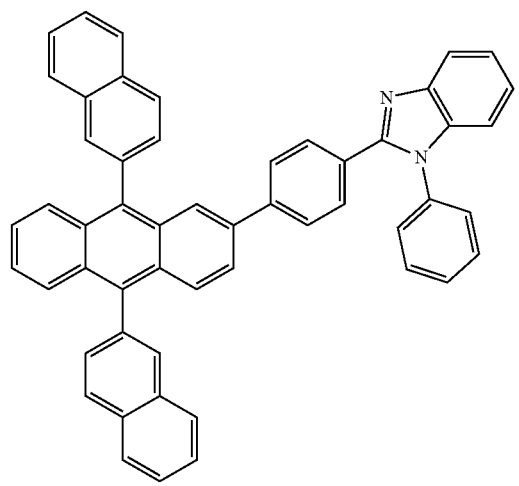

GD-1

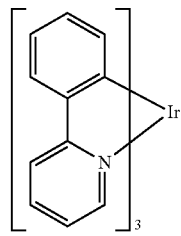

LiQ

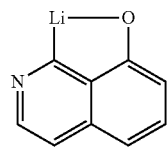

GH-1

GH-1 structure

ET-1

ET-1 structure

Then, a compound (LiQ) was deposited to a thickness of 2 nm and MgAg was deposited at a volume ratio of 10:1 to a thickness of 100 nm to form a second electrode 52, thereby providing a reflecting electrode (FIG. 4 (4)). Subsequently, in a low-humidity nitrogen atmosphere, a cap-shaped glass plate was adhered with an epoxy resin based adhesion agent to ensure sealing, thus producing four 5 mm×5 mm bottom emission type organic EL display on one substrate. The film thickness referred to here is the reading on a crystal oscillation type film thickness monitor.

(Evaluation of Light Emission Characteristics)

The organic EL display prepared by the above procedure were caused to emit light by driving it with a direct current of 10 mA/cm² and observed to check for non-emitting regions or light emission failures such as uneven brightness. From the organic EL display devices produced, good elements free of problems in initial characteristics were selected and held at 80° C. for 500 hours as durability test. After the durability test, the organic EL displays were caused to emit light by driving it with a direct current of 10 mA/cm$^2$ and observed to check for changes in light emission characteristics such as non-emitting regions and uneven brightness. Evaluations were made according to the criteria given below, and specimens rated as A+, A, or B, which had a light emitting region area of 80% or more relative to the light emitting region area measured before the durability test, which represents 100%, were judged as acceptable. Those rated as A+ or A, which had a light emitting region area of 90% or more, were judged as good in terms of light emission characteristics, and those rated as A+, which had a light emitting region area of 95% or more, were judged as excellent in terms of light emission characteristics.

A+: Having a light emitting region area of 95% to 100% after durability test

A: Having a light emitting region area of 90% to 94% after durability test

B: Having a light emitting region area of 80% to 89% after durability test

C: Having a light emitting region area of 70% to 79% after durability test

D: a light emitting region area of 50% to 69% after durability test

E: Having a light emitting region area of 0% to 49% after durability test

Example 1

Under yellow light, 0.341 g of NCI-831 was weighed out, and then 7.915 g of MBA and 4.816 g of PGMEA were added, followed by stirring to ensure dissolution. Then, 6.157 g of a 30 mass % solution of the polyimide (PI-1) obtained in Synthesis example 1 in MBA, 1.421 g of a 50 mass % solution of DPHA in MBA, and 0.568 g of a 50 mass % solution of A-BPEF in PGMEA were added and stirred to provide a preparation liquid as a uniform solution. Then, 7.319 g of the pigment dispersion liquid (Bk-1) obtained in Preparation example 1 was weighed out and 17.681 g of the preparation liquid obtained above was added and stirred to provide a uniform solution. Subsequently, the resulting solution was filtered through a filter with a pore size of 0.45 µm to provide a composition 1.

The composition 1 prepared was spread on an ITO substrate by spin coating using a spin coater (MS-A100; manufactured by Mikasa Co., Ltd.) at an appropriate rotating speed and prebaked on a hot plate equipped with a buzzer (HPD-3000BZN; manufactured by AS ONE Corporation) at 110° C. for 120 seconds to produce a prebaked film having a thickness of about 1.8 µm. The prebaked film produced was subjected to spray development with a 2.38 mass % aqueous TMAH solution by a small development apparatus for photolithography (AD-2000; manufactured by Takizawa Sangyo Co., Ltd.), and the time period (breaking point; hereinafter referred to as B. P.) required for complete dissolution of the prebaked film (unexposed parts) was measured.

A prebaked film was prepared by the same procedure as above, and then a double side alignment type single side aligner (Mask Aligner PEM-6M; manufactured by Union Optical Co., Ltd.) was used to apply the i-line (wavelength 365 nm), h-line (wavelength 405 nm), or g-line (wavelength 436 nm) beam from an ultrahigh pressure mercury lamp to the resulting prebaked film through a gray scale mask (MDRM MODEL 4000-5-FS; manufactured by Opto-Line International) to carry out patterning exposure. After the light exposure step, a small development apparatus for photolithography (AD-2000; manufactured by Takizawa Sangyo Co., Ltd.) was used to develop the film with a 2.38 mass % aqueous TMAH solution, followed by rinsing with water for 30 seconds. The development time was 1.5 times the B. P. After the development step, a high temperature inert gas oven (INH-9CD-S; manufactured by Koyo Thermo Systems Co., Ltd.) was used to perform heat-curing at 250° C. to produce a cured film having a film thickness of about 1.2 µm. Regarding the heat-curing conditions, the film was heat-cured in a nitrogen atmosphere at 250° C. for 60 minutes.

Examples 2 to 85 and Comparative Examples 1 to 8

According to the same procedure as in Example 1, compositions 2 to 93 were prepared from the components given in Table 3-1 to Table 16-1. Using each of the compositions obtained, a film of the composition was formed on a substrate and evaluated for photosensitive characteristics and cured film characteristics in the same way as in Example 1. Results are summarized in Table 3-2 to Table 16-2. In particular, the components and evaluation results of Example 6 are given in Table 4-1 to Table 6-1, Table 11-1 to Table 12-1, Table 4-2 to Table 6-2, and Table 11-2 to Table 12-2, and the components and evaluation results of Example 37 are given in Table 8-1 to Table 10-1, Table 13-1 to Table 15-1, Table 8-2 to Table 10-2, and Table 13-2 to Table 15-2 for easy comparison.

TABLE 3-1

| | | Components [parts by mass] | | | | | |
|---|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Example 1 | 1 | Bk-1 | — | PI-1 (65) | — | DPHA (25) A-BPEF (10) | NCI-831 (12) |
| Example 2 | 2 | Bk-1 | — | PIP-1 (65) | — | DPHA (25) A-BPEF (10) | NCI-831 (12) |
| Example 3 | 3 | Bk-1 | — | PBO-1 (65) | — | DPHA (25) A-BPEF (10) | NCI-831 (12) |
| Example 4 | 4 | Bk-1 | — | PBOP-1 (65) | — | DPHA (25) A-BPEF (10) | NCI-831 (12) |

TABLE 3-1-continued

| | | | | | | |
|---|---|---|---|---|---|---|
| Example 5 | 5 | Bk-1 | — | PS-1 (65) | — | DPHA (25) A-BPEF (10) | NCI-831 (12) |
| Example 6 | 6 | Bk-2 | PI-1 (11.6) | PI-1 (53.4) | — | DPHA (25) A-BPEF (10) | NCI-831 (12) |

| | Components [parts by mass] | | | | | |
|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
| Example 1 | Bk-S0100CF (34.8) | S-20000 (11.6) | MBA PGMEA | 100 | 35 | 22.0 |
| Example 2 | Bk-S0100CF (34.8) | S-20000 (11.6) | MBA PGMEA | 100 | 35 | 22.0 |
| Example 3 | Bk-S0100CF (34.8) | S-20000 (11.6) | MBA PGMEA | 100 | 35 | 22.0 |
| Example 4 | Bk-S0100CF (34.8) | S-20000 (11.6) | MBA PGMEA | 100 | 35 | 22.0 |
| Example 5 | Bk-S0100CF (34.8) | S-20000 (11.6) | MBA PGMEA | 100 | 35 | 22.0 |
| Example 6 | Bk-S0100CF (34.8) | S-20000 (11.6) | MBA PGMEA | 100 | 35 | 22.0 |

TABLE 3-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 1 | 1 | 50 B | 10 B | 37 A | 22 A+ | 0.55 B |
| Example 2 | 2 | 40 A | 10 B | 32 A | 20 A+ | 0.55 B |
| Example 3 | 3 | 50 B | 10 B | 37 A | 22 A+ | 0.55 B |
| Example 4 | 4 | 40 A | 10 B | 33 A | 20 A+ | 0.55 B |
| Example 5 | 5 | 35 A | 10 B | 30 A+ | 20 A+ | 0.55 B |
| Example 6 | 6 | 50 B | 7 B | 37 A | 22 A+ | 0.55 B |

| | Photosensitive characteristics/ cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics after durability test [%] |
| Example 1 | 7.5 A | 1.0 | >1.0 × 10^15 | good | 100 A+ |
| Example 2 | 17.3 B | 1.0 | >1.0 × 10^15 | good | 100 A+ |
| Example 3 | 7.7 A | 1.0 | >1.0 × 10^15 | good | 100 A+ |
| Example 4 | 17.5 B | 1.0 | >1.0 × 10^15 | good | 100 A+ |
| Example 5 | 19.1 B | 1.0 | >1.0 × 10^15 | good | 100 A+ |
| Example 6 | 7.3 A | 1.0 | >1.0 × 10^15 | good | 100 A+ |

TABLE 4-1

| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
|---|---|---|---|---|---|---|---|
| Example 7 | 7 | Bk-2 | PI-1 (11.6) | PI-1 (53.4) | — | DPHA (25) A-BPEF (10) | NCI-831 (8) |
| Example 8 | 8 | Bk-2 | PI-1 (11.6) | PI-1 (53.4) | — | DPHA (25) A-BPEF (10) | NCI-831 (10) |
| Example 6 | 6 | Bk-2 | PI-1 (11.6) | PI-1 (53.4) | — | DPHA (25) A-BPEF (10) | NCI-831 (12) |
| Example 9 | 9 | Bk-2 | PI-1 (11.6) | PI-1 (53.4) | — | DPHA (25) A-BPEF (10) | NCI-831 (14) |
| Example 10 | 10 | Bk-2 | PI-1 (11.6) | PI-1 (53.4) | — | DPHA (25) A-BPEF (10) | NCI-831 (16) |
| Example 11 | 11 | Bk-2 | PI-1 (11.6) | PI-1 (53.4) | — | DPHA (25) A-BPEF (10) | NCI-831 (20) |
| Example 12 | 12 | Bk-2 | PI-1 (11.6) | PI-1 (53.4) | — | DPHA (25) A-BPEF (10) | NCI-831 (22) |
| Example 13 | 13 | Bk-2 | PI-1 (11.6) | PI-1 (53.4) | — | DPHA (25) A-BPEF (10) | NCI-831 (25) |
| Example 14 | 14 | Bk-2 | PI-1 (11.6) | PI-1 (53.4) | — | DPHA (25) A-BPEF (10) | NCI-831 (32) |

| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
|---|---|---|---|---|---|---|
| Example 7 | Bk-S0100CF (34.8) | S-20000 (11.6) | MBA PGMEA | 100 | 35 | 22.5 |
| Example 8 | Bk-S0100CF (34.8) | S-20000 (11.6) | MBA PGMEA | 100 | 35 | 22.2 |
| Example 6 | Bk-S0100CF (34.8) | S-20000 (11.6) | MBA PGMEA | 100 | 35 | 22.0 |
| Example 9 | Bk-S0100CF (34.8) | S-20000 (11.6) | MBA PGMEA | 100 | 35 | 21.7 |
| Example 10 | Bk-S0100CF (34.8) | S-20000 (11.6) | MBA PGMEA | 100 | 35 | 21.4 |
| Example 11 | Bk-S0100CF (34.8) | S-20000 (11.6) | MBA PGMEA | 100 | 35 | 20.9 |
| Example 12 | Bk-S0100CF (34.8) | S-20000 (11.6) | MBA PGMEA | 100 | 35 | 20.7 |
| Example 13 | Bk-S0100CF (34.8) | S-20000 (11.6) | MBA PGMEA | 100 | 35 | 20.3 |
| Example 14 | Bk-S0100CF (34.8) | S-20000 (11.6) | MBA PGMEA | 100 | 35 | 19.5 |

TABLE 4-2

| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
|---|---|---|---|---|---|---|
| Example 7 | 7 | 65 / C | 7 / B | 33 / A | 20 / A+ | 0.90 / C |
| Example 8 | 8 | 55 / B | 7 / B | 35 / A | 20 / A+ | 0.60 / B |
| Example 6 | 6 | 50 / B | 7 / B | 37 / A | 22 / A+ | 0.55 / B |
| Example 9 | 9 | 45 / A | 7 / B | 37 / A | 22 / A+ | 0.50 / B |

TABLE 4-2-continued

| | | | | | | |
|---|---|---|---|---|---|---|
| Example 10 | 10 | 40<br>A | 7<br>B | 39<br>A | 24<br>A+ | 0.50<br>B |
| Example 11 | 11 | 35<br>A | 7<br>B | 43<br>A | 31<br>A | 0.45<br>B |
| Example 12 | 12 | 25<br>A+ | 7<br>B | 49<br>B | 38<br>A | 0.40<br>A |
| Example 13 | 13 | 20<br>A+ | 7<br>B | 56<br>B | 41<br>A | 0.50<br>B |
| Example 14 | 14 | 20<br>A+ | 7<br>B | 67<br>C | 50<br>B | 0.70<br>C |

| | Photosensitive characteristics/ cured film characteristics | | | |
|---|---|---|---|---|
| | Heat resistance difference in high temperature weight retention rate [mass %] | Light-shielding OD value | Insulating properties surface resistivity [Ω/□] | Luminescence characteristics of organic EL display | |
| | | | | Initial characteristics | Characteristics of after durability test [%] |
| Example 7 | 7.6<br>A | 1.0 | >1.0 × 10^15 | good | 100<br>A+ |
| Example 8 | 7.4<br>A | 1.0 | >1.0 × 10^15 | good | 100<br>A+ |
| Example 6 | 7.3<br>A | 1.0 | >1.0 × 10^15 | good | 100<br>A+ |
| Example 9 | 7.3<br>A | 1.0 | >1.0 × 10^15 | good | 100<br>A+ |
| Example 10 | 7.2<br>A | 1.0 | >1.0 × 10^15 | good | 100<br>A+ |
| Example 11 | 7.1<br>A | 1.0 | >1.0 × 10^15 | good | 100<br>A+ |
| Example 12 | 7.1<br>A | 1.0 | >1.0 × 10^15 | good | 100<br>A+ |
| Example 13 | 7.1<br>A | 1.0 | >1.0 × 10^15 | good | 100<br>A+ |
| Example 14 | 7.0<br>A | 1.0 | >1.0 × 10^15 | good | 100<br>A+ |

TABLE 5-1

| | | | Components [parts by mass] | | | |
|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) |
| Example 15 | 15 | Bk-2 | PI-1 (2) | PI-1 (63) | — | DPHA (25)<br>A-BPEF (10) |
| Example 16 | 16 | Bk-2 | PI-1 (4.3) | PI-1 (60.7) | — | DPHA (25)<br>A-BPEF (10) |
| Example 17 | 17 | Bk-2 | PI-1 (7) | PI-1 (58) | — | DPHA (25)<br>A-BPEF (10) |
| Example 6 | 6 | Bk-2 | PI-1 (11.6) | PI-1 (53.4) | — | DPHA (25)<br>A-BPEF (10) |
| Example 18 | 18 | Bk-2 | PI-1 (14.8) | PI-1 (50.2) | — | DPHA (25)<br>A-BPEF (10) |
| Example 19 | 19 | Bk-2 | PI-1 (20.9) | PI-1 (44.1) | — | DPHA (25)<br>A-BPEF (10) |
| Example 20 | 20 | Bk-3 | PI-1 (29.1) | PI-1 (35.9) | — | DPHA (25)<br>A-BPEF (10) |
| Example 21 | 21 | Bk-3 | PI-1 (40.35) | PI-1 (24.65) | — | DPHA (25)<br>A-BPEF (10) |
| Example 22 | 22 | Bk-3 | PI-1 (51) | PI-1 (14) | — | DPHA (25)<br>A-BPEF (10) |

TABLE 5-1-continued

| | Components [parts by mass] | | | | Content of (A1) in total of (A1) and (A2) [mass %] | Content of (B) in total of (A1), (A2), and (B) [mass %] | Content of coloring agent (D) in total solid [mass %] |
|---|---|---|---|---|---|---|---|
| | Photo initiator (C1) | Coloring agent (D) derived from pigment dispersion liquid | Dispersing agent (E) derived from pigment dispersion liquid | Solvent | | | |
| Example 15 | NCI-831 (12) | Bk-S0100CF (6) | S-20000 (2) | MBA PGMEA | 100 | 35 | 5.0 |
| Example 16 | NCI-831 (12) | Bk-S0100CF (12.9) | S-20000 (4.3) | MBA PGMEA | 100 | 35 | 10.0 |
| Example 17 | NCI-831 (12) | Bk-S0100CF (20.9) | S-20000 (7) | MBA PGMEA | 100 | 35 | 15.0 |
| Example 6 | NCI-831 (12) | Bk-S0100CF (34.8) | S-20000 (11.6) | MBA PGMEA | 100 | 35 | 22.0 |
| Example 18 | NCI-831 (12) | Bk-S0100CF (44.5) | S-20000 (14.8) | MBA PGMEA | 100 | 35 | 26.0 |
| Example 19 | NCI-831 (12) | Bk-S0100CF (62.6) | S-20000 (20.9) | MBA PGMEA | 100 | 35 | 32.0 |
| Example 20 | NCI-831 (12) | Bk-S0100CF (75.8) | S-20000 (11.7) | MBA PGMEA | 100 | 35 | 38.0 |
| Example 21 | NCI-831 (12) | Bk-S0100CF (104.9) | S-20000 (1.6) | MBA PGMEA | 100 | 35 | 45.0 |
| Example 22 | NCI-831 (12) | Bk-S0100CF (132.6) | S-20000 (20.4) | MBA PGMEA | 100 | 35 | 50.0 |

TABLE 5-2

| | Composition | Photosensitive characteristics/cured film characteristics | | | | |
|---|---|---|---|---|---|---|
| | | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 15 | 15 | 35 A | 4 A | 32 A | 20 A+ | 0.60 B |
| Example 16 | 16 | 40 A | 5 A | 34 A | 20 A+ | 0.55 B |
| Example 17 | 17 | 45 A | 6 B | 35 A | 20 A+ | 0.50 B |
| Example 6 | 6 | 50 B | 7 B | 37 A | 22 A+ | 0.55 B |
| Example 18 | 18 | 55 B | 8 B | 39 A | 24 A+ | 0.55 B |
| Example 19 | 19 | 60 B | 9 B | 41 A | 26 A+ | 0.55 B |
| Example 20 | 20 | 70 C | 9 B | 44 A | 29 A+ | 0.55 B |
| Example 21 | 21 | 80 C | 10 B | 47 B | 32 A | 0.60 B |
| Example 22 | 22 | 90 C | 10 B | 50 B | 36 A | 0.60 B |

TABLE 5-2-continued

| | Photosensitive characteristics/ cured film characteristics | | | | |
|---|---|---|---|---|---|
| | Heat resistance difference in high temperature weight retention rate [mass %] | Light-shielding OD value | Insulating properties surface resistivity [Ω/□] | Luminescence characteristics of organic EL display | |
| | | | | Initial characteristics | Characteristics after durability test [%] |
| Example 15 | 4.2 A+ | 0.3 | >1.0 × 10^15 | good | 100 A+ |
| Example 16 | 6.4 A | 0.5 | >1.0 × 10^15 | good | 100 A+ |
| Example 17 | 6.5 A | 0.7 | >1.0 × 10^15 | good | 100 A+ |
| Example 6 | 7.3 A | 1.0 | >1.0 × 10^15 | good | 100 A+ |
| Example 18 | 8.1 A | 1.2 | >1.0 × 10^15 | good | 100 A+ |
| Example 19 | 9.3 A | 1.5 | >1.0 × 10^15 | good | 100 A+ |
| Example 20 | 10.4 A | 1.7 | >1.0 × 10^15 | good | 100 A+ |
| Example 21 | 11.5 A | 2.0 | >1.0 × 10^15 | good | 100 A+ |
| Example 22 | 12.7 A | 2.2 | >1.0 × 10^15 | good | 100 A+ |

TABLE 6-1

| | Composition | Components [parts by mass] | | | | |
|---|---|---|---|---|---|---|
| | | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Example 23 | 23 | Bk-2 | PI-1 (11.6) | PI-1 (53.4) | — | DPHA (25) FLN-1 (10) | NCI-831 (12) |
| Example 6 | 6 | Bk-2 | PI-1 (11.6) | PI-1 (53.4) | — | DPHA (25) A-BPEF (10) | NCI-831 (12) |
| Example 24 | 24 | Bk-2 | PI-1 (11.6) | PI-1 (53.4) | — | DPHA (25) TR-FR-301 (10) | NCI-831 (12) |
| Example 25 | 25 | Bk-2 | PI-1 (11.6) | PI-1 (53.4) | — | DPHA (25) FLN-2 (10) | NCI-831 (12) |
| Example 26 | 26 | Bk-2 | PI-1 (11.6) | PI-1 (53.4) | — | DPHA (25) FLN-3 (10) | NCI-831 (12) |
| Example 27 | 26 | Bk-2 | PI-1 (11.6) | PI-1 (53.4) | — | DPHA (25) FLN-4 (10) | NCI-831 (12) |
| Example 28 | 28 | Bk-2 | PI-1 (11.6) | PI-1 (53.4) | — | DPHA (25) FLN-5 (10) | NCI-831 (12) |
| Example 29 | 29 | Bk-2 | PI-1 (11.6) | PI-1 (53.4) | — | DPHA (25) IDN-1 (10) | NCI-831 (12) |
| Example 30 | 30 | Bk-2 | PI-1 (11.6) | PI-1 (53.4) | — | DPHA (25) IDN-2 (10) | NCI-831 (12) |
| Example 31 | 31 | Bk-2 | PI-1 (11.6) | PI-1 (53.4) | — | DPHA (25) IDN-3 (10) | NCI-831 (12) |

| | Components [parts by mass] | | | | | |
|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
| Example 23 | Bk-S0100CF (34.8) | S-20000 (11.6) | MBA PGMEA | 100 | 35 | 22.0 |
| Example 6 | Bk-S0100CF (34.8) | S-20000 (11.6) | MBA PGMEA | 100 | 35 | 22.0 |
| Example 24 | Bk-S0100CF (34.8) | S-20000 (11.6) | MBA PGMEA | 100 | 35 | 22.0 |

TABLE 6-1-continued

| | | | | | | |
|---|---|---|---|---|---|---|
| Example 25 | Bk-S0100CF (34.8) | S-20000 (11.6) | MBA PGMEA | 100 | 35 | 22.0 |
| Example 26 | Bk-S0100CF (34.8) | S-20000 (11.6) | MBA PGMEA | 100 | 35 | 22.0 |
| Example 27 | Bk-S0100CF (34.8) | S-20000 (11.6) | MBA PGMEA | 100 | 35 | 22.0 |
| Example 28 | Bk-S0100CF (34.8) | S-20000 (11.6) | MBA PGMEA | 100 | 35 | 22.0 |
| Example 29 | Bk-S0100CF (34.8) | S-20000 (11.6) | MBA PGMEA | 100 | 35 | 22.0 |
| Example 30 | Bk-S0100CF (34.8) | S-20000 (11.6) | MBA PGMEA | 100 | 35 | 22.0 |
| Example 31 | Bk-S0100CF (34.8) | S-20000 (11.6) | MBA PGMEA | 100 | 35 | 22.0 |

TABLE 6-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 23 | 23 | 50<br>B | 7<br>B | 40<br>A | 25<br>A+ | 0.60<br>B |
| Example 6 | 6 | 50<br>B | 7<br>B | 37<br>A | 22<br>A+ | 0.55<br>B |
| Example 24 | 24 | 50<br>B | 7<br>B | 37<br>A | 22<br>A+ | 0.55<br>B |
| Example 25 | 25 | 40<br>A | 5<br>A | 37<br>A | 25<br>A+ | 0.45<br>B |
| Example 26 | 26 | 45<br>A | 6<br>B | 46<br>B | 35<br>A | 0.45<br>B |
| Example 27 | 27 | 60<br>B | 7<br>B | 35<br>A | 20<br>A+ | 0.55<br>B |
| Example 28 | 28 | 40<br>A | 0<br>A+ | 37<br>A | 25<br>A+ | 0.35<br>A |
| Example 29 | 29 | 50<br>B | 7<br>B | 40<br>A | 25<br>A+ | 0.60<br>B |
| Example 30 | 30 | 50<br>B | 7<br>B | 40<br>A | 25<br>A+ | 0.60<br>B |
| Example 31 | 31 | 50<br>B | 7<br>B | 40<br>A | 25<br>A+ | 0.60<br>B |

| | Photosensitive characteristics/ cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics after durability test [%] |
| Example 23 | 7.3<br>A | 1.0 | >1.0 × 10^15 | good | 100<br>A+ |
| Example 6 | 7.3<br>A | 1.0 | >1.0 × 10^15 | good | 100<br>A+ |
| Example 24 | 7.4<br>A | 1.0 | >1.0 × 10^15 | good | 100<br>A+ |
| Example 25 | 7.0<br>A | 1.0 | >1.0 × 10^15 | good | 100<br>A+ |
| Example 26 | 7.0<br>A | 1.0 | >1.0 × 10^15 | good | 100<br>A+ |
| Example 27 | 7.5<br>A | 1.0 | >1.0 × 10^15 | good | 100<br>A+ |
| Example 28 | 7.0<br>A | 1.0 | >1.0 × 10^15 | good | 100<br>A+ |
| Example 29 | 8.3<br>A | 1.0 | >1.0 × 10^15 | good | 100<br>A+ |

TABLE 6-2-continued

| Example 30 | 8.3 A | 1.0 | >1.0 × 10^15 | good | 100 A+ |
| Example 31 | 8.4 A | 1.0 | >1.0 × 10^15 | good | 100 A+ |

TABLE 7-1

| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
|---|---|---|---|---|---|---|---|
| Example 32 | 32 | Bk-2 | PI-1 (11.6) | PI-1 (53.4) | — | A-BPEF (10) CPL-1 (25) | NCI-831 (12) |
| Example 33 | 33 | Bk-2 | PI-1 (11.6) | PI-1 (53.4) | — | A-BPEF (10) DPCA-20 (25) | NCI-831 (12) |
| Example 34 | 34 | Bk-2 | PI-1 (11.6) | PI-1 (53.4) | — | A-BPEF (10) DPCA-30 (25) | NCI-831 (12) |
| Example 35 | 35 | Bk-2 | PI-1 (11.6) | PI-1 (53.4) | — | A-BPEF (10) CPL-2 (25) | NCI-831 (12) |
| Example 36 | 36 | Bk-2 | PI-1 (11.6) | PI-1 (53.4) | — | A-BPEF (10) CPL-3 (25) | NCI-831 (12) |
| Example 37 | 37 | Bk-2 | PI-1 (11.6) | PI-1 (53.4) | — | A-BPEF (10) DPCA-60 (25) | NCI-831 (12) |
| Example 38 | 38 | Bk-2 | PI-1 (11.6) | PI-1 (53.4) | — | A-BPEF (10) DPCA-120 (25) | NCI-831 (12) |
| Example 39 | 39 | Bk-2 | PI-1 (11.6) | PI-1 (53.4) | — | A-BPEF (10) A-DPH-6E (25) | NCI-831 (12) |
| Example 40 | 40 | Bk-2 | PI-1 (11.6) | PI-1 (53.4) | — | A-BPEF (10) A-DPH-12E (25) | NCI-831 (12) |
| Example 41 | 41 | Bk-2 | PI-1 (11.6) | PI-1 (53.4) | — | A-BPEF (10) A-DPH-6P (25) | NCI-831 (12) |

| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
|---|---|---|---|---|---|---|---|
| Example 32 | Bk-S0100CF (34.8) | S-20000 (11.6) | MBA PGMEA | 100 | 35 | 29 | 22.0 |
| Example 33 | Bk-S0100CF (34.8) | S-20000 (11.6) | MBA PGMEA | 100 | 35 | 29 | 22.0 |
| Example 34 | Bk-S0100CF (34.8) | S-20000 (11.6) | MBA PGMEA | 100 | 35 | 29 | 22.0 |
| Example 35 | Bk-S0100CF (34.8) | S-20000 (11.6) | MBA PGMEA | 100 | 35 | 29 | 22.0 |
| Example 36 | Bk-S0100CF (34.8) | S-20000 (11.6) | MBA PGMEA | 100 | 35 | 29 | 22.0 |
| Example 37 | Bk-S0100CF (34.8) | S-20000 (11.6) | MBA PGMEA | 100 | 35 | 29 | 22.0 |
| Example 38 | Bk-S0100CF (34.8) | S-20000 (11.6) | MBA PGMEA | 100 | 35 | 29 | 22.0 |
| Example 39 | Bk-S0100CF (34.8) | S-20000 (11.6) | MBA PGMEA | 100 | 35 | 29 | 22.0 |
| Example 40 | Bk-S0100CF (34.8) | S-20000 (11.6) | MBA PGMEA | 100 | 35 | 29 | 22.0 |
| Example 41 | Bk-S0100CF (34.8) | S-20000 (11.6) | MBA PGMEA | 100 | 35 | 29 | 22.0 |

TABLE 7-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 32 | 32 | 40 | 5 | 37 | 24 | 0.40 |
| | | A | A | A | A+ | A |
| Example 33 | 33 | 35 | 3 | 37 | 25 | 0.30 |
| | | A | A | A | A+ | A |
| Example 34 | 34 | 35 | 2 | 37 | 26 | 0.30 |
| | | A | A | A | A+ | A |
| Example 35 | 35 | 30 | 1 | 37 | 27 | 0.25 |
| | | A+ | A | A | A+ | A |
| Example 36 | 36 | 30 | 1 | 37 | 28 | 0.25 |
| | | A+ | A | A | A+ | A |
| Example 37 | 37 | 30 | 0 | 37 | 29 | 0.20 |
| | | A+ | A+ | A | A+ | A+ |
| Example 38 | 38 | 25 | 0 | 37 | 29 | 0.20 |
| | | A+ | A+ | A | A+ | A+ |
| Example 39 | 39 | 40 | 5 | 43 | 30 | 0.40 |
| | | A | A | A | A+ | A |
| Example 40 | 40 | 35 | 4 | 40 | 28 | 0.35 |
| | | A | A | A | A+ | A |
| Example 41 | 41 | 35 | 4 | 40 | 28 | 0.35 |
| | | A | A | A | A+ | A |

| | Photosensitive characteristics/ cured film characteristics | | | | |
|---|---|---|---|---|---|
| | Heat resistance difference in high temperature weight retention rate [mass %] | Light-shielding OD value | Insulating properties surface resistivity [Ω/□] | Luminescence characteristics of organic EL display | |
| | | | | Initial characteristics | Characteristics after durability test [%] |
| Example 32 | 7.3 | 1.0 | >1.0 × 10^15 | good | 100 |
| | A | | | | A+ |
| Example 33 | 7.2 | 1.0 | >1.0 × 10^15 | good | 100 |
| | A | | | | A+ |
| Example 34 | 7.1 | 1.0 | >1.0 × 10^15 | good | 100 |
| | A | | | | A+ |
| Example 35 | 7.0 | 1.0 | >1.0 × 10^15 | good | 100 |
| | A | | | | A+ |
| Example 36 | 7.0 | 1.0 | >1.0 × 10^15 | good | 100 |
| | A | | | | A+ |
| Example 37 | 7.0 | 1.0 | >1.0 × 10^15 | good | 100 |
| | A | | | | A+ |
| Example 38 | 7.0 | 1.0 | >1.0 × 10^15 | good | 100 |
| | A | | | | A+ |
| Example 39 | 8.0 | 1.0 | >1.0 × 10^15 | good | 100 |
| | A | | | | A+ |
| Example 40 | 8.4 | 1.0 | >1.0 × 10^15 | good | 100 |
| | A | | | | A+ |
| Example 41 | 8.1 | 1.0 | >1.0 × 10^15 | good | 100 |
| | A | | | | A+ |

TABLE 8-1

| Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) | Coloring agent (D) derived from pigment dispersion liquid |
|---|---|---|---|---|---|---|---|
| Example 42 | 42 | Bk-2 | Pl-1 (11.6) | Pl-1 (53.4) | — | DPHA (20) A-BPEF (10) DPCA-60 (5) | NCl-831 (12) | Bk-S0100CF (34.8) |
| Example 43 | 43 | Bk-2 | Pl-1 (11.6) | Pl-1 (53.4) | — | DPHA (15) A-BPEF (10) DPCA-60 (10) | NCl-831 (12) | Bk-S0100CF (34.8) |
| Example 44 | 44 | Bk-2 | Pl-1 (11.6) | Pl-1 (53.4) | — | DPHA (10) A-BPEF (10) DPCA-60 (15) | NCl-831 (12) | Bk-S0100CF (34.8) |
| Example 45 | 45 | Bk-2 | Pl-1 (11.6) | Pl-1 (53.4) | — | DPHA (5) A-BPEF (10) DPCA-60 (20) | NCl-831 (12) | Bk-S0100CF (34.8) |
| Example 37 | 37 | Bk-2 | Pl-1 (11.6) | Pl-1 (53.4) | — | A-BPEF (10) DPCA-60 (25) | NCl-831 (12) | Bk-S0100CF (34.8) |
| Example 46 | 46 | Bk-2 | Pl-1 (11.6) | Pl-1 (53.4) | — | A-BPEF (5) DPCA-60 (30) | NCl-831 (12) | Bk-S0100CF (34.8) |
| Example 47 | 47 | Bk-2 | Pl-1 (11.6) | Pl-1 (48.4) | — | A-BPEF (10) DPCA-60 (30) | NCl-831 (12) | Bk-S0100CF (34.8) |
| Example 48 | 48 | Bk-2 | Pl-1 (11.6) | Pl-1 (43.4) | — | A-BPEF (10) DPCA-60 (35) | NCl-831 (12) | Bk-S0100CF (34.8) |
| Example 49 | 49 | Bk-2 | Pl-1 (11.6) | Pl-1 (38.4) | — | A-BPEF (10) DPCA-60 (40) | NCl-831 (12) | Bk-S0100CF (34.8) |

| | Dispersing agent (E) derived from pigment dispersion liquid | Solvent | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
|---|---|---|---|---|---|---|
| Example 42 | S-20000 (11.6) | MBA PGMEA | 100 | 35 | 67 | 22.0 |
| Example 43 | S-20000 (11.6) | MBA PGMEA | 100 | 35 | 50 | 22.0 |
| Example 44 | S-20000 (11.6) | MBA PGMEA | 100 | 35 | 40 | 22.0 |
| Example 45 | S-20000 (11.6) | MBA PGMEA | 100 | 35 | 33 | 22.0 |
| Example 37 | S-20000 (11.6) | MBA PGMEA | 100 | 35 | 29 | 22.0 |
| Example 46 | S-20000 (11.6) | MBA PGMEA | 100 | 35 | 14 | 22.0 |
| Example 47 | S-20000 (11.6) | MBA PGMEA | 100 | 40 | 25 | 22.0 |
| Example 48 | S-20000 (11.6) | MBA PGMEA | 100 | 45 | 22 | 22.0 |
| Example 49 | S-20000 (11.6) | MBA PGMEA | 100 | 50 | 20 | 22.0 |

TABLE 8-2

| | Composition | Sensitivity [mJ/cm²] | Development residue [%] | Cross-sectional shape of pattern after development [°] | Cross-sectional shape of pattern after heat curing [°] | Difference in pattern opening width between before and after heat curing [μm] |
|---|---|---|---|---|---|---|
| | | Photosensitive characteristics/cured film characteristics | | | | |
| Example 42 | 42 | 40<br>A | 6<br>B | 37<br>A | 24<br>A+ | 0.45<br>B |
| Example 43 | 43 | 35<br>A | 3<br>A | 37<br>A | 27<br>A+ | 0.30<br>A |
| Example 44 | 44 | 30<br>A+ | 0<br>A+ | 37<br>A | 29<br>A+ | 0.20<br>A+ |
| Example 45 | 45 | 30<br>A+ | 0<br>A+ | 37<br>A | 29<br>A+ | 0.20<br>A+ |
| Example 37 | 37 | 30<br>A+ | 0<br>A+ | 37<br>A | 29<br>A+ | 0.20<br>A+ |
| Example 46 | 46 | 30<br>A+ | 0<br>A+ | 38<br>A | 32<br>A | 0.15<br>A+ |
| Example 47 | 47 | 25<br>A+ | 0<br>A+ | 40<br>A | 34<br>A | 0.15<br>A+ |
| Example 48 | 48 | 20<br>A+ | 0<br>A+ | 42<br>A | 38<br>A | 0.10<br>A+ |
| Example 49 | 49 | 15<br>A+ | 0<br>A+ | 50<br>B | 48<br>B | 0.05<br>A+ |

| | Heat resistance difference in high temperature weight retention rate [mass %] | Light-shielding OD value | Insulating properties surface resistivity [Ω/□] | Luminescence characteristics of organic EL display Initial characteristics | Characteristics after durability test [%] |
|---|---|---|---|---|---|
| | Photosensitive characteristics/ cured film characteristics | | | | |
| Example 42 | 7.3<br>A | 1.0 | >1.0 × 10^15 | good | 100<br>A+ |
| Example 43 | 7.2<br>A | 1.0 | >1.0 × 10^15 | good | 100<br>A+ |
| Example 44 | 7.1<br>A | 1.0 | >1.0 × 10^15 | good | 100<br>A+ |
| Example 45 | 7.0<br>A | 1.0 | >1.0 × 10^15 | good | 100<br>A+ |
| Example 37 | 7.0<br>A | 1.0 | >1.0 × 10^15 | good | 100<br>A+ |
| Example 46 | 7.0<br>A | 1.0 | >1.0 × 10^15 | good | 100<br>A+ |
| Example 47 | 7.0<br>A | 1.0 | >1.0 × 10^15 | good | 100<br>A+ |
| Example 48 | 7.0<br>A | 1.0 | >1.0 × 10^15 | good | 100<br>A+ |
| Example 49 | 7.0<br>A | 1.0 | >1.0 × 10^15 | good | 100<br>A+ |

TABLE 9-1

| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
|---|---|---|---|---|---|---|---|
| | | Components[parts by mass] | | | | | |
| Example 50 | 50 | Bk-2 | PI-1<br>(11.6) | PI-1<br>(53.4) | — | DPHA (9.5)<br>A-BPEF (0.5)<br>DPCA-60 (25) | NCI-831<br>(12) |
| Example 51 | 51 | Bk-2 | PI-1<br>(11.6) | PI-1<br>(53.4) | — | DPHA (9)<br>A-BPEF (1)<br>DPCA-60 (25) | NCI-831<br>(12) |

TABLE 9-1-continued

| | | | | | | | |
|---|---|---|---|---|---|---|---|
| Example 52 | 52 | Bk-2 | PI-1 (11.6) | PI-1 (53.4) | — | DPHA (7) A-BPEF (2) DPCA-60 (25) | NCI-831 (12) |
| Example 53 | 53 | Bk-2 | PI-1 (11.6) | PI-1 (53.4) | — | DPHA (5) A-BPEF (5) DPCA-60 (25) | NCI-831 (12) |
| Example 37 | 37 | Bk-2 | PI-1 (11.6) | PI-1 (53.4) | — | A-BPEF (10) DPCA-60 (25) | NCI-831 (12) |

| | Components[parts by mass] | | | | | | |
|---|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
| Example 50 | Bk-S0100CF (34.8) | S-20000 (11.6) | MBA PGMEA | 100 | 35 | 2 | 22.0 |
| Example 51 | Bk-S0100CF (34.8) | S-20000 (11.6) | MBA PGMEA | 100 | 35 | 4 | 22.0 |
| Example 52 | Bk-S0100CF (34.8) | S-20000 (11.6) | MBA PGMEA | 100 | 35 | 7 | 22.0 |
| Example 53 | Bk-S0100CF (34.8) | S-20000 (11.6) | MBA PGMEA | 100 | 35 | 17 | 22.0 |
| Example 37 | Bk-S0100CF (34.8) | S-20000 (11.6) | MBA PGMEA | 100 | 35 | 29 | 22.0 |

TABLE 9-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 50 | 50 | 40 A | 0 A+ | 50 B | 35 A | 0.55 B |
| Example 51 | 51 | 35 A | 0 A+ | 44 A | 33 A | 0.35 A |
| Example 52 | 52 | 30 A+ | 0 A+ | 41 A | 31 A | 0.30 A |
| Example 53 | 53 | 30 A+ | 0 A+ | 37 A | 29 A+ | 0.20 A+ |
| Example 37 | 37 | 30 A+ | 0 A+ | 37 A | 29 A+ | 0.20 A+ |

| | Photosensitive characteristics/cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics of after durability test [%] |
| Example 50 | 9.0 A | 1.0 | >1.0 × 10^15 | good | 100 A+ |
| Example 51 | 8.0 A | 1.0 | >1.0 × 10^15 | good | 100 A+ |
| Example 52 | 7.6 A | 1.0 | >1.0 × 10^15 | good | 100 A+ |
| Example 53 | 7.2 A | 1.0 | >1.0 × 10^15 | good | 100 A+ |

TABLE 9-2-continued

| | | | | | |
|---|---|---|---|---|---|
| Example 37 | 7.0 A | 1.0 | >1.0 × 10^15 | good | 100 A+ |

TABLE 10-1

| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
|---|---|---|---|---|---|---|---|
| Example 37 | 37 | Bk-2 | PI-1 (11.6) | PI-1 (53.4) | — | A-BPEF (10) DPCA-60 (25) | NCI-831 (12) |
| Example 54 | 54 | Bk-2 | PI-1 (11.6) | PI-1 (53.4) | — | A-BPEF (15) DPCA-60 (20) | NCI-831 (12) |
| Example 55 | 55 | Bk-2 | PI-1 (11.6) | PI-1 (53.4) | — | A-BPEF (18) DPCA-60 (17) | NCI-831 (12) |
| Example 56 | 56 | Bk-2 | PI-1 (11.6) | PI-1 (53.4) | — | A-BPEF (20) DPCA-60 (15) | NCI-831 (12) |
| Example 57 | 57 | Bk-2 | PI-1 (11.6) | PI-1 (51.4) | — | A-BPEF (20) DPCA-60 (17) | NCI-831 (12) |
| Example 58 | 58 | Bk-2 | PI-1 (11.6) | PI-1 (51.4) | — | A-BPEF (22) DPCA-60 (15) | NCI-831 (12) |
| Example 59 | 59 | Bk-2 | PI-1 (11.6) | PI-1 (48.4) | — | A-BPEF (25) DPCA-60 (15) | NCI-831 (12) |

| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
|---|---|---|---|---|---|---|---|
| Example 37 | Bk-S0100CF (34.8) | S-20000 (11.6) | MBA PGMEA | 100 | 35 | 29 | 22.0 |
| Example 54 | Bk-S0100CF (34.8) | S-20000 (11.6) | MBA PGMEA | 100 | 35 | 43 | 22.0 |
| Example 55 | Bk-S0100CF (34.8) | S-20000 (11.6) | MBA PGMEA | 100 | 35 | 51 | 22.0 |
| Example 56 | Bk-S0100CF (34.8) | S-20000 (11.6) | MBA PGMEA | 100 | 35 | 57 | 22.0 |
| Example 57 | Bk-S0100CF (34.8) | S-20000 (11.6) | MBA PGMEA | 100 | 37 | 54 | 22.0 |
| Example 58 | Bk-S0100CF (34.8) | S-20000 (11.6) | MBA PGMEA | 100 | 37 | 59 | 22.0 |
| Example 59 | Bk-S0100CF (34.8) | S-20000 (11.6) | MBA PGMEA | 100 | 40 | 63 | 22.0 |

TABLE 10-2

| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
|---|---|---|---|---|---|---|
| Example 37 | 37 | 30 A+ | 0 A+ | 37 A | 29 A+ | 0.20 A+ |
| Example 54 | 54 | 30 A+ | 0 A+ | 37 A | 29 A+ | 0.20 A+ |
| Example 55 | 55 | 30 A+ | 0 A+ | 37 A | 29 A+ | 0.25 A |

TABLE 10-2-continued

| | | | | | | |
|---|---|---|---|---|---|---|
| Example 56 | 56 | 30 | 0 | 37 | 27 | 0.30 |
| | | A+ | A+ | A | A+ | A |
| Example 57 | 57 | 30 | 0 | 37 | 27 | 0.30 |
| | | A+ | A+ | A | A+ | A |
| Example 58 | 58 | 30 | 1 | 37 | 26 | 0.35 |
| | | A+ | A | A | A+ | A |
| Example 59 | 59 | 30 | 3 | 37 | 24 | 0.45 |
| | | A+ | A | A | A+ | B |

| | Photosensitive characteristics/cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics of after durability test [%] |
| Example 37 | 7.0 A | 1.0 | >1.0 × 10^15 | good | 100 A+ |
| Example 54 | 7.0 A | 1.0 | >1.0 × 10^15 | good | 100 A+ |
| Example 55 | 6.9 A | 1.0 | >1.0 × 10^15 | good | 100 A+ |
| Example 56 | 6.9 A | 1.0 | >1.0 × 10^15 | good | 100 A+ |
| Example 57 | 6.9 A | 1.0 | >1.0 × 10^15 | good | 100 A+ |
| Example 58 | 6.8 A | 1.0 | >1.0 × 10^15 | good | 100 A+ |
| Example 59 | 6.8 A | 1.0 | >1.0 × 10^15 | good | 100 A+ |

TABLE 11-1

| | | Components [parts by mass] | | | | | |
|---|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Example 6 | 6 | Bk-2 | PI-1 (11.6) | PI-1 (53.4) | — | DPHA (25) A-BPEF (10) | NCI-831 (12) |
| Example 60 | 60 | Bk-2 | PI-1 (11.6) | PI-1 (53.4) | — | DPHA (25) A-BPEF (10) | NCI-831 (12) |
| Example 61 | 61 | Bk-2 | PI-1 (11.6) | PI-1 (53.4) | — | DPHA (25) A-BPEF (10) | NCI-831 (12) |
| Example 62 | 62 | Bk-2 | PI-1 (11.6) | PI-1 (53.4) | — | DPHA (25) A-BPEF (10) | NCI-831 (12) |
| Example 63 | 63 | Bk-2 | PI-1 (11.6) | PI-1 (38.4) PIP-1 (15) | — | DPHA (25) A-BPEF (10) | NCI-831 (12) |
| Example 64 | 64 | Bk-2 | PI-1 (11.6) | PI-1 (38.4) PIP-2 (15) | — | DPHA (25) A-BPEF (10) | NCI-831 (12) |
| Example 65 | 65 | Bk-2 | PI-1 (11.6) | PI-1 (38.4) PBO-1 (15) | — | DPHA (25) A-BPEF (10) | NCI-831 (12) |
| Example 66 | 66 | Bk-2 | PI-1 (11.6) | PI-1 (38.4) PBOP-1 (15) | — | DPHA (25) A-BPEF (10) | NCI-831 (12) |

| | Components [parts by mass] | | | | | |
|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
| Example 6 | Bk-S0100CF (34.8) | S-20000 (11.6) | MBA PGMEA | 100 | 35 | 22.0 |

TABLE 11-1-continued

| | | | | | | |
|---|---|---|---|---|---|---|
| Example 60 | Bk-S0100CF (34.8) | S-20000 (11.6) | MBA PGMEA | 100 | 35 | 22.0 |
| Example 61 | Bk-S0100CF (34.8) | S-20000 (11.6) | MBA PGMEA | 100 | 35 | 22.0 |
| Example 62 | Bk-S0100CF (34.8) | S-20000 (11.6) | MBA PGMEA | 100 | 35 | 22.0 |
| Example 63 | Bk-S0100CF (34.8) | S-20000 (11.6) | MBA PGMEA | 100 | 35 | 22.0 |
| Example 64 | Bk-S0100CF (34.8) | S-20000 (11.6) | MBA PGMEA | 100 | 35 | 22.0 |
| Example 65 | Bk-S0100CF (34.8) | S-20000 (11.6) | MBA PGMEA | 100 | 35 | 22.0 |
| Example 66 | Bk-S0100CF (34.8) | S-20000 (11.6) | MBA PGMEA | 100 | 35 | 22.0 |

TABLE 11-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 6 | 6 | 50 B | 7 B | 37 A | 22 A+ | 0.55 B |
| Example 60 | 60 | 55 B | 7 B | 37 A | 22 A+ | 0.55 B |
| Example 61 | 61 | 45 A | 7 B | 37 A | 22 A+ | 0.55 B |
| Example 62 | 62 | 45 A | 7 B | 37 A | 22 A+ | 0.55 B |
| Example 63 | 63 | 45 A | 7 B | 34 A | 20 A+ | 0.55 B |
| Example 64 | 64 | 45 A | 7 B | 34 A | 20 A+ | 0.55 B |
| Example 65 | 65 | 50 B | 7 B | 37 A | 22 A+ | 0.55 B |
| Example 66 | 66 | 45 A | 7 B | 35 A | 20 A+ | 0.55 B |

| | Photosensitive characteristics/cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics of after durability test [%] |
| Example 6 | 7.3 A | 1.0 | >1.0 × 10^15 | good | 100 A+ |
| Example 60 | 7.4 A | 1.0 | >1.0 × 10^15 | good | 100 A+ |
| Example 61 | 7.3 A | 1.0 | >1.0 × 10^15 | good | 100 A+ |
| Example 62 | 7.4 A | 1.0 | >1.0 × 10^15 | good | 100 A+ |
| Example 63 | 8.4 A | 1.0 | >1.0 × 10^15 | good | 100 A+ |
| Example 64 | 8.3 A | 1.0 | >1.0 × 10^15 | good | 100 A+ |
| Example 65 | 7.3 A | 1.0 | >1.0 × 10^15 | good | 100 A+ |
| Example 66 | 8.4 A | 1.0 | >1.0 × 10^15 | good | 100 A+ |

TABLE 12-1

| | Composition | First resin (A1) derived from Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
|---|---|---|---|---|---|---|---|
| Example 6 | 6 | Bk-2 | PI-1 (11.6) | PI-1 (53.4) | — | DPHA (25) A-BPEF (10) | NCI-831 (12) |
| Example 67 | 67 | Bk-2 | PI-1 (11.6) | PI-1 (38.4) PS-1 (15) | — | DPHA (25) A-BPEF (10) | NCI-831 (12) |
| Example 68 | 68 | Bk-2 | PI-1 (11.6) | PI-1 (38.4) PS-2 (15) | — | DPHA (25) A-BPEF (10) | NCI-831 (12) |
| Example 69 | 69 | Bk-2 | PI-1 (11.6) | PI-1 (38.4) PS-3 (15) | — | DPHA (25) A-BPEF (10) | NCI-831 (12) |
| Example 70 | 70 | Bk-2 | PI-1 (11.6) | PI-1 (38.4) | CR-1 (15) | DPHA (25) A-BPEF (10) | NCI-831 (12) |
| Example 71 | 71 | Bk-2 | PI-1 (11.6) | PI-1 (38.4) | CR-2 (15) | DPHA (25) A-BPEF (10) | NCI-831 (12) |
| Example 72 | 72 | Bk-2 | PI-1 (11.6) | PI-1 (38.4) | WR-301 (15) | DPHA (25) A-BPEF (10) | NCI-831 (12) |
| Example 73 | 73 | Bk-2 | PI-1 (11.6) | PI-1 (38.4) | AE-1 (15) | DPHA (25) A-BPEF (10) | NCI-831 (12) |
| Example 74 | 74 | Bk-2 | PI-1 (11.6) | PI-1 (38.4) | AC-1 (15) | DPHA (25) A-BPEF (10) | NCI-831 (12) |

| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
|---|---|---|---|---|---|---|
| Example 6 | Bk-S0100CF (34.8) | S-20000 (11.6) | MBA PGMEA | 100 | 35 | 22.0 |
| Example 67 | Bk-S0100CF (34.8) | S-20000 (11.6) | MBA PGMEA | 100 | 35 | 22.0 |
| Example 68 | Bk-S0100CF (34.8) | S-20000 (11.6) | MBA PGMEA | 100 | 35 | 22.0 |
| Example 69 | Bk-S0100CF (34.8) | S-20000 (11.6) | MBA PGMEA | 100 | 35 | 22.0 |
| Example 70 | Bk-S0100CF (34.8) | S-20000 (11.6) | MBA PGMEA | 77 | 35 | 22.0 |
| Example 71 | Bk-S0100CF (34.8) | S-20000 (11.6) | MBA PGMEA | 77 | 35 | 22.0 |
| Example 72 | Bk-S0100CF (34.8) | S-20000 (11.6) | MBA PGMEA | 77 | 35 | 22.0 |
| Example 73 | Bk-S0100CF (34.8) | S-20000 (11.6) | MBA PGMEA | 77 | 35 | 22.0 |
| Example 74 | Bk-S0100CF (34.8) | S-20000 (11.6) | MBA PGMEA | 77 | 35 | 22.0 |

TABLE 12-2

| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
|---|---|---|---|---|---|---|
| Example 6 | 6 | 50 B | 7 B | 37 A | 22 A+ | 0.55 B |
| Example 67 | 67 | 40 A | 7 B | 31 A | 20 A+ | 0.55 B |
| Example 68 | 68 | 35 A | 7 B | 41 A | 26 A+ | 0.55 B |
| Example 69 | 69 | 35 A | 7 B | 31 A | 20 A+ | 0.55 B |

TABLE 12-2-continued

| | | | | | | |
|---|---|---|---|---|---|---|
| Example 70 | 70 | 35 A | 7 B | 32 A | 20 A+ | 0.55 B |
| Example 71 | 71 | 35 A | 7 B | 32 A | 20 A+ | 0.55 B |
| Example 72 | 72 | 35 A | 7 B | 32 A | 20 A+ | 0.55 B |
| Example 73 | 73 | 35 A | 7 B | 32 A | 20 A+ | 0.55 B |
| Example 74 | 74 | 35 A | 7 B | 31 A | 20 A+ | 0.55 B |

| | Photosensitive characteristics/cured film characteristics | | | Luminescence characteristics of organic EL display | |
|---|---|---|---|---|---|
| | Heat resistance | | Insulating | | |
| | difference in high temperature weight retention rate [mass %] | Light-shielding OD value | properties surface resistivity [Ω/□] | Initial characteristics | Characteristics of after durability test [%] |
| Example 6 | 7.3 A | 1.0 | >1.0 × 10^15 | good | 100 A+ |
| Example 67 | 10.4 A | 1.0 | >1.0 × 10^15 | good | 100 A+ |
| Example 68 | 11.1 A | 1.0 | >1.0 × 10^15 | good | 100 A+ |
| Example 69 | 11.2 A | 1.0 | >1.0 × 10^15 | good | 100 A+ |
| Example 70 | 14.4 A | 1.0 | >1.0 × 10^15 | good | 95 A |
| Example 71 | 14.1 A | 1.0 | >1.0 × 10^15 | good | 95 A |
| Example 72 | 14.2 A | 1.0 | >1.0 × 10^15 | good | 95 A |
| Example 73 | 16.2 A | 1.0 | >1.0 × 10^15 | good | 90 A |
| Example 74 | 20.2 B | 1.0 | >1.0 × 10^15 | good | 85 B |

TABLE 13-1

| | Components [parts by mass] | | | | | |
|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Example 37 | 37 | Bk-2 | PI-1 (11.6) | PI-1 (53.4) | — | A-BPEF (10) DPCA-60 (25) | NCI-831 (12) |
| Example 75 | 75 | Bk-4 | PI-1 (11.6) | PI-1 (53.4) | — | A-BPEF (10) DPCA-60 (25) | NCI-831 (12) |
| Example 76 | 76 | Bk-5 | PI-1 (11.6) | PI-1 (53.4) | — | A-BPEF (10) DPCA-60 (25) | NCI-831 (12) |
| Example 77 | 77 | Bk-6 | PI-1 (7) | PI-1 (58) | — | A-BPEF (10) DPCA-60 (25) | NCI-831 (12) |
| Example 78 | 78 | Bk-7 | PI-1 (20.9) | PI-1 (44.1) | — | A-BPEF (10) DPCA-60 (25) | NCI-831 (12) |
| Example 79 | 79 | Bk-8 | PI-1 (20.9) | PI-1 (44.1) | — | A-BPEF (10) DPCA-60 (25) | NCI-831 (12) |

| | Components [parts by mass] | | | Total | | | |
|---|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | content of (B1) and (B2) in total of (B1), (B2), and (B3) [mass %] | Content of coloring agent (D) in total solid [mass %] |
| Example 37 | Bk-S0100CF (34.8) | S-20000 (11.6) | MBA PGMEA | 100 | 35 | 29 | 22.0 |

TABLE 13-1-continued

| | | | | | | | |
|---|---|---|---|---|---|---|---|
| Example 75 | Bk-S0084 (34.8) | D.BYK-167 (11.6) | MBA PGMEA | 100 | 35 | 29 | 22.0 |
| Example 76 | Bk-A1103 (34.8) | D.BYK-167 (11.6) | MBA PGMEA | 100 | 35 | 29 | 22.0 |
| Example 77 | TPK-1227 (20.9) | D.BYK-167 (7) | MBA PGMEA | 100 | 35 | 29 | 15.0 |
| Example 78 | P.R.254 (21.9) P.Y.139 (9.4) P.B.15: 6 (31.3) | D.BYK-167 (20.9) | MBA PGMEA | 100 | 35 | 29 | 32.0 |
| Example 79 | P.V.23 (31.3) P.Y.139 (31.3) | D.BYK-167 (20.9) | MBA PGMEA | 100 | 35 | 29 | 32.0 |

TABLE 13-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 37 | 37 | 30 A+ | 0 A+ | 37 A | 29 A+ | 0.20 A+ |
| Example 75 | 75 | 40 A | 0 A+ | 37 A | 29 A+ | 0.20 A+ |
| Example 76 | 76 | 40 A | 0 A+ | 38 A | 30 A+ | 0.20 A+ |
| Example 77 | 77 | 55 B | 0 A+ | 39 A | 29 A+ | 0.25 A |
| Example 78 | 78 | 50 B | 0 A+ | 37 A | 29 A+ | 0.20 A+ |
| Example 79 | 79 | 50 B | 0 A+ | 37 A | 29 A+ | 0.20 A+ |

| | Photosensitive characteristics/cured film characteristics | | | Luminescence characteristics of organic EL display | |
|---|---|---|---|---|---|
| | Heat resistance difference in high temperature weight retention rate [mass %] | Light-shielding OD value | Insulating properties surface resistivity [Ω/□] | Initial characteristics | Characteristics after durability test [%] |
| Example 37 | 7.0 A | 1.0 | >1.0 × 10^15 | good | 100 A+ |
| Example 75 | 8.3 A | 1.0 | >1.0 × 10^15 | good | 100 A+ |
| Example 76 | 8.6 A | 1.0 | >1.0 × 10^15 | good | 100 A+ |
| Example 77 | 9.4 A | 1.0 | >1.0 × 10^13 | good | 80 B |
| Example 78 | 9.6 A | 1.0 | >1.0 × 10^14 | good | 95 A |
| Example 79 | 9.5 A | 1.0 | >1.0 × 10^14 | good | 95 A |

TABLE 14-1

| | | | Components [parts by mass] | | | | |
|---|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Example 37 | 37 | Bk-2 | PI-1 (11.6) | PI-1 (53.4) | — | A-BPEF (10) DPCA-60 (25) | NCI-831 (12) |
| Example 80 | 80 | Bk-9 | PI-1 (11.6) | PI-1 (53.4) | — | A-BPEF (10) DPCA-60 (25) | NCI-831 (12) |
| Example 81 | 81 | Bk-2 | PI-1 (11.6) | PI-1 (53.4) | — | A-BPEF (10) HX-220 (25) | NCI-831 (12) |
| Example 82 | 82 | Bk-2 | PI-1 (11.6) | PI-5 (53.4) | — | A-BPEF (10) DPCA-60 (25) | NCI-831 (12) |
| Example 83 | 83 | Bk-2 | PI-1 (11.6) | PI-5 (38.4) | WR-301 (15) | A-BPEF (10) DPCA-60 (25) | NCI-831 (12) |

| | Components [parts by mass] | | | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
|---|---|---|---|---|---|---|---|
| | Coloring agent (D) derived from pigment dispersion liquid | Dispersing agent (E) derived from pigment dispersion liquid | Solvent | | | | |
| Example 37 | Bk-S0100CF (34.8) | S-20000 (11.6) | MBA PGMEA | 100 | 35 | 29 | 22.0 |
| Example 80 | Bk-CBF1 (34.8) | S-20000 (11.6) | MBA PGMEA | 100 | 35 | 29 | 21.2 |
| Example 81 | Bk-S0100CF (34.8) | S-20000 (11.6) | MBA PGMEA | 100 | 35 | 29 | 22.0 |
| Example 82 | Bk-S0100CF (34.8) | S-20000 (11.6) | MBA PGMEA | 100 | 35 | 29 | 22.0 |
| Example 83 | Bk-S0100CF (34.8) | S-20000 (11.6) | MBA PGMEA | 100 | 35 | 29 | 22.0 |

TABLE 14-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [μm] |
| Example 37 | 37 | 30 A+ | 0 A+ | 37 A | 29 A+ | 0.20 A+ |
| Example 80 | 80 | 30 A+ | 0 A+ | 30 A+ | 25 A+ | 0.15 A+ |
| Example 81 | 81 | 35 A | 0 A+ | 30 A+ | 25 A+ | 0.15 A+ |
| Example 82 | 82 | 25 A+ | 0 A+ | 30 A+ | 25 A+ | 0.15 A+ |
| Example 83 | 83 | 20 A+ | 0 A+ | 30 A+ | 25 A+ | 0.15 A+ |

| | Photosensitive characteristics/ cured film characteristics | | | | |
|---|---|---|---|---|---|
| | Heat resistance difference in high temperature weight retention rate [mass %] | Light- shielding OD value | Insulating properties surface resistivity [Ω/□] | Luminescence characteristics of organic EL display Initial characteristics | Characteristics after durability test [%] |
| Example 37 | 7.0 A | 1.0 | >1.0 × 10^15 | good | 100 A+ |

TABLE 14-2-continued

| | | | | | |
|---|---|---|---|---|---|
| Example 80 | 5.0 A+ | 1.0 | >1.0 × 10^15 | good | 100 A+ |
| Example 81 | 7.5 A | 1.0 | >1.0 × 10^15 | good | 100 A+ |
| Example 82 | 7.2 A | 1.0 | >1.0 × 10^15 | good | 100 A+ |
| Example 83 | 14.2 A | 1.0 | >1.0 × 10^15 | good | 95 A |

TABLE 15-1

| | Components [parts by mass] | | | | | |
|---|---|---|---|---|---|---|
| | Composition | Pigment dispersion liquid | First resin (A1) derived from pigment dispersion liquid | First resin (A1) derived from preparation liquid | Radical polymerizable compound (B) compound (B1) compound (B2) compound (B3) | Photo initiator (C1) | Coloring agent (D) derived from pigment dispersion liquid |
| Example 37 | 37 | Bk-2 | PI-1 (11.6) | PI-1 (53.4) | A-BPEF (10) DPCA-60 (25) | NCI-831 (12) | Bk-S0100CF (34.8) |
| Example 84 | 84 | Bk-2 | PI-1 (11.6) | PI-1 (53.4) | A-BPEF (10) DPCA-60 (25) | NCI-831 (12) | Bk-S0100CF (34.8) |
| Example 85 | 85 | Bk-2 | PI-1 (11.6) | PI-1 (53.4) | A-BPEF (10) DPCA-60 (25) | NCI-831 (12) | Bk-S0100CF (34.8) |

| | Components [parts by mass] | | | Content of (A1) in total of (A1) and (A2) [mass %] | Content of (B) in total of (A1), (A2), and (B) [mass %] | Total content of (B1) and (B2) in total of (B1), (B2), and (B3) [mass %] | Content of coloring agent (D) in total solid [mass %] |
|---|---|---|---|---|---|---|---|
| | Dispersing agent (E) derived from pigment dispersion liquid | Crosslinking agent (F) compound (F1) compound (F2) | Solvent | | | | |
| Example 37 | S-20000 (11.6) | — | MBA PGMEA | 100 | 35 | 29 | 22.0 |
| Example 84 | S-20000 (11.6) | FR-201 (10) | MBA PGMEA | 100 | 35 | 29 | 22.0 |
| Example 85 | S-20000 (11.6) | IDE-1 (10) | MBA PGMEA | 100 | 35 | 29 | 22.0 |

TABLE 15-2

| | Photosensitive characteristics/cured film characteristics | | | | | |
|---|---|---|---|---|---|---|
| | Composition | Sensitivity [mJ/cm²] | Development residue [%] | Cross-sectional shape of pattern after development [°] | Cross-sectional shape of pattern after heat curing [°] | Difference in pattern opening width between before and after heat curing [μm] |
| Example 37 | 37 | 30 A+ | 0 A+ | 37 A | 29 A+ | 0.20 A+ |
| Example 84 | 84 | 25 A+ | 0 A+ | 30 A+ | 25 A+ | 0.15 A+ |
| Example 85 | 85 | 25 A+ | 0 A+ | 31 A | 26 A+ | 0.15 A+ |

TABLE 15-2-continued

|  | Photosensitive characteristics/ cured film characteristics | | | Luminescence characteristics of organic EL display | |
|---|---|---|---|---|---|
|  | Heat resistance difference in high temperature weight retention rate [mass %] | Light-shielding OD value | Insulating properties surface resistivity [Ω/□] | Initial characteristics | Characteristics after durability test [%] |
| Example 37 | 7.0 A | 1.0 | >1.0 × 10^15 | good | 100 A+ |
| Example 84 | 6.0 A | 1.0 | >1.0 × 10^15 | good | 100 A+ |
| Example 85 | 6.2 A | 1.0 | >1.0 × 10^15 | good | 100 A+ |

TABLE 16-1

| | Components [parts by mass] | | | | | | |
|---|---|---|---|---|---|---|---|
| | Composition | Pigment dispersion liquid | First resin (A1) derived from pigment dispersion liquid | First resin (A1) derived from preparation liquid | Second resin (A2) derived from preparation liquid | Radical polymerizable compound (B) compound (B1) compound (B2) compound (B3) | Photo initiator (C1) |
| Comparative example 1 | 86 | Bk-1 | — | — | AC-1 (65) | DPHA (25) A-BPEF (10) | NCI-831 (12) |
| Comparative example 2 | 87 | Bk-2 | PI-1 (11.6) | PI-1 (53.4) | — | DPCA-60 (35) | NCI-831 (12) |
| Comparative example 3 | 88 | Bk-2 | PI-1 (11.6) | PI-1 (53.4) | — | DPHA (10) DPCA-60 (25) | NCI-831 (12) |
| Comparative example 4 | 89 | Bk-2 | PI-1 (1) | PI-1 (64) | — | DPHA (35) | NCI-831 (12) |
| Comparative example 5 | 90 | Bk-2 | PI-1 (4.3) | PI-1 (60.7) | — | DPHA (35) | NCI-831 (12) |
| Comparative example 6 | 91 | Bk-2 | PI-1 (11.6) | PI-1 (53.4) | — | DPHA (35) | NCI-831 (12) |
| Comparative example 7 | 92 | Bk-6 | PI-1 (20.9) | PI-1 (44.1) | — | DPHA (35) | NCI-831 (12) |
| Comparative example 8 | 93 | — | — | PI-1 (65) | — | DPHA (25) A-BPEF (10) | NCI-831 (12) |

| | Components [parts by mass] | | | | | |
|---|---|---|---|---|---|---|
| | Coloring agent (D) derived from pigment dispersion liquid | Dispersing agent (E) derived from pigment dispersion liquid | Solvent | Content of (A1) in total of (A1) and (A2) [mass %] | Content of (B) in total of (A1), (A2), and (B) [mass %] | Content of coloring agent (D) in total solid [mass %] |
| Comparative example 1 | Bk-S0100CF (34.8) | S-20000 (11.6) | MBA PGMEA | 0 | 35 | 22.0 |
| Comparative example 2 | Bk-S0100CF (34.8) | S-20000 (11.6) | MBA | 100 | 35 | 22.0 |
| Comparative example 3 | Bk-S0100CF (34.8) | S-20000 (11.6) | MBA | 100 | 35 | 22.0 |
| Comparative example 4 | Bk-S0100CF (3) | S-20000 (1) | MBA | 100 | 35 | 2.5 |
| Comparative example 5 | Bk-S0100CF (12.9) | S-20000 (4.3) | MBA | 100 | 35 | 10.0 |
| Comparative example 6 | Bk-S0100CF (34.8) | S-20000 (11.6) | MBA | 100 | 35 | 22.0 |
| Comparative example 7 | P.R.254 (21.9) P.Y.139 (9.4) P.B.15: 6 (31.3) | D.BYK-167 (20.9) | MBA | 100 | 35 | 32.0 |
| Comparative example 8 | — | — | MBA PGMEA | 100 | 35 | 0.0 |

TABLE 16-2

| | | Photosensitive characteristics/cured film characteristics | | | | |
|---|---|---|---|---|---|---|
| | Composition | Sensitivity [mJ/cm$^2$] | Development residue [%] | Cross-sectional shape of pattern after development [°] | Cross-sectional shape of pattern after heat curing [°] | Difference in pattern opening width between before and after heat curing [µm] |
| Comparative example 1 | 86 | 35<br>A | 30<br>D | 32<br>A | 20<br>A+ | 0.55<br>B |
| Comparative example 2 | 87 | 25<br>A+ | 0<br>A+ | 65<br>C | 61<br>C | 0.05<br>A+ |
| Comparative example 3 | 88 | 45<br>A | 0<br>A+ | 62<br>C | 37<br>B | 0.80<br>C |
| Comparative example 4 | 89 | 55<br>B | 20<br>C | 53<br>B | 33<br>A | 1.20<br>D |
| Comparative example 5 | 90 | 65<br>C | 40<br>D | 55<br>B | 37<br>A | 1.10<br>D |
| Comparative example 6 | 91 | 90<br>C | 80<br>E | 60<br>B | 40<br>A | 1.20<br>D |
| Comparative example 7 | 92 | 110<br>D | 50<br>E | 60<br>B | 40<br>A | 1.20<br>D |
| Comparative example 8 | 93 | 25<br>A+ | 0<br>A+ | 30<br>A+ | 20<br>A+ | 0.70<br>C |

| | Photosensitive characteristics/cured film characteristics | | | | |
|---|---|---|---|---|---|
| | Heat resistance difference in high temperature weight retention rate [mass %] | Light-shielding OD value | Insulating properties surface resistivity [Ω/□] | Luminescence characteristics of organic EL display Initial characteristics | Characteristics after durability test [%] |
| Comparative example 1 | 36.8<br>D | 1.0 | >1.0 × 10^15 | good | 30<br>E |
| Comparative example 2 | 10.0<br>A | 1.0 | >1.0 × 10^15 | good | 100<br>A+ |
| Comparative example 3 | 10.5<br>A | 1.0 | >1.0 × 10^15 | good | 100<br>A+ |
| Comparative example 4 | 8.5<br>A | 0.15 | >1.0 × 10^15 | good | 100<br>A+ |
| Comparative example 5 | 10.1<br>A | 0.5 | >1.0 × 10^15 | good | 100<br>A+ |
| Comparative example 6 | 12.2<br>A | 1.0 | >1.0 × 10^15 | good | 100<br>A+ |
| Comparative example 7 | 15.1<br>B | 1.0 | 1.0 × 10^14 | good | 95<br>A |
| Comparative example 8 | 4.0<br>A+ | — | >1.0 × 10^15 | good | 100<br>A+ |

Example 86

(Production Method for Organic EL Display not Having Polarizing Layer)

Figure 5:
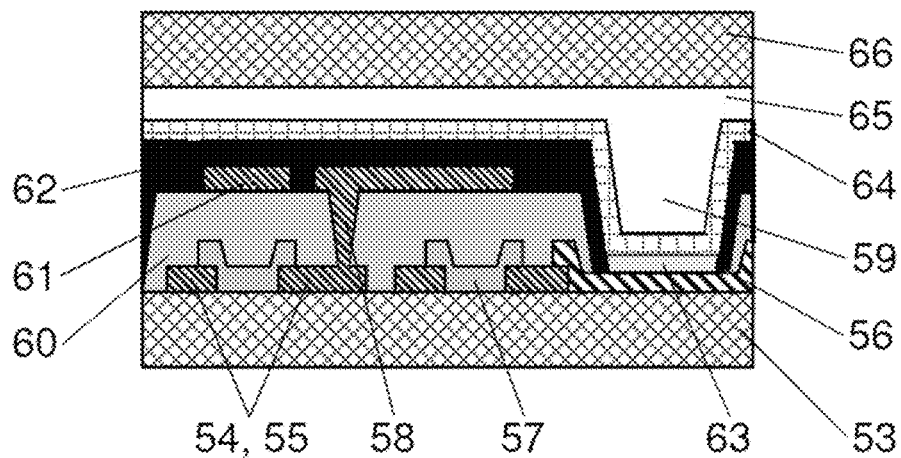
FIG. 5 shows a schematic diagram illustrating a typical cross section of an organic EL display device having no polarizing layer.

A schematic diagram of the organic EL display to produce is shown in FIG. 5. First, on a non-alkali glass substrate 53 with a size of 38×46 mm, an overlying film of chromium and gold was formed by electron beam deposition and etched to form a source electrode 54 and a drain electrode 55. Then, a 100 nm film of APC (silver/palladium/copper=98.07/0.87/1.06 (by mass)) was formed by sputtering and etched for pattern processing to form an APC layer, and another 10 nm film of ITO was formed on the APC layer by sputtering and etched to form a reflecting electrode 56 as first electrode. After cleaning the electrode surface with oxygen plasma, a film of amorphous IGZO was formed by sputtering and etched to form an oxide semiconductor layer 57 between the source and drain electrodes. Then, a film of a positive type photosensitive polysiloxane based material (SP-P2301; manufactured by Toray Industries, Inc.) was formed by spin coating, and a via hole 58 and a pixel region 59 were opened by photolithography, followed by heat-curing to form a gate insulation layer 60. Subsequently, a film of gold was formed by electron beam deposition and etched to form a gate electrode 61, thus producing an oxide TFT array.

By the same method as described in Example 1, a composition 6 was spread on the oxide TFT array, prebaked to form a film, subjected to patterning exposure through a photomask having a predetermined pattern, developed, rinsed to open a pixel region, and heat-cured to form a TFT protection layer/pixel dividing layer 62 having a light-shielding capability. In this way, a pixel dividing layer having openings with a width of 70 µm and a length of 260 µm aligned at intervals of 155 µm in the width direction and 465 µm in the length direction, each opening exposing the reflecting electrode, was formed in a limited effective area of the substrate. These openings would finally form light emitting pixels of an organic EL display. The limited effective area of the substrate had a size of 16 mm×16 mm and the pixel dividing layer had a thickness of about 1.0 μm.

Then, by the method described in paragraph (16), an organic EL light emitting layer 63 was formed using the compound (HT-1) for a hole injection layer, the compound (HT-2) for a hole transport layer, the compound (GH-1) as host material, the compound (GD-1) as dopant material, and the compound (ET-1) and compound (LiQ) as electronic transport materials.

Subsequently, MgAg was deposited at a volume ratio of 10:1 to form a film with a thickness of 10 nm and etched to form a transparent electrode 64 as second electrode. Then, in a low-humidity nitrogen atmosphere, an organic EL sealing material (Struct Bond (registered trademark) XMF-T; manufactured by Mitsui Chemicals, Inc.) was used to form a sealing film 65. In addition, a non-alkali glass substrate 66 was combined with a sealing film, and four 5 mm×5 mm top-emission type organic EL displays having no polarizing layer were formed on one substrate. The film thickness referred to here is the reading on a crystal oscillation type film thickness monitor.

(Evaluation of Light Emission Characteristics)

The organic EL displays prepared by the above method were driven by a direct current of 10 mA/cm² to emit light and observed to determine the brightness (Y') in the case where external light was applied to the pixel dividing layer and the brightness ($Y_0$) in the case where no external light was applied. As an indicator of the decrease in external light reflection, the contrast was calculated by the equation given below.

$$\text{Contrast} = Y_0/Y'$$

Evaluations were made according to the criteria given below, and specimens rated as A+, A, or B, which had a contrast of 0.80 or more, were judged as acceptable. Those rated as A+ or A, which had a contrast of 0.90 or more, were judged as good in terms of external light reflection reduction effect and those rated as A+, which had a contrast of 0.95 or more, were judged as excellent in terms of external light reflection reduction effect. The organic EL display prepared by the above method had a contrast of 0.90, proving that external light reflection was decreased.

A+: Having a contrast of 0.95 to 1.00
A: Having a contrast of 0.90 to 0.94
B: Having a contrast of 0.80 to 0.89
C: Having a contrast of 0.70 to 0.79
D: Having a contrast of 0.50 to 0.69
E: Having a contrast of 0.01 to 0.49

Example 87

(Evaluation of Halftone Characteristics 1)

According to the method described in Example 1 given above, a prebaked film of the composition 6 having a film thickness of 5 μm was formed on an ITO substrate and then a double side alignment type single side aligner (Mask Aligner PEM-6M; manufactured by Union Optical Co., Ltd.) was used to perform patterning exposure to the i-line (wavelength 365 nm), h-line (wavelength 405 nm), or g-line (wavelength 436 nm) beam from an ultrahigh pressure mercury lamp through a halftone photomask designed for halftone characteristics evaluation in such a manner that the exposure energy for the transparent portions would be equal to the exposure energy representing the sensitivity of a prebaked film having a thickness of 5 μm, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to produce a step-shaped cured film of the composition 6.

The halftone photomask used had transparent portions, light-shielding portions, and translucent portions located between the transparent portions and the light-shielding portions. It had regions where the transmittance (% $T_{HT}$)% of the translucent portions was 10%, 15%, 20%, 25%, 30%, 35%, 40%, 45%, or 50% of the transmittance (% $T_{FT}$) of the transparent portions. Each transparent portion is adjacent to a translucent portion and the translucent portion is adjacent to a light-shielding portion. It had regions where the pattern of each transparent portion, translucent portion, and light-shielding portion has a linear shape. It had regions where both the transparent portions and the translucent portion have rectangular shapes. It had regions where the transparent portions have pattern sizes of 2 μm, 5 μm, 10 μm, 15 μm, 20 μm, 30 μm, 40 μm, 50 μm, or 100 μm. Each light-shielding portion has a pattern size of 10 μm. On the other hand, it had regions where the translucent portions have pattern sizes of 2 μm, 5 μm, 10 μm, 15 μm, 20 μm, 25 μm, 30 μm, 35 μm, 40 μm, 45 μm, 50 μm, or 100 μm.

Figure 6:
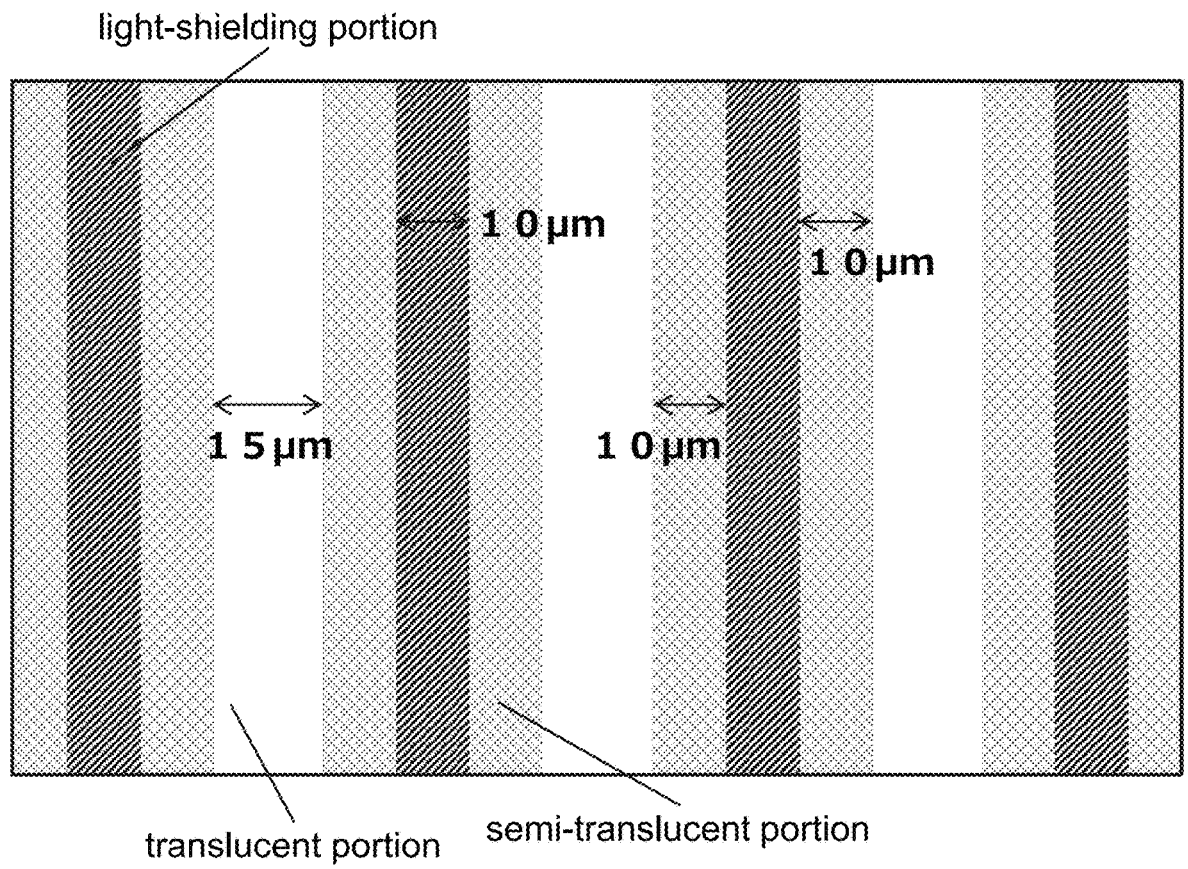
FIG. 6 shows a schematic diagram illustrating the arrangement and sizes of translucent portions, light-shielding portions, and semi-translucent portions in a halftone photomask used for evaluation of halftone characteristics.

FIG. 6 shows a typical arrangement of transparent portions, light-shielding portions, and translucent portions in a typical halftone photomask.

A surface roughness/contour form measuring machine (SURFCOM 1400D, manufactured by Tokyo Seimitsu Co., Ltd.) was used to measure the film thickness of the transparent portions after the development step and their film thickness ($T_{FT}$) μm after the heat curing step under the measuring conditions of a magnification of 10,000 times, a measuring length of 1.0 mm, and a measuring speed of 0.30 mm/s. For the translucent portions, the film thickness of regions having different transmittances after the development step and their film thickness ($T_{HT}$) μm after the heat curing step were measured to determine the minimum film thickness ($T_{HT/min}$) μm, measured after the heat curing step, of the translucent portions remaining after the development step. As an indicator of the halftone characteristics, the maximum stepped film thickness was calculated by the equation given below.

$$\text{Maximum stepped film thickness} = (T_{FT}) - (T_{HT/min})$$

Evaluations were made according to the criteria given below, and samples rated as A+, A, B, or C, which had a maximum stepped film thickness of 1.0 μm or more, were judged as acceptable. Those rated as A+, A, or B, which had a maximum stepped film thickness of 1.5 μm or more, were judged as having good halftone characteristics and those rated as A+ or A, which had a maximum stepped film thickness of 2.0 μm or more, were judged as having excellent halftone characteristics. In the cured film of the composition 6 prepared by the above procedure, the transparent portions had a film thickness ($T_{FT}$) of 4.0 μm after the heat curing step whereas the translucent portions had a minimum film thickness ($T_{HT/min}$) of 2.3 μm after the heat curing step, leading to a maximum step film thickness of 1.7 μm and proving acceptable halftone characteristics.

A+: Having a maximum stepped film thickness of 2.5 μm or more
A: Having a maximum stepped film thickness of 2.0 μm or more and less than 2.5 μm
B: Having a maximum stepped film thickness of 1.5 μm or more and less than 2.0 μm
C: Having a maximum stepped film thickness of 1.0 μm or more and less than 1.5 μm D: Having a maximum stepped film thickness of 0.5 µm or more and less than 1.0 µm E: Having a maximum stepped film thickness of 0.1 µm or more and less than 0.5 µm F: Having a maximum stepped film thickness of less than 0.1 µm or non-measurable because no film remained after development Examples 88 to 93 and Comparative Examples 9 to 10

The same procedure was performed using the compositions 37, 80, 81, 82, 83, and 84 in Examples 88 to 93 and using the composition 86 and 91 in Comparative examples 9 and 10, respectively, a step-shaped cured film of each composition was prepared and its development was performed with the exposure energy ($E_{FT}$) mJ/cm$^2$ representing its sensitivity, followed by measuring the film thickness after the development step and film thickness ($T_{FT}$) µm after the heat curing step. Similarly, the film thickness of the translucent portions after the development step and their film thickness ($T_{HT}$) µm after the heat curing step were measured to determine the minimum film thickness ($T_{HT/min}$) µm, measured after the heat curing step, of the translucent portions remaining after the development step, followed by calculating the maximum stepped film thickness.

For the cured film of the composition 37, the transparent portions had a film thickness ($T_{FT}$) of 4.0 µm after the heat curing step whereas the translucent portions had a minimum film thickness ($T_{HT/min}$) of 1.5 µm after the heat curing step, leading to a maximum stepped film thickness of 2.5 µm and proving excellent halftone characteristics. For the cured film of the composition 80, the transparent portions had a film thickness ($T_{FT}$) of 4.0 µm after the heat curing step whereas the translucent portions had a minimum film thickness ($T_{HT/min}$) of 1.0 µm after the heat curing step, leading to a maximum stepped film thickness of 3.0 µm and proving excellent halftone characteristics. For the cured film of the composition 81, the transparent portions had a film thickness ($T_{FT}$) of 4.0 µm after the heat curing step whereas the translucent portions had a minimum film thickness ($T_{HT/min}$) of 1.0 µm after the heat curing step, leading to a maximum stepped film thickness of 3.0 µm and proving excellent halftone characteristics. For the cured film of the composition 82, the transparent portions had a film thickness ($T_{FT}$) of 4.0 µm after the heat curing step whereas the translucent portions had a minimum film thickness ($T_{HT/min}$) of 1.1 µm after the heat curing step, leading to a maximum stepped film thickness of 2.9 µm and proving excellent halftone characteristics. For the cured film of the composition 83, the transparent portions had a film thickness ($T_{FT}$) of 4.0 µm after the heat curing step whereas the translucent portions had a minimum film thickness ($T_{HT/min}$) of 1.2 µm after the heat curing step, leading to a maximum stepped film thickness of 2.8 µm and proving excellent halftone characteristics. For the cured film of the composition 84, the transparent portions had a film thickness ($T_{FT}$) of 4.0 µm after the heat curing step whereas the translucent portions had a minimum film thickness ($T_{HT/min}$) of 1.0 µm after the heat curing step, leading to a maximum stepped film thickness of 3.0 µm and proving excellent halftone characteristics. For the cured film of the composition 86, on the other hand, the transparent portions had a film thickness ($T_{FT}$) of 4.0 µm after the heat curing step whereas the translucent portions had a minimum film thickness ($T_{HT/min}$) of 3.7 µm after the heat curing step, leading to a maximum stepped film thickness of 0.3 µm and proving poor halftone characteristics. For the cured film of the composition 91, the transparent portions had a film thickness ($T_{FT}$) of 4.0 µm after the heat curing step whereas the translucent portions had a minimum film thickness ($T_{HT/min}$) of 3.3 µm after the heat curing step, leading to a maximum stepped film thickness of 0.7 µm and proving poor halftone characteristics.

Figure 7:
FIG. 7 shows an image of a step-shaped pattern formed by using a halftone photomask from the negative type photosensitive resin composition according to the present invention, observed after the heat curing step.

FIG. 7 shows an image, observed after the heat curing step, of a step-shaped pattern that was formed from the compositions 37 using a halftone photomask described in FIG. 6.

Example 94

After forming a step-shaped developed film from the composition 37 by the same procedure as above, the resulting developed film was subjected to bleaching exposure by using a double side alignment type single side aligner (Mask Aligner PEM-6M; manufactured by Union Optical Co., Ltd.) to apply i-line (wavelength 365 nm), h-line (wavelength 405 nm), or g-line (wavelength 436 nm) beam from an ultrahigh pressure mercury lamp in an air atmosphere at 23° C. to photo-cure the step-shaped developed film. Subsequently, heat-curing was performed by the same procedure as above to prepare a step-shaped cured film. Similarly, the film minimum thickness ($T_{HT/min}$) of the translucent portions remaining after the development step that were photo-cured and heat-cured were measured, followed by calculating the maximum stepped film thickness. For the photo-cured and subsequently heat-cured film of the composition 37, the transparent portions had a film thickness ($T_{FT}$) of 4.2 µm after the heat curing step whereas the translucent portions had a minimum film thickness ($T_{HT/min}$) of 0.7 µm after the heat curing step, leading to a maximum stepped film thickness of 3.5 µm and proving excellent halftone characteristics.

Example 95

After forming a step-shaped developed film from the composition 37 by the same procedure as above, the resulting developed film was subjected to ultraviolet ray exposure by using a desktop type optical surface treatment apparatus (PL16-110; manufactured by Sen Lights Co., Ltd., ultraviolet ray illuminance 18 mW/cm$^2$ (measuring wavelength 254 nm)) to apply ultraviolet ray (wavelength 185 nm and wavelength 254 nm) from a low pressure mercury lamp in an ozone atmosphere at 23° C. for 120 seconds to photo-cure the step-shaped developed film. Subsequently, heat-curing was performed by the same procedure as above to prepare a step-shaped cured film. Similarly, the minimum film thickness ($T_{HT/min}$) of the translucent portions remaining after the development step that were photo-cured and subsequently heat-cured was measured, followed by calculating the maximum stepped film thickness. For the photo-cured and subsequently heat-cured film of the composition 37, the transparent portions had a film thickness ($T_{FT}$) of 4.5 µm after the heat curing step whereas the translucent portions had a minimum film thickness ($T_{HT/min}$) of 0.8 µm after the heat curing step, leading to a maximum stepped film thickness of 3.7 µm and proving excellent halftone characteristics.

Example 96

Furthermore, after forming a step-shaped developed film from the composition 37 by the same procedure as above, the resulting developed film was treated with plasma generated by a plasma cleaning machine (SPC-100B+H; manufactured by Hitachi High-Technologies Corporation) with a high frequency power (RF power) of 1,200 W at 23° C. for 120 seconds under the conditions of an oxygen gas flow rate of 50 sccm and a treatment pressure of 20 Pa in an oxygen atmosphere to photo-cure the step-shaped developed film. Subsequently, heat-curing was performed by the same procedure as above to prepare a step-shaped cured film. Similarly, the minimum film thickness ($T_{HT/min}$) of the translucent portions remaining after the development step that were photo-cured and subsequently heat-cured was measured, followed by calculating the maximum stepped film thickness. For the photo-cured and subsequently heat-cured film of the composition 37, the transparent portions had a film thickness ($T_{FT}$) of 4.4 µm after the heat curing step whereas the translucent portions had a minimum film thickness ($T_{HT/min}$) of 0.7 µm after the heat curing step, leading to a maximum stepped film thickness of 3.7 µm and proving excellent halftone characteristics.

Figure 8:
FIG. 8 shows an image of a step-shaped pattern formed by using a halftone photomask from the negative type photosensitive resin composition according to the present invention, which was then photo-cured and heat-cured.

FIG. 8 shows an image, observed after the photo-curing and heat curing steps, of a step-shaped pattern formed from the compositions 37 using a halftone photomask described in FIG. 6.

Example 97

(Evaluation of Halftone Characteristics 2)

According to the procedure described in Example 85 given above, a double side alignment type single side aligner (Mask Aligner PEM-6M; manufactured by Union Optical Co., Ltd.), a halftone photomask designed for halftone characteristics evaluation, a small development apparatus for photolithography (AD-2000; manufactured by Takizawa Sangyo Co., Ltd.), and a high temperature inert gas oven (INH-9CD-S; manufactured by Koyo Thermo Systems Co., Ltd.) were used to produce a step-shaped cured film of the composition 6 on an ITO substrate. The halftone photomask used was the same one as described in Example 85.

A surface roughness/contour form measuring machine (SURFCOM 1400D, manufactured by Tokyo Seimitsu Co., Ltd.) was used to measure the film thickness of the transparent portions after the development step and their film thickness ($T_{FT}$) µm after the heat curing step under the measuring conditions of a magnification of 10,000 times, a measuring length of 1.0 mm, and a measuring speed of 0.30 mm/s. Regarding the translucent portions, the film thickness of the region where the transmittance (% $T_{HT}$)% of the translucent portions is equal to 30% of the transmittance (% $T_{FT}$) of the transparent portions, which is denoted by ($T_{HT30}$) µm, and the film thickness of the region where it is equal to 20% of the transmittance (% $T_{FT}$) of the transparent portions, which is denoted by ($T_{HT20}$) µm, were measured, and the film thickness difference between ($T_{HT30}$) and ($T_{HT20}$), which is denoted by ($\Delta T_{HT30-HT20}$) µm, was calculated as an indicator of the halftone characteristics Evaluations were made according to the criteria given below, and specimens rated as A+, A, B, or C, in which the film thickness difference between ($T_{HT30}$) and ($T_{HT20}$) was 0.30 to 1.50 µm, were judged as acceptable. Those rated as A+, A, or B, in which the film thickness difference between ($T_{HT30}$) and ($T_{HT20}$) was 0.50 to 1.30 µm, were judged as having good halftone characteristics and those rated as A+ or A, in which the film thickness difference between ($T_{HT30}$) and ($T_{HT20}$) was 0.70 to 1.20 µm, were judged as having excellent halftone characteristics. On the other hand, those rated as D, E, or F, in which the film thickness difference between ($T_{HT30}$) and ($T_{HT20}$) was 0.29 µm or less or 1.51 µm or more, were judged as having poor halftone characteristics. In the cured film of the composition 6 prepared by the above procedure, the film thickness difference between ($T_{HT30}$) and ($T_{HT20}$) was 0.55 µm, proving acceptable halftone characteristics.

A+: The film thickness difference between ($T_{HT30}$) and ($T_{HT20}$) is 0.80 to 1.10 µm.

A: The film thickness difference between ($T_{HT30}$) and ($T_{HT20}$) is 0.70 to 0.79 µm or 1.11 to 1.20 µm.

B: The film thickness difference between ($T_{HT30}$) and ($T_{HT20}$) is 0.50 to 0.69 µm or 1.21 to 1.30 µm.

C: The film thickness difference between ($T_{HT30}$) and ($T_{HT20}$) is 0.30 to 0.49 µm or 1.31 to 1.50 µm.

D: The film thickness difference between ($T_{HT30}$) and ($T_{HT20}$) is 0.10 to 0.29 µm or 1.51 to 2.00 µm.

E: The film thickness difference between ($T_{HT30}$) and ($T_{HT20}$) is 0.09 µm or less or 2.01 µm or more.

F: The film does not remain after the development step and the film thickness difference between ($T_{HT30}$) and ($T_{HT20}$) is unmeasurable.

Examples 98 to 103 and Comparative Examples 11 and 12

The same procedure was performed using the compositions 37, 80, 81, 82, 83, and 84 in Examples 98 to 103 and using the composition 86 and 91 in Comparative examples 11 and 12, respectively, to prepare a step-shaped cured film of each composition and then the film thickness difference between ($T_{HT30}$) and ($T_{HT20}$), which is denoted by ($\Delta T_{HT30-HT20}$) µm, was calculated.

The cured film of the composition 37 had a film thickness difference between ($T_{HT30}$) and ($T_{HT20}$) of 0.80 µm, showing excellent halftone characteristics. The cured film of the composition 80 had a film thickness difference between ($T_{HT30}$) and ($T_{HT20}$) of 1.00 µm, showing excellent halftone characteristics. The cured film of the composition 81 had a film thickness difference between ($T_{HT30}$) and ($T_{HT20}$) of 1.00 µm, showing excellent halftone characteristics. The cured film of the composition 82 had a film thickness difference between ($T_{HT30}$) and ($T_{HT20}$) of 0.90 µm, showing excellent halftone characteristics. The cured film of the composition 83 had a film thickness difference between ($T_{HT30}$) and ($T_{HT20}$) of 0.90 µm, showing excellent halftone characteristics. The cured film of the composition 84 had a film thickness difference between ($T_{HT30}$) and ($T_{HT20}$) of 1.00 µm, showing excellent halftone characteristics. On the other hand, the cured film of the composition 86 had a film thickness difference between ($T_{HT30}$) and ($T_{HT20}$) of 0.10 µm, showing poor halftone characteristics. The cured film of the composition 91 had a film thickness difference between ($T_{HT30}$) and ($T_{HT20}$) of 0.20 µm, showing poor halftone characteristics.

Example 104

Furthermore, after forming a step-shaped developed film from the composition 37 by the same procedure as above, the resulting developed film was subjected to bleaching exposure by using a double side alignment type single side aligner (Mask Aligner PEM-6M; manufactured by Union Optical Co., Ltd.) to apply i-line (wavelength 365 nm), h-line (wavelength 405 nm), or g-line (wavelength 436 nm) beam from an ultrahigh pressure mercury lamp in an air atmosphere at 23° C. to photo-cure the step-shaped developed film. The exposure energy used was twice the exposure energy representing the sensitivity, that is, (($E_{FT}$)×2) mJ/cm². Subsequently, heat-curing was performed by the same procedure as above to prepare a step-shaped cured film. Similarly, the film thickness difference between ($T_{HT30}$) and ($T_{HT20}$), which is denoted by ($\Delta T_{HT30\text{-}HT20}$) μm, was calculated. The photo-cured and subsequently heat-cured film of the composition 37 had a film thickness difference between ($T_{HT30}$) and ($T_{HT20}$) of 0.90 μm, showing excellent halftone characteristics.

Example 105

(Evaluation of Display Failure Rate)

According to the procedure described in the above paragraph (16) using a halftone photomask having a predetermined pattern and also having transparent portions, light-shielding portions, and translucent portions, a step-shaped cured film of the composition 6 was formed as an insulation layer 50, and 20 (5×4) organic EL display plates were prepared from five 38×46 mm non-alkali glass substrates. The step-shaped cured film has thick film parts, thin film parts, and openings, each opening is surrounded by adjacent thin film parts and the thick film parts are located adjacent to the thin film parts. The openings are arranged in such a manner that openings, each having a width of 70 μm and a length of 260 μm, are aligned at intervals of 155 μm in the width direction and 465 μm in the length direction. Regarding the thin film parts and the thick film parts, the 85 μm space between two openings, each having a width of 70 μm, (interval 155 μm–width 70 μm=85 μm) contains a 25 μm thick film part and two 30 μm thin film parts that are located adjacent to the openings and on the two sides of the thick film part. On the other hand, the 205 μm space between two openings, each having a length of 260 μm, (interval 465 μm–length 260 μm=205 μm) contains a 65 μm thick film part and two 70 μm thin film parts that are located adjacent to the openings and on the two sides of the thick film part. The insulation layer 50 was formed in such a manner that the film thickness of the thick film parts was about 4.0 μm while the film thickness of the thin film parts was about 2.3 μm, and the thick film parts and the thin film parts had a film thickness difference of about 1.7 μm.

Figure 9:
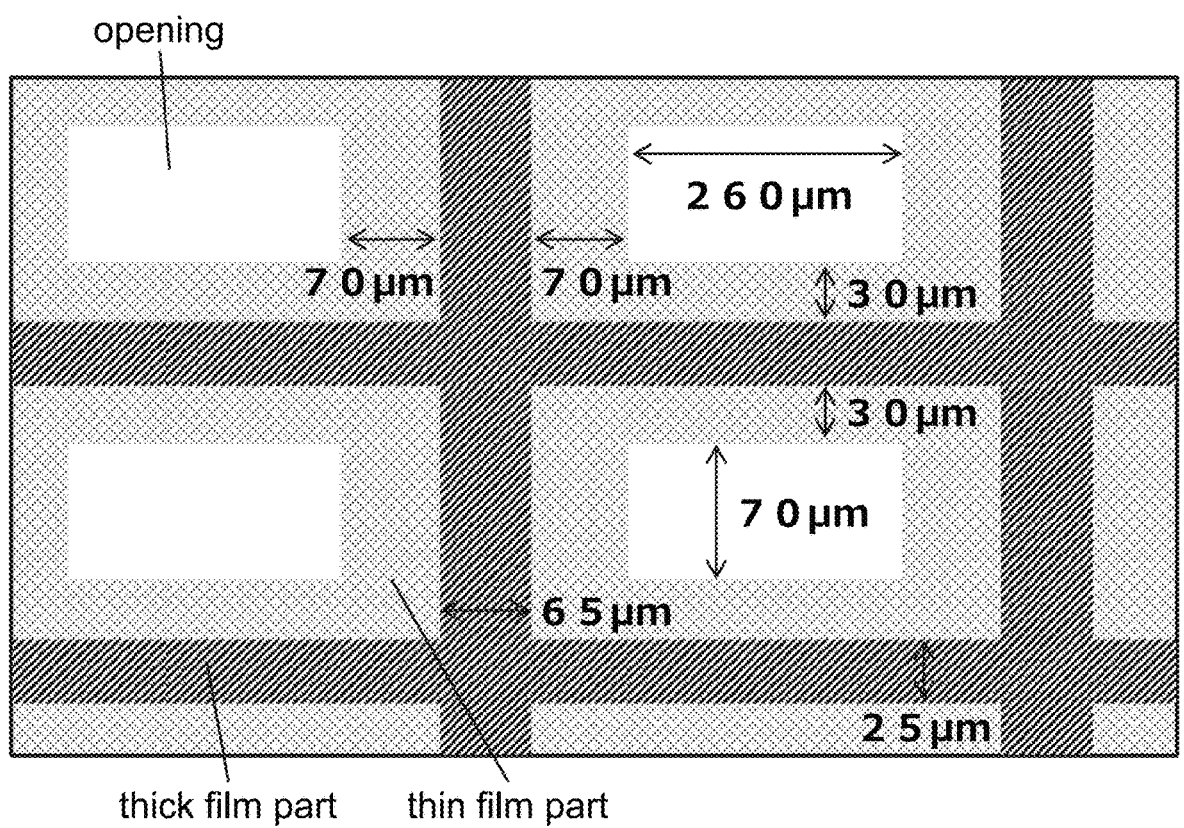
FIG. 9 shows a schematic diagram illustrating the arrangement and sizes of openings, thick film parts, and thin film parts in an organic EL display device used for evaluation of luminescence characteristics.

FIG. 9 is a schematic diagram illustrating the arrangement and sizes of the openings, thick film parts, thin film parts in the organic EL display produced. Here, the halftone photomask used to realize the pattern shown in FIG. 9 has an area where transparent portions and translucent portions are adjacent to each other also while at the same time light-shielding portions and translucent portions are adjacent to each other. It also contains rectangular light-shielding portions. Furthermore, the circumferences of the transparent portions account for 0% of the circumferences of the light-shielding portions where they are in contact with each other.

The organic EL display devices prepared were driven by a direct current of 10 mA/cm² to emit light and observed for display device failures including dark spots attributed to particles formed in the deposition step, non-light emitting regions and uneven brightness attributed to damage to the insulation layer, etc., and the display failure rate was calculated from the number of normal ones in the 20 organic EL display devices.

Evaluations were made according to the criteria given below, and samples rated as A+, A, B, or C, which had a display failure rate of 25% or less, were judged as acceptable. Those rated as A+, A, or B, which had a display failure rate of 15% or less, were judged as having a good yield rate and those rated as A+ or A, which had a display failure rate of 5% or less, were judged as having an excellent yield rate. Organic EL displays were produced using step-shaped cured films of the composition 6 prepared by the above procedure as insulation layers 50, and their display failure rate was found to be 10%, proving a high yield rate.

A+: Having a display failure rate of 0%
A: Having a display failure rate of 1% to 5%
B: Having a display failure rate of 6% to 15%
C: Having a display failure rate of 16% to 25%
D: Having a display failure rate of 26% to 35%
E: Having a display failure rate of 36% to 65%
F: Having a display failure rate of 66% to 100%

Examples 106 to 111 and Comparative Examples 13 and 14

The same procedure was performed using the compositions 37, 80, 81, 82, 83, and 84 in Examples 106 to 111 and using the composition 86 and 91 in Comparative examples 13 and 14, respectively, to prepare organic EL displays in which the step-shaped cured film of each composition was contained as the insulation layer 50, and their display failure rates were calculated. For the insulation layer 50, the thick film parts were designed to have a film thickness of about 4.0 μm.

When using the composition 37, the thin film parts were designed to have a film thickness of about 1.5 μm, and the thick film parts and the thin film parts had a film thickness difference of about 2.5 μm. When using the composition 80, the thick film parts were designed to have a film thickness of about 1.0 μm, and the thin film parts and the thin film parts had a film thickness difference of about 3.0 μm. When using the composition 81, the thin film parts were designed to have a film thickness of about 1.0 μm, and the thick film parts and the thin film parts had a film thickness difference of about 3.0 μm. When using the composition 82, the thin film parts were designed to have a film thickness of about 1.1 μm, and the thick film parts and the thin film parts had a film thickness difference of about 2.9 μm. When using the composition 83, the thin film parts were designed to have a film thickness of about 1.2 μm, and the thick film parts and the thin film parts had a film thickness difference of about 2.8 μm. When using the composition 84, the thin film parts were designed to have a film thickness of about 1.0 μm, and the thick film parts and the thin film parts had a film thickness difference of about 3.0 μm. When using the composition 86, on the other hand, the thin film parts were designed to have a film thickness of about 3.7 μm, and the thick film parts and the thin film parts had a film thickness difference of about 0.3 μm. When using the composition 91, the thin film parts were designed to have a film thickness of about 3.3 μm, and the thick film parts and the thin film parts had a film thickness difference of about 0.7 μm.

Organic EL displays produced from the composition 37 had a display failure rate of 3%, proving an excellent yield rate. Organic EL displays produced from the composition 80, 81, 82, 83, or 84 had a display failure rate of 0%, proving an excellent yield rate. On the other hand, organic EL displays produced from the composition 86 had a display failure rate of 40%, proving a poor yield rate. Organic EL displays produced from the composition 91 had a display failure rate of 30%, proving a poor yield rate.

Example 112

Furthermore, after forming a step-shaped developed film from the composition 37 by the same procedure as above, the resulting developed film was subjected to bleaching exposure by using a double side alignment type single side aligner (Mask Aligner PEM-6M; manufactured by Union Optical Co., Ltd.) to apply i-line (wavelength 365 nm), h-line (wavelength 405 nm), or g-line (wavelength 436 nm) beam from an ultrahigh pressure mercury lamp in an air atmosphere at 23° C. to photo-cure the step-shaped developed film. The exposure energy used was twice the exposure energy representing the sensitivity, that is, $((E_{FT}) \times 2)$ mJ/cm². Subsequently, heat-curing was carried out by the same procedure to produce organic EL displays containing step-shaped cured films as insulation layers 50, and their display failure rate was calculated as above. For the insulation layer 50, the thick film parts were designed to have a film thickness of about 5.0 µm. In the case where the composition 37 was photo-cured and subsequently heat-cured, the thin film parts were designed to have a film thickness of about 1.5 µm, and the thick film parts and the thin film parts had a film thickness difference of about 3.5 µm. The resulting organic EL displays had a display failure rate of 0%, proving an excellent yield rate.

EXPLANATION OF NUMERALS

1: glass substrate
2: TFT
3: cured film for TFT planarization
4: reflecting electrode
5a: prebaked film
5b: cured pattern
6: mask
7: active actinic ray
8: EL light emitting layer
9: transparent electrode
10: cured film for planarization
11: cover glass
12: glass substrate
13: BLU
14: glass substrate with BLU
15: glass substrate
16: TFT
17: cured film for TFT planarization
18: transparent electrode
19: planarization layer
20: alignment layer
21a: prebaked film
21b: cured pattern
22: mask
23: active actinic ray
24: glass substrate with BCS
25: glass substrate with BLU and BCS
26: glass substrate
27: color filter
28: cured pattern
29: cured film for planarization
30: alignment layer
31: color filter substrate
32: glass substrate with BLU, BCS, and BM
33: liquid crystal layer
34: thick film part
35a, 35b, 35c: thin film part
36a, 36b, 36c, 36d, 36e: slope in cross section of cured pattern
37: horizontal side of underlying substrate
47: non-alkali glass substrate
48: first electrode
49: auxiliary electrode
50: insulation layer
51: organic EL layer
52: second electrode
53: non-alkali glass substrate
54: source electrode
55: drain electrode
56: reflecting electrode
57: oxide semiconductor layer
58: via hole
59: pixel region
60: gate insulation layer
61: gate electrode
62: TFT protection layer/pixel dividing layer
63: organic EL light emitting layer
64: transparent electrode
65: sealing film
66: non-alkali glass substrate

The invention claimed is:
1. A negative type photosensitive resin composition comprising:
an alkali-soluble resin (A), a radical polymerizable compound (B), a photo initiator (C1), and
a black pigment (D1a);
wherein
the alkali-soluble resin (A) includes a first resin (A1) containing one or more selected from the group consisting of polyimide (A1-1), polyimide precursor (A1-2), polybenzoxazole (A1-3), and polybenzoxazole precursor (A1-4); and
the radical polymerizable compound (B) includes one or more selected from the group consisting of a fluorene backbone-containing radical polymerizable compound (B1) and an indane backbone-containing radical polymerizable compound (B2),
wherein the radical polymerizable compound (B) further contains a flexible chain-containing aliphatic radical polymerizable compound (B3),
the flexible chain-containing aliphatic radical polymerizable compound (B3) containing a compound as represented by general formula (27) and/or a compound as represented by general formula (28),
the flexible chain-containing aliphatic radical polymerizable compound (B3) having, in the molecule, a group as represented by general formula (24) and a plurality of groups as represented by general formula (25),
wherein the flexible chain-containing aliphatic radical polymerizable compound (B3) contains at least one lactone modified chain and/or at least one lactam modified chain,
wherein the black pigment (D1a) contains a black organic pigment (D1a-1) that contains one or more selected from the group consisting of a benzofuranone based black pigment (D1a-1a), a perylene based black pigment (D1a-1b), and an azo based black pigment (D1a-1c),

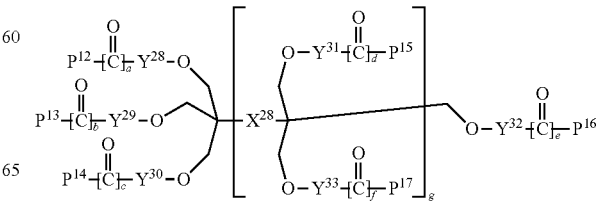

(27)

-continued (28)

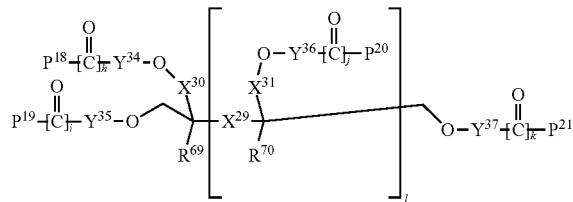

wherein in general formula (27),
$X^{28}$ is a divalent organic group;
$Y^{28}$ to $Y^{33}$ are each independently a direct bond or a group as represented by the general formula (24), and at least one of $Y^{28}$ to $Y^{33}$ is a group as represented by the general formula (24);
$P^{12}$ to $P^{17}$ are each independently a hydrogen atom or a group as represented by the general formula (25), and at least two of $P^{12}$ to $P^{17}$ are groups as represented by the general formula (25); and
a, b, c, d, e, and f are each independently an integer of 0 or 1, and g is an integer of 0 to 10,
wherein in general formula (28),
$X^{29}$ is a divalent organic group;
$X^{30}$ and $X^{31}$ is each independently a direct bond or an alkylene chain containing 1 to 10 carbon atoms;
$Y^{34}$ to $Y^{37}$ are each independently a direct bond or a group as represented by the general formula (24), and at least one of $Y^{34}$ to $Y^{37}$ is a group as represented by the general formula (24);
$R^{69}$ and $R^{70}$ are each independently a hydrogen atom or an alkyl group containing 1 to 10 carbon atoms;
$P^{18}$ to $P^{21}$ are each independently a hydrogen atom or a group as represented by the general formula (25), and at least two of $P^{18}$ to $P^{21}$ are groups as represented by the general formula (25); and
h, i, j, and k are each independently an integer of 0 or 1, and l is an integer of 0 to 10, (24)

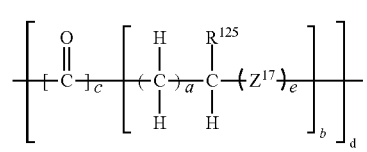

(25)

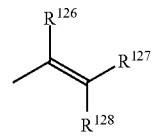

(29)

—O—

(30)

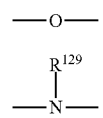

wherein in general formula (24),
$R^{125}$ is a hydrogen atom or an alkyl group containing 1 to 10 carbon atoms;
$Z^{17}$ is a group as represented by general formula (29) or a group as represented by general formula (30);
a is an integer of 1 to 10, b is an integer of 1 to 4, c is 1, d is an integer of 1 to 4, and e is 1;

in general formula (25), $R^{126}$ to $R^{128}$ are each independently a hydrogen atom, an alkyl group containing 1 to 10 carbon atoms, or an aryl group containing 6 to 15 carbon atoms; and
in general formula (30), $R^{129}$ is a hydrogen atom or an alkyl group containing 1 to 10 carbon atoms.

2. A negative type photosensitive resin composition as set forth in claim 1 containing, as the fluorene backbone-containing radical polymerizable compound (B1), a compound as represented by general formula (11),
and/or
containing, as the indane backbone-containing radical polymerizable compound (B2), a compound as represented by general formula (12) and/or a compound as represented by general formula (13):

(11)

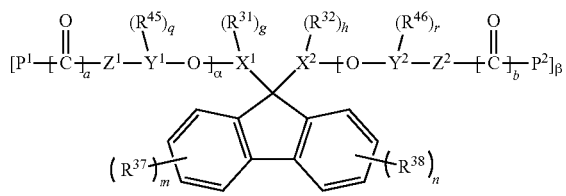

(12)

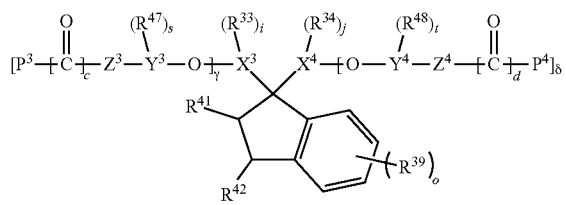

(13)

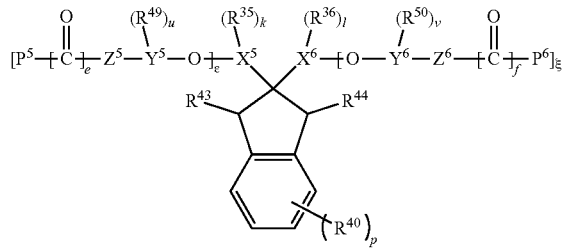

wherein in general formulae (11), (12), and (13),
$X^1$ to $X^6$ are each independently a monocyclic or fused polycyclic divalent to decavalent aromatic hydrocarbon ring containing 6 to 15 carbon atoms or a monocyclic or fused polycyclic divalent to octavalent aliphatic hydrocarbon ring containing 4 to 10 carbon atoms;
$Y^1$ to $Y^6$ are each independently a direct bond, an alkylene group containing 1 to 10 carbon atoms, a cycloalkylene group containing 4 to 10 carbon atoms, an arylene group containing 6 to 15 carbon atoms, or a group as represented by general formula (18);
when $Y^1$ to $Y^6$ are each a direct bond or a group as represented by general formula (18), $Z^1$ to $Z^6$ are each a direct bond and q, r, s, t, u, and v are 0;
when $Y^1$ to $Y^6$ are each an alkylene group containing 1 to 10 carbon atoms, a cycloalkylene group containing 4 to 10 carbon atoms, or an arylene group containing 6 to 15 carbon atoms, $Z^1$ to $Z^6$ are each an oxygen atom, and q, r, s, t, u, and v are each independently an integer of 0 to 8;

$R^{31}$ to $R^{40}$ are each independently a halogen, an alkyl group containing 1 to 10 carbon atoms, a cycloalkyl group containing 4 to 10 carbon atoms, an aryl group containing 6 to 15 carbon atoms, a fluoroalkyl group containing 1 to 10 carbon atoms, a fluorocycloalkyl group containing 4 to 10 carbon atoms, or a fluoroaryl group containing 6 to 15 carbon atoms;

$R^{41}$ to $R^{44}$ are each independently a hydrogen atom, an alkyl group containing 1 to 10 carbon atoms, a cycloalkyl group containing 4 to 10 carbon atoms, or an aryl group containing 6 to 15 carbon atoms; and $R^{45}$ to $R^{50}$ are each independently an alkyl group containing 1 to 10 carbon atoms or a hydroxy group, $P^1$ to $P^6$ are each independently a group as represented by general formula (14);

a, b, c, d, e, and f are each independently 0 or 1; when a, b, c, d, e, and f are 0, $Z^1$ to $Z^6$ are each an oxygen atom; g, h, i, j, k, and l are each independently an integer of 0 to 8, and m, n, o, and p are each independently an integer of 0 to 4; and α, β, γ, δ, ε, ζ and are each independently an integer of 1 to 4;

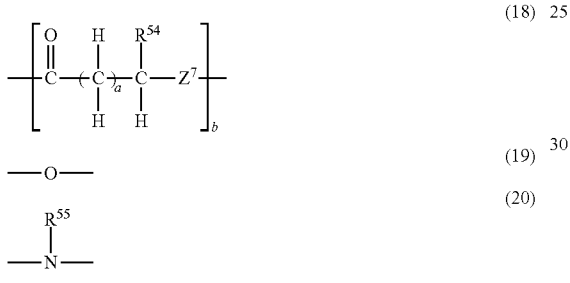

(18)

—O—  (19)

(20)

wherein in general formula (18), $R^{54}$ is a hydrogen atom or an alkyl group containing 1 to 10 carbon atoms;

$Z^7$ is a group as represented by general formula (19) or a group as represented by general formula (20);

a is an integer of 1 to 10 and b is an integer of 1 to 4; and in general formula (20), $R^{55}$ is a hydrogen atom or an alkyl group containing 1 to 10 carbon atoms; and (14)

$$\underset{R^{53}}{\overset{R^{51}}{\diagdown}}C=C\underset{}{\overset{R^{52}}{\diagup}}$$

wherein in general formula (14), $R^{51}$ to $R^{53}$ are each independently a hydrogen atom, an alkyl group containing 1 to 10 carbon atoms, or an aryl group containing 6 to 15 carbon atoms.

3. A negative type photosensitive resin composition as set forth in claim 1 containing, as the fluorene backbone-containing radical polymerizable compound (B1), a compound having a structural unit as represented by general formula (15), or containing, as the indane backbone-containing radical polymerizable compound (B2), a compound having a structural unit as represented by general formula (16) or a compound having a structural unit as represented by general formula (17):

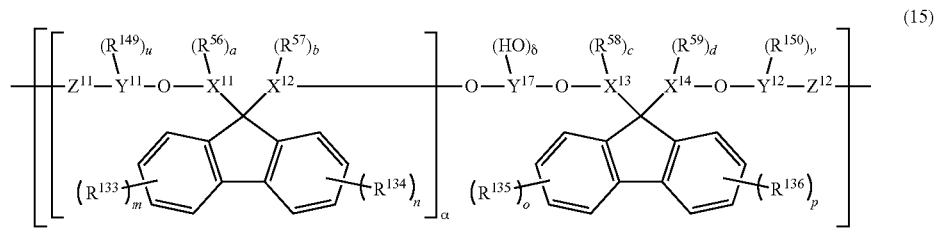

(15)

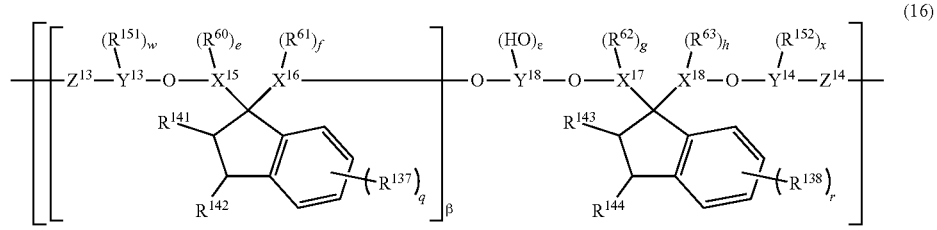

(16)

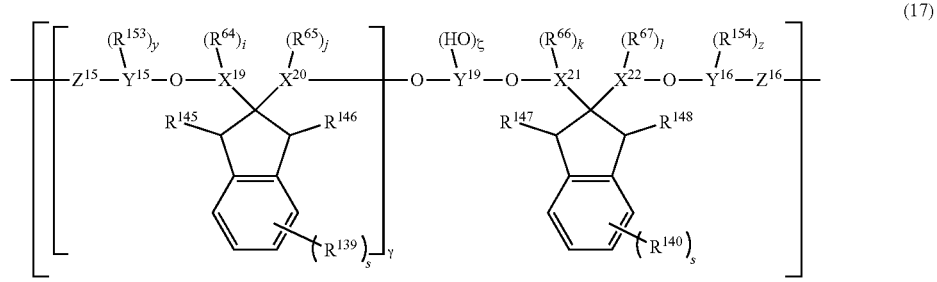

(17)

wherein in general formula (15), (16), and (17),
$X^{11}$ to $X^{22}$ are each independently a monocyclic or fused polycyclic divalent to decavalent aromatic hydrocarbon ring containing 6 to 15 carbon atoms or a monocyclic or fused polycyclic divalent to octavalent aliphatic hydrocarbon ring containing 4 to 10 carbon atoms;
$Y^{11}$ to $Y^{16}$ are each independently a direct bond, an alkylene group containing 1 to 10 carbon atoms, a cycloalkylene group containing 4 to 10 carbon atoms, or an arylene group containing 6 to 15 carbon atoms;
when $Y^{11}$ to $Y^{16}$ are each a direct bond, $Z^{11}$ to $Z^{16}$ are each a direct bond and u, v, w, x, y, and z are 0;
when $Y^{11}$ to $Y^{16}$ are not direct bonds, $Z^{11}$ to $Z^{16}$ are each an oxygen atom and u, v, w, x, y, and z are each independently an integer of 0 to 8;
$Y^{17}$ to $Y^{19}$ are each independently an alkylene group containing 1 to 10 carbon atoms, a cycloalkylene group containing 4 to 10 carbon atoms, or an arylene group containing 6 to 15 carbon atoms;
$R^{56}$ to $R^{67}$ and $R^{133}$ to $R^{140}$ are each independently a halogen, an alkyl group containing 1 to 10 carbon atoms, a cycloalkyl group containing 4 to 10 carbon atoms, an aryl group containing 6 to 15 carbon atoms, a fluoroalkyl group containing 1 to 10 carbon atoms, a fluorocycloalkyl group containing 4 to 10 carbon atoms, or a fluoroaryl group containing 6 to 15 carbon atoms;
$R^{141}$ $R^{148}$ are each independently a hydrogen, an alkyl group containing 1 to 10 carbon atoms, a cycloalkyl group containing 4 to 10 carbon atoms, or an aryl group containing 6 to 15 carbon atoms; and
$R^{149}$ to $R^{154}$ are each independently an alkyl group containing 1 to 10 carbon atoms or a hydroxy group;
a, b, c, d, e, f, g, h, i, j, k, and l are each independently an integer of 0 to 8, and m, n, o, p, q, r, s, and t are each independently an integer of 0 to 4; and
α, β, and γ are each independently 1 or 2, and δ, ε, ζ and are each independently 0 or 1.

4. A negative type photosensitive resin composition as set forth in claim 1, wherein the first resin (A1) contains one or more selected from the group consisting of polyimide (A1-1), polyimide precursor (A1-2), polybenzoxazole (A1-3), and polybenzoxazole precursor (A1-4).

5. A negative type photosensitive resin composition as set forth in claim 4 containing, as the polyimide precursor (A1-2), a structural unit as represented by general formula (3):

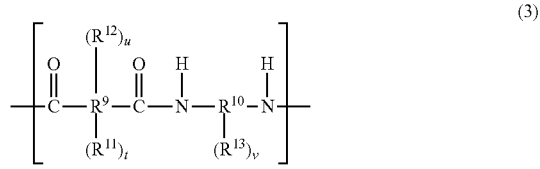

wherein in general formula (3),
$R^9$ is a tetravalent to decavalent organic group, and $R^{10}$ is a divalent to decavalent organic group; and
$R^{11}$ is a substituent group as represented by the general formula (5) or general formula (6) given above;
$R^{12}$ is a phenolic hydroxyl group, a sulfonic acid group, or a mercapto group; and $R^{13}$ is a phenolic hydroxyl group, a sulfonic acid group, a mercapto group, or a substituent group as represented by the general formula (5) or general formula (6) given above;
t is an integer of 2 to 8;
u is an integer of 0 to 6;
v is an integer of 0 to 8; and 2<t+u<8;

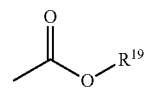

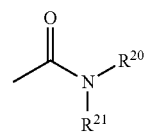

wherein in general formulae (5) and (6), $R^{19}$ to $R^{21}$ are each independently an alkyl group containing 1 to 10 carbon atoms, an acyl group containing 2 to 6 carbon atoms, or an aryl group containing 6 to 15 carbon atoms.

6. A negative type photosensitive resin composition as set forth in claim 1, wherein the fluorene backbone-containing radical polymerizable compound (B1) and the indane backbone-containing radical polymerizable compound (B2) each have 1 to 3 radical polymerizable groups in the molecule.

7. A negative type photosensitive resin composition as set forth in claim 1, wherein the fluorene backbone-containing radical polymerizable compound (B1) and the indane backbone-containing radical polymerizable compound (B2) contain at least one lactone modified chain and/or at least one lactam modified chain.

8. A negative type photosensitive resin composition as set forth in claim 1, wherein the total weight of the fluorene backbone-containing radical polymerizable compound (B1) and the indane backbone-containing radical polymerizable compound (B2) accounts for 1 to 22 parts by mass relative to the total quantity, which accounts for 100 parts by mass, of the alkali-soluble resin (A) and the radical polymerizable compound (B).

9. A negative type photosensitive resin composition as set forth in claim 1 further comprising, as the crosslinking agent (F), an epoxy compound having a fluorene backbone and a plurality of epoxy groups in the molecule (F1) and/or an epoxy compound having an indane backbone and a plurality of epoxy groups in the molecule (F2).

10. A negative type photosensitive resin composition as set forth in claim claim 1, wherein the black organic pigment (D1a-1) further contains a covering layer (DC) that contains one selected from the group consisting of a silica covering layer (DC-1), metal oxide covering layer (DC-2), and metal hydroxide covering layer (DC-3).

11. A cured film formed by curing a negative type photosensitive resin composition as set forth in claim 1.

12. An element having a cured film as set forth in claim 11.

13. An organic EL display comprising a cured film as set forth in claim 11 as one or more selected from the group consisting of pixel dividing layer, electrode insulation layer, wiring insulation layer, TFT planarization layer, electrode planarization layer, wiring planarization layer, TFT protection layer, electrode protection layer, and wiring protection layer.

14. An organic EL display as set forth in claim 13, wherein the cured film has a step-shaped cured pattern, and the film thickness difference ($\Delta T_{FT\text{-}HT}$) μm between ($T_{FT}$) and ($T_{HT}$) is in the range of 1.5 to 10.0 μm, wherein ($T_{FT}$) μm denotes the film thickness of the thick parts while ($T_{HT}$) μm denotes the film thickness of the thin parts in the step-shaped cured pattern.

15. A production method for an organic EL display comprising:
    (1) a step for forming a coating film of a negative type photosensitive resin composition as set forth in claim 1 on a substrate,
    (2) a step for applying active actinic ray to the coating film of the negative type photosensitive resin composition through a photomask,
    (3) a step for development using an alkaline solution to form a pattern of the negative type photosensitive resin composition, and
    (4) a step for heating the pattern to produce a cured pattern of the negative type photosensitive resin composition.

16. An organic EL display production method as set forth in claim 15, wherein the photomask is one that has a pattern containing transparent portions and light-shielding portions and also containing translucent portions lower in transmittance than the transparent portions and higher in transmittance than the light-shielding portions and located between the transparent portions and the light-shielding portions.

17. An organic EL display production method as set forth in claim 16, wherein the pattern of the negative type photosensitive resin composition is a step-shaped pattern, and the step (3) for development using an alkaline solution to form a pattern of the negative type photosensitive resin composition is followed by a step (3b) for photo-curing the pattern of the negative type photosensitive resin composition.

* * * * *